US007260510B2

(12) United States Patent
Sumida

(10) Patent No.: US 7,260,510 B2
(45) Date of Patent: Aug. 21, 2007

(54) SIMULATION MODEL CREATION METHOD AND SYSTEM, AND STORAGE MEDIUM

(75) Inventor: Shizuo Sumida, Hiroshima (JP)

(73) Assignees: Mazda Motor Corporation, Hiroshima (JP); Shizuo Sumida, Hiroshima (JP)

( * ) Notice: Subject to any disclaimer, the term of this patent is extended or adjusted under 35 U.S.C. 154(b) by 901 days.

(21) Appl. No.: 10/110,408

(22) PCT Filed: Aug. 24, 2001

(86) PCT No.: PCT/JP01/07260

§ 371 (c)(1),
(2), (4) Date: Apr. 12, 2002

(87) PCT Pub. No.: WO02/17024

PCT Pub. Date: Feb. 28, 2002

(65) Prior Publication Data
US 2003/0115037 A1    Jun. 19, 2003

(30) Foreign Application Priority Data
Aug. 25, 2000 (JP) .............................. 2000-256327

(51) Int. Cl.
*G06F 17/50* (2006.01)
(52) U.S. Cl. ........................................................ 703/2
(58) Field of Classification Search .................... 703/2
See application file for complete search history.

(56) References Cited

U.S. PATENT DOCUMENTS

| 4,965,743 | A | 10/1990 | Malin et al. ................. 364/513 |
| 5,249,151 | A | 9/1993 | Chang et al. |
| 5,431,261 | A | 7/1995 | Olgac |

(Continued)

FOREIGN PATENT DOCUMENTS

| EP | 0415637 A2 | 3/1991 |
| FR | 2724744 | 3/1996 |
| FR | 2728368 | 6/1996 |
| GB | 2334682 | 9/1999 |
| JP | A 9-91334 | 4/1997 |
| WO | WO97/12301 | 4/1997 |

OTHER PUBLICATIONS

Barsoum, N.N., et al., "Observation and simulation of a large signal mechanical vibrating system," Comp. Methods in Appl. Mech. and Eng., vol. 135, pp. 1-13, Aug. 15, 1996.

(Continued)

*Primary Examiner*—Hugh Jones

(57) ABSTRACT

This invention systematically creates models that simulate operations from a component of a single function to a machine that combines many components and also to a system that combines a plurality of machines, which can be expressed by all physical systems such as an electric system and mechanical system, solid-state system and fluid system, and the like. The invention creates an overall function simulation model using a plurality of function simulation models which are independently provided for predetermined functions and are coupled via potential and flow variables. When respective function simulation models include linear characteristic elements A, B, C, E, F, and G and at least one function simulation model includes nonlinear characteristic elements X and Y, the nonlinear characteristic elements are separated from the linear characteristic elements by handling the nonlinear characteristics as functions in the function simulation model, the plurality of function simulation models are integrated as linear characteristic elements (integration process), and the nonlinear characteristic elements are linked to the functions in the integrated function simulation model (succession process).

21 Claims, 125 Drawing Sheets

U.S. PATENT DOCUMENTS

| | | | |
|---|---|---|---|
| 5,651,341 A | | 7/1997 | Harada et al. |
| 5,659,467 A | | 8/1997 | Vickers ...................... 364/138 |
| 6,041,424 A | * | 3/2000 | Kurata et al. .................. 714/33 |
| 6,304,835 B1 | * | 10/2001 | Hiramatsu et al. ............. 703/7 |

OTHER PUBLICATIONS

Crossley, P.R., et al., "A nonlinear engine model for drivetrain system development," Control 1991, International Conference, pp. 921-925, vol. 2.

Ellis, R.E., et al., "Two numerical issues in simulating constrained dynamics," Robotics and Automation, 1992, Proc., 1992 IEEE Intl. Conf., pp. 312-318, vol. 1, May 12-14, 1992.

Hiramatsu, Shigeki, et al., "Modeling of Power Train by Applying the Virtual Prototype Concept," The Soc. Of Automotive Engineers of Japan lecture meeting preprints 1974, pp. 177-181, Oct. 2123. 1997.

Hiramatsu, Shigeki, et al., "Modeling for Functional Expression of Rotary Apparatus (2nd Report, Planetary Gear Train)," The JSME (Series C), vol. 65, No. 638, pp. 44-51, Oct. 1999.

Kim, Jung-Ho, et al., "AUTOTOOL, a PC-based object-oriented automotive powertrain simulation tool," Intelligent Transportation System, ITSC '97, Nov. 9-12, 1997, pp. 753-758.

Sumida, Sizuo, et al., "Modeling of Virtual Prototype, part I," JSME 72nd general conference lecture meeting lecture papers, pp. 421-422, Mar. 29-31, 1995,Japanese article, with English language Abstract.

Sumida, Sizuo, et al., "Modeling of Virtual Prototype, part II," Mazda Motor Corporation, Japanese article, with English language Abstract (3 pages).

Shizuo, Sumida, et al., "Hiearchical Functional Model for Automobile Development," Mazda Motor Corporation, Japanese article, with English language Abstract, Oct. 1997.

Koda, Takehisa, et al., "Fundamentals of Bond Graph," The J. of the Japan Soc. of Investment and Management, vol. 9, No. 1, pp. 25-31, 1997 (with partial English translation).

Lee, H.P., "Flexural Vibration of an Orthotropic Rotating Shaft Moving Over Supports", Journal of Sound and Vibration, vol. 179, Issue: 2, Jan. 12, 1995, pp. 347-357.

Nagamatsu, Masao, et al., "A new Approach on Modeling for Product Development (The Basic Concept of Functional Model)," No. 97-1618, 1997, pp. 131-138 (Japanese Article), (Complete English language translation, JSME International Journal, Series C, vol. 42, No. 1, 1999, pp. 235-239).

Nagamatsu, Akio, et al., "A New Approach on Modeling for Product Development (Expansion and Unification)," Japanese article with English language Abstract (pp. 108-115), and complete English translation, JSME International Journal, Series C, vol. 42, No. 4, 1999, pp. 907-913.

Nagamatsu, Akio, et al., "Approach of Modeling for Aiding Product Development of Automobile (A Study on Construction of Virtual Prototype)," The Soc. of Automotive Eng. Of Japan 2000 spring meeting preprints. 2000, pp. 1/4-4/4, Japanese article with English language Abstract.

Sumida, Sizuo, et al., "A New Approach on Modeling for Product Development (Nonlinear System 1 Basic Element)," The J. of JSME (Series C), vol. 64, No. 622, pp. 131-138, Jun. 1998, Japanese article, with English language Abstract, pp. 99-106.

Yoshimura, Hiroaki, et al., "Multibody Dynamics and Symbolic Scheme," JSME 72nd general conference lecture meeting lecture papers, pp. 417-418, Mar. 29-31, 1995.

* cited by examiner (a) COEFFICIENT ELEMENT (b) DISTRIBUTION ELEMENT

FIG. 10A
3D MAP
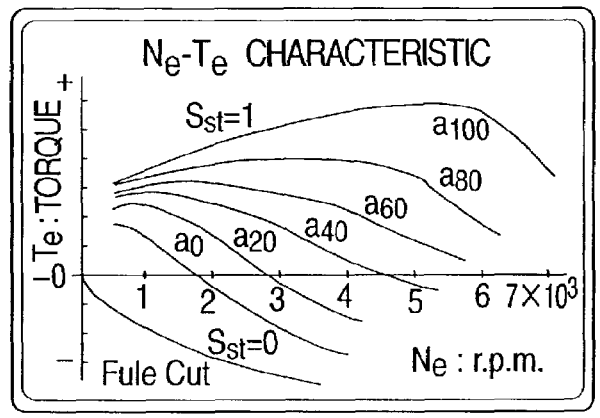
2D MAP
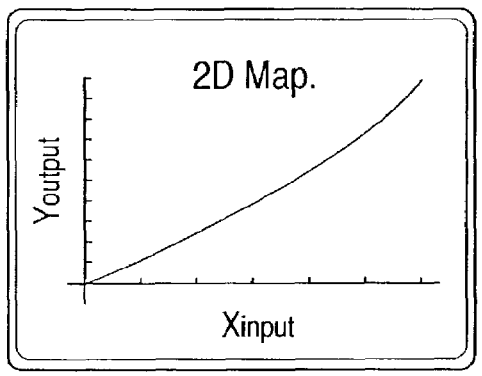
ZONE MAP
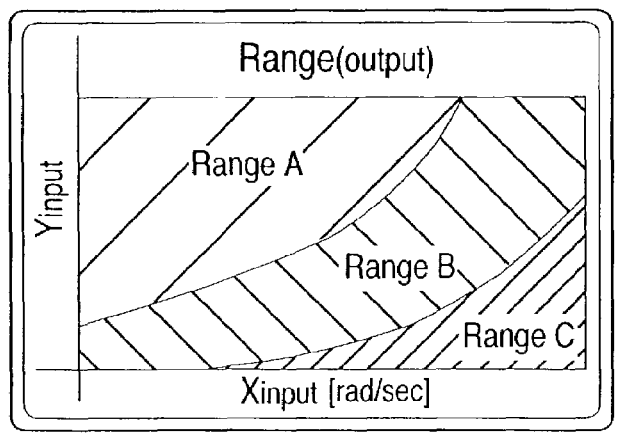

FIG. 10B
FRICTIONAL FORCE
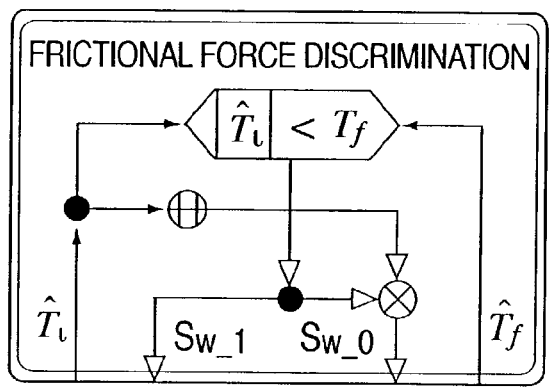
FLUID DRAG FORCE
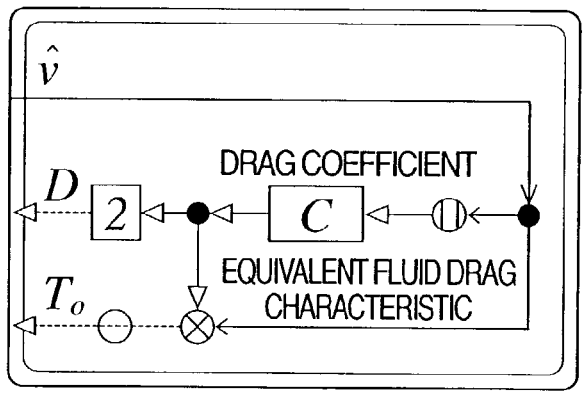
GRAVITY CHARACTERISTIC
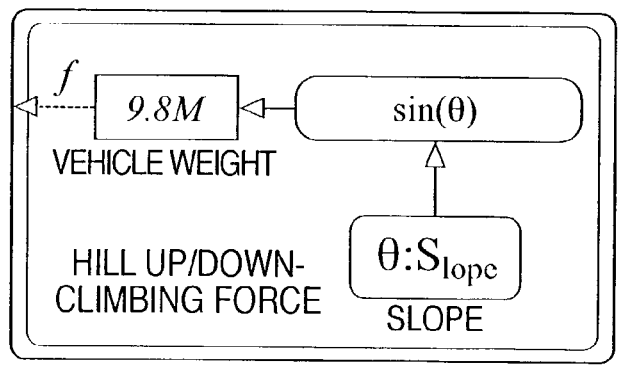

FIG. 10C
PRIMARY DELAY
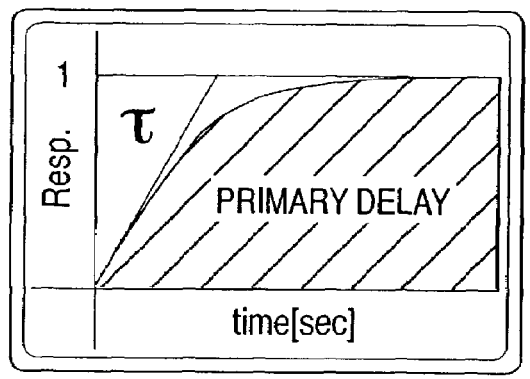
SECONDARY DELAY
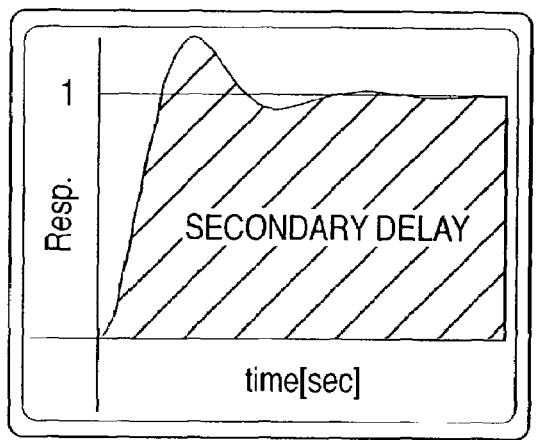
TIME DELAY
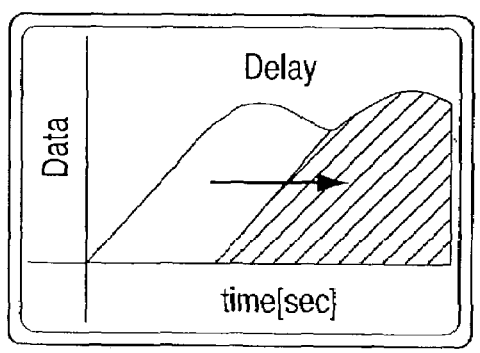

FIG. 10D
MT CLUTCH OPERATION
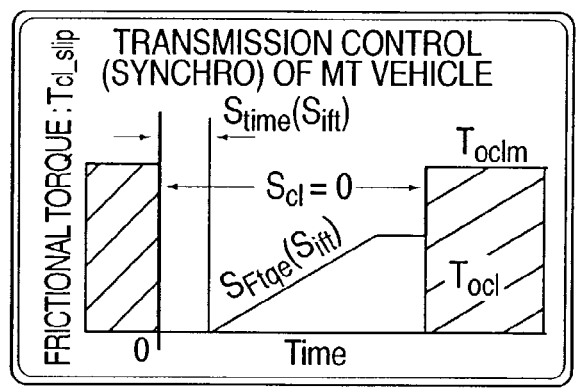
LU CLUTCH OPERATION
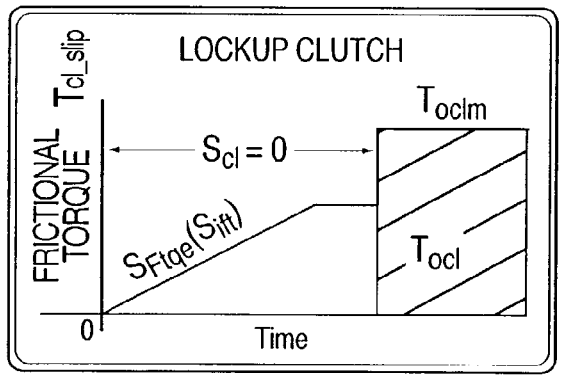
TRANSMISSION MAP OPERATION
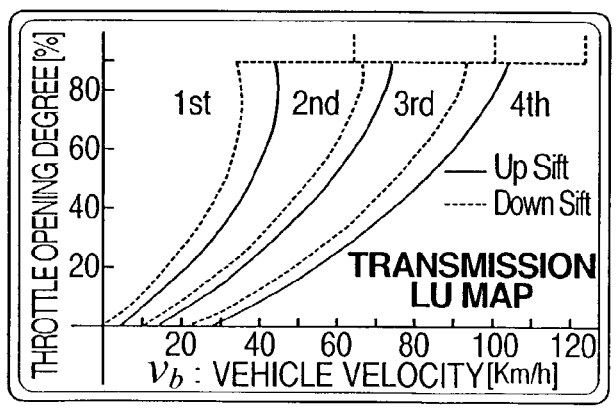

FIG. 17B
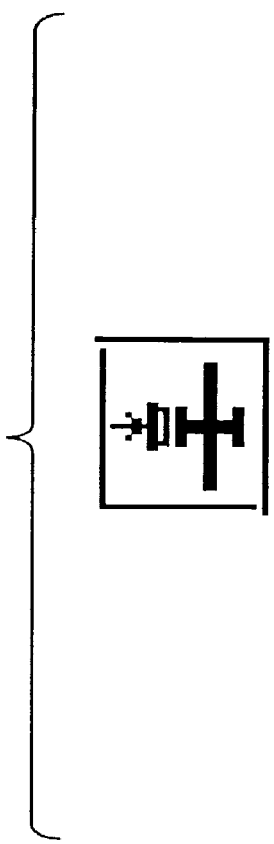
BRAKE MODEL
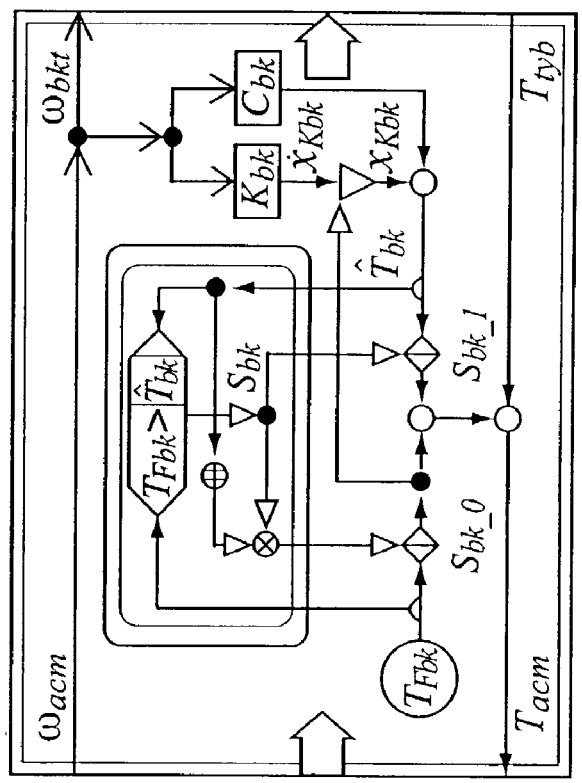

F I G. 17C
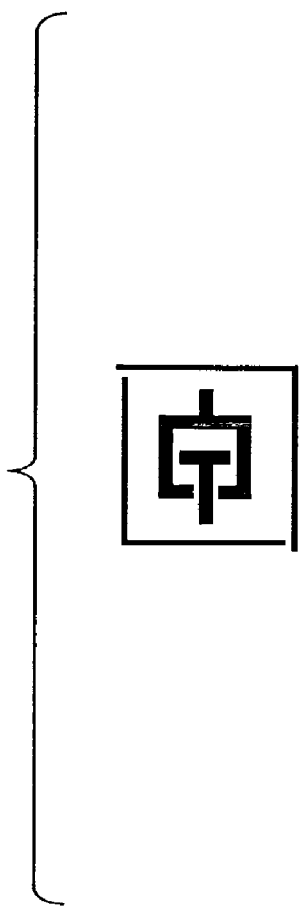

F I G. 17E
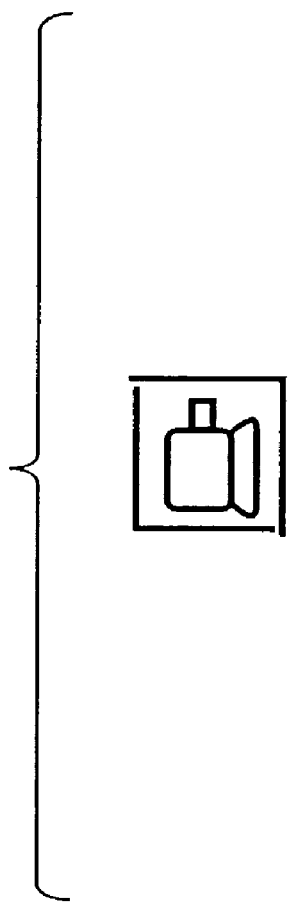
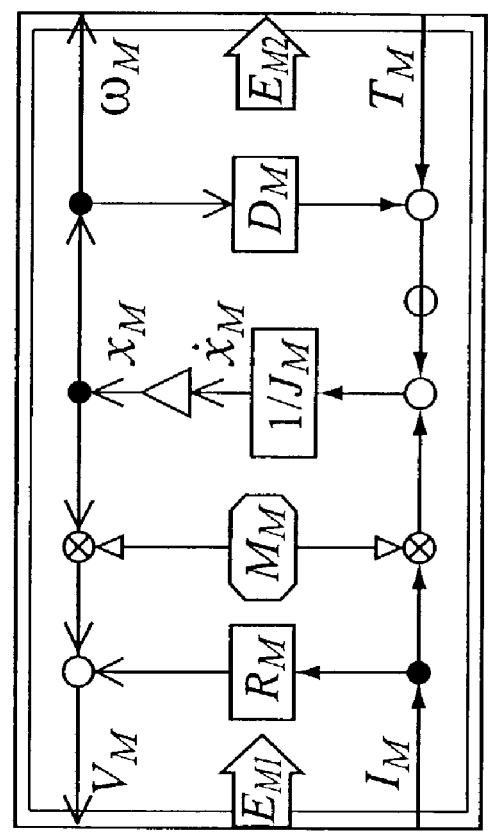
MOTOR MODEL (SIMPLE FORM)

FIG. 17F
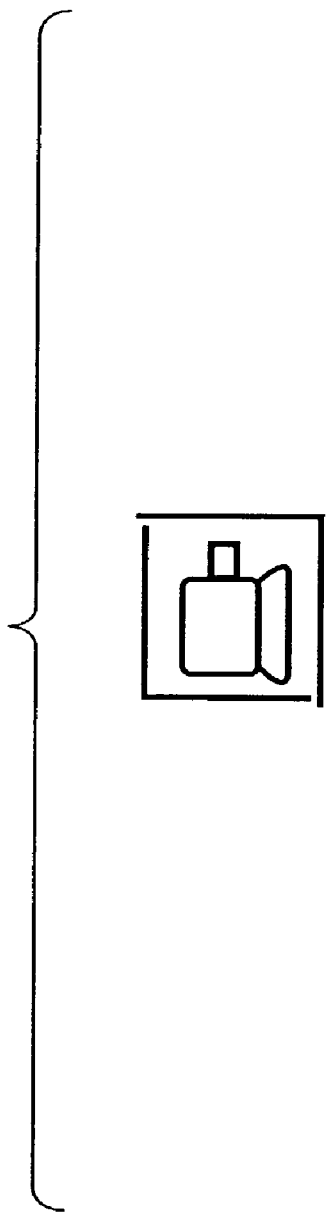
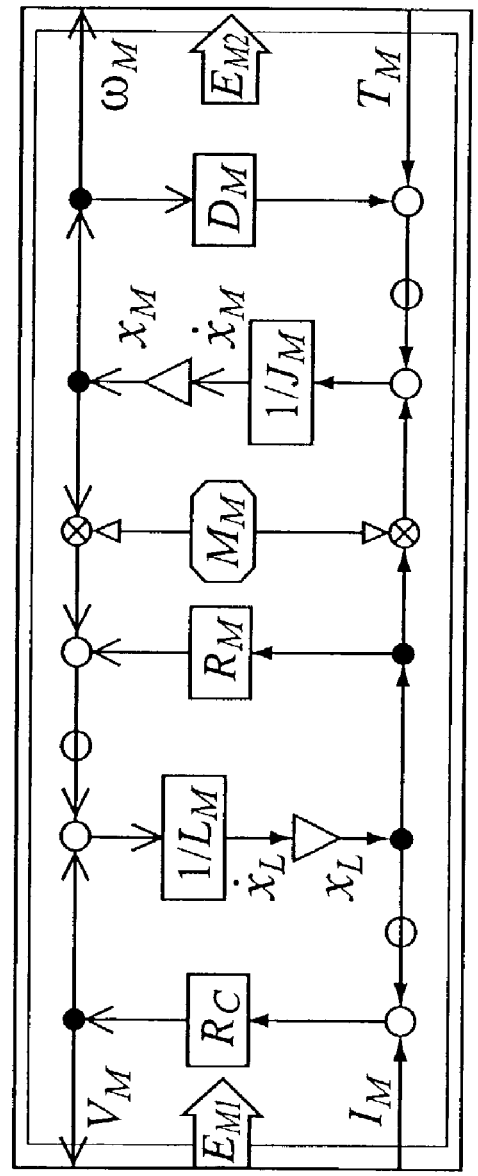
MOTOR MODEL (ACCURATE FORM)

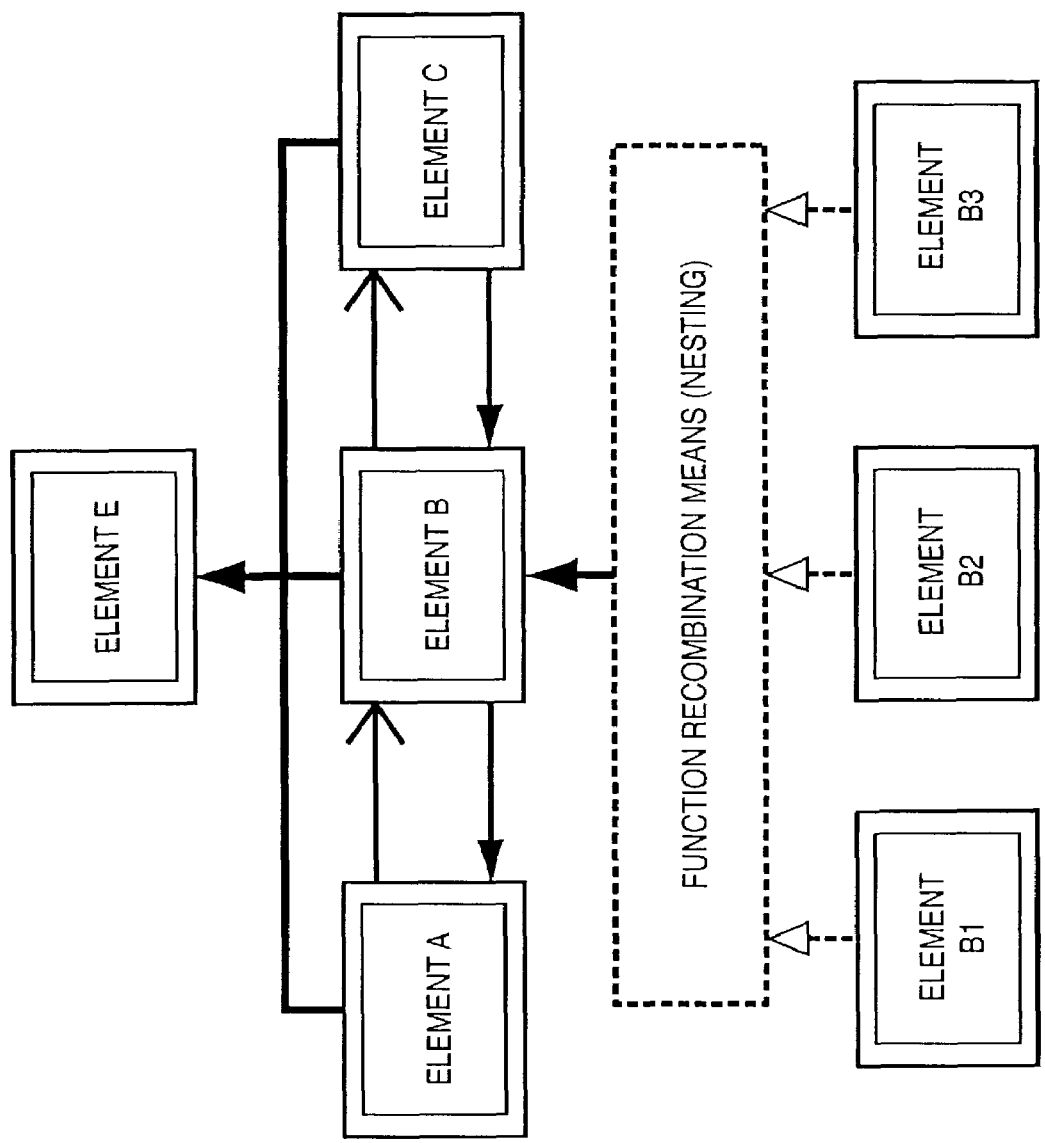

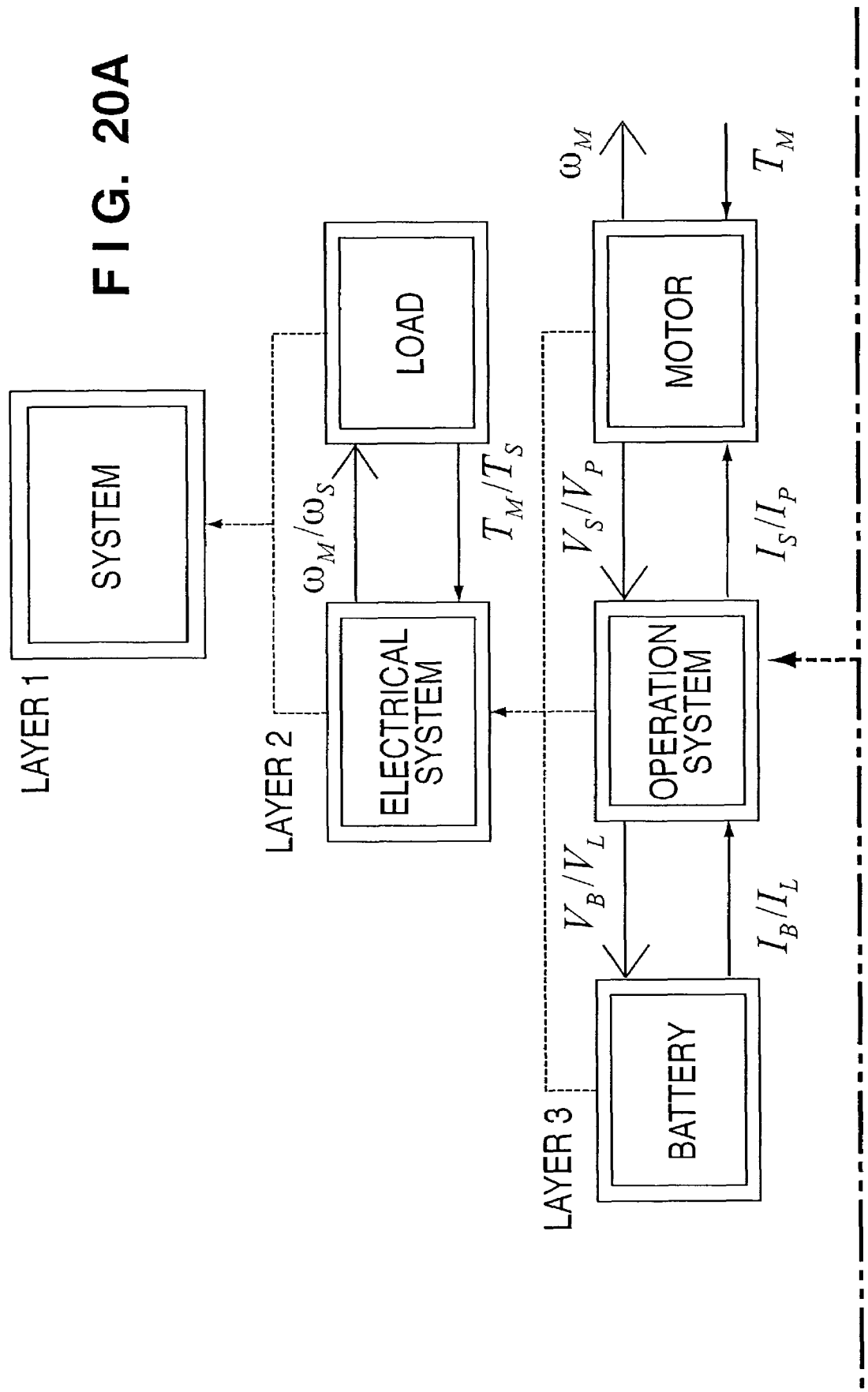

FIG. 33
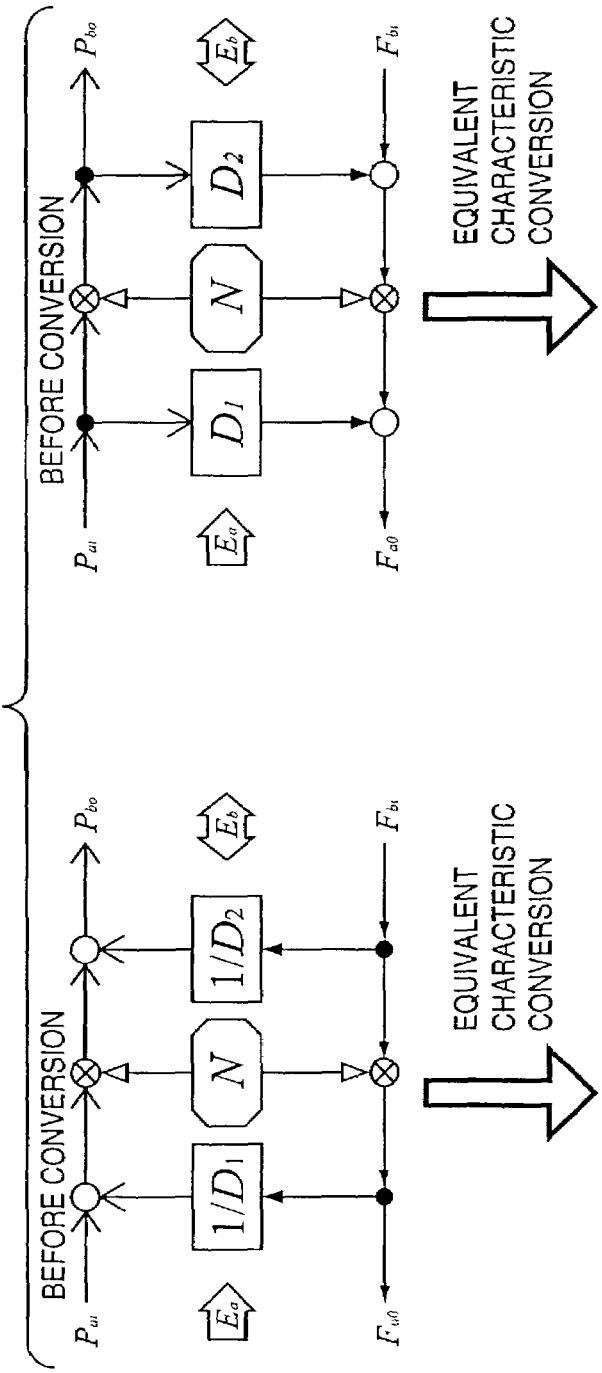
(a) SERIES CONNECTION OF POTENTIAL LOSS ELEMENTS
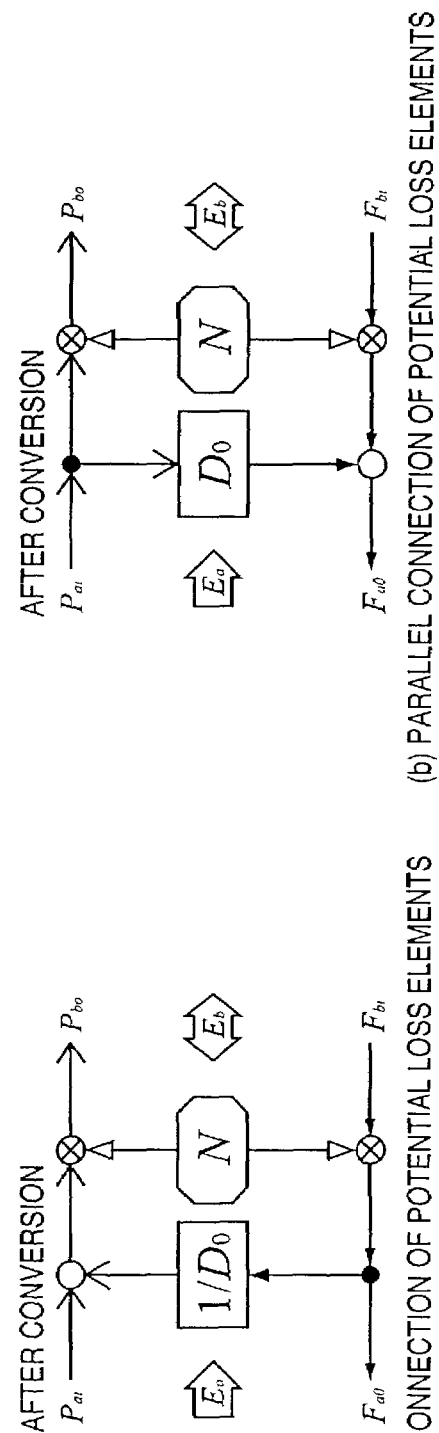
(b) PARALLEL CONNECTION OF POTENTIAL LOSS ELEMENTS

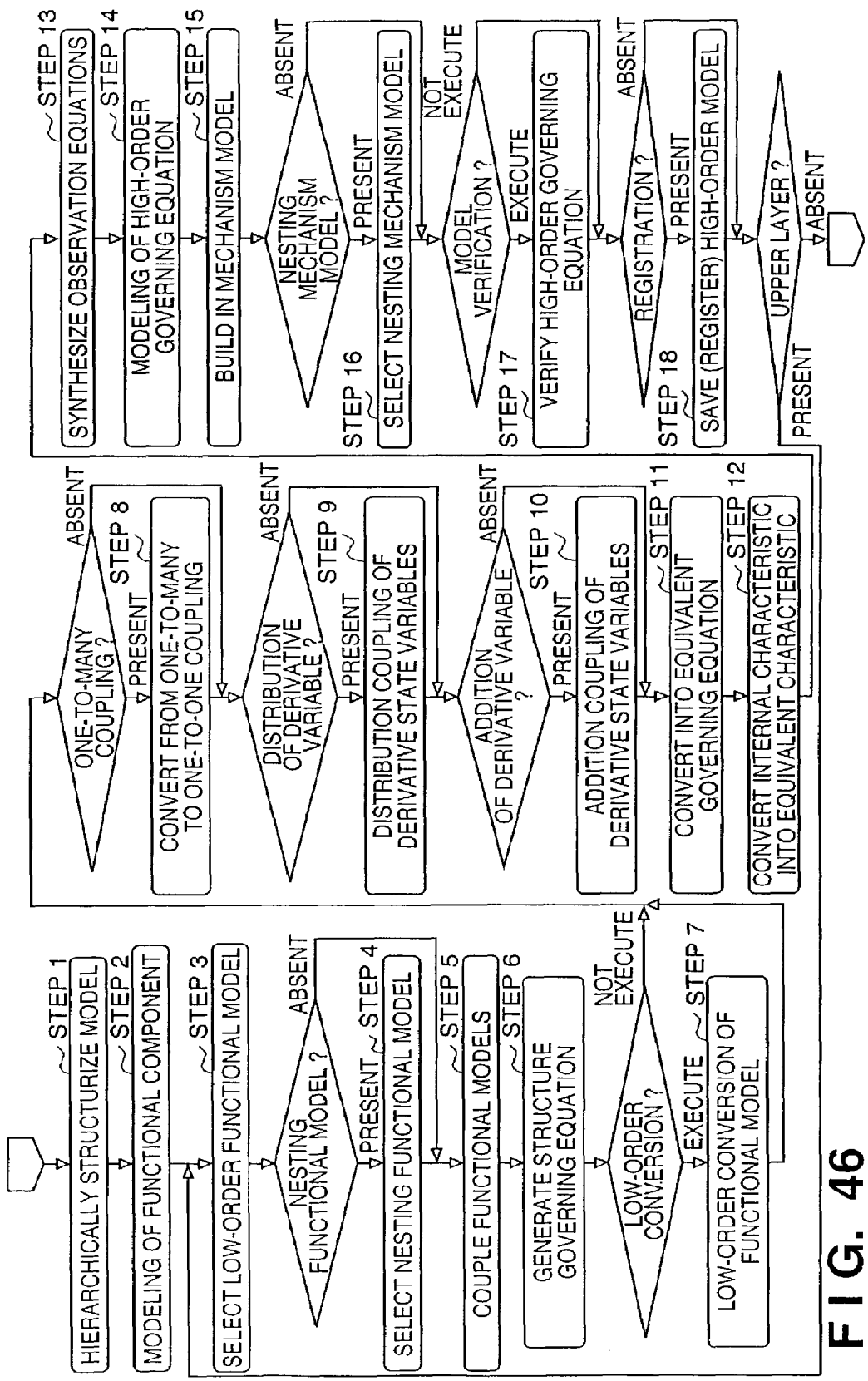
F I G. 46

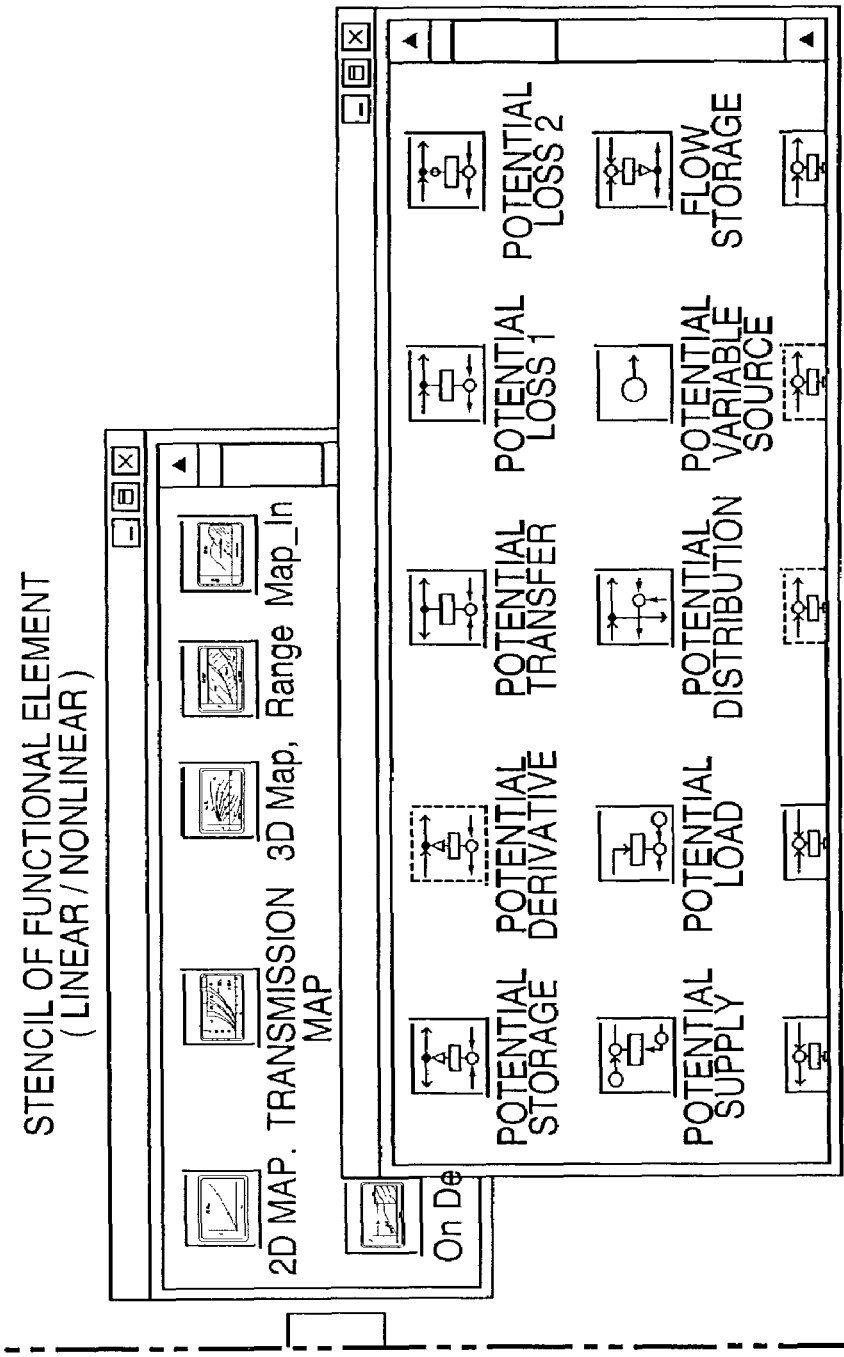
F I G. 56C

FIG. 57

CATEC

CHARACTERISTIC TABLE

| VARIABLE NAME | | UNIT | CHARACTERISTIC NAME |
|---|---|---|---|
| $M =$ | $Je =$ | $Nm/(rad/s^2)$ | MOMENT OF INERTIA |
| $D =$ | $De$ | $Nm/(rad/s)$ | VISCOUS DRAG COEFFICIENT |
| $Fo =$ | $Toe$ | $Nm$ | TORQUE SOURCE |

STATE VARIABLE TABLE

| VARIABLE NAME | | UNIT | VARIABLE NAME |
|---|---|---|---|
| $Pbo =$ | $\omega e$ | $rad/s$ | ENGINE ANGULAR VELOCITY |
| $Te =$ | $Te$ | $Nm$ | ENGINE LOAD TORQUE |

MECHANISM MODEL

| VARIABLE NAME | | UNIT | CHARACTERISTIC SIGNAL NAME |
|---|---|---|---|
| $\alpha e =$ | $\alpha e$ | % | THROTTLE OPENING DEGREE |
| $Sst =$ | $Sst$ | | START SWITCH SIGNAL |

FIG. 59

| CATEC | | | |
|---|---|---|---|
| CHARACTERISTIC VALUE INPUT TABLE | | | |
| CHARACTERISTIC VALUE | | UNIT | CHARACTERISTIC NAME |
| $Je =$ | | $Nm/(rad/s^2)$ | MOMENT OF INERTIA |
| $De =$ | Fnc_De | $Nm/(rad/s)$ | VISCOUS DRAG COEFFICIENT |
| $Toe =$ | Fnc_Tq | $Nm$ | TORQUE SOURCE |

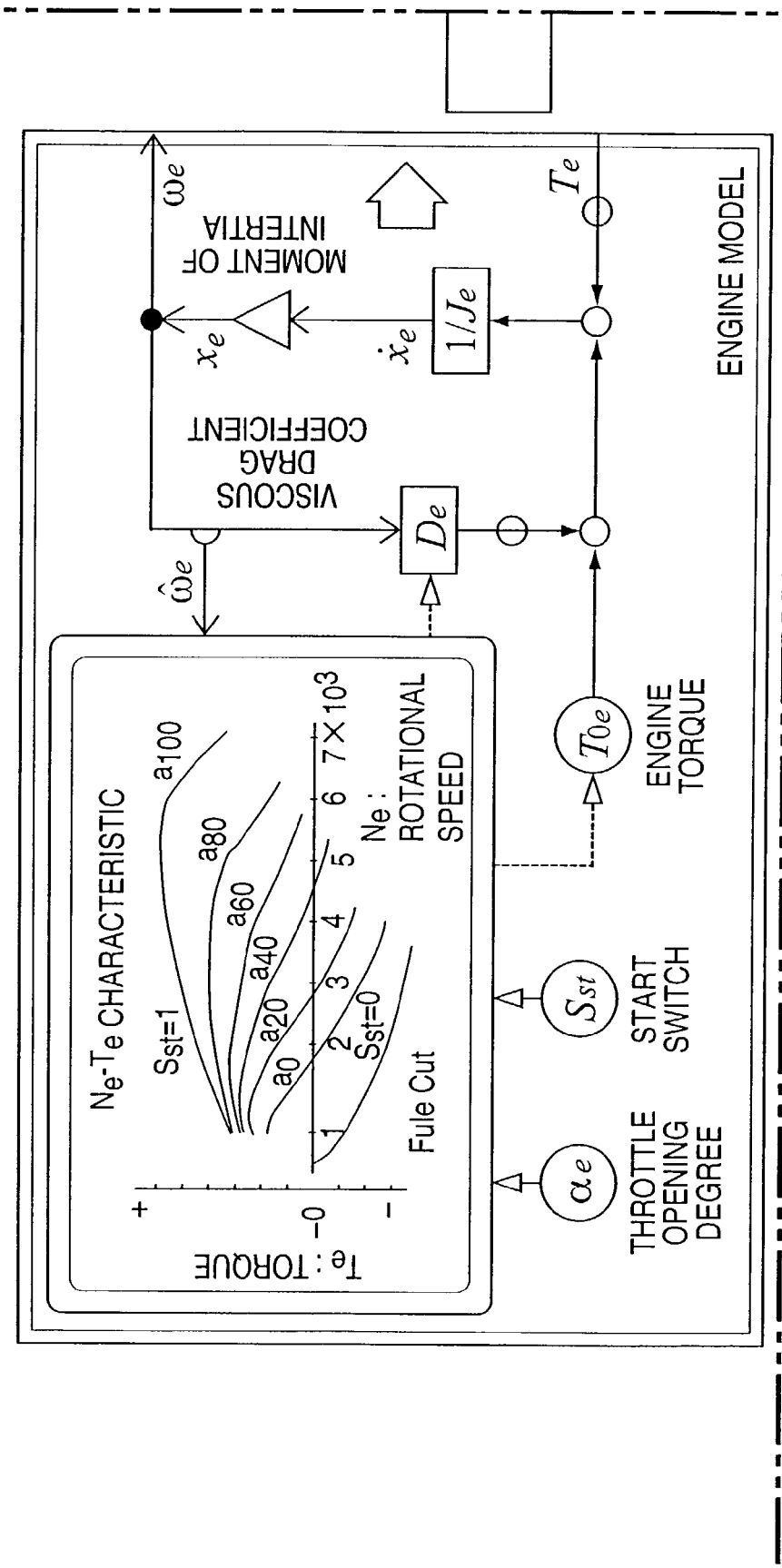
F I G. 61A

FIG. 64
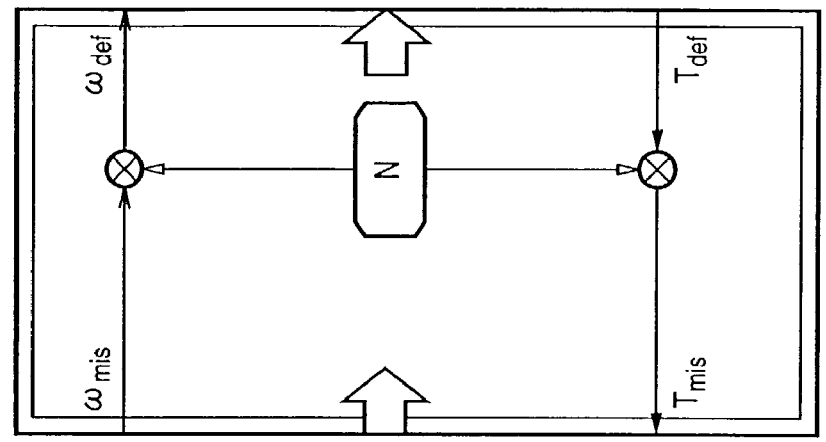
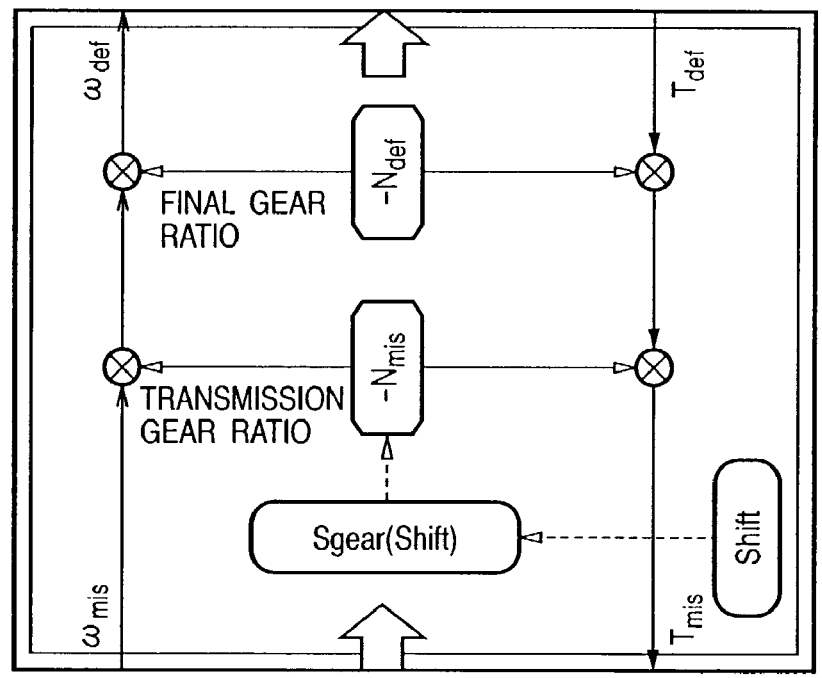

FIG. 69
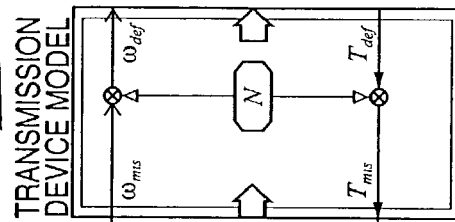
TRANSMISSION DEVICE MODEL
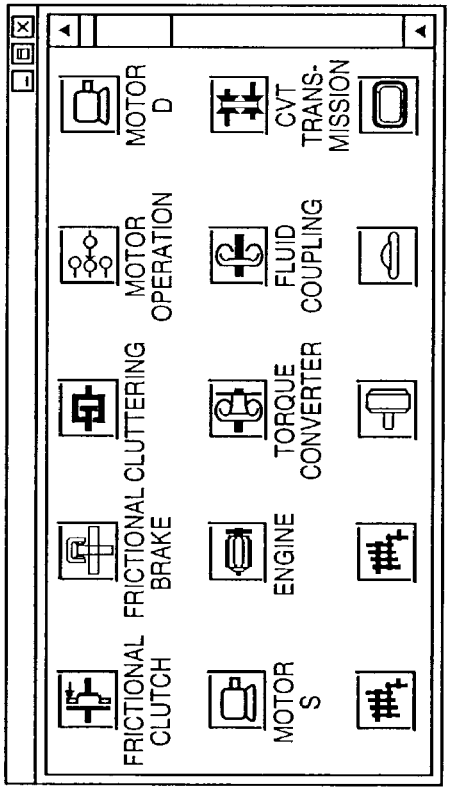
REGISTERED STENCILS OF VEHICLE FUNCTIONAL COMPONENTS
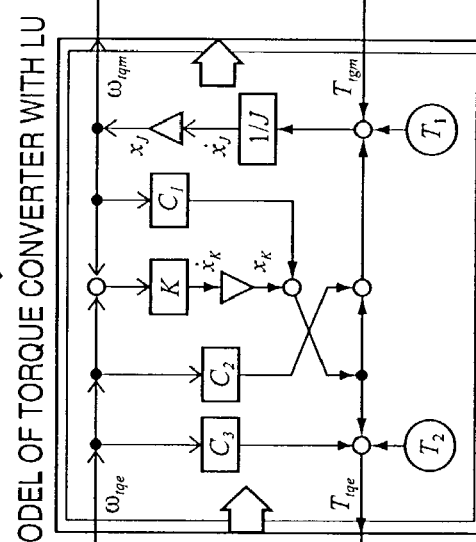
MODEL OF TORQUE CONVERTER WITH LU
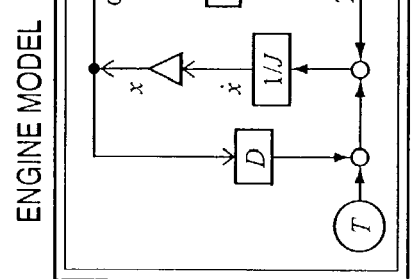
ENGINE MODEL

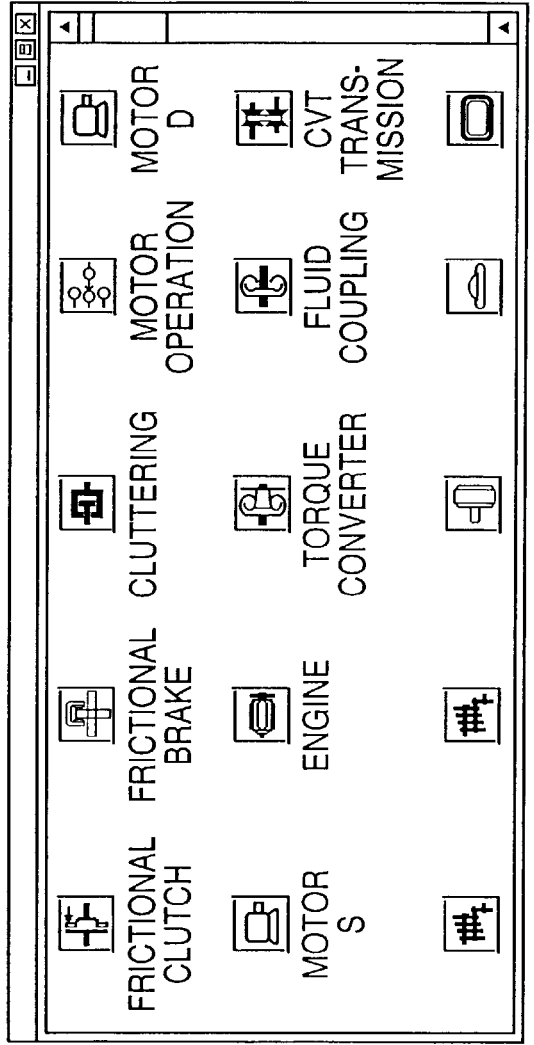
F I G. 69A

FIG. 71
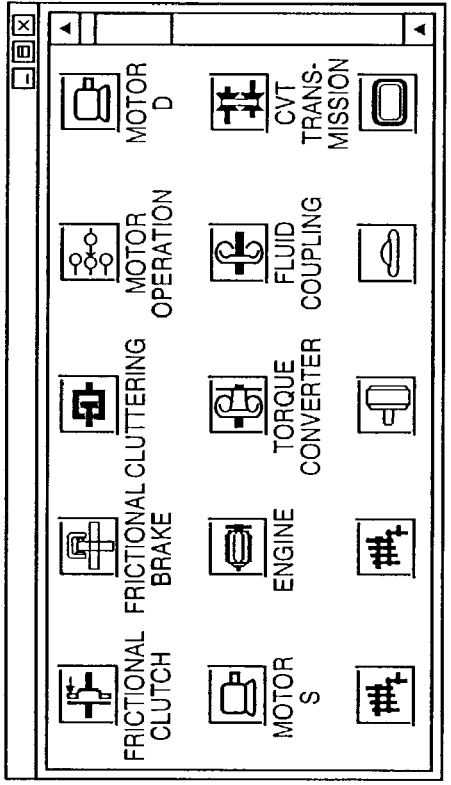
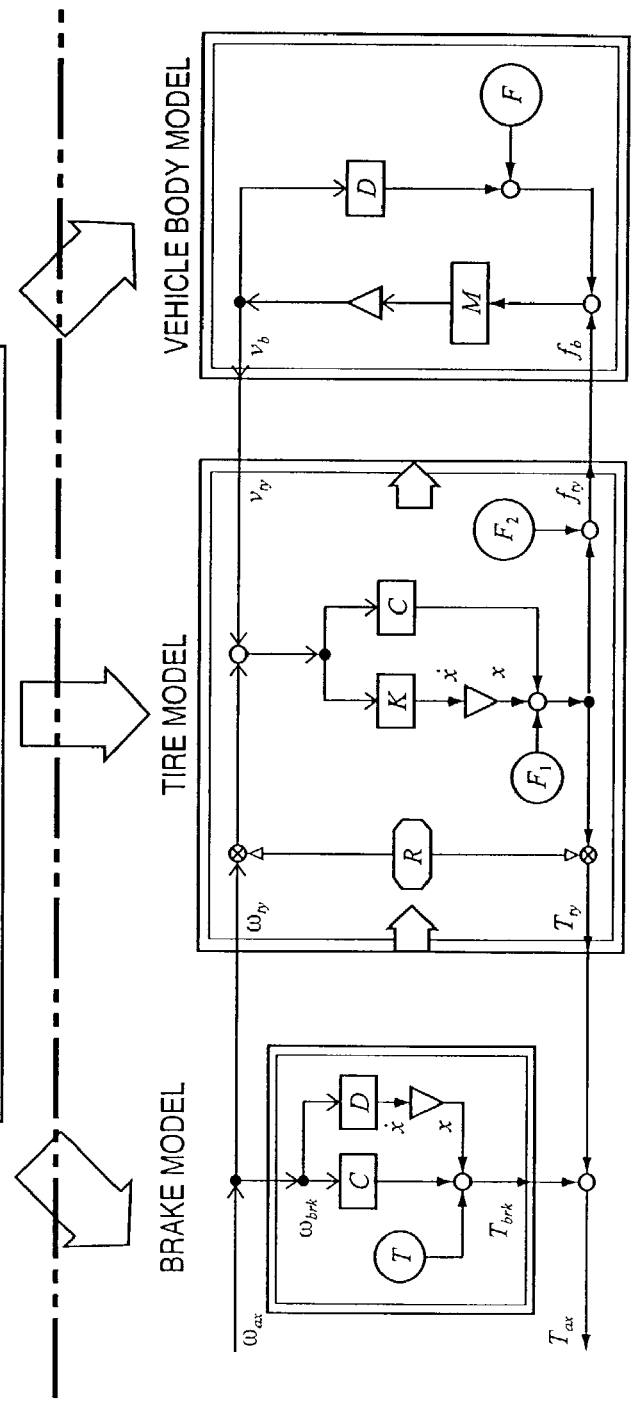

FIG. 77

{FM_Symbo}

| Symbol | Name | Symbol | Name | Symbol | Name | Symbol | Name | Symbol | Name | Symbol | Name | Symbol | Name | Symbol | Name |
|---|---|---|---|---|---|---|---|---|---|---|---|---|---|---|---|
| ● | DISTRIBUTION | ○ | ADDITION | ⊗ | MULTI-PLICATION | ⊘ | DIVISION | △ | DERIVATIVE / INTEGRAL | △ | DOUBLE INTEGRAL | △ | INITIALI-ZATION | △ | CONVO-LUTION INTEGRAL | □ | CHARACTER-ISTIC |
| □ | COEFFICIENT | ◇ | SWITCH | ○ | SIDE LOAD | ○ | MANUAL OPERATION | ○ | FUNCTION | ◐ | NEGATIVE SIGN | ◐ | OBSER-VATION VARIABLE | ◐ | ESTIMATED OBSERVATION | ◐ | CUMULA-TIVE OBSER-VATION | ◐ | ACCUMULATED ESTIMATION |
| ⊕ | ABSOLUTE VALUE | ⊕ | SIGN EXTRACTION | ◇ | TIME VALUE | ◇ | TIME OBSERVATION | ⬡ | DISCRIMI-NATION CONDITION | ⬭ | SAMPLE | ⬭ | DELAY | ⬭ | OR | ⬭ | AND | ⇕ | ENERGY (TRANS-MISSION) | ⬇ | ENERGY |
| △ | RELAY LINE | ↑ | POTENTIAL VARIABLE A | ↑ | POTENTIAL VARIABLE B | ↑ | FLOW VARIABLE A | ↑ | FLOW VARIABLE B | ↑ | SIGNAL A | ↑ | SIGNAL B | △ | SUBSTITU-TION VARIABLE A | △ | SUBSTITU-TION VARIABLE B | | STATE LINE A |
| ⌐ | STATE LINE B | ┈ | SUBSTITU-TION LINE A | ┈ | SUBSTITU-TION LINE B | ▭ | FUNCTIONAL MODEL | ⬡ | MECHANISM MODEL | ⬡ | EVALUATION MODEL | ▭ | SHAPE MODEL | ▭ | EXPLANATORY VIEW | | |

FIG. 79

CATEC

CHARACTERISTIC VALUE INPUT TABLE

| CHARACTERISTIC VALUE | UNIT | CHARACTERISTIC NAME |
|---|---|---|
| | | |
| | | |
| | | |
| | | |

$K_{cl}=$
$C_{cl}=$
$T_{Ccl}=$
$T_{Fcl}=$

SIMULATION MODEL CREATION METHOD AND SYSTEM, AND STORAGE MEDIUM

TECHNICAL FIELD

The present invention relates to a simulation model creation method and apparatus, and a storage medium and, more particularly, to a simulation model creation method for systematically generating models that simulate operations from a component of a single function to a machine that combines many components and also to a system that combines a plurality of machines, which can be expressed by all physical systems such as an electric system and mechanical system, solid-state system and fluid system, and the like, an apparatus therefor, and a storage medium.

BACKGROUND ART

For the purpose of shortening the time required for product development, it is becoming increasingly important to perform estimation and confirmation of performance and functions, which are conventionally done by tests using samples, during the initial period of development.

A physical system such as a machine can be considered as an organism of functions comprised of many components. Individual components collaborate and function while converting and exchanging energy with each other in accordance with partial roles of their shares, and dynamically blend in concord to accomplish the purpose and mission of a machine as a whole in accordance with the required performance. For example, various kinds of performance such as travel performance of an automobile appear as integrated characteristics of individual units such as an engine, transmission device, and the like. Since these characteristics involves a plurality of different engineering fields, conventionally, different theoretical systems are combined and modeled by a unique method that meets the purpose of each particular simulation. However, it is not efficient to provide simulations against many problems and to maintain and manage them.

To solve this problem, a modeling technique which is common to different fields and can easily integrate them is required.

The present inventors have proposed a technique for expressing each component by identifying the energy flow using concepts called potential and float variables using a system equation in Japanese Patent Laid-Open No. 9-91334 and the like, thereby expressing a unit built by a plurality of components as a matrix.

Also, the present inventors has proposed examples of simulation by applying the above contents to automobile components in Japanese Patent Laid-Open Nos. 11-282897 and 11-282898.

Furthermore, the following papers have been disclosed:

(1) Hiroaki Yosimura & Takehiko Kawase, "Multibody dynamics and symbolic scheme", The Japan Society of Mechanical Engineers 72nd general conference lecture meeting lecture papers, pp. 417-418, Mar. 29 to 31, 1995;

(2) Shizuo Kakuta & Shigeyoshi Hiramatsu, "Modeling of virtual prototype, (part I)", The Japan Society of Mechanical Engineers 72nd general conference lecture meeting lecture papers, pp. 421-422, Mar. 29 to 31, 1995;

(3) Shizuo Kakuta & Shigeyoshi Hiramatsu, "Modeling of virtual prototype, (part II)", The Japan Society of Mechanical Engineers 72nd general conference lecture meeting lecture papers, pp. 381-382, Mar. 29 to 31, 1995;

(4) Takehisa Koda & Kouichi Inoue, "Fundamentals of bond graph", The Journal of the Japan Society of Investment and Management Vol. 9, No. 1, pp. 25-31, 1997;

(5) Shigeki Hiramatsu, Yasuhiro Harada, Hiroyuki Aarakawa, Ken Komori, & Shizuo Kakuta, "Modeling of power train by applying the virtual prototype concept", The Society of Automotive Engineers of Japan lecture meeting preprints 1974, pp. 177-180, Oct. 21 to 23, 1997;

(6) Shizuo Kakuta, Masao Nagamatsu, Kouichi Maruyama, & Sigeki Hiramatsu, "Hierarchical functional model for automobile development", The Society of Automotive Engineers of Japan lecture meeting preprints 974, pp. 177-180, Oct. 21 to 23, 1997;

(7) Masao Nagamatsu, Sizuo Kakuta, & Akio Nagamatsu, "A new approach on modeling for product development", The Journal of the Japan Society of Mechanical Engineers (Series C) Vol. 64, No. 622, pp. 131-138, June 1998;

(8) Akio Nagamatsu, Sizuo Kakuta, & Masao Nagamatsu, "A new approach on modeling for product development", The Journal of the Japan Society of Mechanical Engineers (Series C) Vol. 64, No. 627, pp. 108-115, November 1998;

(9) Sizuo Kakuta, Masao Nagamatsu, & Akio Nagamatsu, "A new approach on modeling for product development", The Journal of the Japan Society of Mechanical Engineers (Series C) Vol. 65, No. 632, pp. 99-106, April 1999;

(10) Yosiki Hiramatsu, Sizuo Kakuta, Masao Nagamatsu, & Akio Nagamatsu, "Modeling for functional expression of rotary apparatus", The Journal of the Japan Society of Mechanical Engineers (Series C) Vol. 65, No. 638, pp. 44-51, October 1999; and

(11) Akio Nagamatsu, Sizuo Kakuta, & Shigeki Hiramatsu, "Approach of modeling for aiding product development of automobile development", The Society of Automotive Engineers of Japan 2000 spring meeting preprints, 2000.

However, individual contents, schemes, or their application examples have been referred, a technique for handling all physical systems from a component of a single function to a system such as an automobile together, resources and tools for implementing such technique have not been available yet.

As one of approaches of modeling used to develop such machine products and conditions required therefor, so-called expansion and integration of models are known.

One of the principal objectives of such approaches is to model from component models to a large-scale product model as in actual products and components, and to allow recombination and disassembly of component models on a model. For this purpose, models must be able to achieve structurization by means of expansion that combines models while allowing coexistence of independence and continuity of models in a given layer, and also hierarchization that forms a high-order model by integrating component models of a given level and converting them into an equivalent function.

In order to implement such modeling, it is important to systematize the expansion & integration scheme and hierarchization scheme used in product development using expansion, integration, hierarchization, inclusion relation, and the like using functional and mechanism models, so as to clarify a mutual relationship.

For functional and mechanism models whose mutual relationship is clarified by systematization, equivalent model conversion by combining models is required on a governing equation that simulates them. Also, equivalent model conversion must model-convert storage characteristics expressed by derivative state variables included in a model into an equivalent storage characteristic. Especially, in order to convert an integrated model into a low-order model, a group of storage characteristics left upon series or parallel connection after erasing rigidity, moment of inertia, and the like which are not required in an entity must be converted into an equivalent characteristic. With this integration, all input/output state variables that couple functional models are constrained, and all constraint conditions in a system are erased.

In these expansion and integration processes, it is especially important to handle nonlinear elements in terms of the arithmetic volume and precision. Since nonlinear elements are built in a functional model as some variable elements, i.e., become one of variables of the governing equation, nonlinear elements are involved in the process more intricately toward upper layers as a result of integration, thus increasing the arithmetic volume, while if nonlinear elements are simplified to reduce the arithmetic volume, the prevision suffers.

DISCLOSURE OF INVENTION

The present invention has been made to solve these problems, and has as its object to provide a simulation model creation method for systematically generating models that simulate operations from a component of a single function to a machine that combines many components and also to a system that combines a plurality of machines, which can be expressed by all physical systems such as an electric system and mechanical system, solid-state system and fluid system, and the like, an apparatus therefor, and a storage medium.

That is, even when many nonlinear characteristics are contained, the arithmetic processing volume can be minimized, and the precision can be improved. The present invention provides a simulation model creation method which can easily set respective models and, especially, nonlinear characteristics in a nested structure, an apparatus therefor, and a storage medium.

The present invention provides a simulation model creation method that allows an easy combination process of functional models, an apparatus therefor, and a storage medium.

The present invention provides a simulation model creation method which allows to observe intermediate potential and flow variables which cannot be observed due to integration.

The present invention provides a simulation model creation method which allows easily generation of a function simulation model, an apparatus therefor, and a storage medium.

The present invention provides a simulation model creation method which allows logical recognition and re-use of an integrated function simulation model, an apparatus therefor, and a storage medium.

The present invention provides a simulation model creation method which can do effective business in correspondence with the use levels of users.

In order to solve the above problems, a simulation model creation method of the present invention is a simulation model creation method for creating an overall function simulation model using a plurality of function simulation models which are independently provided for predetermined functions and are coupled via potential and flow variables, comprising the step of: when respective function simulation models include linear characteristic elements and at least one function simulation model includes a nonlinear characteristic element, separating the nonlinear characteristic element and the linear characteristic elements, and replacing the nonlinear characteristic element by a predetermined linear element; integrating the plurality of function simulation models as linear characteristic elements after the nonlinear characteristic element is replaced by the predetermined linear element; and linking the nonlinear characteristic element to the predetermined linear element in the integrated function simulation model.

Note that the nonlinear characteristic element is expressed by nonlinear data provided in the form of a function $f(x)$, a graph plotted on the abscissa and ordinate, a table, or the like. The method further comprises, before the integrating step, a step of converting the function simulation models to match flow directions of the potential and flow variables among the plurality of function simulation models. The integrating step includes a step of converting a plurality of characteristic elements in the integrated function simulation model into an equivalent characteristic element. The converting step includes a step of grouping the plurality of characteristic elements in the integrated function simulation model based on characteristic types, and converting the characteristic elements into equivalent characteristic elements for respective characteristic types. When the characteristic element is a loss characteristic, a series connection of a plurality of characteristic elements is converted into a sum of characteristic values thereof, and a parallel connection of a plurality of characteristic elements is converted into a reciprocal value of a sum of reciprocal values of characteristic values thereof. When the characteristic element is a storage characteristic, a series connection of a plurality of characteristic elements is converted into a reciprocal value of a sum of reciprocal values of characteristic values thereof, and a parallel connection of a plurality of characteristic elements is converted into a sum of characteristic values thereof.

A simulation model creation method for creating an overall function simulation model using a plurality of function simulation models which are independently provided for predetermined functions and are coupled via potential and flow variables, comprising the step of: when the plurality of function simulation models undergo one-to-many integration, substituting input and output variables of many function simulation models into input and output variables of one function simulation model; and executing an integration process by arranging the plurality of function simulation models on the basis of the substituted input and output variables of many function simulation models, and the input and output variables of the one function simulation model.

A simulation model creation method for creating an overall function simulation model using a plurality of function simulation models which are independently provided for predetermined functions, and are coupled via potential and flow variables, comprising the step of: creating, in advance, function simulation models of linear or nonlinear characteristics, each of which includes at least one functional element; and creating a new function simulation model by selectively combining the function simulation models.

A simulation model creation method for creating an overall function simulation model using a plurality of function simulation models which are independently provided for predetermined functions and are coupled via potential and flow variables, comprising the step of: creating function simulation models corresponding to components that serve as predetermined functions; and exchanging mathematical models, which express the created function simulation models, as components. Note that the mathematical models are exchanged via a detachable storage medium or communication. The method further comprises the step of registering data, including mathematical models which express the created function simulation models, as resources of a new function simulation model.

A simulation model creation method for creating an overall function simulation model using a plurality of function simulation models which are independently provided for predetermined functions and are coupled via potential and flow variables, comprising the step of: preparing linear functional elements which indicate a linear relationship between the potential and flow variables, and a coefficient element for connecting the linear functional elements; building a predetermined linear element in place of a nonlinear element in a functional element, when the nonlinear element is built in the functional element; creating a new functional element corresponding to a component by integrating at least one functional element by the coefficient element, wherein the creating step builds the nonlinear element in place of the predetermined linear element in the new functional element after creating the new functional element by integrating linear functional elements, when the nonlinear element is included in the new functional element; and repeating integration of new functional elements corresponding to the components until an overall function to be simulated is created.

Note that the functional element includes a loss element which loses energy, and a storage element which stores energy. The coefficient element is an element for converting physical systems of functional elements to be integrated, and when the physical systems are equal, the functional elements are integrated with omitting the coefficient element is omitted, by setting a value of the coefficient element to be 1. The step of creating the new functional element includes a step of allowing a plurality of functional elements to be integrated by converting at least one or both of input and output directions and signs of the potential and flow variables, and a step of simplifying a structure of the new functional element by equivalently converting the new functional element created by integration into a pair of loss and storage elements.

A simulation model creation method for creating an overall function simulation model using a plurality of function simulation models which are independently provided for predetermined functions and are coupled via potential and flow variables, comprising the step of: preparing linear functional elements each of which indicates a linear relationship between the potential and flow variables, a coefficient element for connecting the linear functional element, and equivalent functional elements obtained by converting input and output directions and signs of potential and flow variables of the functional elements; building a predetermined linear element in place of a nonlinear element in a functional element, when the nonlinear element is built in the functional element; creating a new functional element corresponding to a component by integrating at least one functional element by the coefficient element, wherein the creating step builds the nonlinear element in place of the predetermined linear element in the new functional element after creating the new functional element by integrating linear functional elements, when the nonlinear element is included in the new functional element; and repeating integration of new functional elements corresponding to the components until an overall function to be simulated is created.

A simulation model creation method for creating an overall function simulation model using a plurality of function simulation models which are independently provided for predetermined functions and are coupled via potential and flow variables, comprising the step of: inputting data of mathematical models expressing function simulation models of components, and data of a nonlinear element when the nonlinear element is included, which are provided by a component manufacturer; selecting function simulation models of desired components on the basis of the data of the mathematical models expressing the function simulation models of the components, and the data of the nonlinear element, and assembling the overall function simulation model using the selected function simulation models; and creating a mathematical model of a new function simulation model expressing the overall function by arranging and integrating the assembled overall function simulation model. Resources of the mathematical models expressing the function simulation models of the components are supplied to the component manufacturer, and a step of inputting coefficients of the mathematical models on the basis of the resources and sending back the mathematical models from the component manufacture. Note that the data associated with the nonlinear element is provided in the form of a function f(x), a graph plotted on the abscissa and ordinate, a table, or the like.

A simulation model display method of the present invention is a method of displaying a simulation model for simulating an overall function using a plurality of function simulation models which are independently provided for predetermined functions and are coupled via potential and flow variables, selectively including at least two steps of: a first displaying step of displaying a relation between the plurality of function simulation models and the overall function using component images which respectively express the plurality of function simulation models and a coupling image of the component images that expresses the overall function; a second displaying step of displaying the relation between the plurality of function simulation models and the overall function using function connection images which respectively express the plurality of function simulation models and a function connection image that expresses the overall function; and a third displaying step of displaying the relation between the plurality of function simulation models and the overall function using mathematical models which respectively express the plurality of function simulation models and a mathematical model that expresses the overall function. Note that the second displaying step selectively includes a step of displaying at least a portion of a function using a black box, and a step of displaying all functions using functional elements.

A method of providing simulation model creation means for creating an overall function simulation model using a plurality of function simulation models which are independently provided for predetermined functions and are coupled via potential and flow variables, comprising the steps of: providing the simulation model creation means for creating a new function simulation model by selecting and combining the plurality of provided function simulation models, and limiting the function simulation models to be provided on the basis of a contract condition.

A product development method using a simulation model for simulating an overall function using a plurality of function simulation models which are independently provided for predetermined functions and are coupled via potential and flow variables, comprising the steps of: creating data of mathematical models of function simulation models corresponding to components which form a simulation model simulating the overall function, and data of a nonlinear element when the nonlinear element is included; making an order contract of a desired component with a component manufacturer by data of a mathematical model expressing a function simulation model of the component, and data of a nonlinear element when the nonlinear element is included; and testing a product which provides the overall function using the component which was manufactured and delivered by the component manufacturer in accordance with the function simulation model. Note that the data associated with the nonlinear element is provided in the form of a function f(x), a graph plotted on the abscissa and ordinate, a table, or the like.

A simulation model creation system for creating an overall function simulation model using a plurality of function simulation models which are independently provided for predetermined functions and are coupled via potential and flow variables, when respective function simulation models include linear characteristic elements and at least one function simulation model includes a nonlinear characteristic element, comprising: means for separating the nonlinear characteristic element and the linear characteristic elements, and replacing the nonlinear characteristic element with a predetermined linear element; means for integrating the plurality of function simulation models as linear characteristic elements after the nonlinear characteristic element is replaced with the predetermined linear element; and means for linking the nonlinear characteristic element to the predetermined linear element in the integrated function simulation model.

Note that the system further comprises means for converting the function simulation models to match flow directions of the potential and flow variables among the plurality of function simulation models. The integrating means includes means for converting a plurality of characteristic elements in the integrated function simulation model into an equivalent characteristic element. The system further comprises means for exchanging mathematical models that express the function simulation models via a detachable storage medium or communication.

A storage medium of the present invention is a computer readable storage medium for providing a simulation model creation method for creating an overall function simulation model using a plurality of function simulation models which are independently provided for predetermined functions and are coupled via potential and flow variables, including at least a program for creating the function simulation models, and a program for integrating the plurality of function simulation models, the integrating program, when respective function simulation models include linear characteristic elements and at least one function simulation model includes a nonlinear characteristic element, comprising the steps of: separating the nonlinear characteristic element and the linear characteristic elements, and replacing the nonlinear characteristic element with a predetermined linear element; integrating the plurality of function simulation models as linear characteristic elements after the nonlinear characteristic element is replaced with the predetermined linear element; and linking the nonlinear characteristic element to the predetermined linear element in the integrated function simulation model.

Note that the integrating program further includes a step of for converting the function simulation models to match flow directions of the potential and flow variables among the plurality of function simulation models. The integrating step includes a step of converting a plurality of characteristic elements in the integrated function simulation model into an equivalent characteristic element. The storage medium further including a database for searchably storing the created function simulation models. The database includes a read-only area for storing created function simulation models in advance, and an area for rewritably storing newly created function simulation models. The database identifiably stores a detailed functional model, equivalent functional model(s), simplified functional model, and symbolized model in correspondence with one functional element, and further including a program for limiting access contents to the database in accordance with a contract.

A computer readable storage medium for providing a simulation model creation method for creating an overall function simulation model using a plurality of function simulation models which are independently provided for predetermined functions and are coupled via potential and flow variables, including at least a program for generating the function simulation models, and a program for integrating the plurality of function simulation models, the integrating program, when the plurality of function simulation models undergo one-to-many integration, comprising the steps of: substituting input and output variables of many function simulation models into input and output variables of one function simulation model; and executing an integration process by arranging the plurality of function simulation models on the basis of the substituted input and output variables of the many function simulation models, and the input and output variables of the one function simulation model.

A computer readable storage medium for providing a simulation model creation method for creating an overall function simulation model using a plurality of function simulation models which are independently provided for predetermined functions and are coupled via potential and flow variables, including: data of function simulation models of linear or nonlinear characteristics, which are created in advance and each of which includes at least one functional element; and a program for creating a new function simulation model by selecting and combining the function simulation models.

A computer readable storage medium for providing a simulation model creation method for creating an overall function simulation model using a plurality of function simulation models which are independently provided for predetermined functions and are coupled via potential and flow variables, including at least resource elements for creating the function simulation models, and a program for integrating the plurality of function simulation models, the resource elements including linear functional elements each indicating a linear relationship between the potential and flow variables, and a coefficient element for connecting the linear functional elements, the integrating program comprising the steps of: building a predetermined linear element in place of a nonlinear element in a functional element, when the nonlinear element is built in the functional element; creating a new functional element corresponding to a component by integrating at least one functional element by the coefficient element, wherein the creating step builds the nonlinear element in place of the predetermined linear element in the new functional element after creating the new functional element by integrating linear functional elements, when the nonlinear element is included in the new functional element; and repeating integration of new functional elements corresponding to the components until an overall function to be simulated is created.

A computer readable storage medium for providing a simulation model creation method for creating an overall function simulation model using a plurality of function simulation models which are independently provided for predetermined functions and are coupled via potential and flow variables, including at least resource elements for creating the function simulation models, and a program for integrating the plurality of function simulation models, the resource elements including linear functional elements each indicating a linear relationship between the potential and flow variables, and a coefficient element for connecting the linear functional elements, the integrating program comprising the steps of: building a predetermined linear element in place of a nonlinear element in a functional element, when the nonlinear element is built in the functional element; creating a new functional element corresponding to a component by integrating at least one functional element by the coefficient element, wherein the creating step builds the nonlinear element in place of the predetermined linear element in the new functional element after creating the new functional element by integrating linear functional elements, when the nonlinear element is included in the new functional element; and repeating integration of new functional elements corresponding to the components until an overall function to be simulated is created.

A computer readable storage medium for providing a simulation model creation method for creating an overall function simulation model using a plurality of function simulation models which are independently provided for predetermined functions and are coupled via potential and flow variables, including at least a program for creating the overall function from a plurality of function simulation models, the program comprising the steps of: inputting data of mathematical models expressing function simulation models of components, and data of a nonlinear element when the nonlinear element is included, which are provided by a component manufacture; selecting function simulation models of desired components on the basis of the data of the mathematical models expressing the function simulation models of the components, and the data of the nonlinear element, and assembling the selected function simulation models; and creating a mathematical model of a new function simulation model that expresses the overall function by arranging and integrating the assembled overall function. Note that the data associated with the nonlinear element is provided in the form of a function f(x), a graph plotted on the abscissa and ordinate, a table, or the like.

A computer readable storage medium for providing a simulation model creation method for creating an overall function simulation model using a plurality of function simulation models which are independently provided for predetermined functions and are coupled via potential and flow variables, including at least a program for displaying a relation between the plurality of function simulation models and the overall function, the program selectively comprising: a first displaying step of displaying a relation between the plurality of function simulation models and the overall function using component images which respectively express the plurality of function simulation models and a coupling image of the component images that expresses the overall function; a second displaying step of displaying the relation between the plurality of function simulation models and the overall function using function connection images which respectively express the plurality of function simulation models and a function connection image that expresses the overall function; and a third displaying step of displaying the relation between the plurality of function simulation models and the overall function using mathematical models which respectively express the plurality of function simulation models and a mathematical model that expresses the overall function.

A simulation model creation system for creating an overall function using a plurality of function simulation models which are independently provided for predetermined functions and are coupled via potential and flow variables, comprising: at least a CPU and a storage unit for storing processing modules, the CPU, when respective function simulation models include linear characteristic elements and at least one function simulation model includes a nonlinear characteristic element, executing the stored processing modules including: a processing module for separating the nonlinear characteristic element and the linear characteristic elements, and replacing the nonlinear characteristic element with a predetermined linear element; a processing module for integrating the plurality of function simulation models as linear characteristic elements after the nonlinear characteristic element is replaced with the predetermined linear element; and a processing module for linking the nonlinear characteristic element to the predetermined linear element in the integrated function simulation model.

Note that the CPU further executes a processing module for converting the function simulation models to match flow directions of the potential and flow variables among the plurality of function simulation models. The integrating processing module includes a processing module for converting a plurality of characteristic elements in the integrated function simulation model into an equivalent characteristic element. The system further comprises a processing module and interface for exchanging mathematical models that express the function simulation models via a detachable storage medium or communication.

According to the arrangement of the present invention, the following functions and the like are achieved.

① An integrated high-order governing equation does not include any unconstrained state variables (independent variables) except for input/output state variables used to connect other systems.

② Functional models can be simulated from the integrated high-order governing equation.

③ Concrete functions of low-order functional models are abridged to abstract functions in equivalent functional models which are integrated to a high-order model.

④ Governing equations before and after integration are equal to each other, and can be integrated to a high-order functional model.

⑤ Expansion and integration that have one-to-one correspondence between the component arrangement of a product and functional models can be attained.

⑥ By erasing rigidity, mass, and the like which may be unnecessary in an entity, a model can be converted to a low-order model.

⑦ State variables hidden inside a functional model by integration can be observed using an observation equation.

⑧ All expansion and integration processes can be done on a computer in accordance with a standardized sequence.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

FIG. 10 shows an example of a nonlinear element group according to an embodiment of the present invention;

FIG. 18 is a conceptual diagram of the nested structure of similar functional models according to an embodiment of the present invention;

FIG. 33 is a diagram showing an equivalent characteristic conversion example of loss characteristics;

FIG. 46 is a flow chart showing an example of the expansion & integration sequence according to an embodiment of the present invention;

FIG. 57 shows a display example of an update table of variable names of functional models;

FIG. 59 shows a display example of a characteristic value definition table;

FIG. 64 shows an example of a functional model and equivalent functional model of a transmission device;

FIG. 77 shows an example of a stencil group of modeling symbols according to an embodiment of the present invention;

FIG. 79 shows a display example of an input/output table;

BEST MODE FOR CARRYING OUT THE INVENTION

Figure 1:
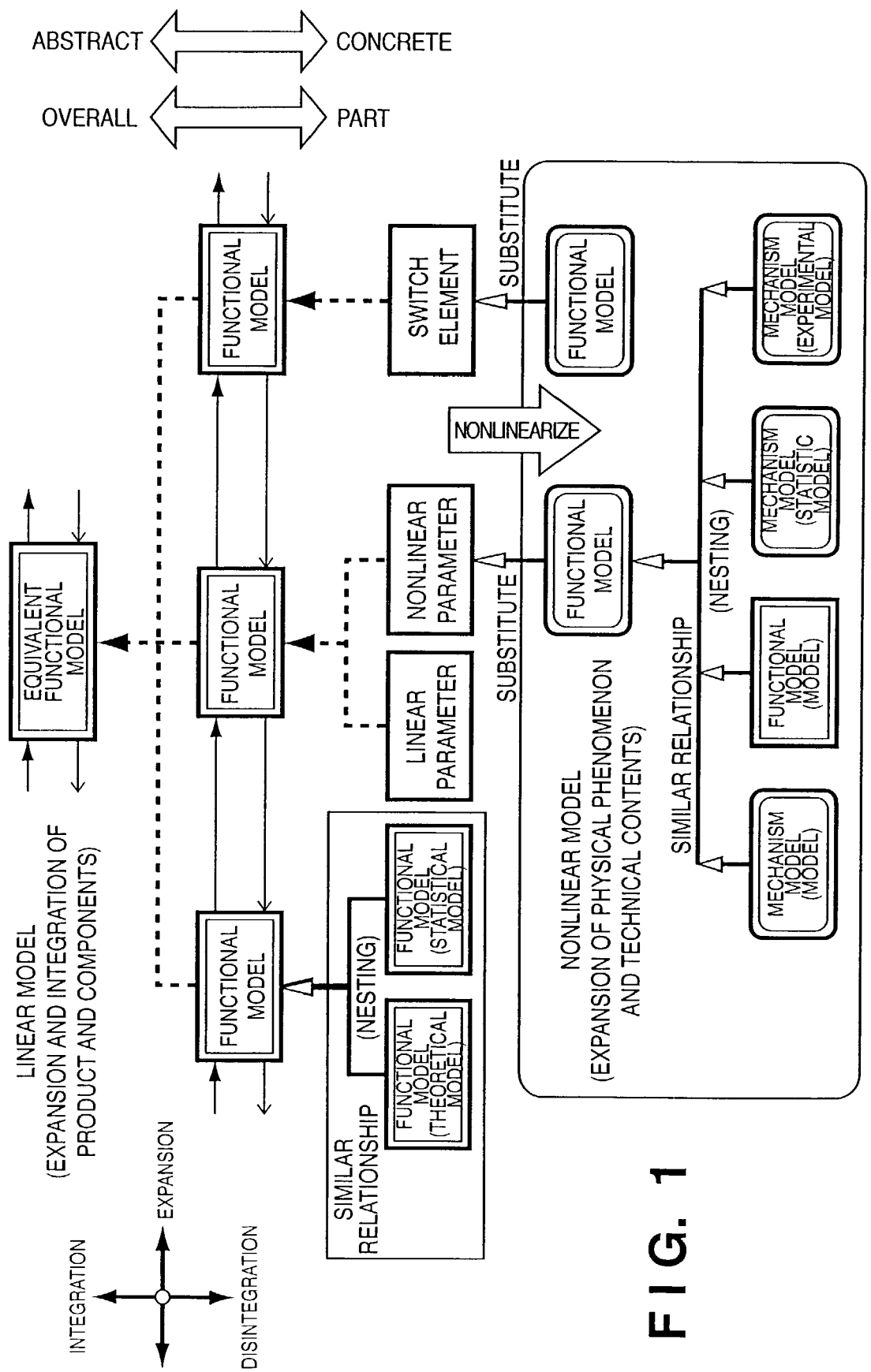
FIG. 1 is a schematic diagram showing the arrangement of functional•mechanism models according to an embodiment of the present invention.

An embodiment of the present invention will be described in detail hereinafter with reference to the accompanying drawings. The configuration of this embodiment is as follows.

1. Description of Configuration of This Embodiment

2. Description of Terms and Symbols
<2-1. Basic Function Element of Linear Model>
(2-1-1. State Variable)
(2-1-2. Characteristic)
(1) Characteristic
(2) Coefficient
(3) Switch Element
(4) Side Load
<2-2. Modeling Symbols>
(2-2-1. Symbols of Linear Model)
(2-2-2. Symbols of Nonlinear Model)
<2-3. Nonlinear Symbols>
(1) Manipulated Variable
(2) Substitution Variable
<2-4. Logic Operator>
(1) Estimated Observation Variable
(2) Logic Operator
<2-5. Nonlinear Operator>
(1) Absolute Value
(2) Sign
(3) Square
(4) Initialization (Integral)
(5) Condition Checking
(6) Function Equation
(7) Manipulation
(8) ON-OFF Switch
(9) AND, OR 3. Basic Concept of This Embodiment
    <3-1. Concept of Functional and Mechanism Models>
    <3-2. Expression of Functional Model Using Potential and Flow Variables>
    <3-3. Basic Element of Model>
        (3-3-1. Storage and Loss Characteristics and Distribution Element)
        (3-3-2. Coefficient Element)
        (3-3-3. Function Element: Linear)
        (3-3-4. Functional Model)
        (3-3-5. Mechanism Element: Nonlinear)
        (3-3-6. Mechanism Model)
        (3-3-7. Component Model)
    <3-4. Identification in Large-scale System>
    <3-5. Concept of Integration Process of Functional Models in This Embodiment>

4. Concept of Expansion and Integration Processes of Functional Model
    <4-1. Basic Concept>
    <4-2. Expansion Process (Structurization)>
        (4-2-1. One-to-one Duality Coupling)
        (4-2-2. One-to-many Duality Coupling)
        (4-2-3. Sign Conversion in Functional Model)
    <4-3. Integration Process>
    <4-4. Equivalent Conversion Process>
        (4-4-1. Dual Conversion)
        (1) Dual Conversion of Storage Characteristic
        (2) Dual Conversion of Transfer and Loss Elements
        (3) Dual Conversion of Supply and Load Elements
        (4-4-2. Equivalent Conversion)
        (1) Equivalent Conversion of Loss Characteristic
        (2) Equivalent Conversion of Storage Characteristic
        (3) Equivalent Conversion of Distribution Coupling
        (4) Equivalent Conversion of Addition Coupling 5. Execution Functional Model
    <5-1. Conversion into Execution Governing Equation>
    (5-1-1. Input Constraint of Execution Functional Model)

6. Example of Arithmetic Process in Device of Each Process
    <6-1. Overall Image>
    <6-2. Governing Equation of Functional Model>
    <6-3. Formulation of Structurized Models>
    <6-4. Formulation of Hierarchical Models>
        (6-4-1. Formulation)
        (6-4-2. Constraint Condition of Governing Equation)
        (6-4-3. Example of Hierarchization of RLC Series Circuit)
    <6-5. Governing Equation of Equivalent Conversion>
        (1) Dual Conversion of Storage Element
        (2) Dual Conversion of Transfer and Loss Elements
        (3) Dual Conversion of Supply and Load Elements
        (4) Equivalent Conversion of Loss Characteristic
        (5) Equivalent Conversion of Distribution Coupling
        (5-1) Overall Governing Equation
        (5-2) Distribution and Addition Processes of State Variables
        (5-3) Rearrangement of Columns of Overall Governing Equation
        (5-4) Distribution Coupling Process of Derivative State Variable
        (6) Equivalent Conversion of Addition Coupling
        (6-1) Overall Governing Equation
        (6-2) Distribution and Addition Processes of State Variables
        (6-3) Distribution Coupling Process of Derivative State Variable
    <6-6. Execution Governing Equation>
    (6-6-1. Execution Governing Equation of Transient State)
    (6-6-2. Execution Governing Equation of Steady State)

7. Example of Expansion and Integration of Model
    <7-1. Example of Processing Sequence>
    <7-2. Example of Rear Wiper System>
    (7-2-1. Component Arrangement and Hierarchical Functional Models)
    (7-2-2. Modeling of Motor)
    (7-2-3. Low-order Conversion of Rigidity of Blade)
    (7-2-4. Element Models of Building Components)
    (1) Modeling of Window Glass and Wiper Blade
    (2) Modeling of Reduction Gear Mechanism and Motor
    (3) Modeling of Battery and Operation System
    (7-2-5. Equivalent Model Conversion by Integration)
    (1) Expansion and Integration from Layer 3 to Layer 2
    (2) Expansion and Integration from Layer 2 to Layer 1
    (7-2-6. Simulation Result)
    <7-3. Example of Automotive Vehicle>
    (7-3-1. Modeling Using Symbolized Models)
    (7-3-2. Modeling of Functional Components)
    (7-3-2-1. Modeling of Engine)
    (1) Functional Model
    (2) Governing Equation
    (3) Mechanism Model
    (4) Equivalent Functional Model
    (5) Model Registration
    (7-3-2-2. Modeling of Other Vehicle Functional Components)
    (1) Torque Converter Model with Lockup Function
    (2) Transmission Device Model
    (3) Brake Model
    (4) Tire Model
    (5) Vehicle Body Model
    (7-3-3. Expansion and Integration of Vehicle Functional Model)
    (7-3-3-1. Functional Model of Power Train)
    (7-3-3-2. Functional Model of Vehicle Body System and Vehicle)

8. Example of System Arrangement of This Embodiment
    <8-1. Schematic Example of Hardware and Software Arrangements>
    <8-2. Detailed Example of Hardware Arrangement>
    <8-3. Detailed Example of Processing Sequence>
    <8-4. Example of Data Configuration in Modeling of Wiper>
    (8-4-1. Example of Configuration of RAM)
    (8-4-2. Example of Configuration of Database)

9. Operating System of Functional•Mechanism Model
    <9-1. Re-use Method of Model>
    <9-2. Model Contents of Model Collection>
    (9-2-1. Package of Detailed Function Models)
    (9-2-2. Package of Equivalent Function Models)
    (9-2-3. Package of Simplified Function Models)
    (9-2-4. Package of Symbolized Models)

10. Business Model
    <10-1. Transaction of Functional-Mechanism Model>
    <10-2. Performance Approval of Product on Order in Product Development>
    <10-3. Sales of Functional Component With Evaluation Model>

11. Execution of Simulation
    <11-1. Resources for Generating Simulation Model>
    <11-2. Generation of Simulation Model>
    <11-3. Execution of Simulation>
2. Description of Terms and Symbols Terms used in this specification and symbols used in the drawings, and the like will be defined below.

<2-1. Basic Function Element of Linear Model>

(2-1-1. State Variable)

State variables can be categorized into the following flow and potential variables.

① The potential variable indicates a state variable that represents the moving amount or quantity of a medium that carries energy such as a voltage, speed, flow rate, or the like.

② The flow variable indicates a state variable that represents the strength or amount of energy of a medium of a unit amount such as a current, force, fluid pressure, or the like.

The flow and potential variables are used in combination so that a pair of them becomes energy. For example, modeling exploits the fact that the product of voltage and current becomes electric power and the product of speed and force becomes power. This means that the basis of a functional model lies in the energy principle, a model of a system is expressed by potential and flow variables, and all physical laws associated with these variables can be expressed on the model.

The integral value of the potential or flow variable represents the storage variable of the quantity or strength of energy and, for example, the moving position, impulse, and the like of a mechanical system correspond to it.

A system connected by the potential variable and its storage variable is called a potential system, and a system of the flow variable is similarly called a flow system. These systems are the bases of mechanical and electrical theories. The mechanical engineering is based on the force (pressure) of the flow system, and handles the speed of the potential system or the distance (position) as the integral value of the speed as a result. On the other hand, the electrical engineering can be considered as a theoretical system which is based on the voltage of the potential system, and handles the current of the flow system as a result. A modeling scheme to be described hereinafter equivalently handles these potential and flow systems, uses the duality of conversion therebetween, and integrates theories and laws of respective engineering fields.

(2-1-2. Characteristic)

(1) Characteristic

Characteristics associate flow and potential variables with each other, represent the nature of a system, and are classified into two kinds of characteristics, i.e., a storage characteristic that stores energy, and a loss characteristic that involves energy loss such as an electrical resistance, viscous damping, and the like. The characteristics generate energy expressed by the product of potential and flow variables, and can generate internal energy at the same time. The internal energy is converted into a temperature or distance, which can be described by an output state variable.

① The storage characteristic is classified into a characteristic which stores a change in flow variable as energy to convert it into a potential variable such as inductance, spring stiffness, and the like, and a characteristic which stores a change in potential variable as energy to convert it into a flow variable such as electrical capacitance, mass, and the like.

② The loss characteristic is classified into a characteristic which converts a loss that depends on a potential variable into a flow variable such as leak resistance of electrical capacitance, viscous drag of fluid, and the like, and a characteristic which converts a loss that depends on a flow variable into a potential variable such as electrical resistance, internal damping due to material compression, and the like.

(2) Coefficient

Coefficients are numbers and quantities that associate flow variables or potential variables with each other, and are categorized into the following four types:

① a unitless quantity that associates identical physical unit systems such as a turn ratio of a transformer, gear ratio, and the like;

② a quantity with a unit that associates different physical unit systems such as a torque constant and speed constant of a motor, tire radius, piston sectional area, and the like;

③ a unitless quantity that converts coordinate systems of state variables such as a link mechanism that moves in a multi-dimensional coordinate space, motion of a vehicle, and the like; and ④ a unitless quantity to be multiplied by one of a pair of potential and flow variables such as a loss ratio, gain of a control system, and the like. A system that incorporates this coefficient involves an increase/decrease in energy.

Each of the coefficients ① to ③ is multiplied by both the pair of potential and flow variables so as not to involve any increase/decrease in energy. The concept of conversion coefficients that apply coefficients having a meaning common to the potential and flow variables is one of features of the functional model, and allows modeling beyond different physical unit systems and coexistence of different physical unit systems in a single model. The coefficient serves as a weighting coefficient which functions as a square for the storage and loss characteristics.

(3) Switch Element

Switch elements are logic elements which connect/release state variables in a functional model, and a functional model that incorporates switch elements becomes a nonlinear model which changes the model structure. The coefficient value of this element is a unitless quantity such as 1 (true) and 0 (false) or 1, 0, −1, and can be considered as a coefficient for a specific purpose, which connects/disconnects state variables.

(4) Side Load

Side Loads serve to generate or absorb state variables in a model, and include two types corresponding to potential and flow variables. All potential or flow variables which do not form pairs are defined as side loads, which exclude unconstrained state variables from the system. The side loads include:

① loads corresponding to potential variables such as the internal voltage of a battery, voltage drop of a diode, ambient temperature of a device, and the like; and ② loads corresponding to flow variables such as a frictional toque, transfer torque of a clutch, a current source that supplies a constant current, and the like;

③ The functions of the side loads are categorized into a generation source such as the internal voltage of a battery that generates a state variable, and an absorption source such as a frictional torque that absorbs a state variable. The generation or absorption function of the side load is determined when the load is built in a model.

<2-2. Symbols of Modeling>

(2-2-1. Symbols of Linear Model)

A block diagram that expresses a model follows rules of a general block diagram (139), and modeling is done using symbols shown in Tables 1 and 2 below in addition to them. Symbols shown in that diagram are mainly used in a linear model.

TABLE 1

| Symbol Name | | Symbol | Remarks |
|---|---|---|---|
| State Variable | Energy | | Energy input/output direction |
| | Potential variable | | |
| | Flow variable | | |
| Operator | Addition | | $C = A + B$ (A, B, C: state variable) |
| | Branch (equivalence) | | $A = A = A$ |
| | Sign conversion | | $B = -A$ |
| | Integral | | $B = \int A dt$ |
| | Double integral | | $(B_1, B_2) \; B_1 = \int A dt, B_2 = \int\int A dt$ |
| | Differential | | $B = dA/dt$ |

TABLE 2

| Symbol Name | | Symbol | Remarks |
|---|---|---|---|
| Nature | Coefficient Conversion | | $B = R \times A$ (R: coefficient) |
| | Characteristic Conversion | | $B = P \times A$ (P: Characteristic) |
| | Side Load | | $B = A$ (A: state variable) |
| Observation variable | Observation point | | $B = A$ (B: observed value of A) |
| | Estimated observation variable | | $B_{(k+1)} = A_{(k+1)}$ $C_{(K+1)} = \int A_{(K+1)} dt$ B: estimated observation variable C: estimated storage observation variable |

(2-2-2. Symbols of Nonlinear Model)

Modeling of nonlinear systems having various kinds requires corresponding expression methods. Basically, the purpose of modeling is met as long as expression that allows visual understanding while clarifying the rules and methods of modeling the contents, nature, functions, and the like of nonlinearity, and can be converted into a mathematical model is used. Tables 3 and 4 show typical symbols used in nonlinear modeling.

TABLE 3

| Symbol Name | | Symbol | Remarks |
|---|---|---|---|
| Variable | Manipulated variable | | Manipulation characteristic value (signal other than state variable) |
| | Substitution variable | | substitution of characteristic coefficient side load value |
| Logic Operator | NC switch (normally ON) | | if (C = 0) then (B = A) else (B = 0) normally: C = 0 |
| | NO switch (normally OFF) | | if (C = 1) then (B = A) else (B = 0) normally: C = 0 |
| | AND | | $C = \min(A, B)$ (smaller one of inputs A and B is C) |
| | OR | | $C = \max(A, B)$ (larger one of inputs A and B is C) |
| Nonlinear Operator | Multiplication | | $C = A \times B$ |
| | Square | | $B = A^2$ |
| | Inverse conversion | | $B = 1/A$ |
| | Absolute value | | $B = |A|$ |
| | Sign | | $B = A/|A|$ |

TABLE 4

| Symbol Name | | Symbol | Remarks |
|---|---|---|---|
| Operator | Initialization (integral) | | if (C = 0) then (B = $\int A dt$) else (B = 0) |
| | Convolution integral | | |
| Function equation | Condition Check | | if (Cond) then (B = 1) else (B = 0) (Cond: condition check equation) |

TABLE 4-continued

| Symbol Name | Symbol | Remarks |
|---|---|---|
| Function equation | A → fnc(A) → B | B = fnc (A) (fnc ( ): function name/symbol) |
| Manual operation | Ⓐ → B | A = B (A: signal) |

<2-3. Nonlinear Signal>

(1) Manipulated Variable

A manipulated variable indicates the converted physical quantity such as the absolute value, sign, the square of state variable, and the like other than the potential and flow variables, and logic signals such as 0 (False) and 1 (True) that manipulate a switch operator or the like. However, upon manipulating from mechanism models in a nested structure a switch element of a functional model that incorporates these models, a substitution variable to be described below is preferably used. Note that a position, deviation, or the like obtained by integrating the speed is often expressed by the substitution variable.

(2) Substitution Variable

A substitution variable indicates a line for substituting a value from a mechanism model into a characteristic. The signal line names of substitution variables can be the same as variable names of these nonlinear characteristics. The substitution variable can seclude a mechanism model from a functional model. Switching of substitution variables allows nesting of nonlinear characteristics and mechanism models.

<2-4. Logic Operator>

A switch element uses a logic operator which is manipulated using condition checking, an estimated observation variable, and the like.

(1) Estimated Observation Variable

In condition checking or the like, a symbol for observing a state variable at a sampling time one period ahead is used. A state variable designated with this symbol executes a governing equation at the current sampling time (k), and then executes an estimated observation equation by substituting a dependent variable of an internal state variable into an independent variable so as to estimate a state variable at the next sampling time (k+1). This estimated observation variable is one of the concepts required for modeling a nonlinear element in the modeling scheme proposed by this paper.

(2) Logic Operator

A logic operator used as a switch element will be described in detail later. In this paper, a switch operator will be generally referred to as a switch element.

<2-5. Nonlinear Operator>

A nonlinear operator is a symbol for modeling a mechanism model to be built in a functional model, and is mainly used to convert an observation variable or manipulated variable.

(1) Absolute Value

This symbol is used to extract an absolute value by excluding the sign of a state variable or manipulated variable. In a mathematical model, this symbol is described by, e.g., b=abs(A).

(2) Sign

This symbol is used to extract a positive/negative (±) sign from a state variable or manipulated variable. In a mathematical model, this symbol is described by, e.g., b=sign(a).

(3) Square

This symbol generates a manipulated variable obtained by squaring a state variable or manipulated variable. This symbol is the same as that for multiplying two or more inputs shown in Reference FIG. 3, and becomes a square symbol in case of one input/output.

(4) Initialization (Integral)

This symbol is an integrator having a function capable of initializing a derivative of a storage characteristic to zero or a predetermined integral.

(5) Condition Checking

Figure 4:
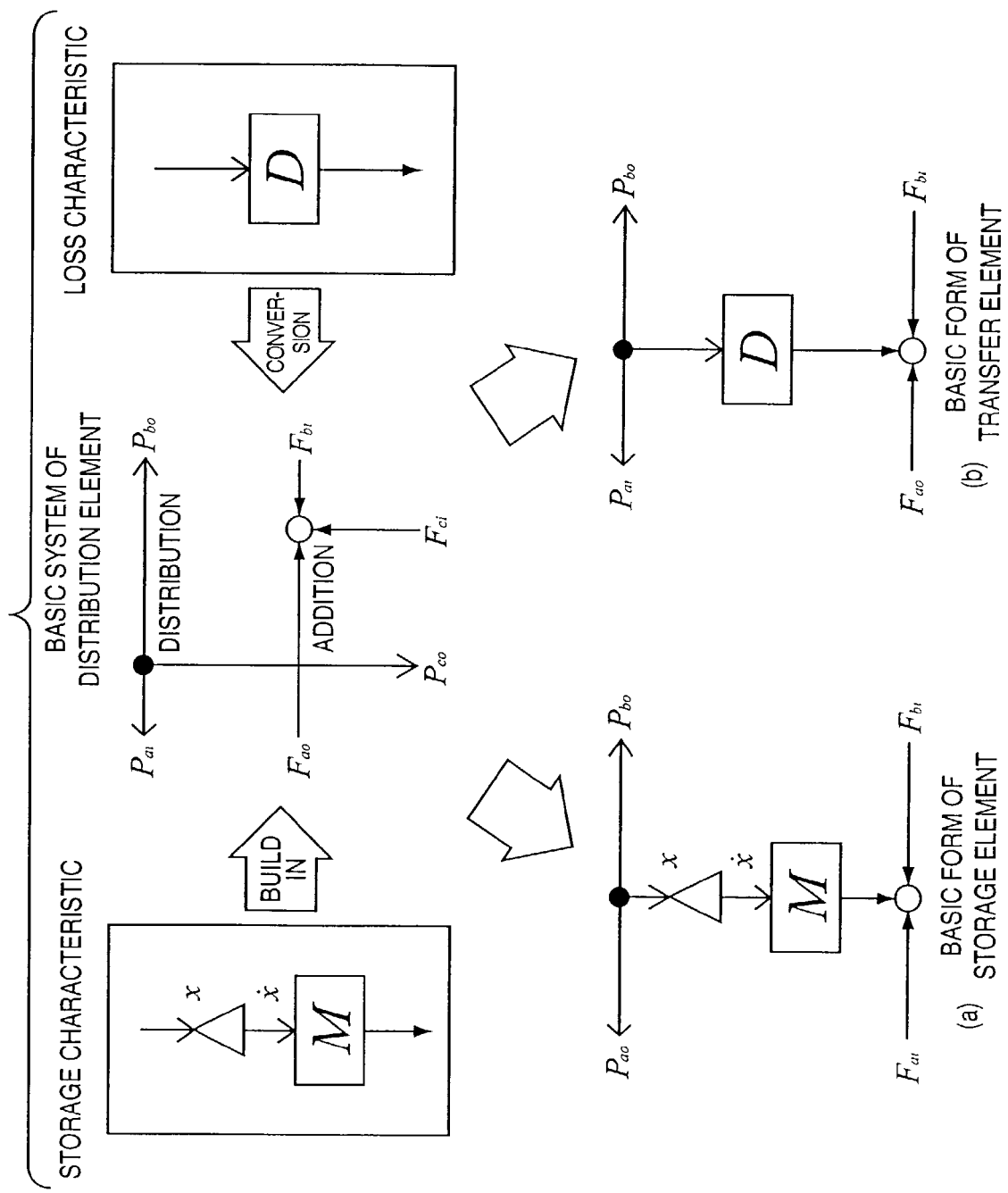
FIG. 4 is a conceptual diagram of function element generation according to an embodiment of the present invention.

Condition Checking is a symbol for generating a manipulated variable of a switch element from an observation variable at a next sampling timing observed by the symbol of the estimated observation variable shown in Reference FIG. 4, or a manipulated variable generated in a mechanism model. A condition checking relation uses operators such as inequality, equation, logic operation, and the like. The operation result outputs a manipulated variable=1 (true) when the relation holds, or 0 (false) when the relation does not hold. An open allow that indicates a manipulated or substitution variable in this case is given a manipulated variable name.

(6) Function Equation

This symbol designates to extract a function value of a state or manipulated variable as a manipulated variable. For example, designation for substituting A into parentheses of a function name sin ( ) and outputting B means a mathematical model B=sin(A).

(7) Manipulation

This symbol generates a signal for externally manipulating a model. For example, switch manipulation or the like can be made.

(8) ON-OFF Switch

This symbol is a switch element that connects/disconnects state variables, signals, and the like, and has normally open (normally OFF), normally close (normally ON), and transfer (switching) functions.

(9) AND, OR

This symbol indicates a logic element that makes logic operations by computing a fuzzy AND, fuzzy OR, and fuzzy NOT of state variables, signals, and the like.

3. Basic Concept of This Embodiment

<3-1. Concept of Functional and Mechanism Models>

Functional models must provide a modeling scheme that requires to use a computer, can match actual products and components to be modeled, and can be blended with product development. As concepts common to these products and product development so far, object-oriented concept, system design, and the like are available, and concepts of expansion and integration of models used in product development must follow them.

Functional and mechanism models proposed herein require concepts of structurization that couples and expands functions, and hierarchization by means of integration that integrates functions into an abstract generic function and disintegration that expands such abstract generic function into specific functions.

Each element of hierarchized functional components (functional models) incorporates a linear characteristic which is proportional to a state variable, and a nonlinear characteristic which is not proportional to a state variable.

Hence, in order to expand and integrate respective functions, these characteristics are independently handled. FIG. 1 shows this relationship as the concept of the arrangement of functional and mechanism models.

In FIG. 1, the linearity of characteristics and coefficients is expressed by functional models, and their nonlinearity is expressed by mechanism models in a nested structure. In each mechanism model, characteristic and coefficient values are updated by a state variable that changes along with an elapse of time. A functional model from which a mechanism model that updates the characteristic and coefficient values is separated can be handled as a linear model. Therefore, expansion of a system that connects functional components (functional models) to each other and integration that combines them into a single functional component (functional model) are done in a functional model, the linearity of which is guaranteed. On the other hand, nonlinearity included in the system is succeeded from low-order to high-order functional models in association with related characteristics and coefficients after the separated mechanism models are integrated. In other words, nonlinearlity included in a group of low-order function models is automatically succeeded to a high-order functional model via the characteristics and coefficients of the mechanism models. Note that a mechanism model has a function (application) of generating an equivalent characteristic that combines linear characteristic values in addition to a function (application) of generating nonlinear characteristic and coefficient values.

<3-2. Expression of Functional Model Using Potential and Flow Variables>

The fundamentals of unit expression as a characteristic feature of a simulation apparatus of this embodiment will be explained below.

Figure 2:
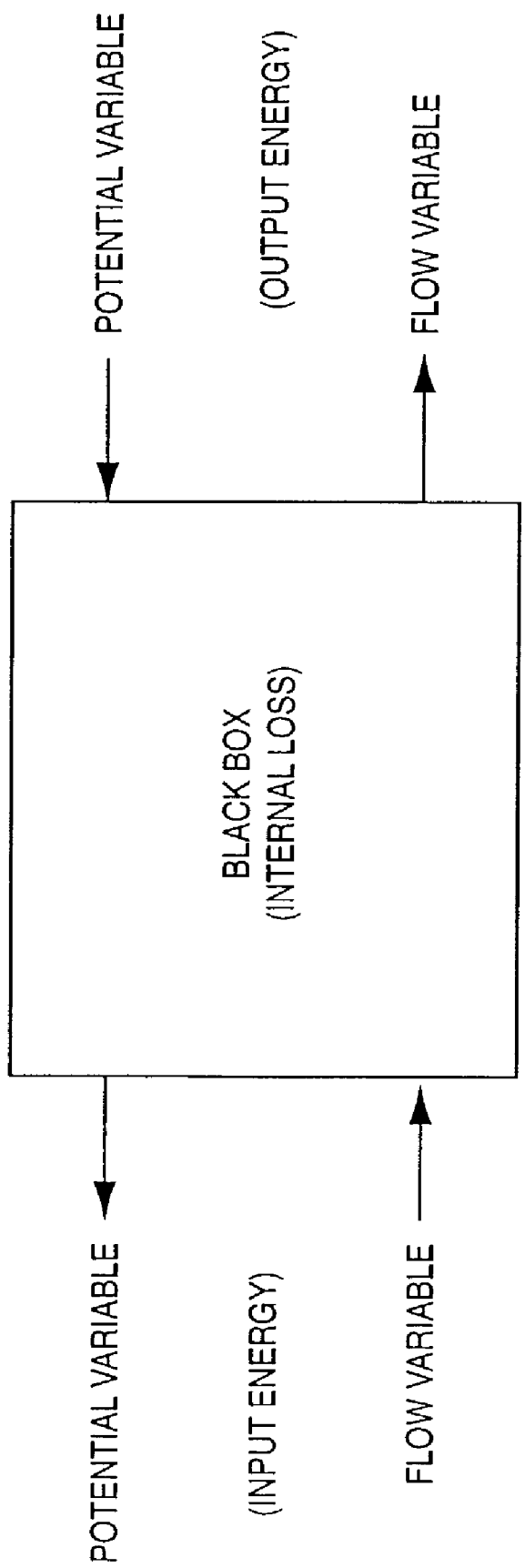
FIG. 2 is a diagram showing the basic arrangement of a functional•mechanism model according to an embodiment of the present invention.

Partial functions that build a system of a given entity are modeled as system elements which exchange energy. If a certain partial function is instantiated as a black box, as shown in FIG. 2, the energy model is defined by the internal loss of the black box, input energy to that block box, and output energy from that black box, and is given by input energy=(output energy+internal loss). The input energy and output energy are respectively expressed by state variables consisting of potential and flow variables. The potential variable is a state variable that represents the potential component of input/output energy acting on the entity, and the flow variable is a state variable that represents the flow component of input/output energy acting on the entity.

The state variable is expressed by a pair of input and output state variables. The input state variable is expressed by an input potential or flow variable, and the output state variable is expressed by an output potential or flow variable. That is, input/output energy is expressed by a pair of an input potential variable and an output flow variable or a pair of an input flow variable and an output potential variable.

Table 5 below summarizes an example of the potential and flow variables.

TABLE 5

| Energy Characteristic | Potential Variable | Flow Variable |
|---|---|---|
| Rectilinear Motion | Velocity | Load |
| Rotation | Angular Velocity | Torque |
| Fluid | Flow Rate | Pressure |
| Electric Heating | Temperature | Heat Quantity |
| Acoustic | Sound Flow | Sound Pressure |
| Electricity | Voltage | Current |

TABLE 5-continued

| Energy Characteristic | Potential Variable | Flow Variable |
|---|---|---|
| Magnetism | Magnetic Flux | Electromotive Force |

The energy model will be explained in more detail below. If a function of a motor is instantiated as a black box, and a current (value) is supplied to the flow variable of input energy, a motor torque corresponding to the current (value) is generated, and an induced voltage (value) corresponding to the internal resistance of the motor and motor angular velocity is returned as the potential variable of the input energy side. In this case, the current is the input flow variable, the voltage is the output potential variable, and (current×voltage) is the input energy. More specifically, if the rotational torque remains the same, the rotational speed of the motor increases and the induced voltage rises as the current increases. On the other hand, the torque is output as an output flow variable, and the angular velocity of the motor is returned as an input potential variable. In this case, the output energy is given by (torque×angular velocity).

Another way of describing this example is that a current is returned as a flow variable by inputting a voltage as a potential variable. In this case, the arrows in FIG. 2 are reversed, i.e., the voltage is the input potential variable and the current is the output flow variable.

The interior of the black box that expresses the entity is constructed by, e.g., a closed loop system (eigenvalue system) that defines the characteristics unique to that entity, and an open loop system that defines the characteristics of an environment which supplies input energy to the closed loop system. In the closed loop system, a permanent loop of the state variable is formed by feeding back the output state variable to the input state variable, and internal elements included in this loop settle an eigenvalue. In the open loop system, the input state variable is applied to the output state variable to form a state variable flow, which settles the flow between an external state variable serving as input energy applied to the entity, and an internal state variable serving as input energy of the eigenvalue. Hence, an energy group applied to the entity applies potential and flow input energy groups to the environment system, and the potential and flow energy groups are applied to the eigenvalue system via the environment system.

In this way, all the partial functions that construct a product are expressed by energy models as system elements, which are combined to have a given connection relationship, thus modeling the product. The present invention has been achieved on the basis of the aforementioned findings.

A model of this embodiment is formed by a "functional model" and "mechanism model".

The functional model is described by the two generalized "state variables", i.e., the "potential" and "flow" mentioned above. The functional model expresses the dynamic characteristics of an entity to be modeled, and plays a role of forming an integrated system by integrating subsystems. The mechanism model gives physical characteristics to be substituted in parameters of the functional model, and depends on the mechanism of an entity. The hierarchical model arrangement can model the overall function by integrating models of subsystems by a common method without making difficult handling of mechanism models which are normally complicated.

The function model is expressed by a system equation, and updates parameters given by the mechanism model at each sampling period. Hence, any nonlinearity of the characteristics resulting from a mechanism is linearized by the functional model at each sampling period.

Figure 3:
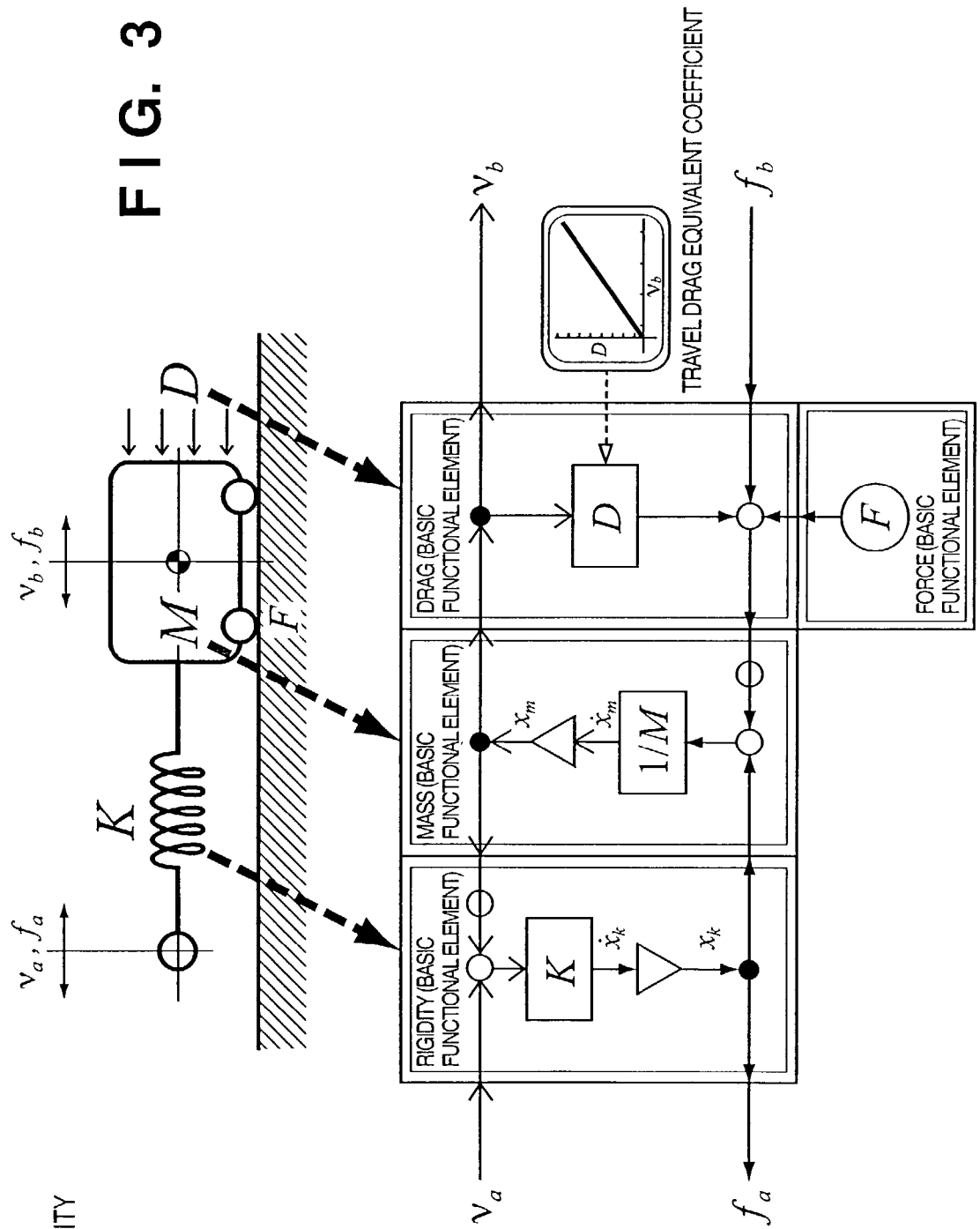
FIG. 3 is a diagram showing a modeling example of functional•mechanism models according to an embodiment of the present invention.

FIG. 3 shows an example of a functional model including linearity and nonlinearity. FIG. 3 depicts a modeling example when a wagon with mass M shown in the upper side is pushed by spring stiffness K. In FIG. 3, travel drag D proportional to the square of a velocity, and frictional force F with the road surface are generated. Modeling in FIG. 3 is done by combining and connecting storage characteristics K and M, viscous drag coefficient D, and standardized function element F of a side load, and nonlinearity of the travel drag is implemented by changing characteristic D.

A governing equation of FIG. 3 is described by:

$$\begin{bmatrix} 0 \\ 0 \\ f_a \\ v_b \end{bmatrix} = \begin{bmatrix} -M & 0 & -D & 1 & 0 & -1 & -F \\ 0 & -\frac{1}{K} & -1 & 0 & 1 & 0 & 0 \\ 0 & 0 & 0 & 1 & 0 & 0 & 0 \\ 0 & 0 & 1 & 0 & 0 & 0 & 0 \end{bmatrix} \begin{bmatrix} \dot{x}_m \\ \dot{x}_k \\ x_m \\ x_k \\ v_a \\ f_b \\ 1 \end{bmatrix} \quad \text{(EQ1)}$$

Note that an equation of the travel drag is omitted.

<3-3. Basic Element of Model>

(3-3-1. Storage and Loss Characteristics and Distribution Element)

Respective characteristics having input/output state variables of potential and flow variables described in a functional model can be handled as functional elements. Each functional model is based on a pair of distribution and addition symbols that connect a plurality of functional models and incorporate storage or loss characteristics. This functional element is connected to the flow and potential variables so that when the sum total of one side is zero, the other side assumes an equivalence. FIG. 4 shows basic forms of functional elements that incorporates storage and loss characteristics in pairs of distribution and addition symbols.

The left side in FIG. 4 shows a basic form of a storage characteristic that incorporates storage characteristics in input and output state variables $P_{co}$ and $F_{ci}$ of a basic form of a distribution element. Likewise, the right side shows a basic form of a transfer element that incorporates a loss characteristic.

The basic form of the distribution element shown in FIG. 4 is a physical law model in which distribution of the potential variable on the upper side represents the continuity of a velocity of a mechanical system, and the flow variable on the lower side represents the balance of force, when it is applied to a mechanical system. Likewise, when this basic form is applied to an electrical system, the upper side represents the Kirchhoff's voltage law, and the lower side represents the Kirchhoff's current law. Note that vertically symmetrical functional elements that distribute the flow variable and add the potential variable are present in FIG. 4.

The governing equation of the lower left basic form of the storage element obtained by building the storage characteristic into this distribution element basic form is described by:

$$\left. \begin{array}{l} P_{aO} = P_{bO} = x \\ 0 = M\dot{x} + F_{ai} + F_{bi} \end{array} \right\} \quad \text{(EQ2)}$$

Likewise, the governing equation of the lower right basic form of the transfer element is described by:

$$\left. \begin{array}{l} P_{aO} = P_{bO} = P_x \\ 0 = D * P_x + F_{ai} + F_{bi} \end{array} \right\} \quad \text{(EQ3)}$$

where $P_X$ is the input potential variable of loss characteristic D.

Figure 5:
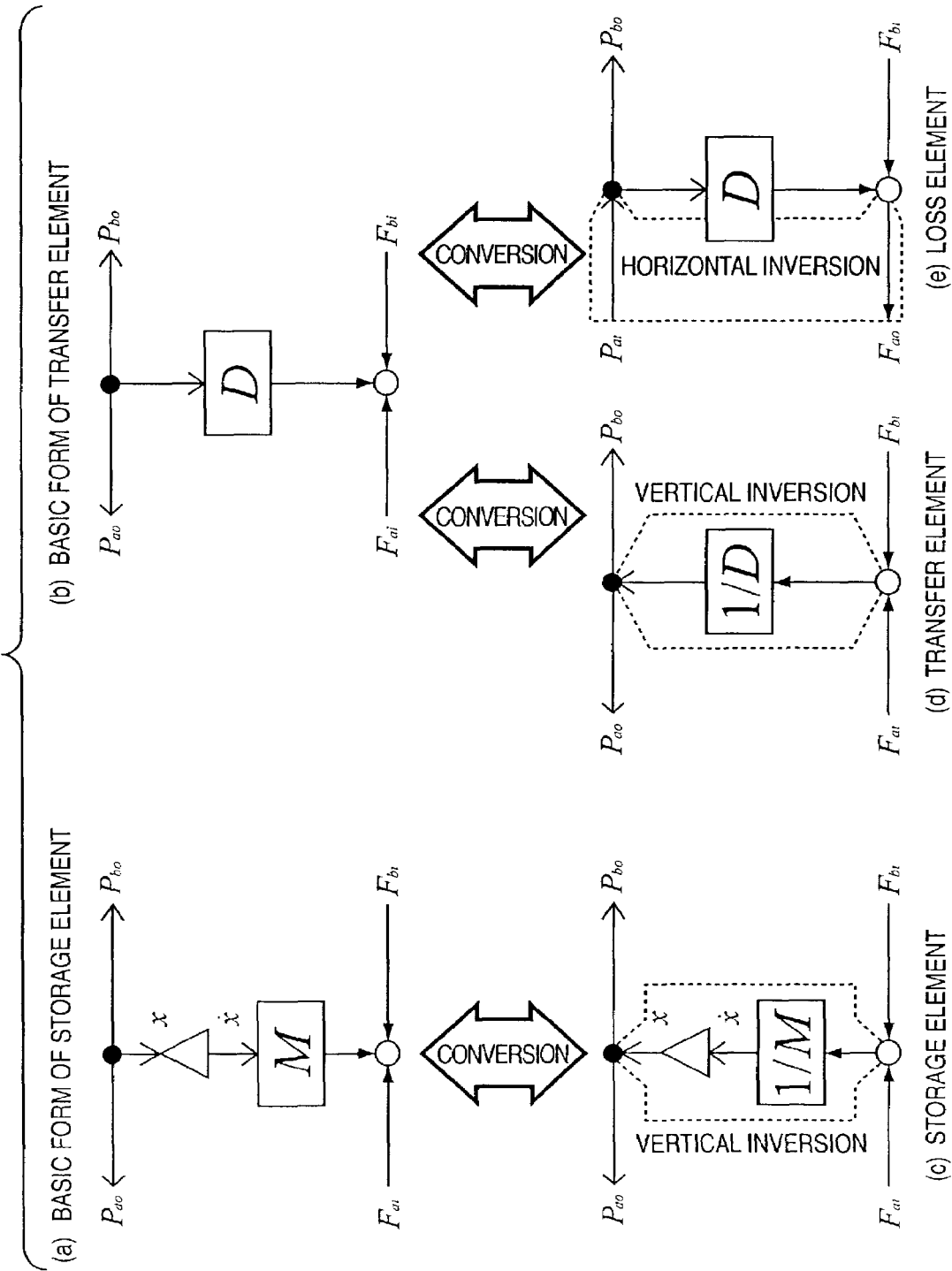
FIG. 5 shows an example of dual conversion of function elements according to an embodiment of the present invention.

The storage and transfer elements shown in FIG. 4 can be converted into functional elements that simulate the internal functions of products and components by reversing the flow direction of input and output state variables each consisting of a pair of potential and flow variables. FIG. 5 shows this example.

A lower left storage element (c) in FIG. 5 is generated by reversing the input and output state variables of the storage characteristics in the basic form of the storage element (a). Likewise, a central transfer element (d) in FIG. 5 is generated by reversing the input and output state variables of the loss characteristics in the basic form of the transfer element (b). Also, a lower right loss element (e) in FIG. 5 is generated by reversing the left input and output state variables in the basic form of the transfer element (b).

These functional elements and the characteristics of a mechanical or electrical system have the relationships: the storage element (c) is a function element indicating a mass or electrical capacitance; the transfer element (d) is a functional element indicating a fluid coupling; and the loss element (e) is a functional element indicating a viscous drag, electrical resistance, or the like. Note that the storage element (c), transfer element (d), and loss element (e) converted in FIG. 5 respectively include functional elements obtained by converting basic forms vertically symmetric to the storage element (a) and transfer element (b).

In this embodiment, generation or conversion of a functional element by reversing a pair of state variables is called dual conversion herein. In a broader sense, vertically symmetrical conversion of a given functional element into another functional element is also called dual conversion. The use method of the dual conversion will be described in more detail in the paragraphs of expansion and integration later.

Mathematical models of dual-converted functional elements are as follows.

The governing equation of the storage element is:

$$\left. \begin{array}{l} \dot{x} = \frac{1}{M}(F_{ai} + F_{bi}) \\ P_{aO} = P_{bO} = x \end{array} \right\} \quad \text{(EQ4)}$$

The governing equation of the transfer element is:

$$P_{a0} = P_{b0} = \frac{1}{D}(F_{ai} + F_{bi})\} \quad \text{(EQ5)}$$

The governing equation of the loss element is:

$$\left.\begin{array}{l} P_{b0} = P_{ai} \\ F_{a0} = D * P_{ai} + F_{bi} \end{array}\right\} \quad \text{(EQ6)}$$

Each functional element is built by combining the potential and flow variables with characteristics. A pair of potential and flow variables as input and output state variables of this function element are connected to other function elements to allow elaborate modeling. Since the product of the pair of potential and flow variables yields energy, energy is exchanged between functional elements of a built functional model. Also, since the pair of potential and flow variables flow state variables in the opposite directions and the flow direction of energy to be exchanged changes depending on the state of a system, the pair of state variables and the energy flow direction have an important relationship. For example, an automobile runs by applying energy of an engine to a vehicle body, while energy is applied from the vehicle body to the engine to put engine brake during travel on a hill. This reveals that a functional element has supply and consumption operations (functions) of energy with respect to other systems.

Upon summarizing the relationship between energy and state variables of a functional model, energy can be categorized into the following three types.

(1) Supply Energy

Energy output from a functional element to another system.

The flow of input and output state variables reverses itself between the pair; an output state variable on the distribution coupling side flows in the same direction as energy, and an input state variable on the addition coupling side flows in the reverse direction.

The input state variable on the addition coupling side has a negative sign since it flows against the energy flow.

(2) Load Energy

Energy input from another system to a functional element.

The flow of input and output state variables reverses itself between the pair; an input state variable on the addition coupling side flows in the same direction as energy, and an output state variable on the distribution coupling side flows in the reverse direction.

The input state variable on the addition coupling side has a positive sign since it flows along the energy flow.

(3) Transfer Energy

Energy exchanged between other systems via a functional element.

The flow of input and output state variable does not reverse itself between the pair.

The input and output state variables have a positive sign due to energy transfer (have no sign).

Figure 6:
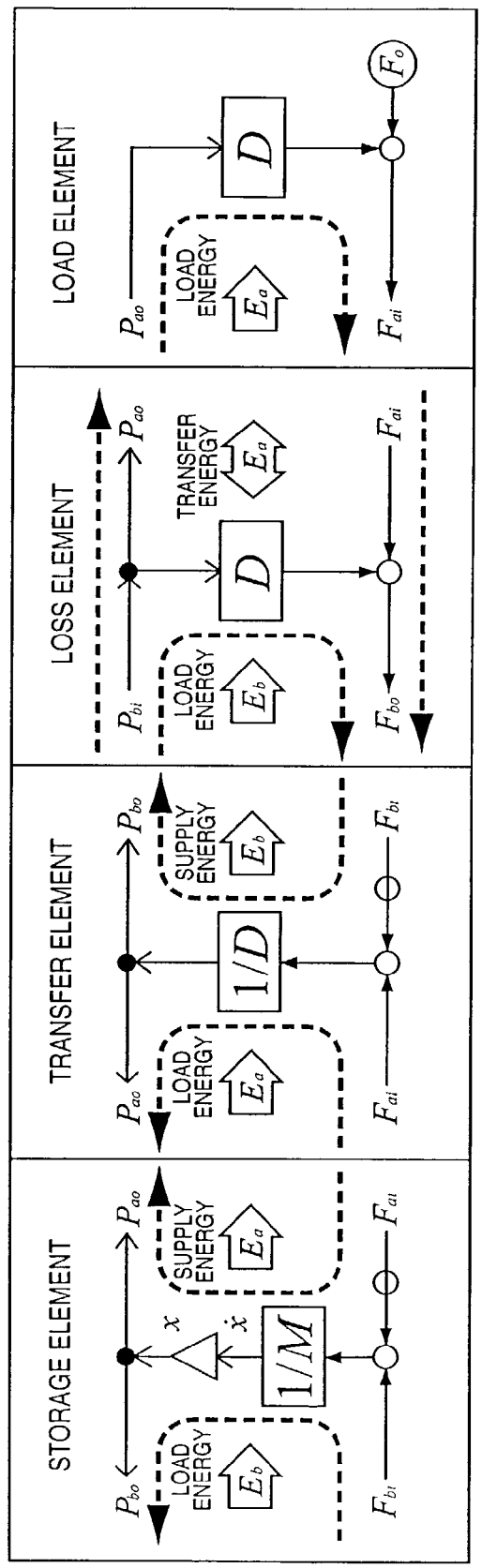
FIG. 6 shows the relationship between the energy flow and state variables according to an embodiment of the present invention.

FIG. 6 shows an example of the relationship between input/output of energy to/from functional elements and state variables (pairs) on the basis of these relationships.

FIG. 6 shows principal functional elements generated from FIG. 5 by dual conversion. A box-shaped arrow in FIG. 6 indicates the direction energy flows, and a dotted return arrow indicates the flow of input and output state variables with respect to the energy. In the storage and transfer elements in FIG. 6, the left side receives load energy that becomes the load on another system, and the right side sends supply energy for driving another system. In the loss element, the left side receives load energy from another system, and the right side transfers transfer energy between systems connected on the right and left sides. The load element is an element obtained by omitting the right output state variable of the loss element, and setting an input state variable as a side load, and consumes load energy received from a system connected on the left side.

(3-3-2. Coefficient Element)

In a product, functional component units are coupled to each other, and functions are intricately linked together. For modeling that simulates such intricate system, it is important to structurize a model that can independently handle functional components expanded inside a product by arranging physical state variables exchanged among expanded functional components. In structurization among functional components, state variables are coupled (connected) by various methods such as a connection of an electrical system, a shaft coupling of a mechanical system, a fluid coupling of a fluid system, and the like. A functional model can be structurized by substituting state variables that couple entities by coupling between models.

Figure 7:
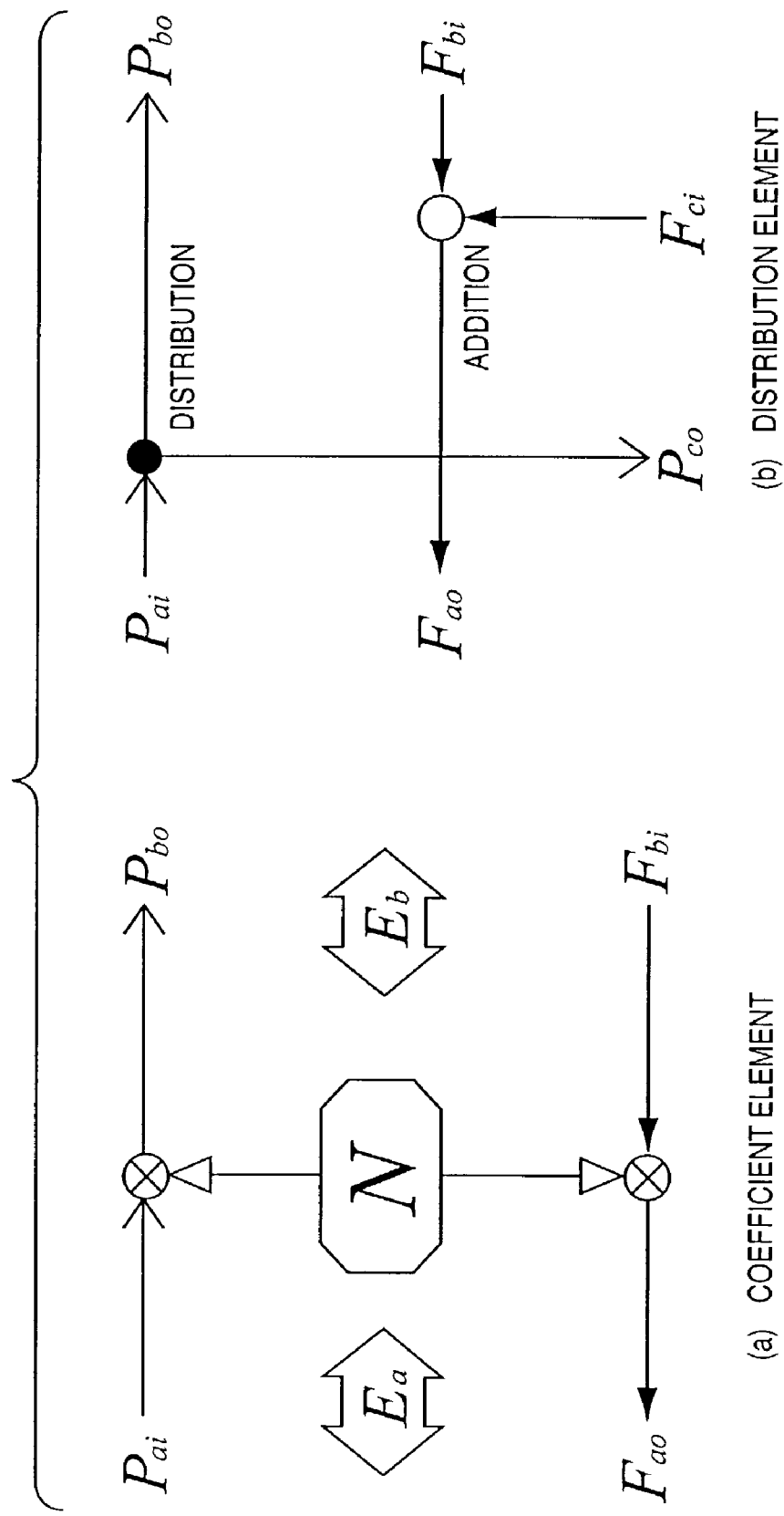
FIG. 7 shows a coefficient element that couples functional models according to an embodiment of the present invention.

Functional models are structurized by coupling them via pairs of potential and flow variables. The coupling condition is not to change energy between functional models to be coupled. A functional element that couples between functional models without changing energy is a coefficient element shown in (a) of FIG. 7. Also, (b) of FIG. 7 is the aforementioned distribution element that connects between a plurality of functional models via a pair of state variables using distribution and addition symbols. The coefficient element shown in FIG. 7 has pairs of upper potential variables and lower flow variables on the two sides, and multiplies them by a coefficient value N. The distribution element represents a special state in which the value of the coefficient element in (a) of FIG. 7 is set to be 1. This relationship is described by:

$$\left.\begin{array}{l} P_{a0} = P_{b0} = P_{c0} \\ F_{ai} = F_{bi} + F_{ci} \end{array}\right\} \quad \text{(EQ7)}$$

$$\left.\begin{array}{l} P_{b0} = NP_{ai} \\ NF_{bi} = F_{a0} \end{array}\right\} \quad \text{(EQ8)}$$

In EQ7, the upper equation describes distribution coupling in FIG. 7, and the lower equation describes addition coupling. EQ8 includes equations of the left side in FIG. 7; the upper equation indicates the potential variable side, and the lower equation indicates the flow variable side. The product of potential variable $P_{b0}$ and flow variable $F_{bi}$ of the right terms of the equations becomes energy, and the product of $P_{ai}$ and $F_{a0}$ on the left side similarly becomes energy. This relationship is described by:

$$E = P_{b0}F_{bi} = NP_{bi}\frac{1}{N}F_{a0} = P_{bi}F_{a0} \quad \text{(EQ9)}$$

As can be seen from EQ9, this element has a function of changing the distribution ratio of the pair of potential and flow variables under the condition that the products $P_{b0} \cdot F_{bi}$ and $P_{ai} \cdot F_{a0}$ are equivalent, and become equal energy.

This coefficient element has a function of coupling functional models of different physical unit systems such as a roller radius that joins a translation system and rotation system, a piston sectional area that couples a fluid system and translation system, a motor constant that couples an electrical system and rotation system inside a motor, and the like, if the coefficient value has a unit. On the other hand, if the coefficient value does not have a unit, the coefficient element has a function of coupling functional models of identical physical unit systems such as a gear ratio, link ratio, sectional area ratio of fluid, transformer of an electrical system, and the like.

When functional models are connected in correspondence with a state wherein functional components are directly coupled such as fastening that ignores rigidity, wiring of electrical components, and the like, the coefficient value is 1. Note that the coefficient value is 1 in this embodiment unless otherwise specified.

Structurization of functional models expands by connecting models via the coefficient or distribution element shown in FIG. 7. In this case, the following two methods are available:

① a method of coupling pairs of potential and flow variables of two elements by the coefficient element to have one-to-one correspondence; and ② a method of coupling pairs of potential and flow variables of one element and a plurality of elements by the distribution element to have a one-to-many relationship.

① is a basic method of structurizing a group of functional groups, and ② is a method of structurizing a group of functional models which are intricately linked together. In one-to-many coupling of the latter method, a one-to-one structurization method can be applied by converting a one-to-many coupling relationship into a one-to-one coupling relationship, and a group of structurized functional models can be integrated into a single system, as will be described later. The expansion on a governing equation can be done on a mathematical model using a structure governing equation prepared by arranging governing equations of coupled elements on a single matrix.

(3-3-3. Function Element: Linear)

Figure 8:
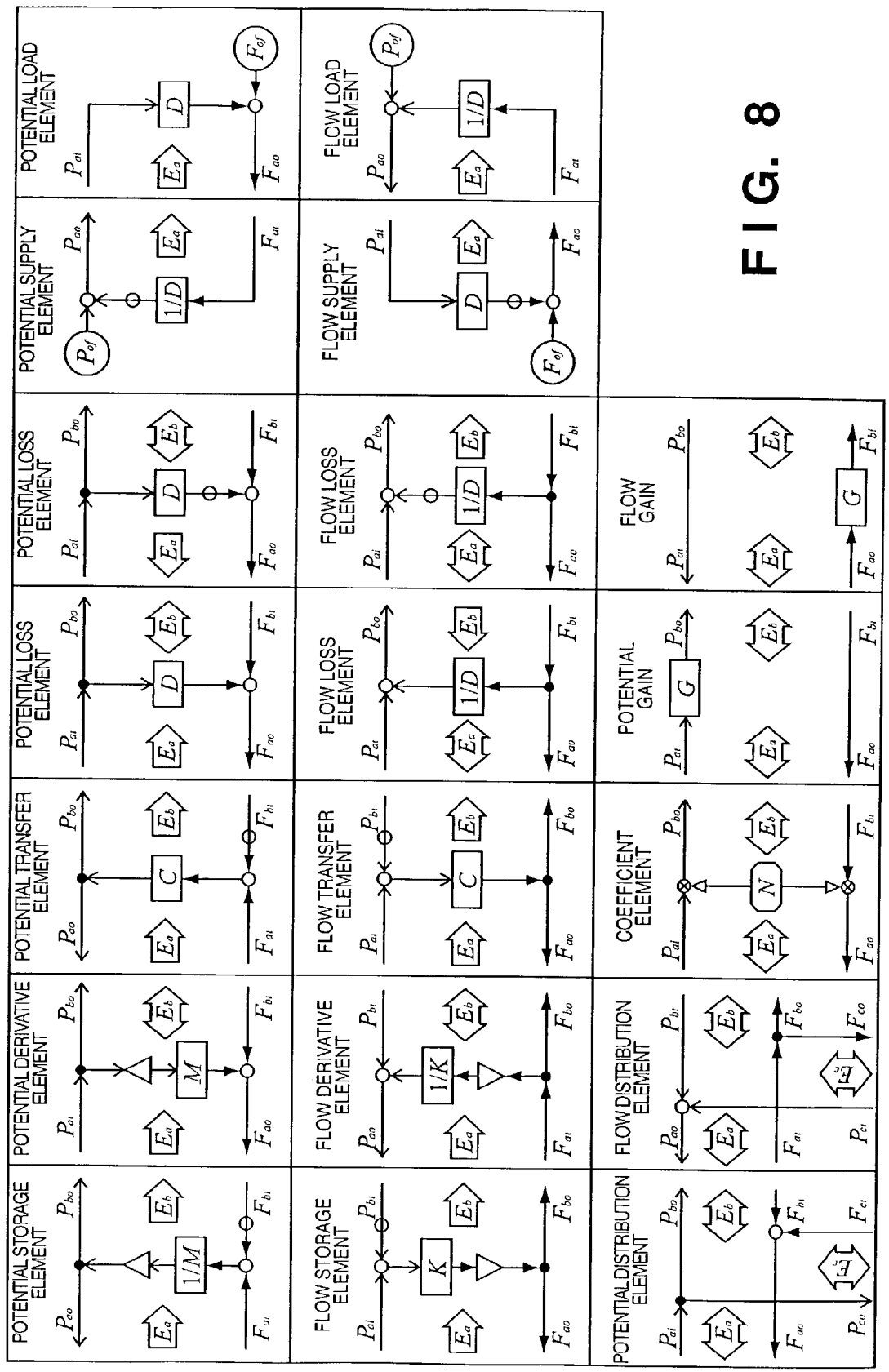
FIG. 8 shows an example of a linear function element group according to an embodiment of the present invention.

Models of functional elements shown in FIG. 8 correspond to a combination of functional elements that represent linear functions, which are obtained by converting the basic forms of functional elements expressed using these symbols in accordance with the aforementioned dual conversion rule.

In FIG. 8, elements in the upper column are a group of functional elements of a potential system, elements in the middle column are a group of functional elements of a given flow system, two left elements in the lower column are distribution elements, and the remaining three elements are functional elements associated with coefficients. These elements are linear functional elements, and a functional model modeled using them becomes a linear model.

(3-3-4. Functional Model)

Functional models modeled using linear functional elements become common ones as long as they have identical functions even in different physical systems, and the mechanisms of different physical systems can replace each other. This is also called nesting.

Figure 9:
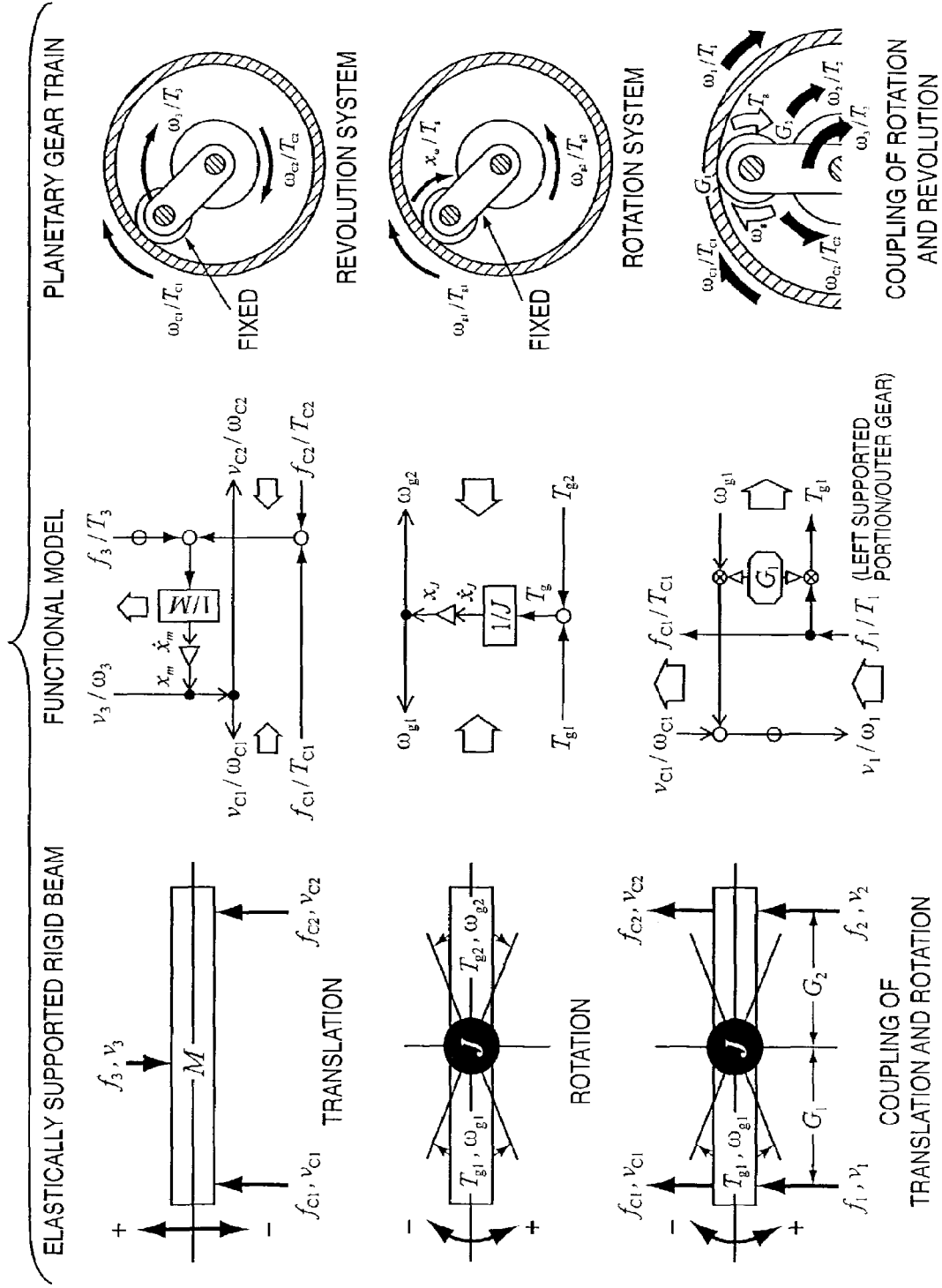
FIG. 9 shows models of internal functions of an elastically supported rigid beam and planetary gear train.

As an example of functional models which have identical functions and commonize different mechanisms, an elastically supported rigid beam and planetary gear train will be explained. The structures of the respective entities are as shown in FIG. 9 when their internal functions are modeled and fixed. As can be seen from FIG. 9, the internal functions of translation, rotation, and translation-rotation of the elastically supported rigid beam respectively correspond to revolution, rotation, and coupling of rotation and revolution of the planetary gear train, and identical functional models are used. Even when physical unit systems and mechanisms are different, identical functional models can be used by recombining mechanism models that give internal characteristic and coefficient values as long as the functions are the same.

In the characteristics of the elastically supported rigid beam and planetary gear train, M represents the mass of the beam (moment of inertia of a carrier); J, the moment of inertia of the beam (moment of inertia of rotation of a planetary gear); $G_1$, the distance from the point of center of gravity to the left support point of the beam (gear ratio between an outer gear and the planetary gear); and $G_2$, the distance from the point of center of gravity to the right support point of the beam (gear ratio between an inner gear and the planetary gear). State variables $v_1$ and $f_1$ of the elastically supported rigid beam on the left side in FIG. 9 are the velocity and force on the beam; $v_2$ and $f_2$, those on the right support point; and $v_3$ and $f_3$, those on the left support point. Likewise, state variables $\omega_3$ and $T_3$ of the planetary gear train are the angular velocity and torque on the carrier; $\omega_1$ and $T_1$, those on the outer gear; and $\omega_2$ and $T_2$, those on the inner gear. As state variables of the planetary gear which are common to those of rotation of the beam shown in FIG. 9, $T_g$ and $\omega_g$ are respectively the angular velocity and torque, and $x_m$ and $x_J$ are internal state variables.

FIG. 9 illustrates the operations of the elastically supported rigid beam and planetary gear train in units of functions.

With respect to the aforementioned state variables in FIG. 9, $v_c$ and $f_c$ represent the velocity and force components of translation of the beam, and $\omega_C$ and $T_C$ the angular velocity and torque of revolution of the carrier. Note that suffix 1 of the elastically supported rigid beam indicates the left support portion side, and 2 the right support portion side. Likewise, suffix 1 of the planetary gear train indicates the outer gear side, and 2 the inner gear side. Respective elements in FIG. 9 are described by the following right and left equations.

The translations of the carrier of the planetary gear train and elastically supported rigid beam are respectively described by:

$$\left. \begin{array}{l} M\dot{x}_m = T_{C1} + T_{C2} - T_3 \\ x_m = \omega_{C1} = \omega_{C2} = \omega_3 \end{array} \right\} \quad \left. \begin{array}{l} M\dot{x}_m = f_{C1} + f_{C2} - f_3 \\ x_m = v_{C1} = v_{C2} = v_3 \end{array} \right\} \quad (EQ10)$$

The rotations of the planetary gear and beam are described by:

$$\left. \begin{array}{l} J\dot{x}_J = T_{g1} + T_{g2} \\ x_J = \omega_{g1} = \omega_{g2} \end{array} \right\} \quad \left. \begin{array}{l} J\dot{x}_J = T_{g1} + T_{g2} \\ x_J = \omega_{g1} = \omega_{g2} \end{array} \right\} \quad (EQ11)$$

The left couplings of revolution and rotation of the outer gear and planetary gear, and translation and rotation of the beam are described by:

$$\left.\begin{array}{l}T_{C1} = T_1 \\ T_{g1} = G_1 T_1 \\ \omega_1 = -(\omega_{C1} + l_1 \omega_{g1})\end{array}\right\} \quad \left.\begin{array}{l}f_{C1} = f_1 \\ T_{g1} = l_1 f_1 \\ v_1 = -(v_{C1} + l_1 \omega_{g1})\end{array}\right\} \quad \text{(EQ12)}$$

Likewise, the right couplings of the inner gear and planetary gear, and the beam are described by:

$$\left.\begin{array}{l}T_{C2} = T_2 \\ T_{g2} = l_2 T_2 \\ \omega_2 = -(\omega_{C2} + l_2 \omega_{g2})\end{array}\right\} \quad \left.\begin{array}{l}f_{C2} = f_2 \\ T_{g2} = l_2 f_2 \\ v_2 = -(v_{C2} + l_2 \omega_{g2})\end{array}\right\} \quad \text{(EQ13)}$$

(3-3-5. Mechanism Element: Nonlinear)

Nonlinear element model examples shown in FIG. 10 are obtained by registering models using their symbols and nonlinear processing functions as stencils. Especially, since nonlinear elements depend on the structures and mechanisms of components and their internal characteristics, elements generated during the modeling process are often registered and re-used.

Of nonlinear functional elements shown in FIG. 10, three examples expressed in the form of graphs in the leftmost column have nonlinear characteristics as map data. The map data is a model for determining the characteristic value of a functional model, in which the X-axis represents an input state variable used to search for characteristics, and the Y-axis represents an output state variable of the characteristic value found by search. Three examples of block diagrams in the second column from the left express nonlinear physical phenomena. Examples in the third column from the left express the response characteristics and delay of states in the form of graphs, and when such graph is built in, the response characteristics in a functional model can be handled as temporal nonlinearity. Upper two examples in the rightmost column represent states wherein the manipulation and operation state change along with transition of a time history. The last, lower right example is an example of a zone map.

(3-3-6. Mechanism Model)

A functional model is formed by characteristics included therein and a pair of state variables which couple the characteristics. The internal characteristics have a characteristic value determined by the structure and mechanism, and include those having numerical value data, and those generated by mechanism models of, e.g., physical and engineering theories, empirical formulas, and the like. The former internal characteristics include those that represent a general method of updating standard values of identical physical characteristics to adapt them to structures, and those that simulate different structures and mechanisms by a single functional model by giving different physical characteristics. The latter mechanism models include those that selectively use a plurality of models depending on the use purposes, simulation precision, or the like of function models in addition to those having the same contents as the former mechanism models. In this way, the internal characteristics of functional models can change their functions by updating their characteristic values. Hence, structures or mechanism models for updating the internal characteristic values must be set in a nested structure.

Figure 11:
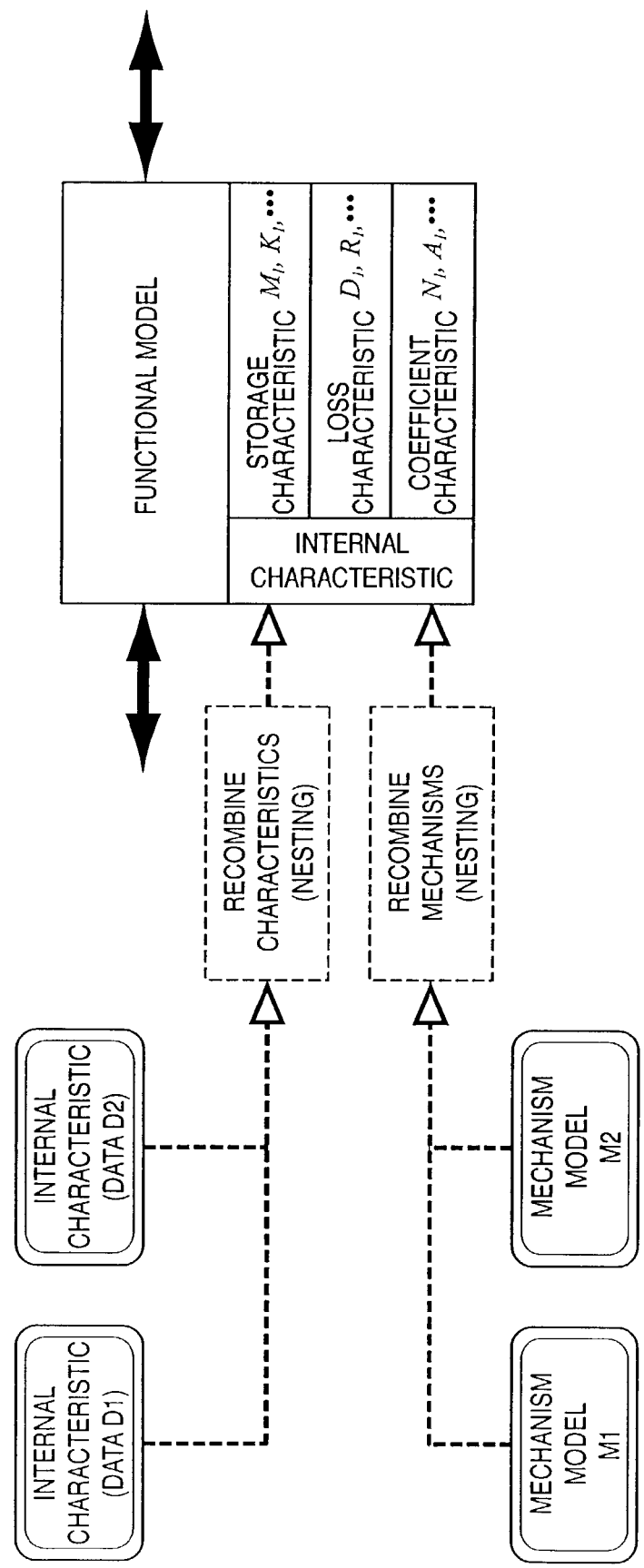
FIG. 11 is a conceptual diagram of nesting internal characteristics according to an embodiment of the present invention.

FIG. 11 shows the concept of the nesting internal characteristics that simply explain this relationship. FIG. 11 illustrates that data $D_1$ and $D_2$ of internal characteristics and mechanism models $M_1$ and $M_2$ which are commonized across physical unit systems are prepared, and are recombined via characteristic and mechanism recombination means so as to make element A correspond to different structures, mechanisms, and physical unit systems.

Figure 12:
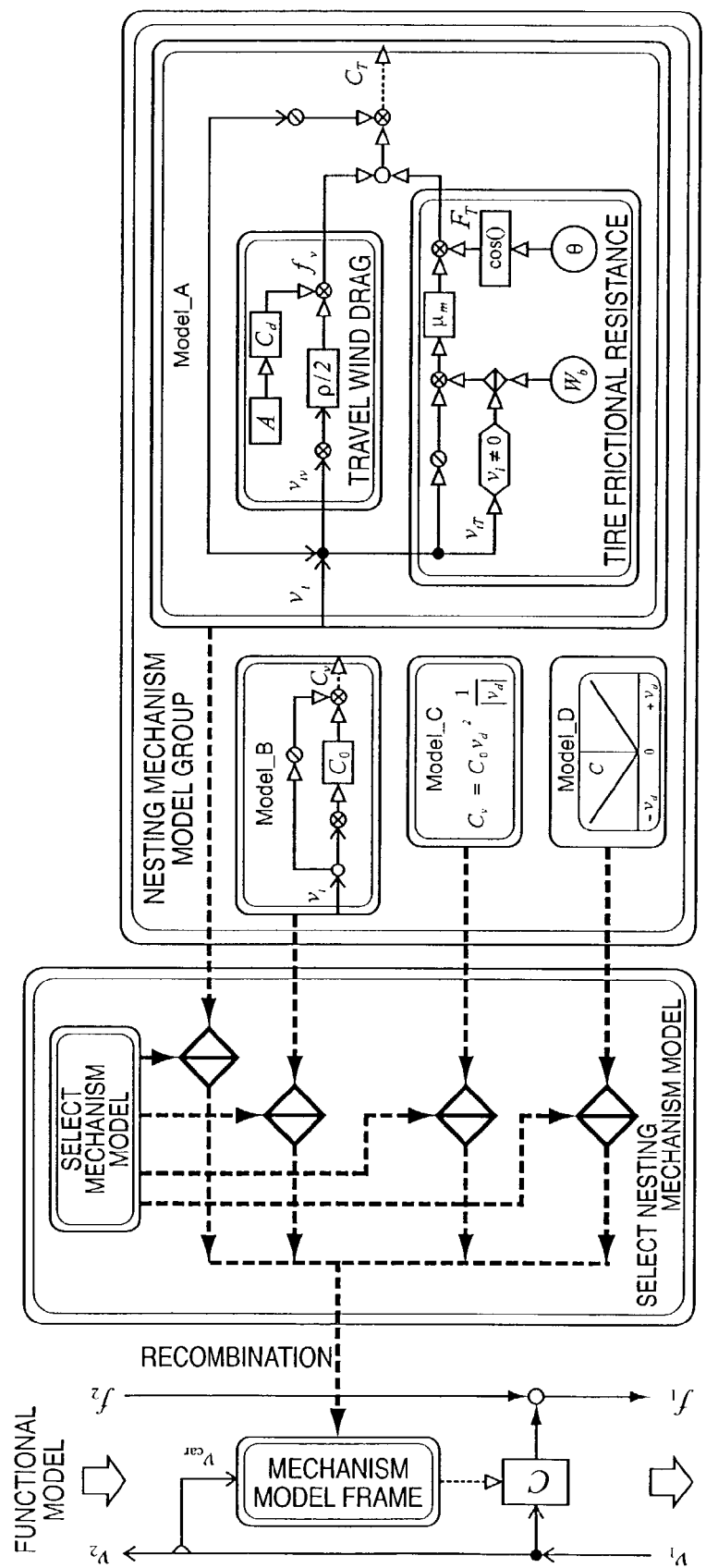
FIG. 12 is a diagram showing an example of nested mechanism models.

FIG. 12 shows an example for recombining mechanism models for generating identical internal characteristics by setting a plurality of mechanism model groups in a nested structure.

FIG. 12 exemplifies a case wherein mechanism model groups that simulate the travel drag of a vehicle having nonlinear characteristics are built in to have a nested structure. The respective mechanism model groups are modeled in correspondence with different precision levels, expression methods, or the like of the travel drag, and are selected in accordance with the purpose of simulation, use purpose of functional models, or the like.

Figure 13:
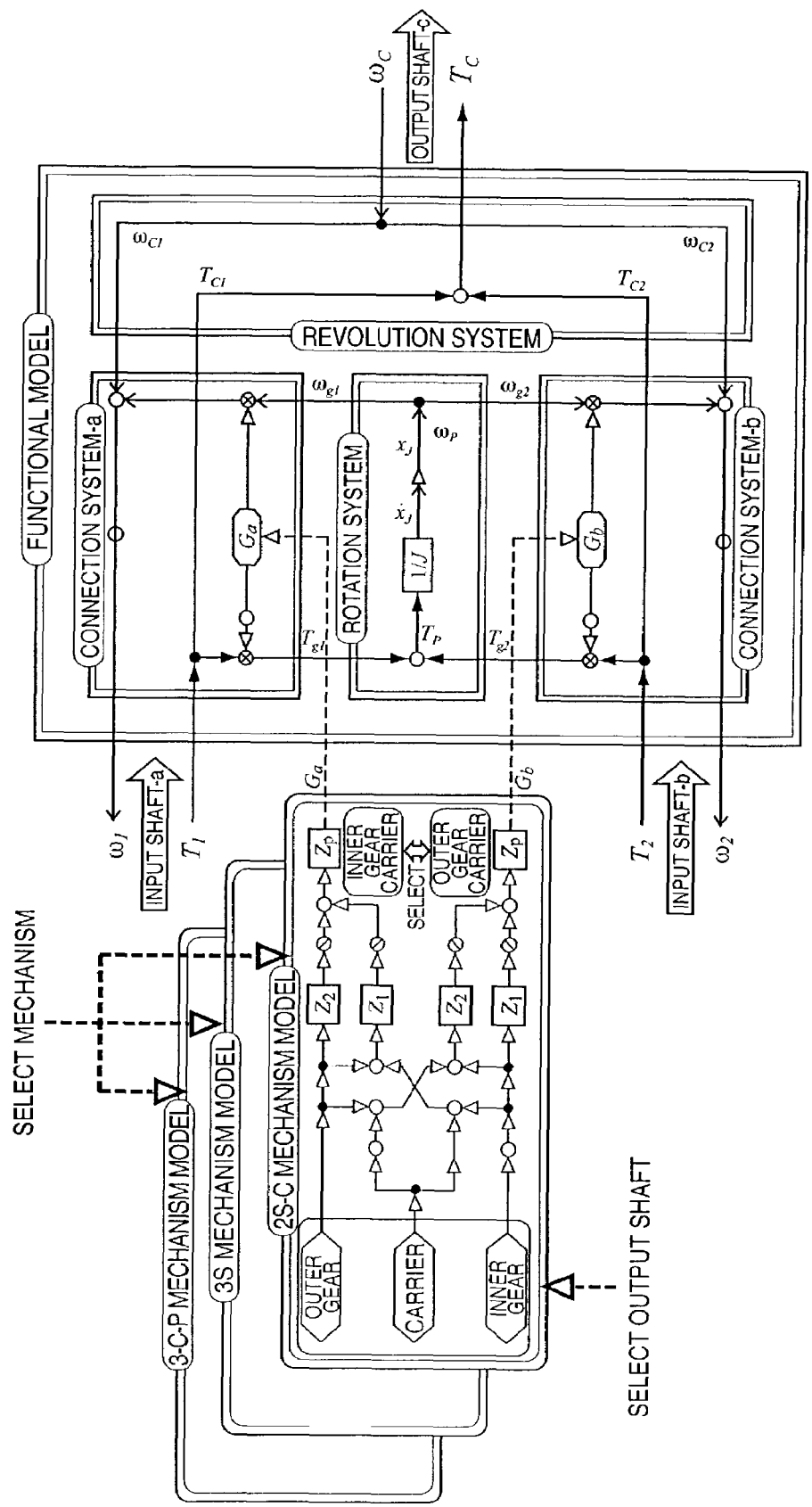
FIG. 13 is a diagram showing another example of nested mechanism models.

FIG. 13 shows the overall functional model assembled by expanding the functional models shown in FIG. 9 as another example of the nested structure. As shown in FIG. 9, the elastically supported rigid beam and planetary gear train can be expressed by identical models except for different variable names of state variables, as a matter of course. The fact that the elastically supported rigid beam and planetary gear train can be expressed by identical models demonstrates that when the internal characteristic values of the elastically supported rigid beam or planetary gear train are prepared and built in identical functional models, models having different mechanisms or physical unit systems can be used.

The governing equation common to the commonized functional model shown in FIG. 13 is described by:

$$\begin{bmatrix}0 \\ 0 \\ \omega_1 \\ \omega_2 \\ \omega_3\end{bmatrix} = \begin{bmatrix}-M & 0 & 0 & 0 & 1 & 1 & -1 \\ 0 & -J & 0 & 0 & G_1 & G_2 & 0 \\ 0 & 0 & -1 & -G_1 & 0 & 0 & 0 \\ 0 & 0 & -1 & -G_2 & 0 & 0 & 0 \\ 0 & 0 & 1 & 0 & 0 & 0 & 0\end{bmatrix} \begin{bmatrix}\dot{x}_m \\ \dot{x}_j \\ x_m \\ x_j \\ T_1 \\ T_2 \\ T_3\end{bmatrix} \quad \text{(EQ14)}$$

Note that this equation is expressed using state variable names of the planetary gear train. As for the elastically supported rigid beam, ω of dependent variables of that equation is replaced by v, and T by f.

Let $z_1$ be the number of teeth of the outer gear, $z_2$ be that of the inner gear, and $z_p$ be that of the planetary gear. Then, gear ratios $G_1$ and $G_2$ between the respective gears upon outputting torques input from the inner and outer gears to the carrier in FIG. 13 are respectively given by:

$$\left.\begin{array}{l}G_1 = \dfrac{z_p}{z_1} \\ G_2 = \dfrac{z_p}{z_2}\end{array}\right\} \quad \text{(EQ15)}$$

Torque acting on the planetary gear is given by:

$$T_g = G_1 T_1 + G_2 T_2 \quad \text{(EQ16)}$$

A planetary gear train having a different structure and mechanism will be modeled below by recombining mechanism models that determine the coefficients of gear ratios $G_1$ and $G_2$ inside the functional model shown in FIG. 13.

Figure 14:
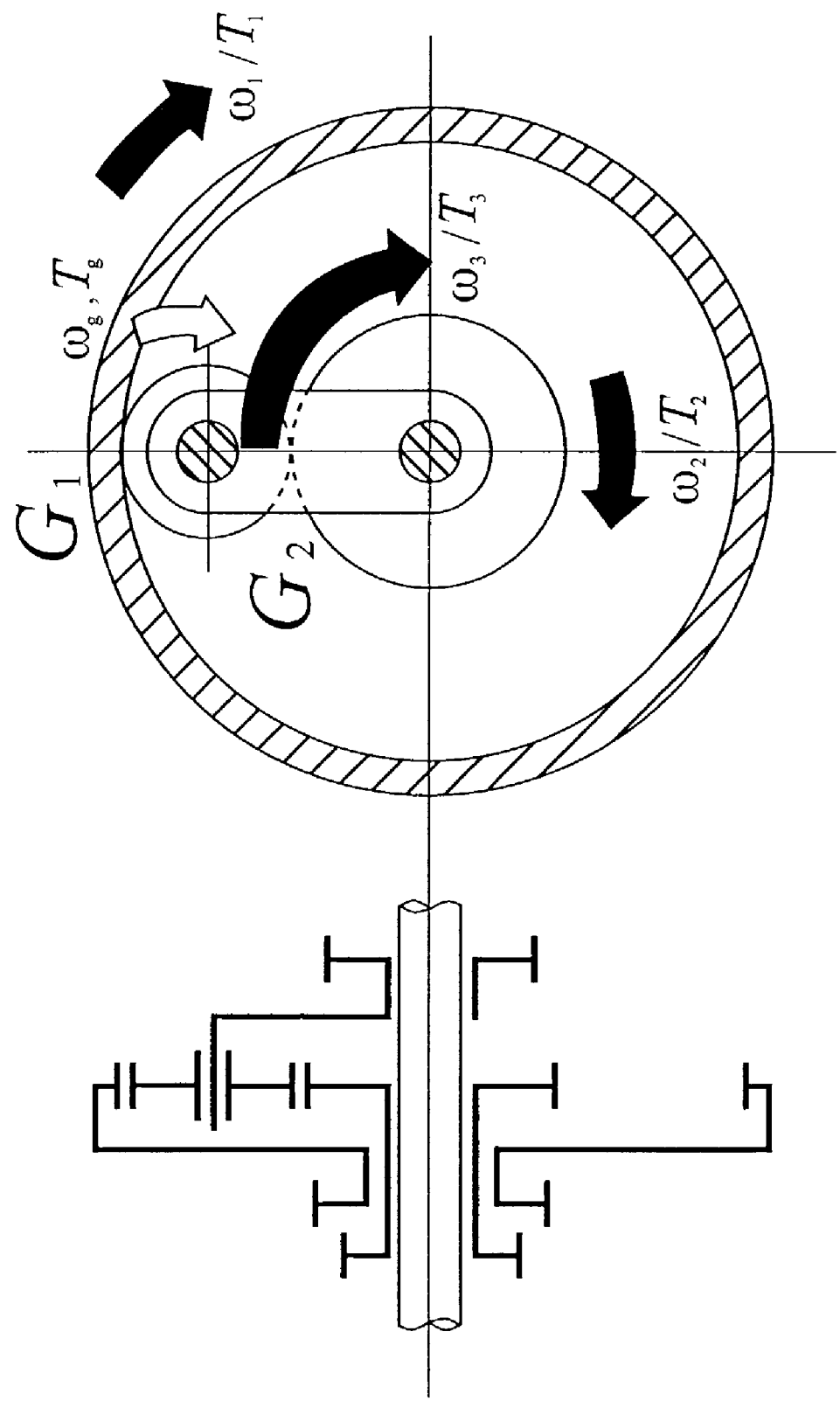
FIG. 14 shows an example of a 2S-C planetary gear train.

As can be seen from the functional model shown in FIG. 13, a 2S-C planetary gear train shown in FIG. 14 can be expressed by identical models even when a combination of input and output shafts is changed since inner and outer gears are symmetric about a carrier.

Hence, gear ratios between the input and output shafts are respectively given by:

$$G_{1P} = \frac{z_P}{z_1}$$
$$G_{2P} = -\frac{z_P(z_1 + z_2)}{z_1 z_2}$$
(EQ17)

EQ17 and EQ15 represent different gear ratios since the torque input and output shafts with respect to the carrier, inner gear, and outer gear have been changed, and reveal that identical models can be obtained if the relationship among the input and output state variables in EQ14, carrier, inner gear, and outer gear is replaced. Hence, this means that FIG. 13 can be applied irrespective of the internal planetary gear train as long as the input and output shafts are determined, and also that the relationship between the carrier, inner gear, and outer gear, and the input and output shafts can be expressed by the gear ratios. That is, in the model of the planetary gear train, the relationship between the gear ratios and the shaft that outputs torque is modeled as a mechanism model, and can be substituted in the gear ratios of the functional model. For example, the mechanism model upon outputting torque from the carrier is given by EQ15, and that upon outputting torque from the outer gear is given by EQ17.

Figure 15:
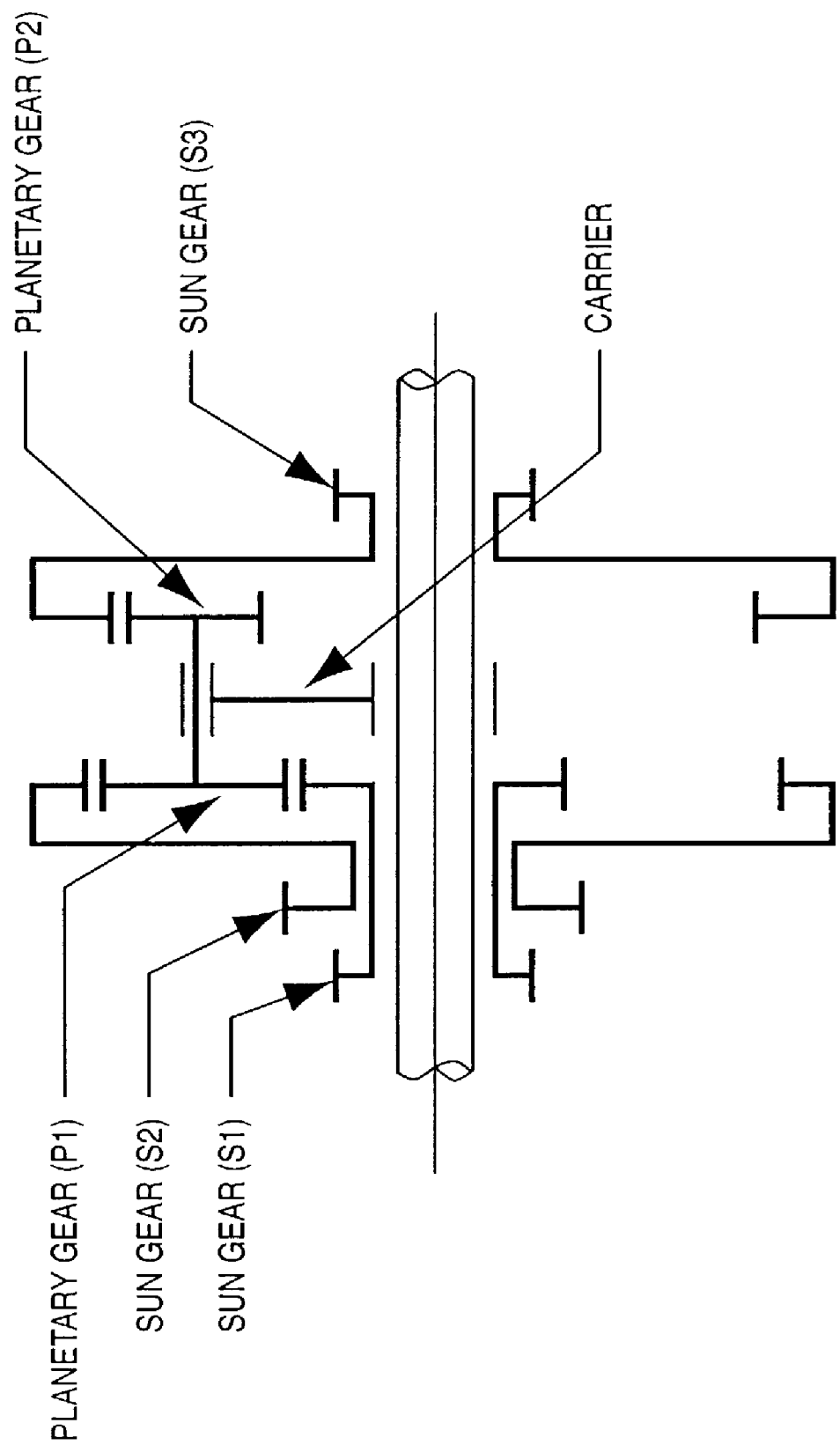
FIG. 15 shows an example of a 3S planetary gear train.

Gear ratios of a 3S planetary gear train in which all basic shafts are comprised of sun gears, as shown in FIG. 15, will be examined below. Let $S_1$ be a constraint shaft, $S_2$ be an input shaft, and $S_3$ be an output shaft. Then, three shafts are coaxial with each other, and the sum of input and constraint torques becomes output torque on the basis of the balance condition of the system. As for a revolution system, when the rotation of the planetary gear is zero as in 2S-C type, the respective shafts revolve together. Also, a rotation system can be considered in the same manner as 2S-C type when the rotation of the output shaft S3 is zero.

Hence, gear ratios $G_{S1}$ and $G_{S2}$ that couple the shafts $S_1$ and $S_2$ in FIG. 15 and the rotation system are respectively given by:

$$G_{S1} = -(z_{S3}z_{P1} + z_{S1}z_{P2})/(z_{S1}z_{S3})$$
$$G_{S2} = (z_{S3}z_{P1} - z_{S2}z_{P2})/(z_{S2}z_{S3})$$
(EQ18)

Figure 16:
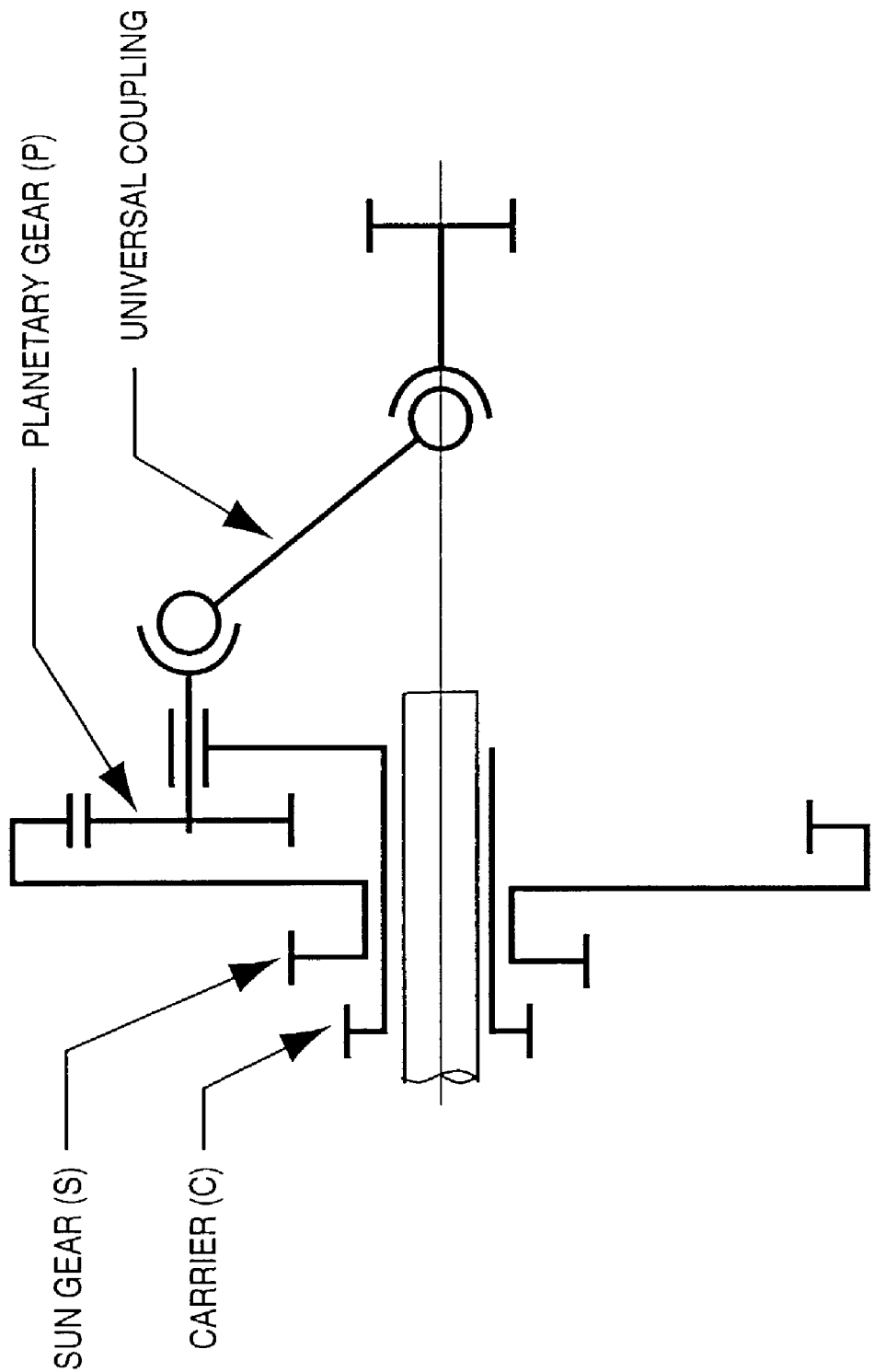
FIG. 16 shows an example of an S-C-P planetary gear train.

Gear ratios of an S-C-P planetary gear train in which a sun gear, carrier, and planetary gear serve as basic shafts, as shown in FIG. 16, will be examined below. Torque is input/output to/from the planetary gear to be coaxial with other two shafts using a universal coupling or the like, as shown in FIG. 16. Hence, the relationship between the input and constraint torques, and the output torque is the same as in 2S-C and 3S types. When rotation of the planetary gear is zero, since the central axis of the planetary gear revolves together with other elements, the shaft connected to the planetary gear also rotates at the same velocity as other basic shafts. That is, when the planetary gear is fixed by the rotation system, the entire revolution system rotates together as in other types.

Therefore, the functional model of S-C-P type shown in FIG. 16 is the same as those of other types, and gear ratios $G_C$ and $G_U$ that couple the rotation systems are given by:

$$G_C = -z_S/z_P$$
$$G_U = 1$$
(EQ19)

Note that gear ratio $G_U=1$ in EQ19 indicates direct coupling by the universal coupling.

FIG. 13 above shows the functional model of the planetary gear train having mechanism models for determining the gear ratios of the functional model by selecting the output torque shaft. On the other hand, different structures of the 2S-C, 3S, and S-C-P planetary gear trains are obtained by recombining their mechanism models in a nested structure. The behaviors, performances, and characteristics of these planetary gear trains can be simulated by modeling the gear ratios of the planetary gear trains with different structures and mechanisms by mechanism models using a single functional model, and recombining the mechanism models.

Upon examination on a mathematical model, the functional model common to the planetary gear trains is described by governing EQ14, and mechanism models modeled according to the structures and mechanisms are described by EQ15, EQ17, EQ18, and EQ19. Substitution of equations of the mechanism models into $G_1$ and $G_2$ in EQ14 of the functional model can form mathematical models that simulate planetary gear trains with different structures and mechanisms.

(3-3-7. Component Model)

Figure 17A:
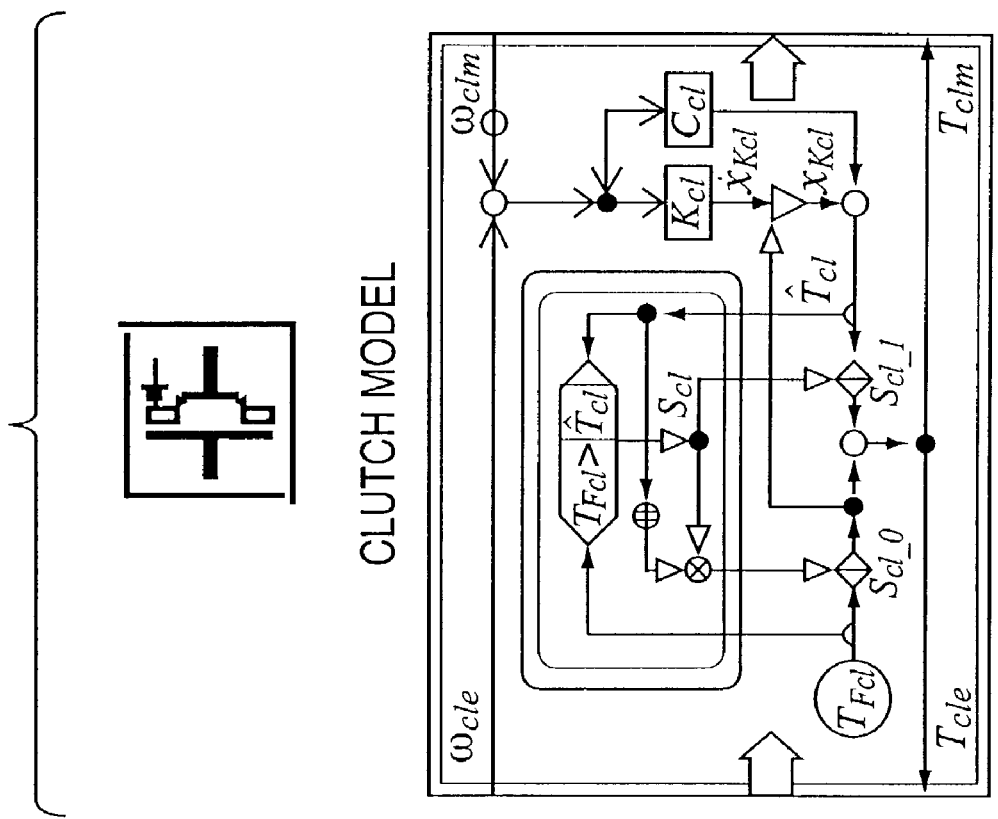
FIG. 17 shows an example of stencils and model group of function components according to an embodiment of the present invention.
Figure 17D:
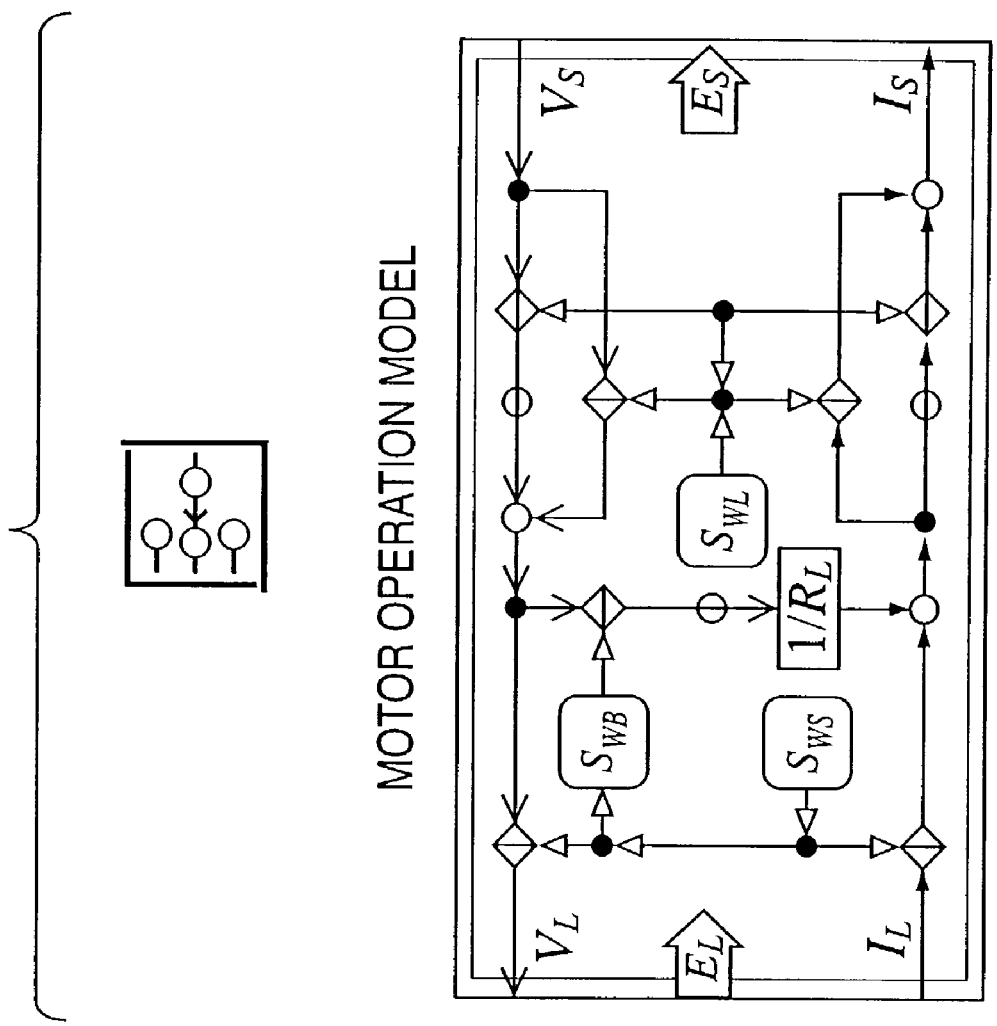

FIG. 17 shows examples of stencils and models of functional components modeled and registered using the aforementioned symbols and functional elements.

In FIG. 17, the upper side shows examples of models obtained by modeling functional components of clutch, brake, and cluttering by combining functional elements and nonlinear elements, and their registered icons. Likewise, the lower side shows examples of models obtained by modeling a motor operation switch and motor as a simplified model and detailed model, and their registered icons. Since these versatile functional components are popularly used in various devices, they can be registered as versatile models, and can be built in upon modeling various devices.

Functional components that include nonlinearity must be handled while being classified into linear and nonlinear models, as described above. A method of building mechanism models for converting a functional model of a linear model into a nonlinear model in a nested structure will be examined below. Functional models can be modeled as identical functional models independently of different structures or physical unit systems of components as along as they have the same function. Since these functional models are linear models, low-order functional models are expanded on a computer, and can be automatically integrated into a high-order functional model. These functional models can form a nested structure if they have the same function, and can be freely recombined. The same applies to mechanism models that implement nonlinearity by updating based on the internal characteristics of the functional models. This indicates that the expanded functional and mechanism models can be freely recombined on a computer by setting functional and mechanism model groups of a similar function, which are prepared in advance, in a nested structure.

If functional models beyond physical unit systems include models of identical functions due to community among models, they can make simulation as models of different physical unit systems. This means that functional models can be commonized across fields such as structures, mechanisms, physical unit systems, and the like if a fewer number of models having different functions are prepared. Functional model groups having similar functions can form a nested structure, as shown in FIG. 18.

That is, element B in FIG. 18 can select and recombine elements $B_1$, $B_2$, and $B_3$. This recombination must be done on the condition that pairs via which element B is connected to other elements A and C guarantee the number of state variables that become energy. Hence, if this condition is satisfied, the interior of the model of element B can be changed.

For example, assume that element B in FIG. 18 is a transmission device. As the transmission device, manual, automatic, and changeless transmission schemes are available. If functional models of these different schemes are prepared, vehicle performances can be compared and evaluated while recombining the transmission devicees on a computer using nesting. The recombination of the transmission devices means that a model the internal functions of which are freely planned and designed may be formed as long as a condition that the input side on the engine side corresponds to the angular velocity (potential variable) and torque (flow variable), and the output shaft on the vehicle body side corresponds to the angular velocity (potential variable) and drive torque (flow variable) is satisfied.

Figure 19:
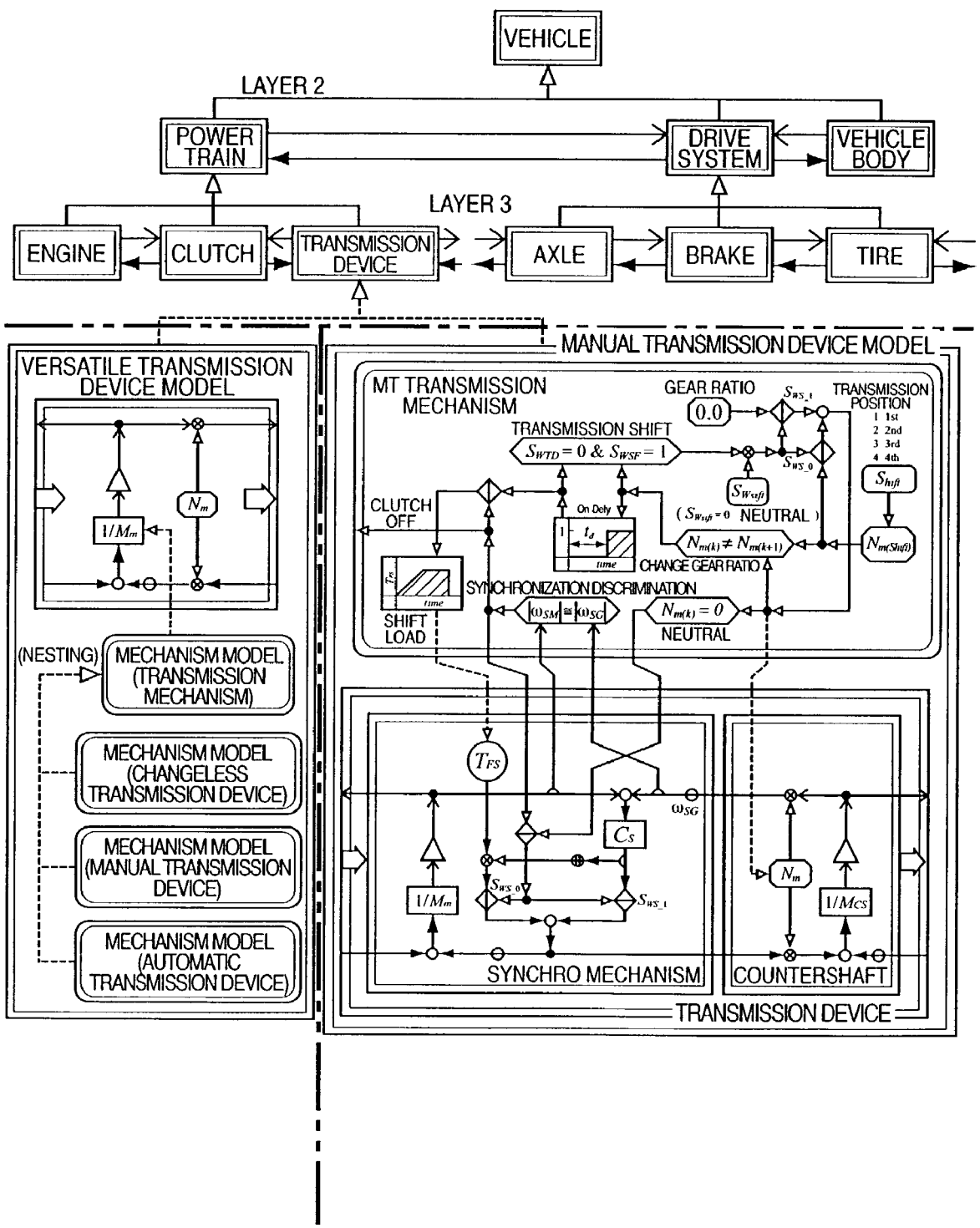
FIG. 19 is a diagram showing an example of the nested structure of an automobile transmission device model.
Figure 19A:
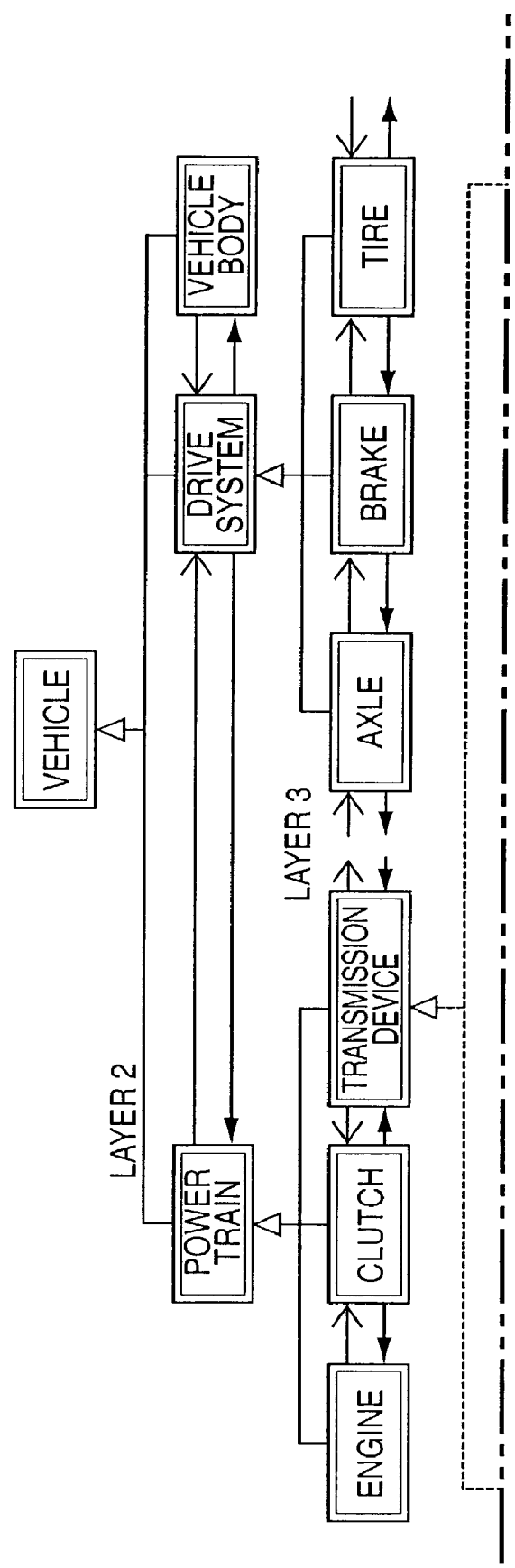
Figure 19B:
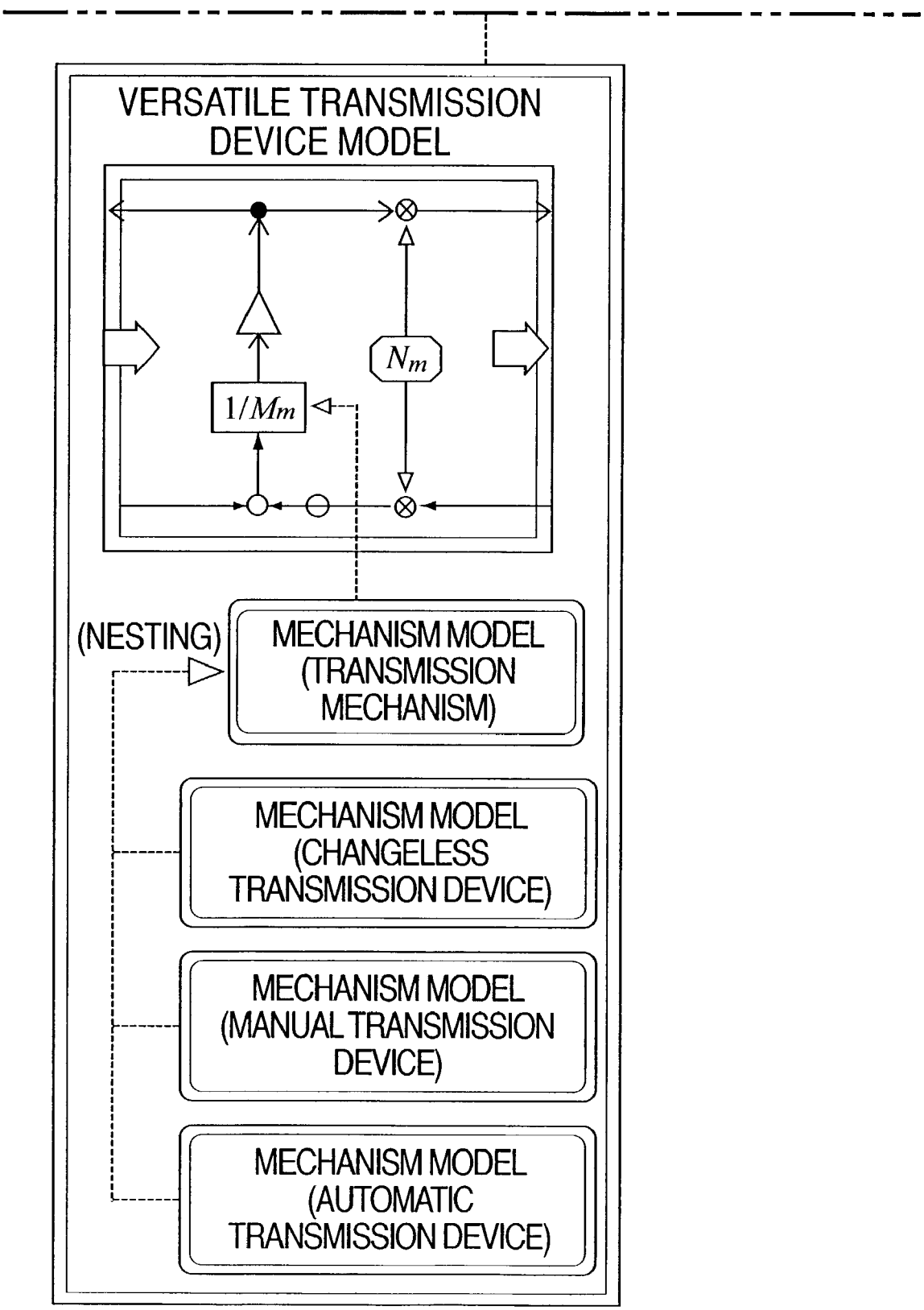
Figure 19C:
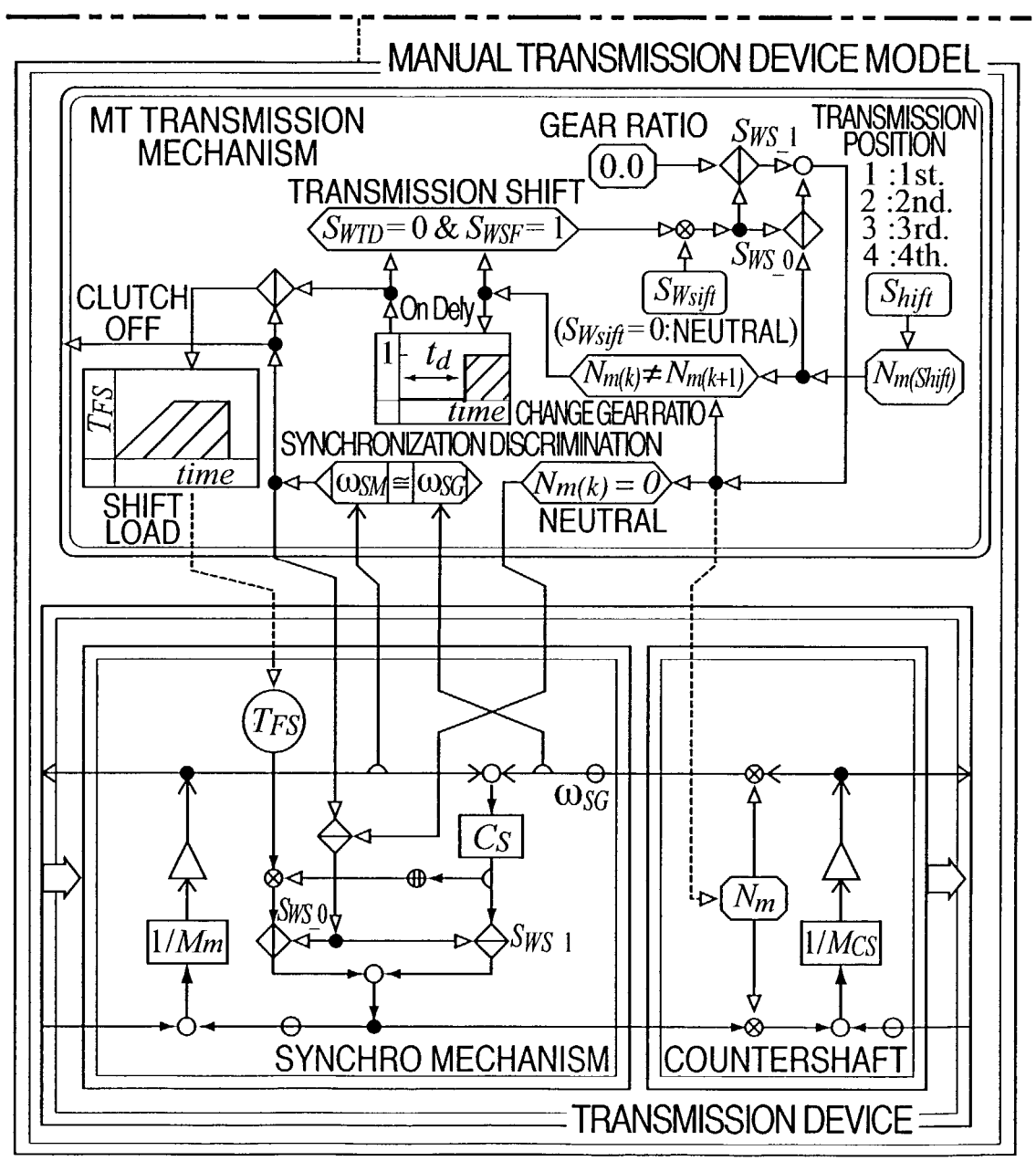

FIG. 19 shows an example in which a versatile transmission device model and manual transmission device model are recombined in a nested structure as a transmission device model in a vehicle model. In a versatile transmission device model shown on the left side in FIG. 19, transmission gear ratios and control methods of transmission devicees with different mechanisms such as a changeless transmission device, manual transmission device, automatic transmission device, and the like can be selected by recombining nesting mechanism models. On the other hand, a manual transmission device model on the right side has a functional model of a synchronization mechanism for switching gears, which has mechanism models of a MT transmission mechanism obtained by modeling the synchronization mechanism. In these functional models, the coefficients of the gear ratios, the characteristics of the synchronization mechanism, and the like are nonlinear, and such nonlinearity is implemented by incorporating mechanism models.

Figure 20:
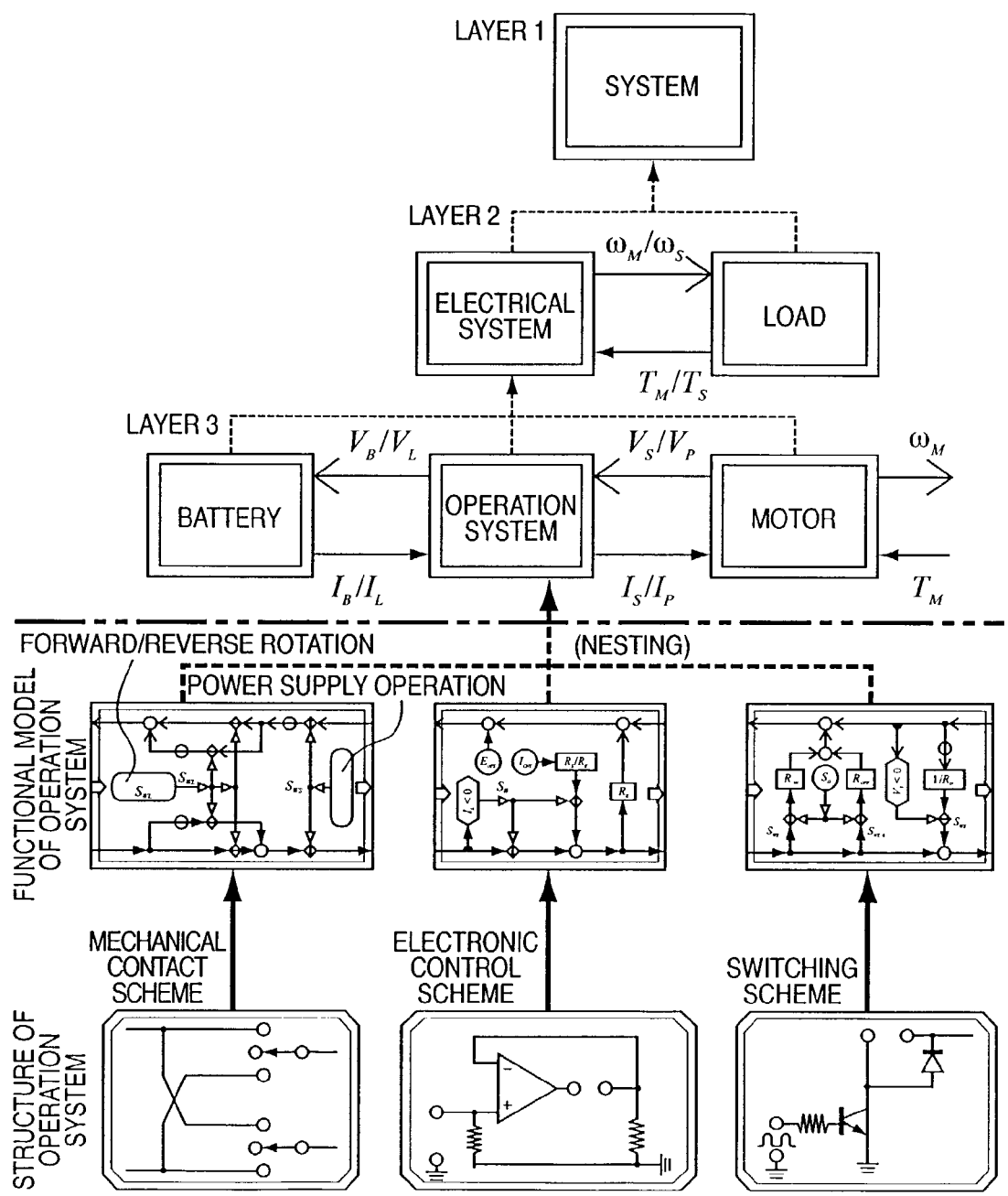
FIG. 20 is a diagram showing an example of the nested structure of a motor operation system model.
Figure 20B:
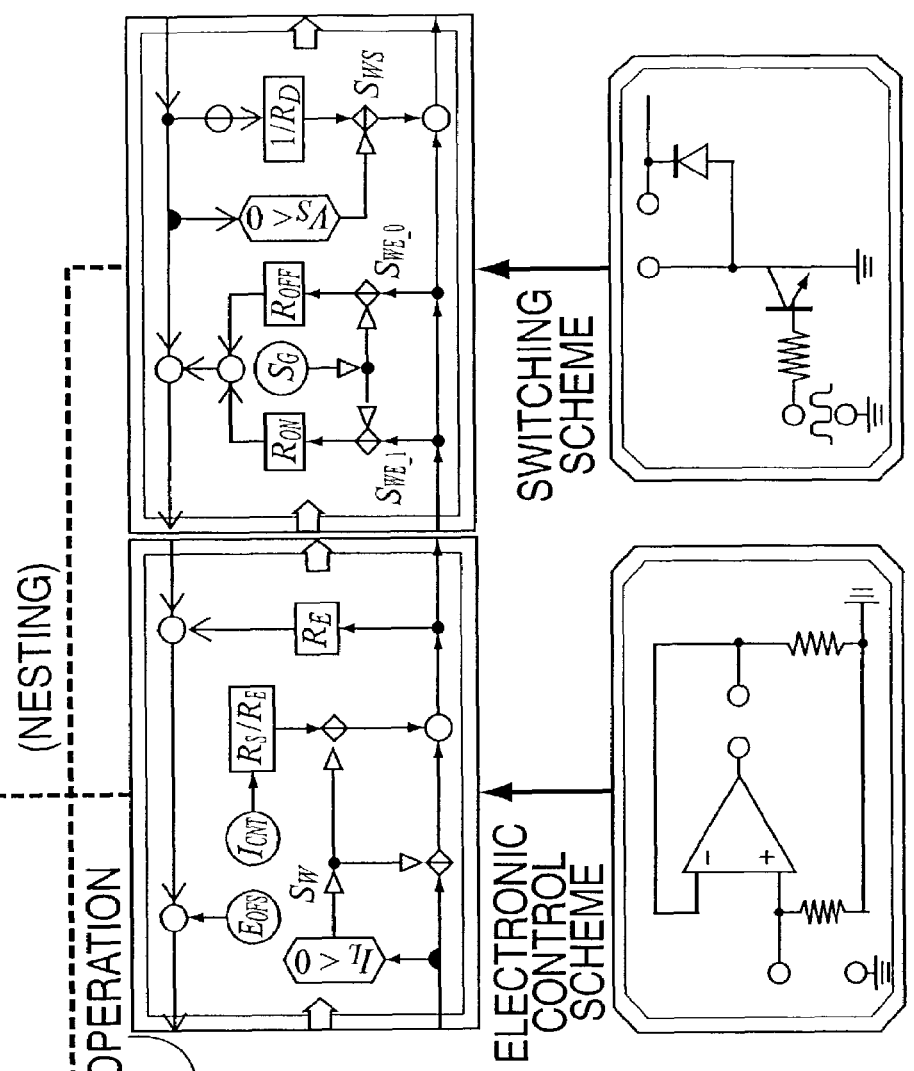

FIG. 20 presented next shows an example wherein operation schemes which operate a motor by a mechanical switch scheme, electronic control scheme, and switching scheme, and all work nonlinearly are recombined using the nested structure of functional models.

<3-4. Identification in Large-scale System>

Since a product and functional components that incorporate many functional components have abstracted equivalent characteristics as their internal characteristics, it becomes difficult to identify the internal characteristics of individual functional components. Such functional components can be identified by integrating the identification results of expanded low-order functional models to a high-order functional model. As for a functional component which can hardly model a functional model, the input and output state variables are measured, and the aforementioned idea of black box can be applied. In this case, an empirical formula modeled by a statistical scheme such as a recursive model is derived from the measured input and output state variables and can be built in.

The equivalent characteristic that identifies a hierarchized high-order functional model and the internal characteristics that identify low-order functional models are required upon clarifying their causality. Especially, when a low-order functional model includes an empirical formula or the like, since the high-order equivalent characteristic is nonlinearized under the influence of the characteristics or state variables of other functional models, such model must be verified.

When a hierarchized functional model group includes a nesting functional model, a functional model which is newly built in the identified functional model group can be identified. In such case, identification can be done by setting the characteristics of the functional model group to be known values, and those of the built-in functional model to be unknown values.

Figure 21:
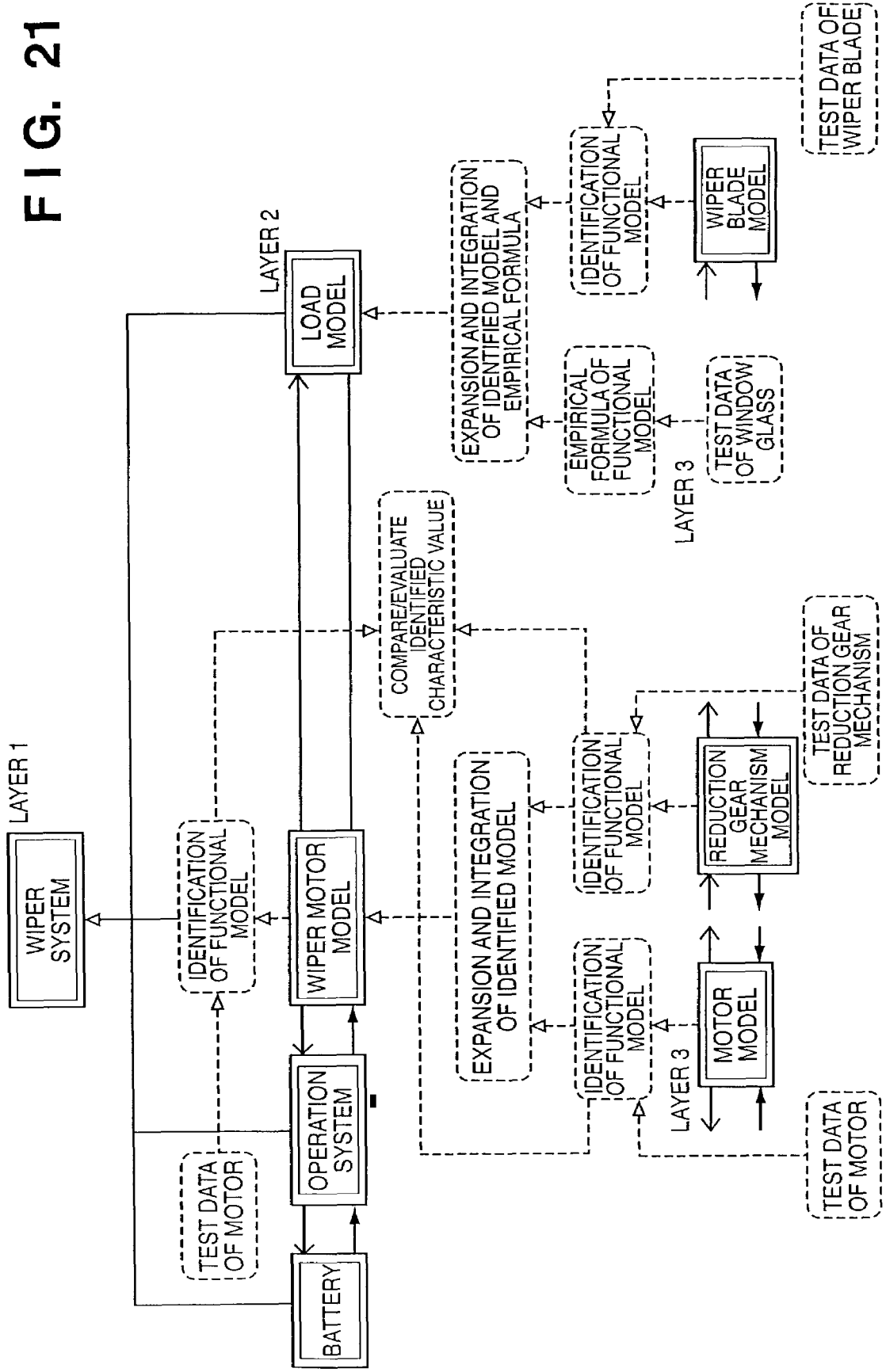
FIG. 21 is a diagram showing the concept of identification of hierarchically structurized functional models according to an embodiment of the present invention.

FIG. 21 shows a method of identifying a functional model group of such hierarchized system. FIG. 21 illustrates an identification method for a rear wiper system in which functional components to be described later are hierarchized.

As will be described in detail later, FIG. 21 shows an example wherein functional models of a motor and reduction gear mechanism that form a wiper motor are identified, and are integrated into a high-order wiper motor model, and an example wherein identified models of an empirical formula of a window glass and a wiper blade are integrated into a high-order load model. In the former example, since the viscous drag coefficient and frictional force of the reduction gear mechanism mainly become nonlinear and are hard to model, the reduction gear mechanism alone and a state wherein the reduction gear mechanism is built in the wiper motor are identified, and identified models are converted into empirical formulas to obtain nesting mechanism models. In the latter example, since the viscous drag coefficient and frictional force of the window glass become nonlinear and are hard to model, they are obtained by empirical formulas as nesting mechanism models. Upon identifying window glasses of different vehicles, since models other than the window glass are known, a functional model (empirical formula) of a partial window glass can be identified from the functional model of the entire rear wiper system by measuring only the wiper torque and angular velocity of an actual vehicle.

<3-5. Concept of Integration Process of Functional Models in This Embodiment>

A complicated product is often prepared by combining functional components that form units for respective functions. Functional components obtained by disassembling the product are considered as a group of functions that form the product in a functional model. That is, in the functional model of the product, since respective components are modeled, components and models have one-to-one correspondence, and component assembly and model assembly can be handled together.

Respective expanded functional models can be integrated to a functionally equivalent high-order functional model. That is, by erasing input state variables (dependent variables) which are the same as output state variables (independent variables) from an input/output equation that forms expanded and structurized governing equations, the structurized governing equations can be integrated into a high-order governing equation equivalent to them. Of course, the governing equations integrated into the high-order equation can simulate equivalent functional models by means of state variables, characteristics, and coefficients on the basis of the same concepts as in the low-order equations, and can also be expressed by state, input/output, and observation equations as in the low-order equations. On the other hand, the characteristics and coefficients that form the integrated high-order functional model inherit mechanism models that non-linearize them from the low-order to the high-order, thus guaranteeing simulation of nonlinearity of the system after integration. By repeating expansion of the integrated functional model to high-order layers, a large-scale product that includes nonlinearity can be modeled.

Figure 22:
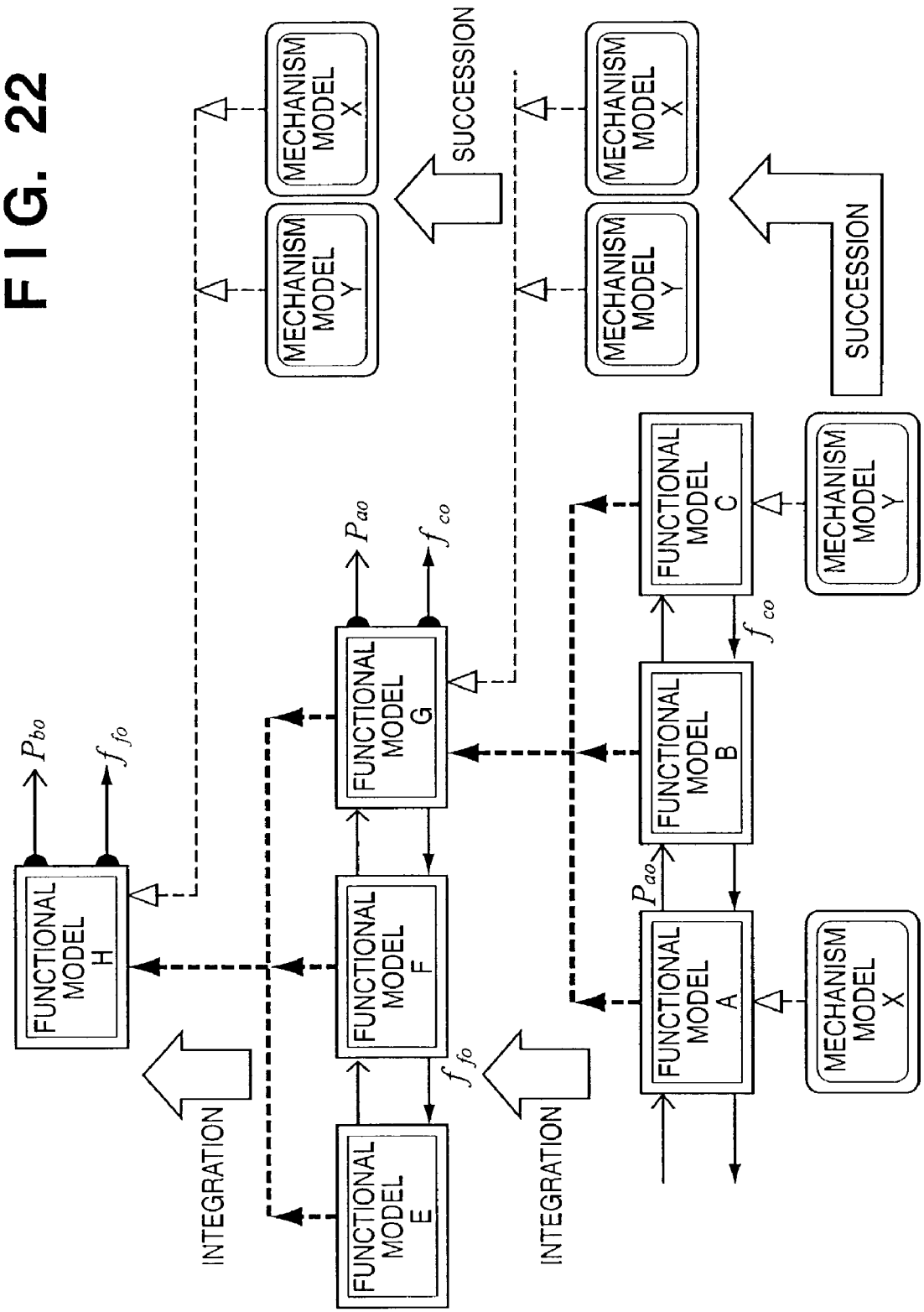
FIG. 22 is a diagram showing the concept of hierarchization of functional models according to an embodiment of the present invention.

FIG. 22 shows the concept of functional models hierarchized by integration. As shown in FIG. 22, expanded functional models A, B, and C are integrated into high-order functional model D, and inherit mechanism models X and Y to be built in functional model D. A potential variable $P_{ao}$ and flow variable $f_{co}$ hidden during this integration process are output as observation variables of functional model D. Functional model D is further expanded to functional models E and F, is integrated into functional model H, and inherits mechanism models X and Y. Highest-order functional model H has no input/output state variables (pair of potential and flow variables) that connect other functional models. A potential variable $P_{ao}$ and flow variable $f_{fo}$ output from functional model H are observation variables. Hence, their governing equations are defined by state and observation equations.

4. Concept of Expansion and Integration Processes of Functional Model

<4-1. Basic Concept>

Figure 23:
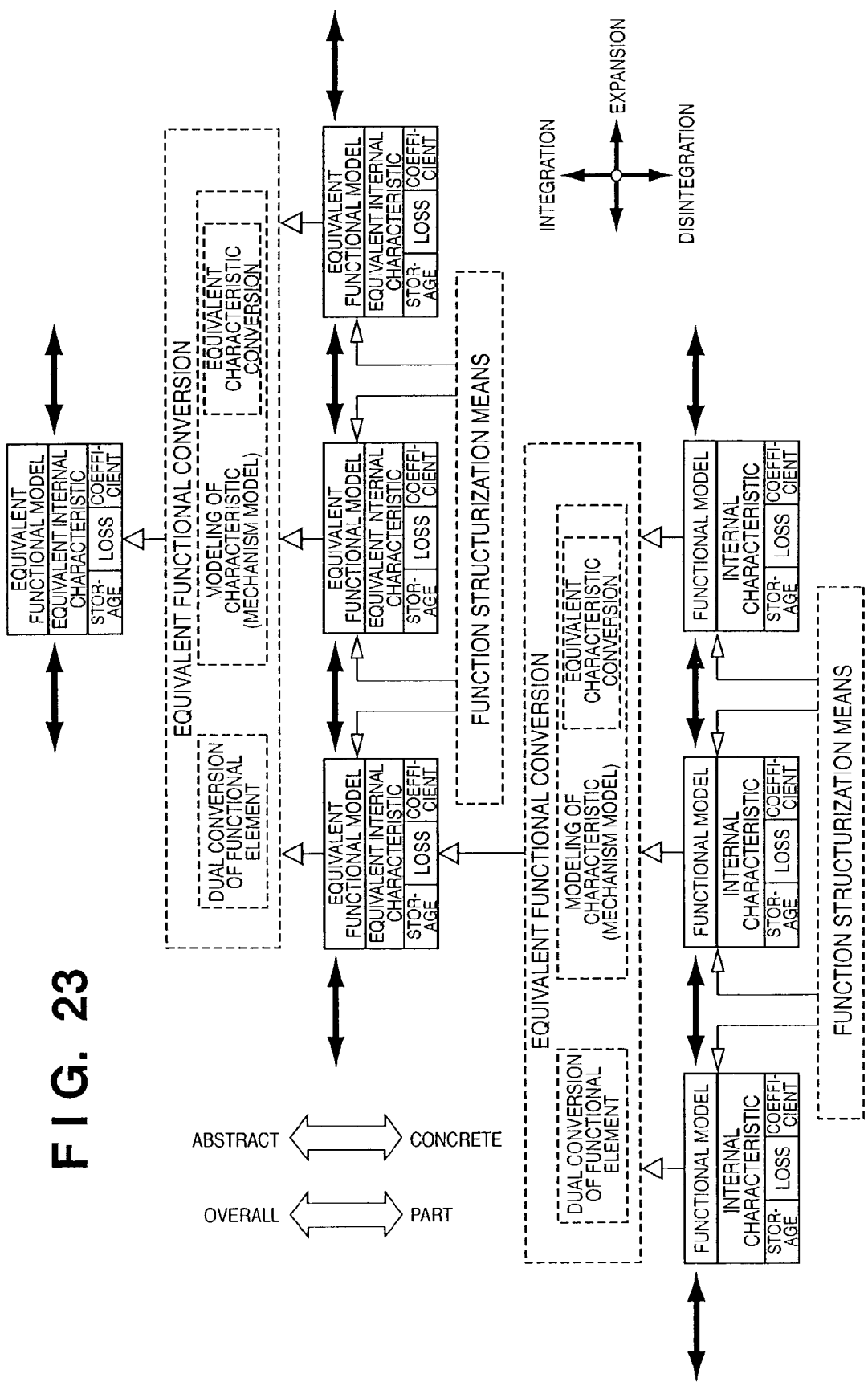
FIG. 23 is a diagram showing the basic concept of expansion•integration of functional models according to an embodiment of the present invention.
Figure 24:
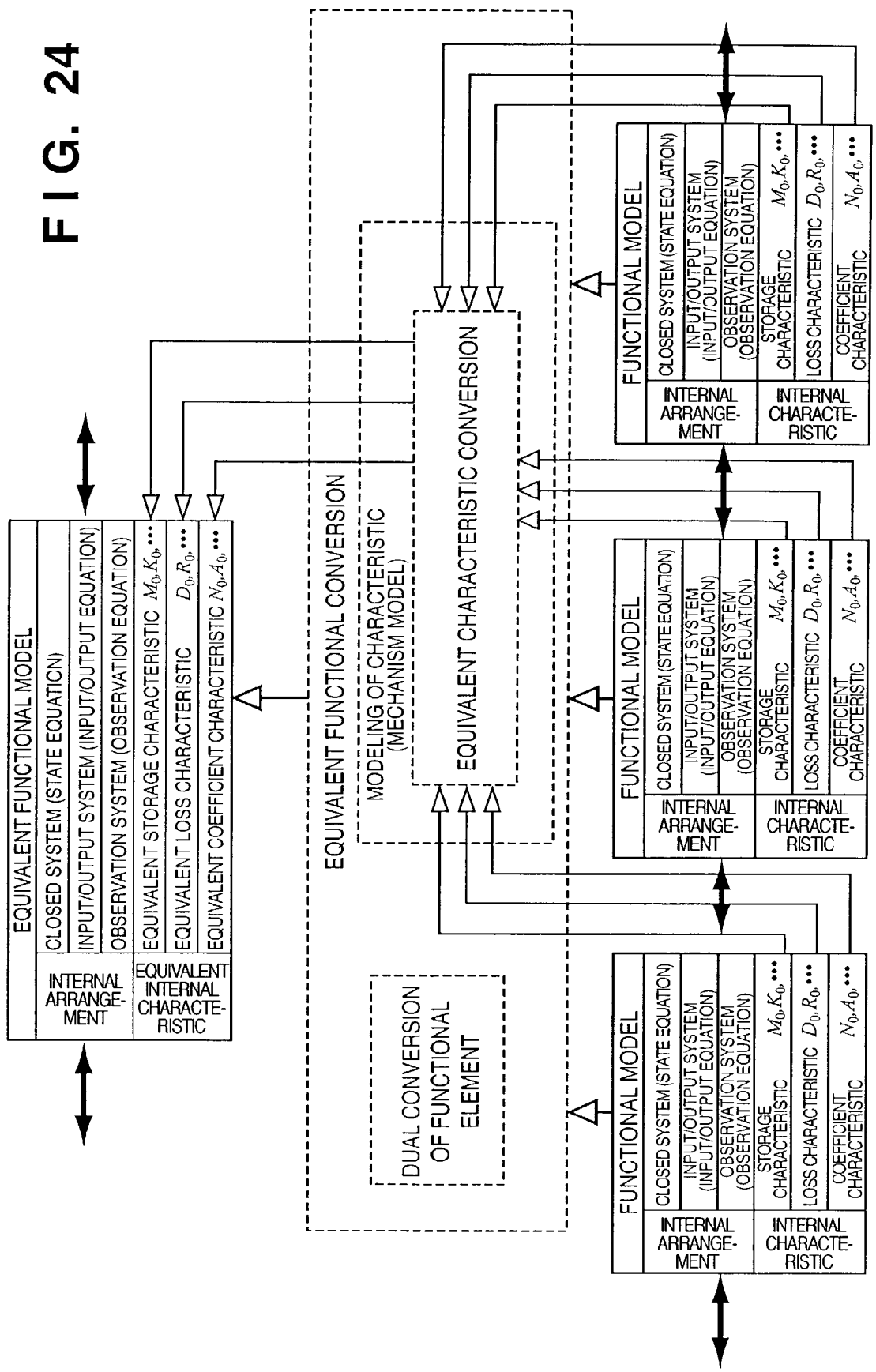
FIG. 24 is a diagram showing the concept of expansion•integration of internal characteristics according to an embodiment of the present invention.

In order to systemize functional models classified into linear models in the configuration concept of the hierarchical structure, the concepts of expansion and integration shown in FIGS. 23 and 24 are required.

FIG. 23 shows the overall image of a method of structurizing functional models by expanding functional models of low-order layers by function structurization means, and hierarchizing the functional models while converting the structurized functional models into equivalent functional models of high-order layers in turn by equivalent function conversion means. The contents of FIG. 23 are as follows.

Functional models and equivalent functional models indicated by solid frames include storage characteristics (equivalent), loss characteristics (equivalent), and coefficient characteristics (equivalent) as their internal characteristics (equivalent).

Dotted frames indicate function structurization means and equivalent function conversion means. The equivalent function conversion means includes dual conversion means, characteristic modeling means, and equivalent characteristic conversion means.

Solid bold arrows indicate state variable groups that connect between functional models, and open arrows indicate the relationships among functional models, functional structurization means, and equivalent function conversion means.

FIG. 24 shows a process for building the internal characteristics of low-order functional models into an equivalent internal characteristic included in a high-order equivalent functional model together by the characteristic modeling means in the equivalent function conversion means. In FIG. 24, thin open arrows indicate the conversion flows of storage, loss, and coefficient characteristics, and other symbols are the same as those in FIG. 23. Characteristics with suffix 0 in FIG. 24 indicate equivalent internal characteristics integrated into the high-order equivalent functional model, and suffices 1 to 3 indicate internal characteristics of low-order functional models.

<4-2. Expansion Process (Structurization)>

(4-2-1. One-to-one Duality Coupling)

Figure 25:
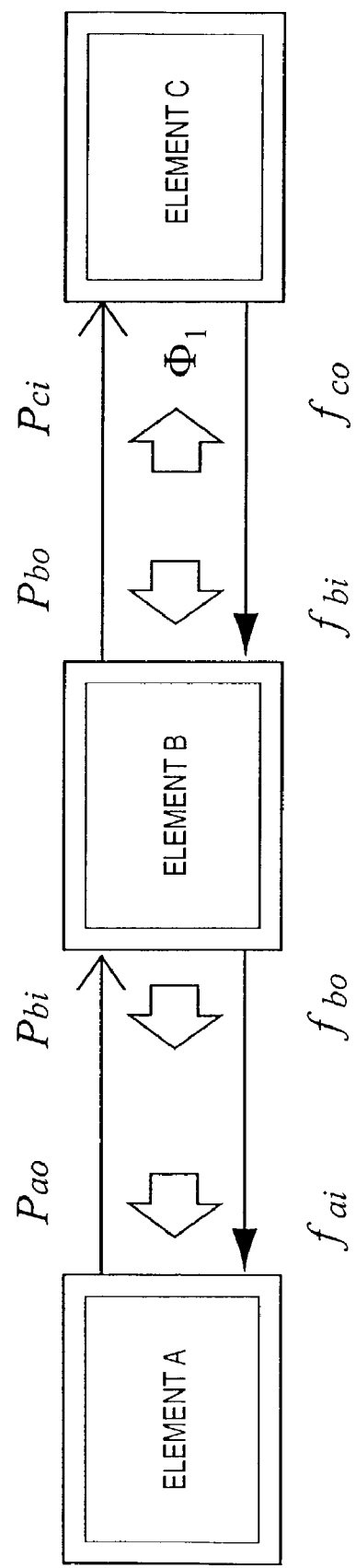
FIG. 25 is a diagram showing the concept of one-to-one duality coupling according to an embodiment of the present invention.

One-to-one coupling as the basis of structurization is done as follows. In FIG. 25, output potential variable $P_{ao}$ of element A is coupled to input potential variable $P_{bi}$ of element B, and output flow variable $f_{bo}$ of element B is coupled to input flow variable $f_{ai}$ of element A. Likewise, elements B and C are coupled via potential variables $P_{ao}$ and $P_{bi}$ and flow variables $f_{bo}$ and $f_{ai}$, and these coupled elements exchange the product of potential and flow variables as energy via a coefficient element assuming a value "1". In expansion of functional models, direct coupling of the pairs of potential and flow variables is called duality coupling. The duality coupling is achieved by substituting the input state variable (name) of a coupling destination model by the output state variable (name) of a coupling source model. As a matter of course, the coupled input and output state variable names may be re-set to have new names which do not exist in the entire system that is to undergo expansion and integration.

Upon coupling via a coefficient element that assumes a value other than 1, an equation of the product of an output state variable name and coefficient element name is substituted by an input state variable name. As another method, a column of a governing equation corresponding to the input state variable (dependent variable) to be coupled may be multiplied by a coefficient.

Figure 26:
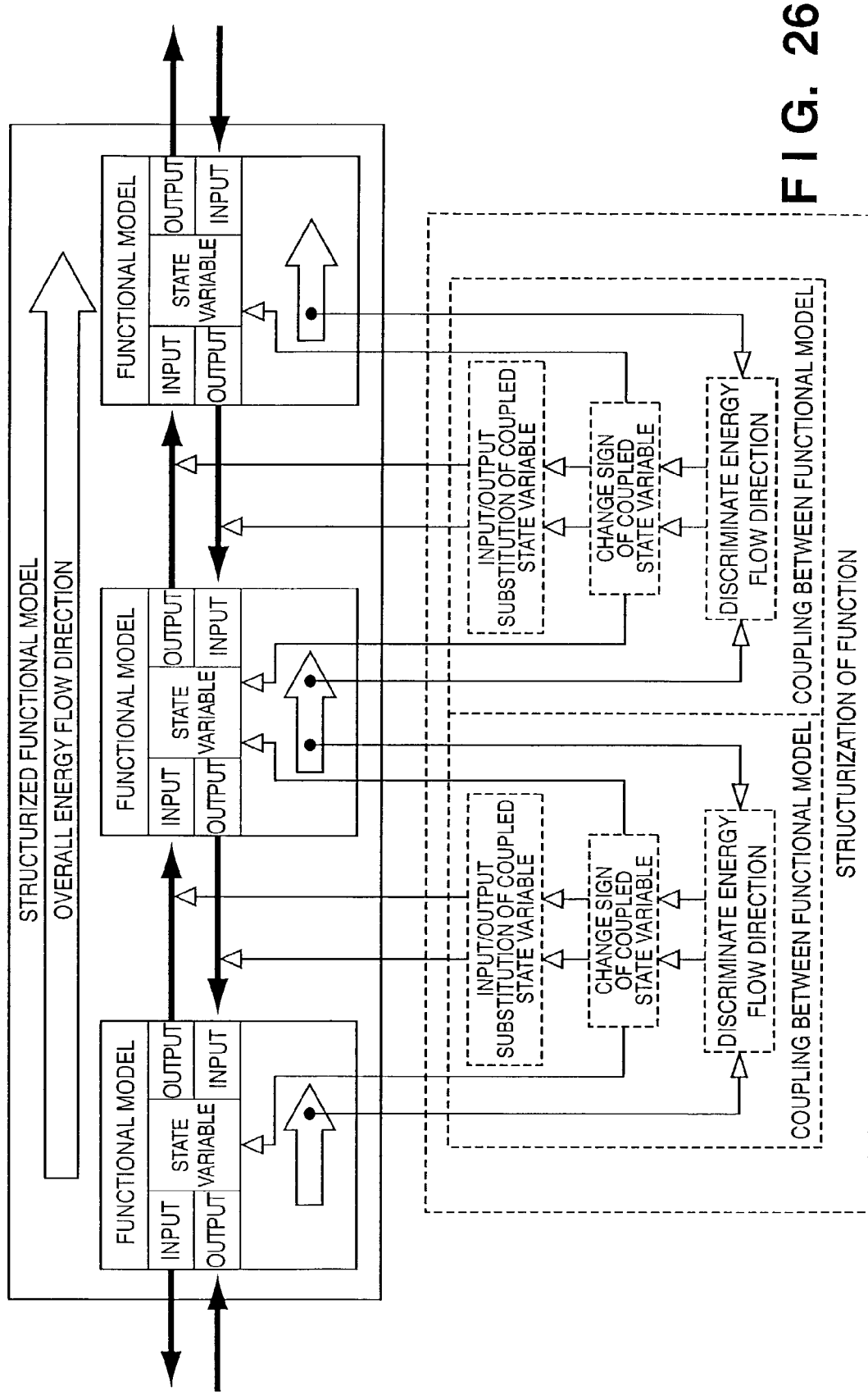
FIG. 26 is a diagram showing the concept of sign conversion of coupled state variables according to an embodiment of the present invention.

FIG. 26 shows the concept of the flow of processing for expanding and structurizing functional models by one-to-one duality coupling. In FIG. 26, open arrows indicate the flow directions of energy, and bold, solid arrows indicate state variables that couple between functional models. The flow direction of energy is checked based on a thin open arrow to convert the sign of state variables of each functional model. The flow directions of energy of respective expanded functional models are matched, and input state variables (variables) are substituted by output state variables (variables).

(4-2-2. One-to-many Duality Coupling)

Figure 27:
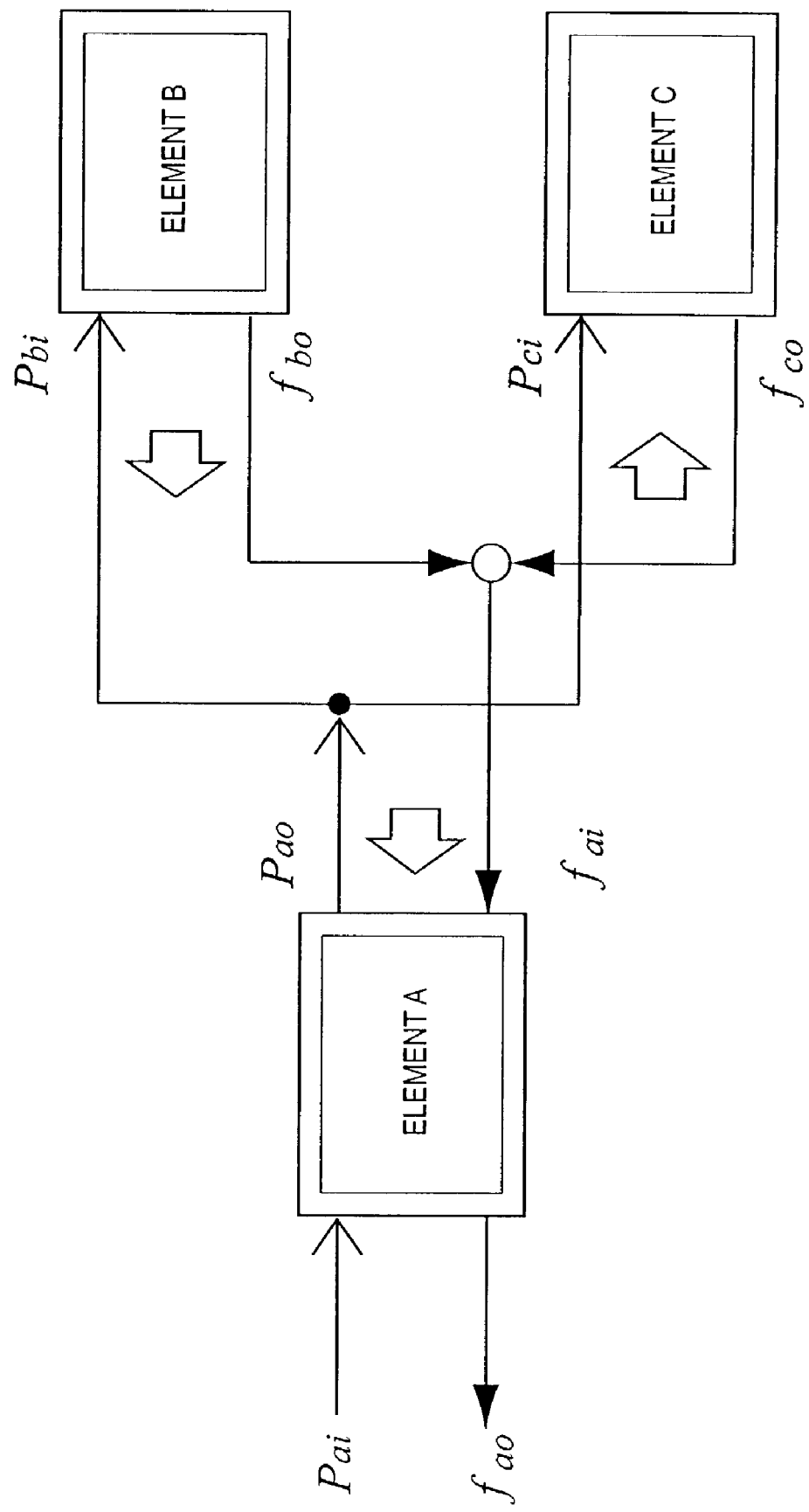
FIG. 27 is a diagram showing one-to-many distribution•addition coupling according to an embodiment of the present invention.

Two or more elements are coupled via a distribution element which allows one element to distribute energy to a plurality of elements, and allows the plurality of elements that received energy to return integrated energy to one element, thus meeting the duality of energy. The coupling method which satisfies this requires the concepts of merge and distribution of energy, which couple the pairs of potential and flow variables via distribution and addition elements. FIG. 27 shows an example wherein merge and distribution are made among three elements.

Elements shown in FIG. 27 exchange the products of pairs, i.e., $P_{ao} \cdot f_{ai}$, $f_{bo} \cdot P_{bi}$, and $f_{co} \cdot P_{ci}$ as energy. In the coupling method shown in FIG. 27, an output potential variable Pao of element A is coupled to inputs $P_{bi}$ and $P_{ci}$ of elements B and C via a distribution symbol and, conversely, output flow variables $f_{bo}$ and $f_{co}$ of elements B and C are added by an addition symbol and the sum is given to input $f_{ai}$ of element A. This means that energy $P_{ai} \cdot f_{ai}$ of element A is distributed to elements B and C by a potential variable, and energies of elements B and C are returned to element A by a flow variable via addition $P_{ai}(f_{ao}+f_{co})$. In this case, the former is called distribution coupling, and the latter is called addition coupling. The following processes are done to expand the coupled elements, thus converting one-to-many coupling into duality coupling.

① In distribution coupling, input state variables (names) of coupling destination models to which energy is to be distributed are substituted by an output state variable (name) of a coupling source model.

② In addition coupling, output state variables (names) to be added of coupling source models are substituted by an input state variable (name) of a coupling destination model.

③ In addition, input and output state variable names which are distribution- and addition-coupled may be re-set to be new state variable names which do not exist in the entire system which is to undergo expansion and integration.

With this conversion, dependent and independent variable names of identical variable names are generated in a single equation that includes, as a matrix, a group of governing equations of respective elements, and identical variable names correspond to state variables connected by expansion.

In one-to-many coupling set with identical input and output state variables (names) of distribution- or addition-coupling between functional models, input and output state variables of the governing equation must be model-converted to have a one-to-one duality coupling relationship. In a conversion method from one-to-many to one-to-one, since dependent and independent variables of an input/output equation correspond to those on a functional model, addition of the next row and column can achieve conversion into a duality coupling state. Details will be explained later in the paragraphs of arithmetic processes.

① One-to-many distribution adds respective column vectors of a governing equation corresponding to an output state variable (input state variable of a functional model) at a distribution point to obtain one column of vectors.

② One-to-many addition adds row vectors of a governing equation corresponding to an input state variable (output state variable of a functional model) at an addition point to obtain one row of vectors.

This conversion from one-to-many into one-to-one means addition of input/output equations (rows) corresponding to identical variable names included in dependent variables on a single governing equation, and also addition of columns corresponding to identical variable names included in independent variables. With this conversion, a group of governing equations expressed by a one-to-many coupling relationship can be handled as one-to-one duality-coupled governing equations.

Figure 28:
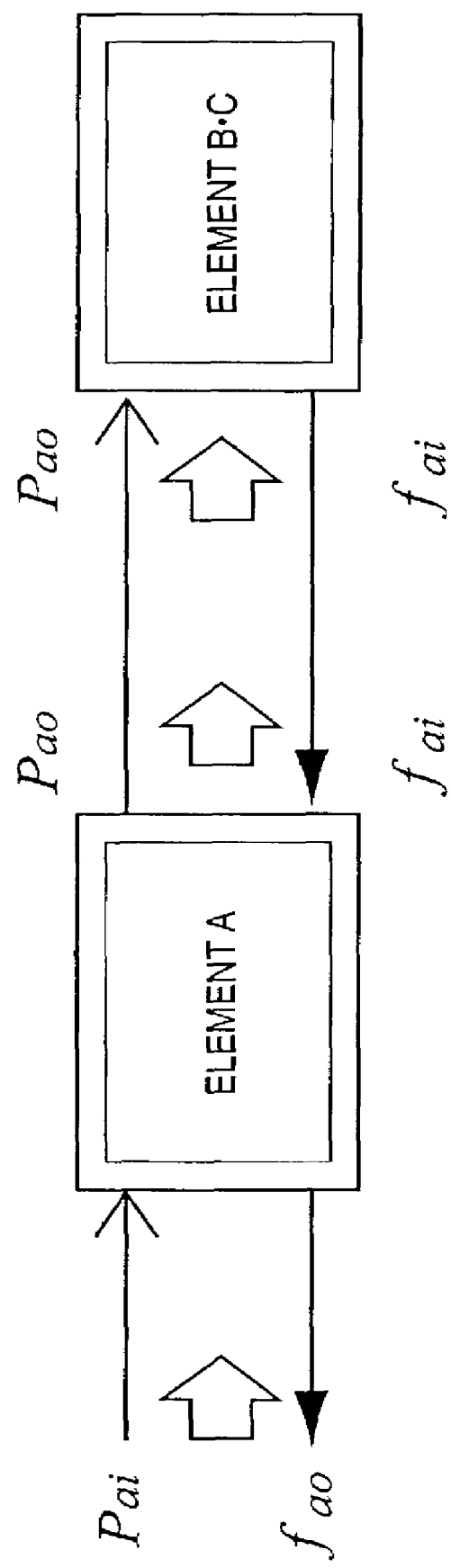
FIG. 28 is a diagram showing the concept of conversion from one-to-many to one-to-one according to an embodiment of the present invention.

The aforementioned conversion can be examined on a functional model as follows. The functional model that includes distribution- and addition-coupled elements shown in FIG. 27 is converted into a functional model in FIG. 28 in which element BC obtained by integrating elements B and C, and element A are duality-connected, by erasing branch and addition points from the model.

(4-2-3. Sign Conversion in Functional Model)

Upon expansion by coupling between elements by duality or one-to-many coupling, connections must be done after the energy flow direction of the entire system after expansion are matched with those defined for respective functional models. In order to match the flow directions, the signs of state variables of respective functional models must be set so that state variables in a direction agreeing with the energy flow of the entire system have a positive sign, and state variables in the opposite direction have a negative sign. To this end, state variables in elements to be expanded are sign-converted in correspondence with the energy flow direction before connection. Note that the relationship between energy and the flow directions of state variables will be explained later in the paragraphs of dual conversion of functional elements.

Upon expansion of functional models, state variables in functional models to be connected undergo sign conversion according to the following rules. Since the flow of energy of a functional model has duality, an energy flow that flows from one to the other of the entire expanded system is assumed, and is defined to be a positive direction for the flow of energy of the entire system. Sign conversion of functional models to be coupled is done in the following sequence.

(1) An element in the same direction as the entire energy flow.

An element in the same direction as the assumed energy flow does not undergo sign conversion.

(2) An element in a direction opposite to the entire energy flow.

A state variable that goes against the entire energy flow with respect to the addition symbol in an element is set to have a positive sign.

Figure 29:
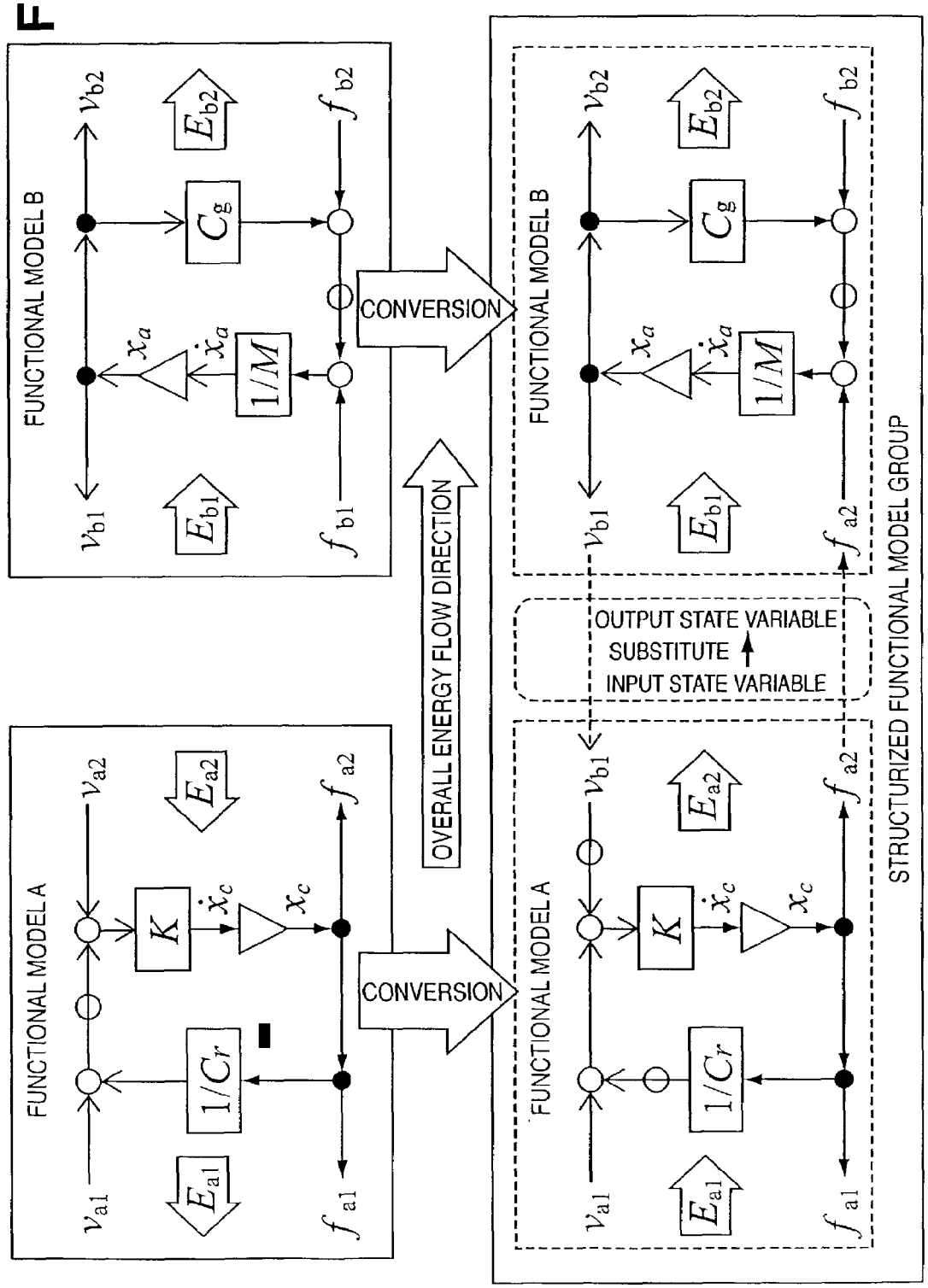
FIG. 29 is a diagram showing the concept of a sign conversion method of functional models according to an embodiment of the present invention.

FIG. 29 shows an example wherein the aforementioned sign conversion is applied to duality coupling. The upper side in FIG. 29 shows a state before functional model A with a flow opposite to the entire energy flow, and functional model B with a flow agreeing with the entire energy flow are coupled. The lower side in FIG. 29 shows an example wherein the sign of a state variable which goes against an addition symbol in functional model with the opposite energy flow direction is changed to a negative sign, functional model B with the same energy flow direction does not undergo sign conversion, and the functional models are connected and expanded. The two functional models are expanded by substituting input state variable $V_{a2}$ of functional model A by output state variable $V_{b1}$ of functional model B, and input state variable $f_{b1}$ of functional model B by input state variable $f_{a2}$ of functional model A.

<4-3. Integration Process>

As shown in FIG. 29, expanded functional elements can be connected to each other. In this connection, functional elements of different physical systems are connected via the aforementioned coefficient element in addition to the aforementioned sign conversion and substitution of signal names. In this case, since respective functional models have been standardized to a form shown in FIG. 2, they are connected to generate one new functional model. Mechanism models (nonlinearity) that provide characteristic values to the functional models before connection are directly delivered to the new functional model.

The new functional model after connection is simplified mainly in the following two procedures.

(1) A functional element which can be ignored in the new functional model, i.e., an element which has nearly no influence on the entire operation, is deleted.

(2) The new functional model is arranged to be expressed by state equations, and input/output equations, and are substituted by integrated, simple elements.

These procedures will be described in more detail later in equivalent conversion to be described below or a conversion example of a matrix equation, or detailed integration examples (an example of a wiper system, an example of an automotive vehicle).

<4-4. Equivalent Conversion Process>

The characteristics and coefficients in a group of low-order functional models are equivalently converted into internal characteristics of a high-order functional model abstracted by expansion and integration, as described above. This equivalent conversion uses different conversion methods depending on different loss characteristics, storage characteristics, and coefficient natures, and series- or parallel-connection of characteristics in an actual structure. In this embodiment, equivalent conversion of characteristics and coefficients by integration will be explained.

Principal usage of equivalent conversion to be described below is to convert a functional model into a model in which characteristics are equivalently converted and arranged into those which are significant in terms of physics and engineering before expansion and integration, and to arrange the internal characteristics of an integrated high-order functional model into an abstracted equivalent characteristic which is significant in terms of physics and engineering.

(4-4-1. Dual Conversion)

A functional model includes characteristics such as a mass, rigidity, viscous drag, and the like that simulate functions. The functional model incorporates minimum units that associate these functions with characteristics as functional elements. In expansion that connects functional models to each other, when the energy flows of functional models and the entire system are matched, the internal functions of each functional model must be changed by, e.g., low-order conversion that lowers the order of a system (functional mode) by omitting unnecessary rigidity and mass, and the like. Conversion of functional elements in a functional model will be examined below.

The aforementioned dual conversion that inverts the directions of a pair of state variables involves sign conversion since the input/output directions of state variables change. Sign conversion of functional elements cannot ignore the relationship between energy and state variables (pairs). In this embodiment, such relationship is clarified by dual-converting principal functional elements. A pair of state variables are dual converted according to the following rules.

1. No negative sign is assigned to input and output state variables on the distribution symbol side. In distribution coupling, since all state variables become equivalent, sign inversion cannot be done.

2. A negative sign can be assigned to input and output state variables on the addition symbol side. Since addition coupling balances by adding all state variables, input and output state variables are matched by sign inversion.

These rules mean that only one state variable can undergo sign inversion since a pair of state variables undergo dual conversion (sign inversion of both variables of a pair results in undoing).

(1) Dual Conversion of Storage Characteristic

Figure 30:
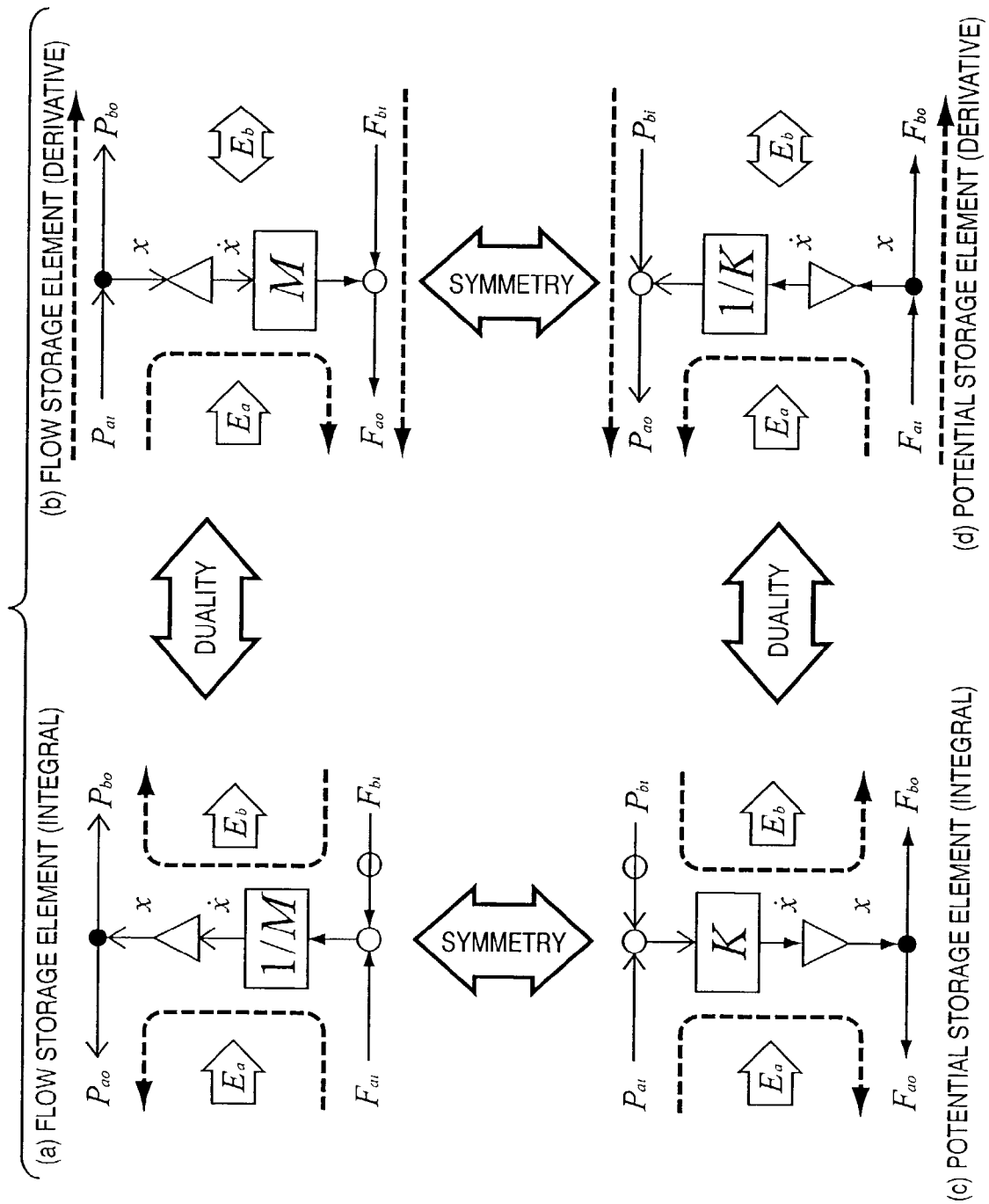
FIG. 30 is a diagram showing a dual conversion example of storage elements.

FIG. 30 shows the relationship when storage elements undergo dual conversion (symmetric conversion).

In FIG. 30, left elements indicate storage elements of an integral type, right elements indicate functional elements of a derivative type, upper elements indicate flow storage elements such as rigidity, electrical capacitance, and the like, and lower elements indicate potential storage elements such as rigidity, inductance, and the like.

(2) Dual Conversion of Transfer and Loss Elements

Figure 31:
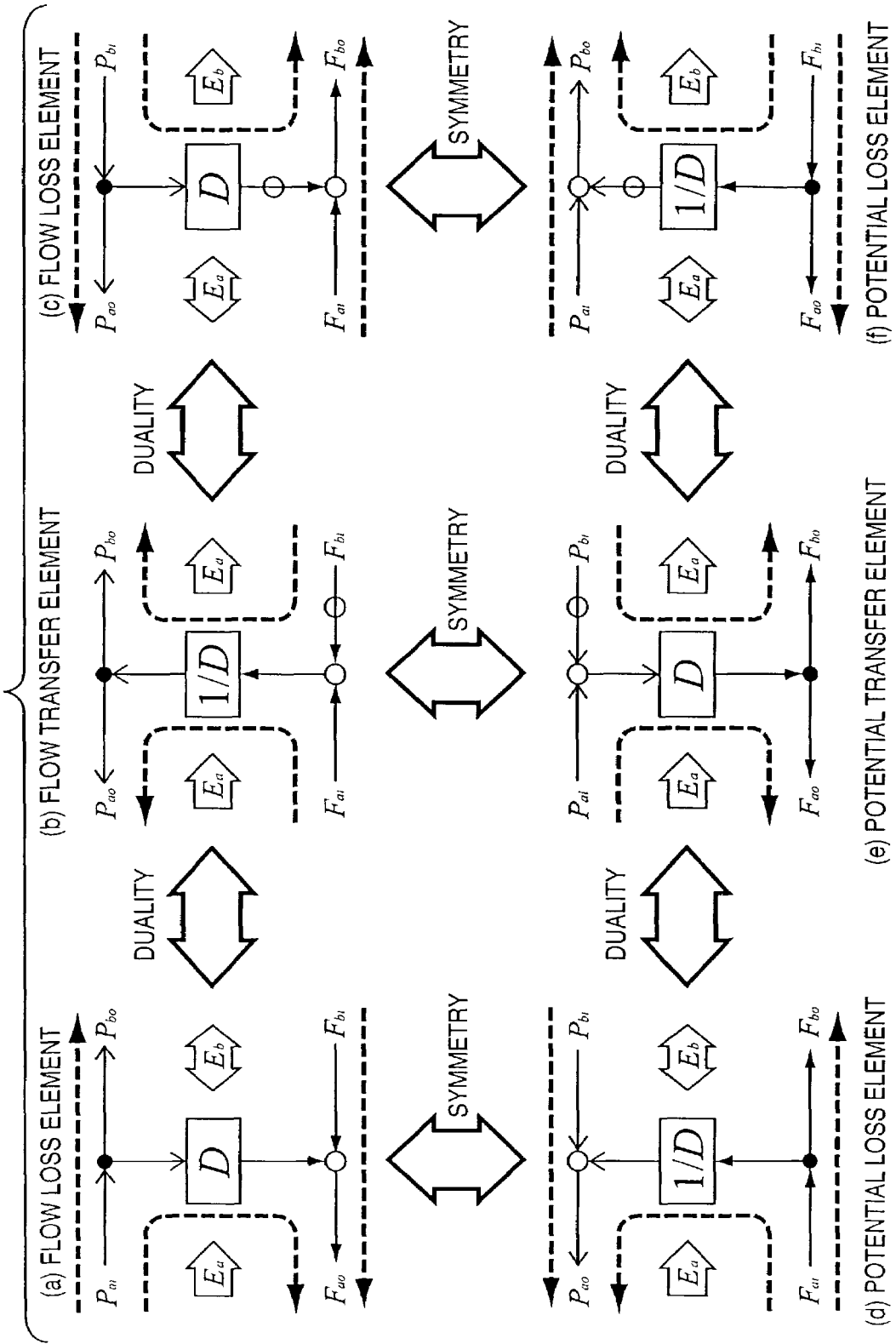
FIG. 31 is a diagram showing a dual conversion example of transfer•loss elements.

FIG. 31 shows the relationship when transfer and loss elements undergo dual conversion (symmetric conversion).

In FIG. 31, central elements are transfer elements, right elements are loss elements, and left elements are loss elements that supply supplied energy as a negative loss. Upper elements are flow transfer and loss elements, and lower elements are potential transfer and loss elements.

(3) Dual Conversion of Supply and Load Elements

Functional elements include single-function functional elements that supply or consume energy with respect to those having two pairs of input and output state variables. These elements can be expressed as functional elements obtained by erasing one pair of state variables from the storage elements in FIG. 30 or loss elements in FIG. 31. Upon erasing the pair of state variables, an output state variable is erased, and an input state variable is defined as a side load that generates a state variable inside an element. Of these functional elements, supply elements correspond to a battery, torque generation source, pressure source, and the like, and load elements correspond to their consumption sources.

Figure 32:
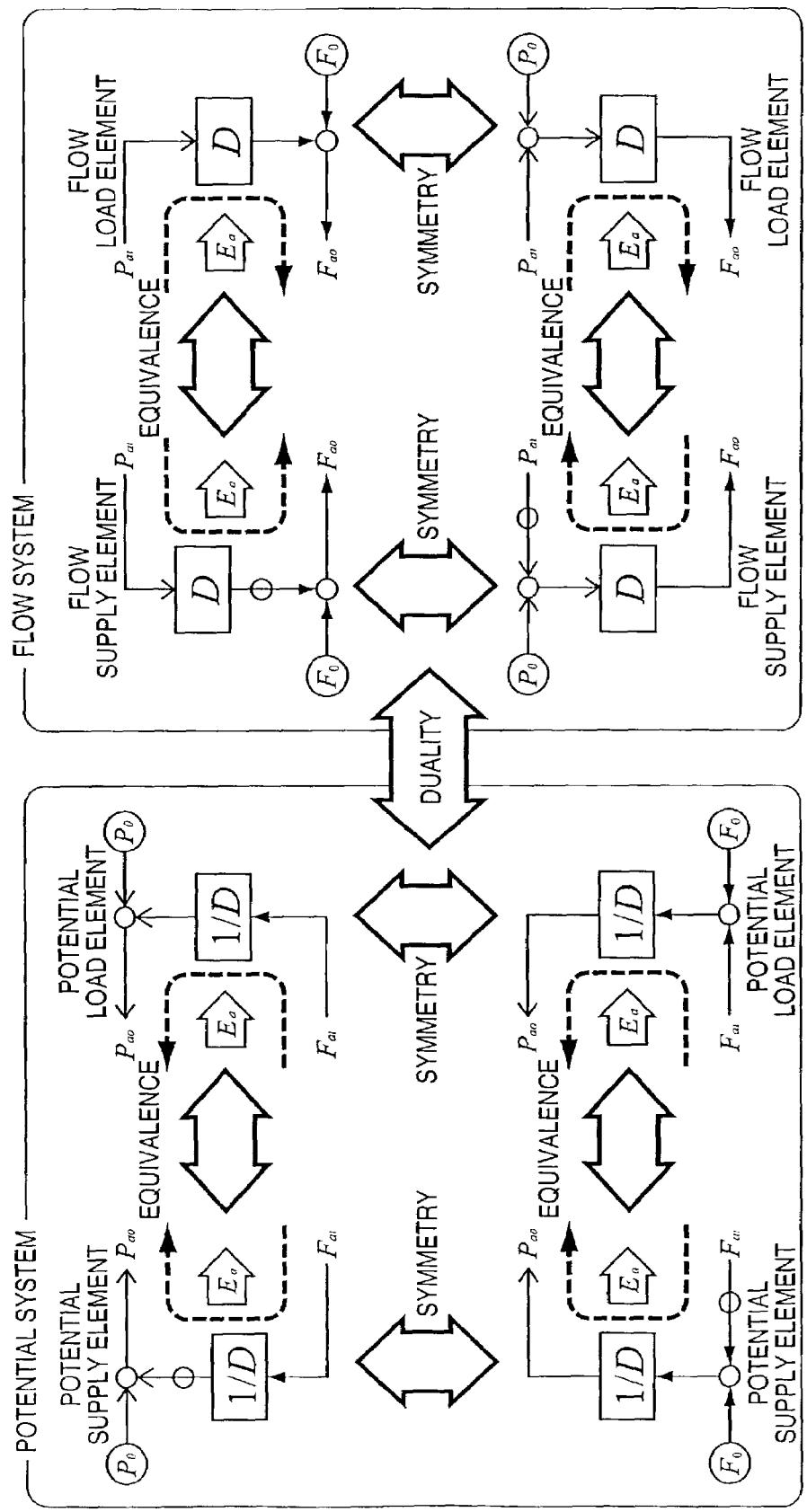
FIG. 32 is a diagram showing a dual conversion example of supply•load elements.

FIG. 32 shows dual conversion of the supply and load elements.

In the left frame (the flow system) in FIG. 32, left elements are supply elements, right elements are load elements, upper elements are those which incorporate potential side loads, and lower elements are those which incorporate flow side loads. On the other hand, elements in the right frame (the potential system) in FIG. 32 are supply and load elements vertically symmetrical to those in the left frame.

(4-4-2. Equivalent Conversion)

(1) Equivalent Conversion of Loss Characteristic

A connection state in which loss characteristics in a functional model are added on the potential variable side (distribution on the flow variable side) corresponds to series connection in an actual structure shape. Likewise, addition on the flow variable side (distribution on the potential variable side) corresponds to parallel connection. Upper models in FIG. 33 correspond to such functional models. In these models, loss characteristics $D_1$ and $D_2$ are connected via coefficient N, and series connection is obtained when coefficient N has a value "1". For example, when coefficient N in FIG. 33 is set at "1", addition coupling on the potential variable side in the right model corresponds to series connection of electrical resistances $D_1$ and $D_2$, through which identical currents flow to add voltage drops. Also, addition coupling of flow variables in the right model in FIG. 33 corresponds to parallel connection of electrical resistances $D_1$ and $D_2$, to which identical voltages are applied to add currents (note that electrical resistances $D_1$ and $D_2$ indicate admittances expressed by the reciprocals of general resistances).

Lower models in FIG. 33 are examples wherein loss characteristic $D_1$ integrates $D_2$ to be equivalently converted into an equivalent loss characteristic $D_0$. Equations and equivalent loss characteristic $D_0$ of the equivalently converted models are respectively given by:

$$P_{bo} = \frac{1}{D_0} N^2 F_{bi} + N P_{ai}$$
$$F_{ao} = N F_{bi}$$
$$D_0 = \frac{1}{\frac{1}{D_1} + \frac{1}{N^2 D_2}}$$
(EQ20)

$$P_{bo} = N P_{ai}$$
$$F_{ao} = D_0 P_{ai} + N F_{bi}$$
$$D_0 = D_1 + N^2 D_2$$
(EQ21)

Of these equations, EQ20 describes the left equivalent conversion in FIG. 33, and EQ21 describes right equivalent conversion. As can be seen from these equations, the square of coefficient N influences loss characteristic $D_2$ side to be integrated. On the other hand, when loss characteristic $D_2$ integrate $D_1$, the square of coefficient N influences loss characteristic $D_1$ side.

(2) Equivalent Conversion of Storage Characteristic

When functional models are expanded while erasing unnecessary rigidity and the like, distribution coupling and addition coupling of derivative state variables are generated on models. They can be converted into one equivalent storage characteristic by integrating storage characteristics. This means low-order conversion that integrates a plurality of derivative variables into one derivative variable. Note that a coefficient element that couples between storage elements is set at 1 that indicates series connection, and the relationship between the storage characteristics and coefficients when the coefficient assumes a value other than "1" is the same as that in equivalent conversion of loss characteristics mentioned above.

This equivalent model conversion of storage characteristics must consider the relationship between series and parallel connections on an actual structure, and the storage characteristics on functional models.

① Couple potential storage characteristic functions in parallel:

Structurally series-connected moments of inertia, parallel-connected electrical capacitances, and the like are considered as functionally parallel-coupled (connected) potential storage characteristics.

② Couple flow storage characteristic functions in series:

Structurally parallel-connected spring stiffnesses, series-connected inductances, or the like are considered as functionally series-coupled (connected) flow storage characteristics.

③ Couple potential storage characteristic functions in series:

Structurally parallel-connected moments of inertia, structurally series-connected electrical capacitances, or the like are considered as functionally series-coupled (connected) potential storage characteristics.

④ Couple flow storage characteristic functions in parallel:

Structurally series-connected spring stiffnesses, parallel-connected inductances, or the like are considered as functionally parallel-coupled (connected) flow storage characteristics.

Figure 34:
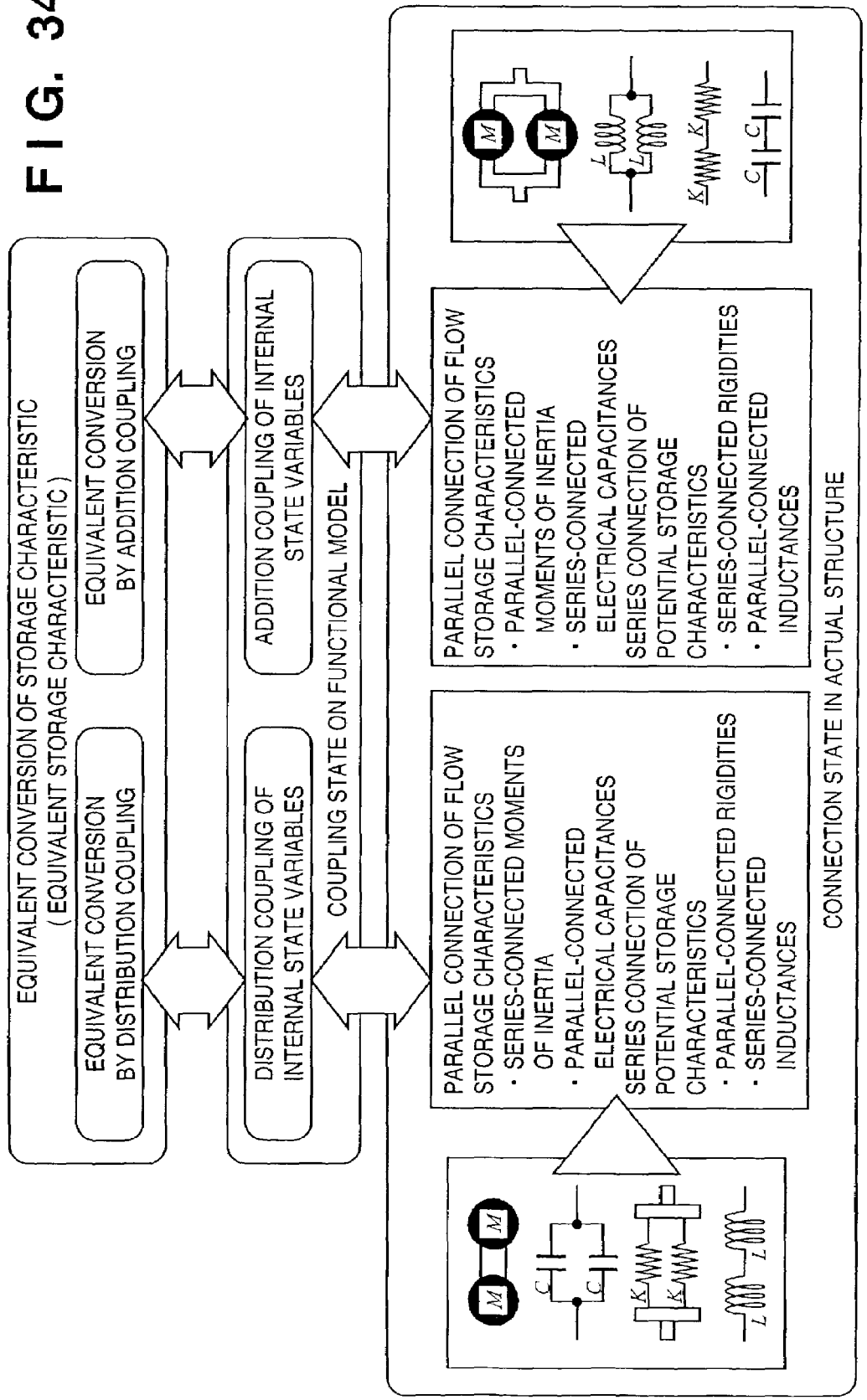
FIG. 34 shows the relationship between the actual structure of storage characteristics and an equivalent characteristic according to an embodiment of the present invention.

As the relationship between them and functional models, ① and ② correspond to distribution coupling of derivative state variables generated by storage characteristics, and ③ and ④ correspond to addition coupling having duality with them, as shown in FIG. 34.

(3) Equivalent Conversion of Distribution Coupling

Figure 35:
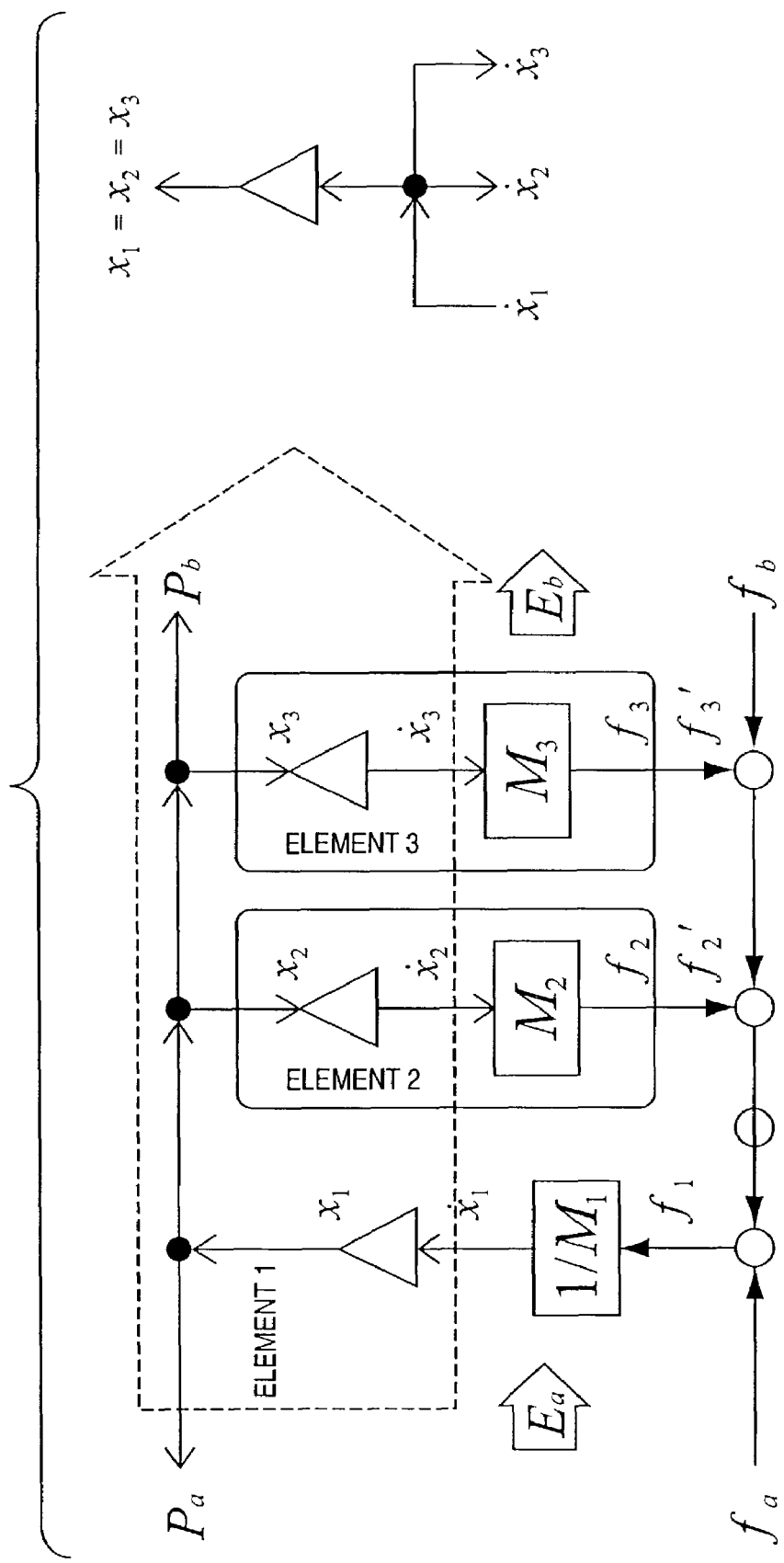
FIG. 35 shows a functional model example of a distribution-coupled derivative.

Three storage characteristics shown in FIG. 35 exemplify modeling of an actual structure of parallel connection of potential storage characteristics described in ① by distribution coupling. In this case, a method of integrating derivative variables distribution-coupled in FIG. 35 into one derivative variable to convert them into an equivalent storage characteristic will be examined. An example obtained by modeling an actual structure of series connection of flow storage characteristics described in ② by distribution coupling can be converted in the same sequence as distribution coupling of the flow system on the basis of the duality of models.

In FIG. 35, integral variable $x_1$ of potential derivative variables is distributed to $x_2$ and $x_3$ and is differentiated again to be converted into a potential derivative variable. As shown in b of FIG. 35, this process is equivalent to direct distribution of a derivative variable to derivative variables by omitting a derivative symbol. The distributed derivative variables are added to storage characteristics M2 and M3 to be converted into flow variables $f_2$ and $f_3$. Furthermore, $f_2$ and $f_3$ are addition-coupled, and the sum is added to storage characteristic M1 via $f_1$ to generate a potential derivative variable. This system externally receives input flow variables $f_a$ and $f_b$.

Equivalent storage characteristic $M_a$ integrated by distribution coupling is given by:

$$M_a = M_1 + M_2 + M_3 \quad \text{(EQ22)}$$

Figure 36:
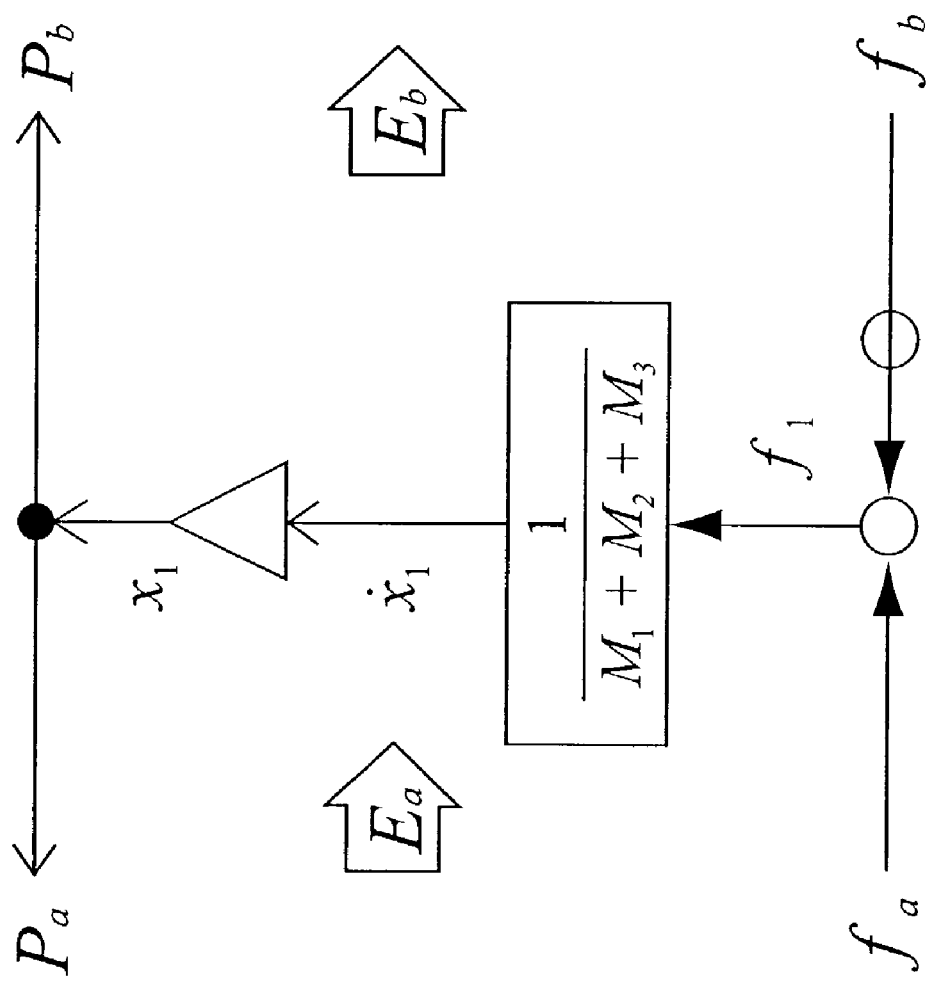
FIG. 36 shows an equivalent functional model example of a distribution-coupled derivative.

An equivalent functional model of EQ22 is shown in FIG. 36 presented next.

(4) Equivalent Conversion of Addition Coupling

Figure 37:
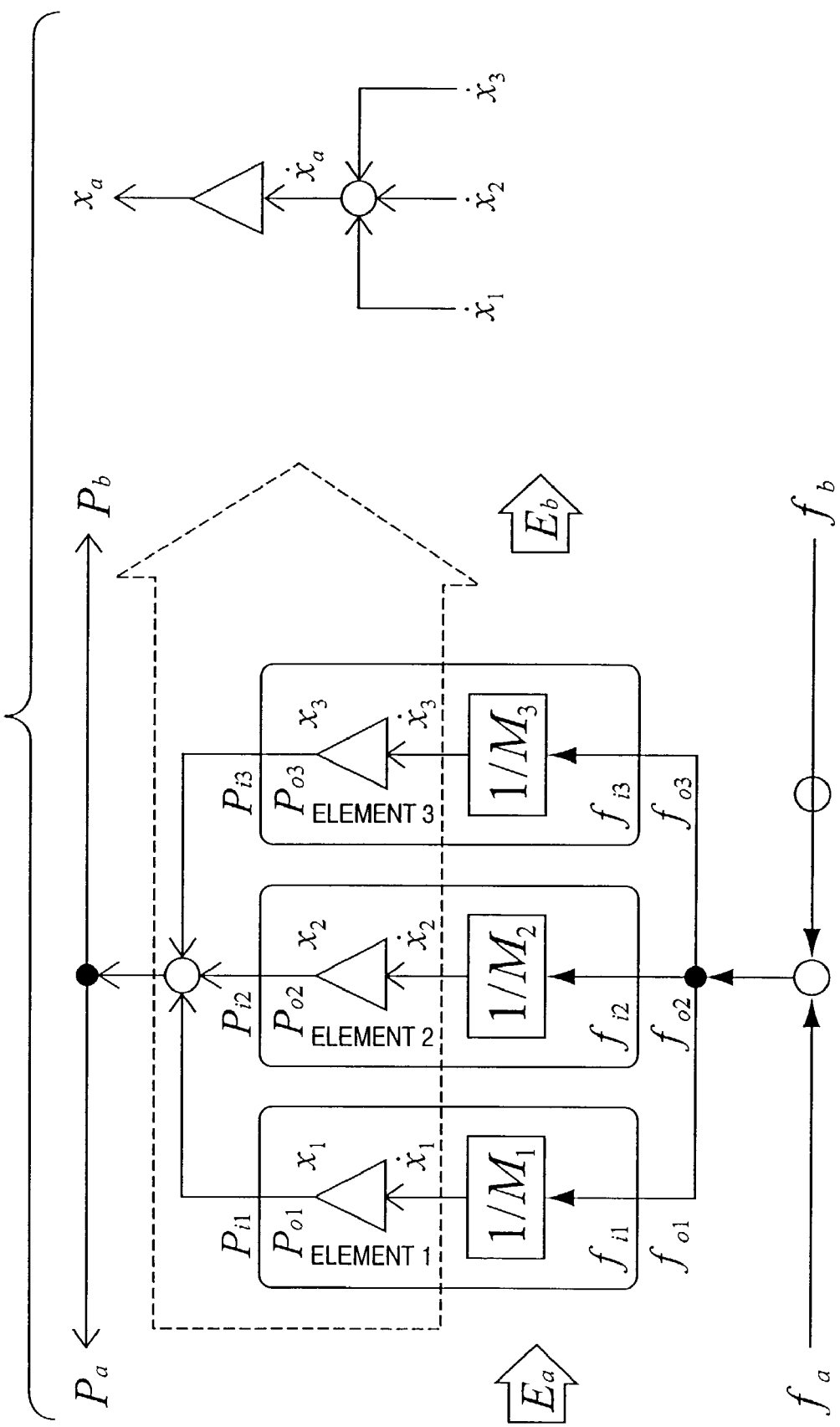
FIG. 37 shows a functional model example of an addition-coupled derivative.

Three storage characteristics shown in FIG. 37 exemplify modeling of an actual structure of series connection of potential storage characteristics described in ③ by addition coupling. In this case, a method of integrating derivative variables addition-coupled in FIG. 37 into one derivative variable to convert them into an equivalent storage characteristic will be examined. An example obtained by modeling an actual structure of parallel connection of flow storage characteristics described in ④ by addition coupling can be converted in the same sequence as distribution coupling of the flow system on the basis of the duality of models.

In FIG. 37, an externally received flow variable fa is distributed to $f_1$, $f_2$, and $f_3$ via a distribution symbol, and is added to storage elements $M_1$, $M_2$, and $M_3$ of elements 1, 2, and 3 to be converted into potential derivative variables (derivatives $x_1$, $x_2$, and $x_3$). Potential integral variables $x_1$, $x_2$, and $x_3$ (or $p_1$, $p_2$, and $p_3$) obtained by integrating these variables are added to a potential variable $p_a$ via an addition symbol, and the sum is externally output. This addition coupling is equivalent to output of $x_a$ obtained by integrating a value which is obtained by directly adding derivative variables (derivatives $x_1$, $x_2$, and $x_3$) to $p_a$. Note that the derivative variable (derivative $x_a$) and integral variable $x_a$ are output terminal elements.

Addition coupling of derivative variables adds derivative variables (derivatives $x_1$, $x_2$, and $x_3$) generated by multiplying flow variables $f_1$, $f_2$, and $f_3$ having an equivalence relation by storage elements $M_1$, $M_2$, and $M_3$. This is equivalent to multiplication of the sum of reciprocals of the storage elements $M_1$, $M_2$, and $M_3$ by the input flow variable $f_a$. This process can be exemplified by:

$$\left. \begin{array}{l} 0 = -M_1 \dot{x}_1 + f_1 \\ 0 = -M_2 \dot{x}_2 + f_2 \\ 0 = -M_3 \dot{x}_3 + f_3 \end{array} \right\} \quad \text{(EQ23)}$$

From EQ23, if the equivalence relation of flow variables is written as $f_1=f_2=f_3=f_a$, and addition of derivative variables is written as (derivatives $x_1+x_2+x_3$)=derivative $x_a$, EQ23 can be expressed by the following equivalent storage characteristic:

$$0 = -(\dot{x}_1 + \dot{x}_2 + \dot{x}_3) + \left(\frac{1}{M_1} + \frac{1}{M_2} + \frac{1}{M_3}\right)f_a \quad \text{(EQ24)}$$
$$0 = -\frac{1}{\left(\frac{1}{M_1} + \frac{1}{M_2} + \frac{1}{M_3}\right)}\dot{x}_a + f_a$$

From the above results, in addition coupling of derivative variables, the sum of reciprocals of diagonal elements of a storage characteristic matrix (square matrix) is further converted into a reciprocal to obtain the equivalent storage characteristic, at the end of equivalent model conversion.

The equivalent storage characteristic $M_a$ integrated by addition coupling is described by:

$$M_a = \frac{1}{\frac{1}{M_1} + \frac{1}{M_2} + \frac{1}{M_3}} \quad \text{(EQ25)}$$

Figure 38:
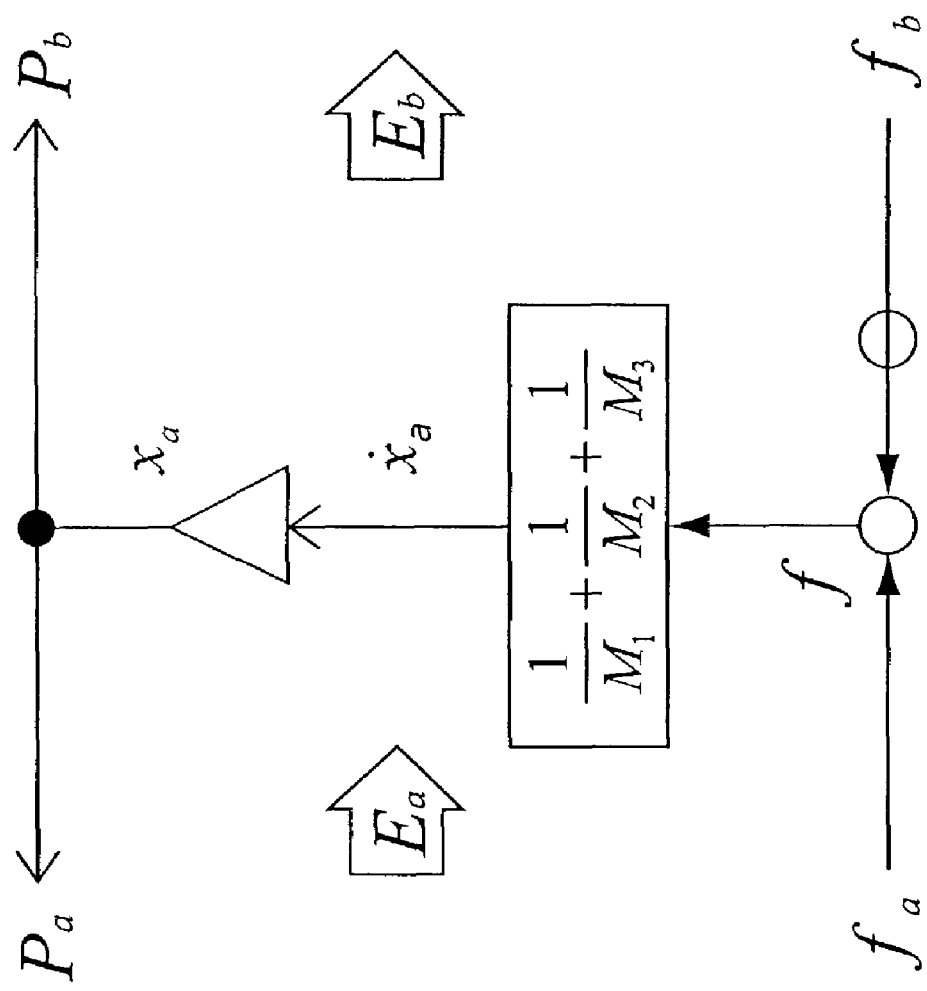
FIG. 38 shows an equivalent functional model example of an addition-coupled derivative.

FIG. 38 shows an equivalent functional model of EQ25.

5. Execution Functional Model

<5-1. Conversion into Execution Governing Equation>

The governing equations of low- and high-order functional models mentioned above are those for allowing functional models to connect each other. Therefore, in order to execute simulation and analysis from these governing equations, these equations must be converted into executable equations according to the purpose intended. The conversion method will be briefly explained below.

(5-1-1. Input Constraint of Execution Functional Model)

The governing equations of the integrated functional model include those for the uppermost layer having no input/output equations, and those for middle layers (functional components and the like) having input/output equations. The former governing equations can be converted into those of an execution form to be described later, and can be used in evaluation and simulation. However, since the input state variables of the latter governing equations are not constrained, they must be constrained by some conditions. The constraint method will be explained below.

The governing equations having input/output equations can be constrained using roughly two different methods.

(1) A method of substituting an input state variable by a side load to be internally generated.

(2) A method of adding a constraint load element to input and output state variables.

Figure 39:
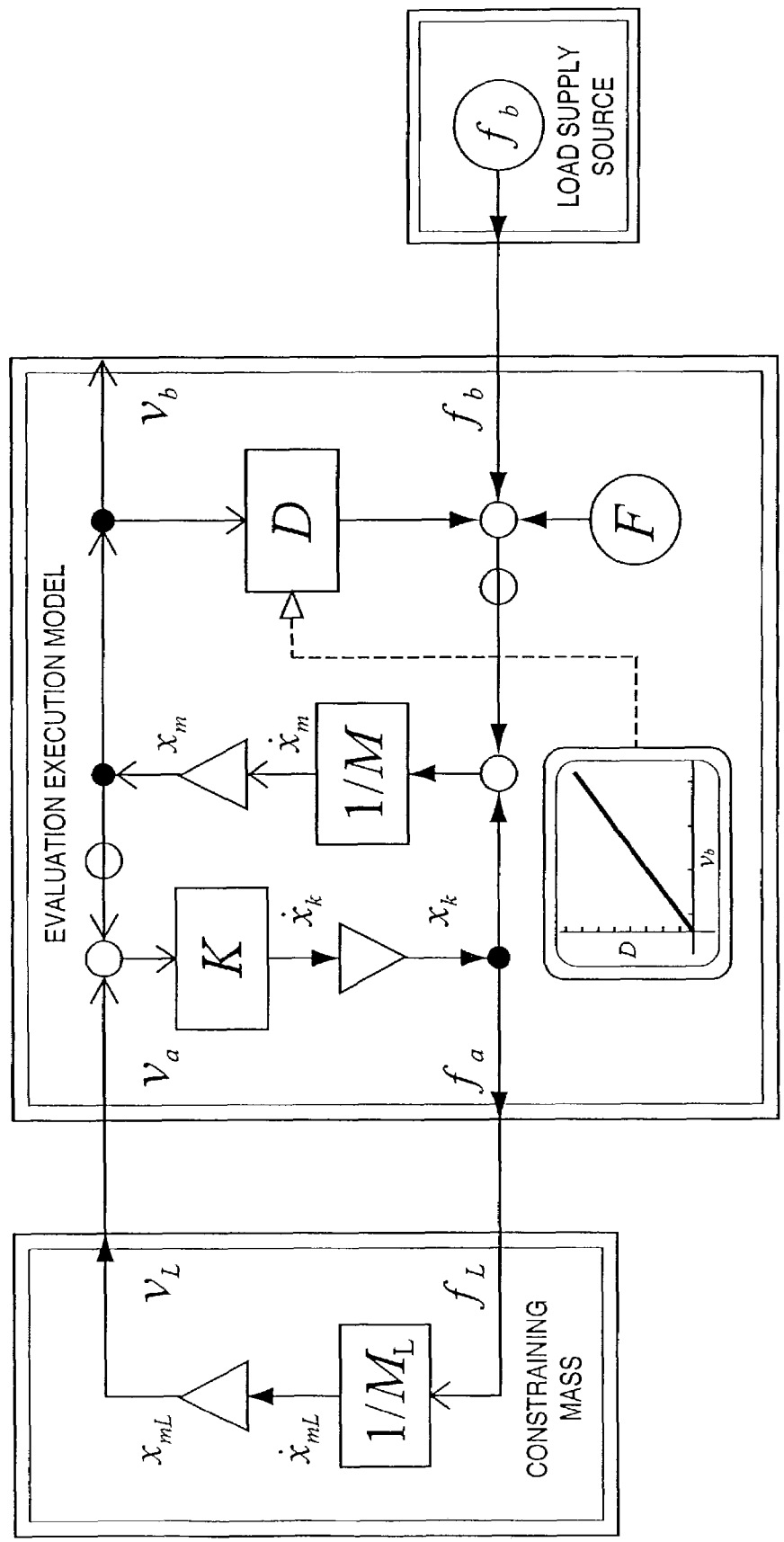
FIG. 39 is a diagram showing a constraint example of input/output state variables of an execution model according to an embodiment of the present invention.

In the former method, in order to substitute input and output state variables by side loads, a column of input state variables to be constrained is added to a column of side loads in the governing equation to convert an input/output equation into an observation equation, and to obtain an output state variable as an observation variable. In the latter constraint method, a constraint condition of a storage characteristic such as mass or the like, and that of a loss characteristic such as viscous drag or the like are added, and expansion and integration processes are executed. FIG. 39 shows an example wherein the spring stiffness K on the left side is constrained by mass $M_L$ and the input state variable $f_b$ on the vehicle body side is constrained by the force of a side load in the upper structure model in FIG. 3 mentioned previously.

The expansion & integration result of the constraint conditions shown in FIG. 39 to the governing equation (EQ1) of FIG. 3 is described by:

$$\begin{bmatrix} 0 \\ 0 \\ 0 \\ f_a \\ v_b \end{bmatrix} = \begin{bmatrix} -M & 0 & 0 & -D & 1 & 0 & -(F+f_b) \\ 0 & -\frac{1}{K} & 0 & -1 & 0 & 1 & 0 \\ 0 & 0 & -M_L & 0 & 1 & 0 & 0 \\ 0 & 0 & 0 & 0 & 1 & 0 & 0 \\ 0 & 0 & 0 & 1 & 0 & 0 & 0 \end{bmatrix} \begin{bmatrix} \dot{x}_m \\ \dot{x}_k \\ \dot{x}_{mL} \\ x_m \\ x_k \\ x_{mL} \\ 1 \end{bmatrix} \quad \text{(EQ26)}$$

In EQ26, an equation of the third row is a state equation constrained by $M_L$. To the last column of the first row, the input state variable fb is added as a side load. The first to third rows of EQ26 are state equations, and the fourth and fifth rows are output state variables paired with input state variables constrained by an observation equation.

6. Example of Arithmetic Process in Device of Each Process

The aforementioned expansion and integration are partially implemented by conversion processes of matrix equations (including a state equation, input/output equation, and observation equation) that represent individual functional models by a computer. The theoretical basis for the generalized process will be explained below. In this embodiment, the user can see this conversion process via a user interface, and can manipulate it.

<6-1. Overall Image>

Figure 40:
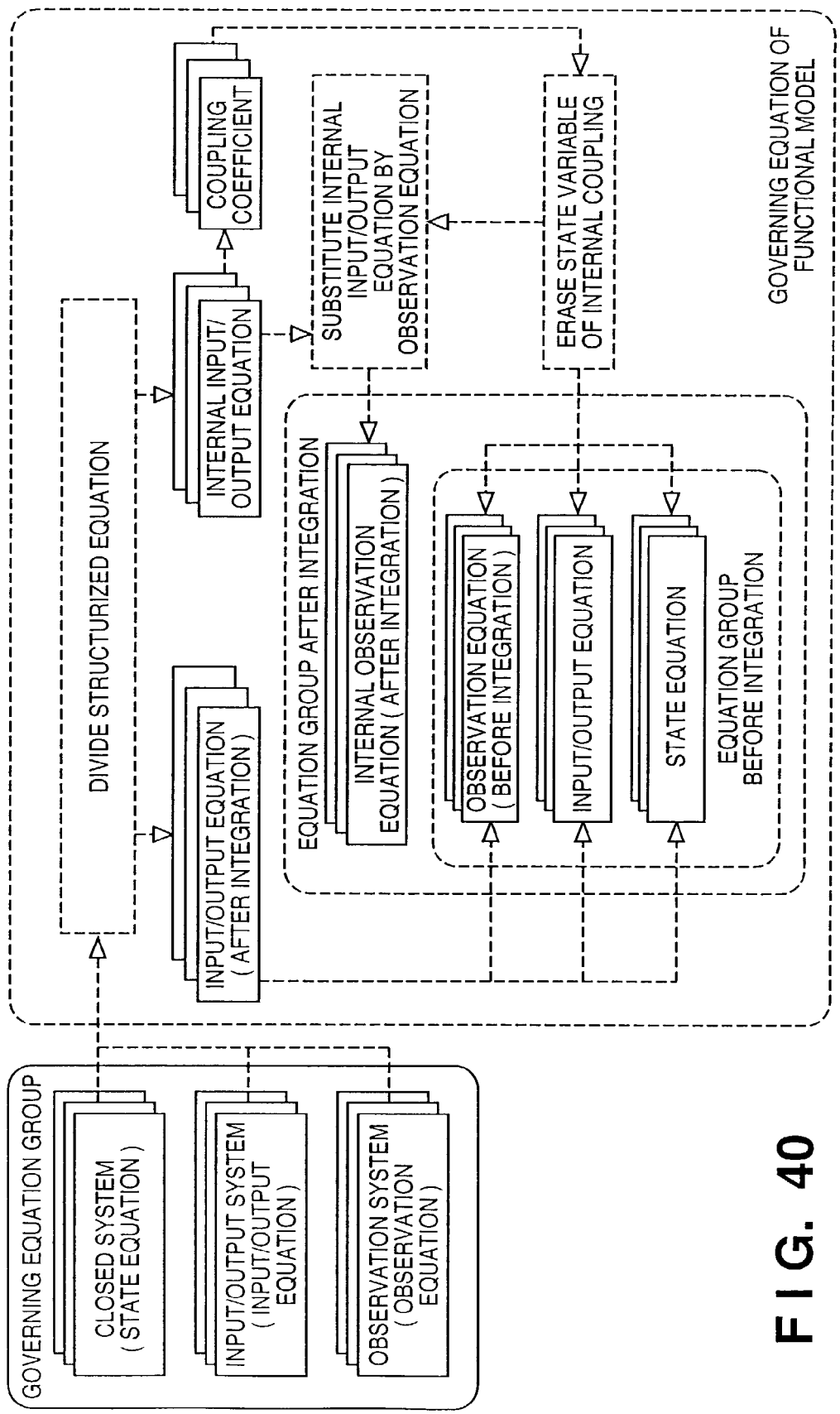
FIG. 40 shows the concept of equivalent model conversion using governing equations according to an embodiment of the present invention.

FIG. 40 shows the causality and processing flow of respective means for converting a closed simulation means group, input/output simulation means group, and internal observation means group of expanded and structurized structure governing equations into equations of closed simulation means, input/output simulation means, and internal observation means after conversion into equivalent functional models.

In FIG. 40, respective simulation means bounded by the left solid frame indicate the closed simulation means group, input/output simulation means group, and internal observation means group before equivalent conversion. Equivalent governing equations in the left frame indicate closed simulation means, input/output simulation means, and internal observation means after conversion, and as for the internal observation means, equations before and after equivalent conversion are used as those for single internal observation means.

<6-2. Governing Equation of Functional Model>

Figure 41:
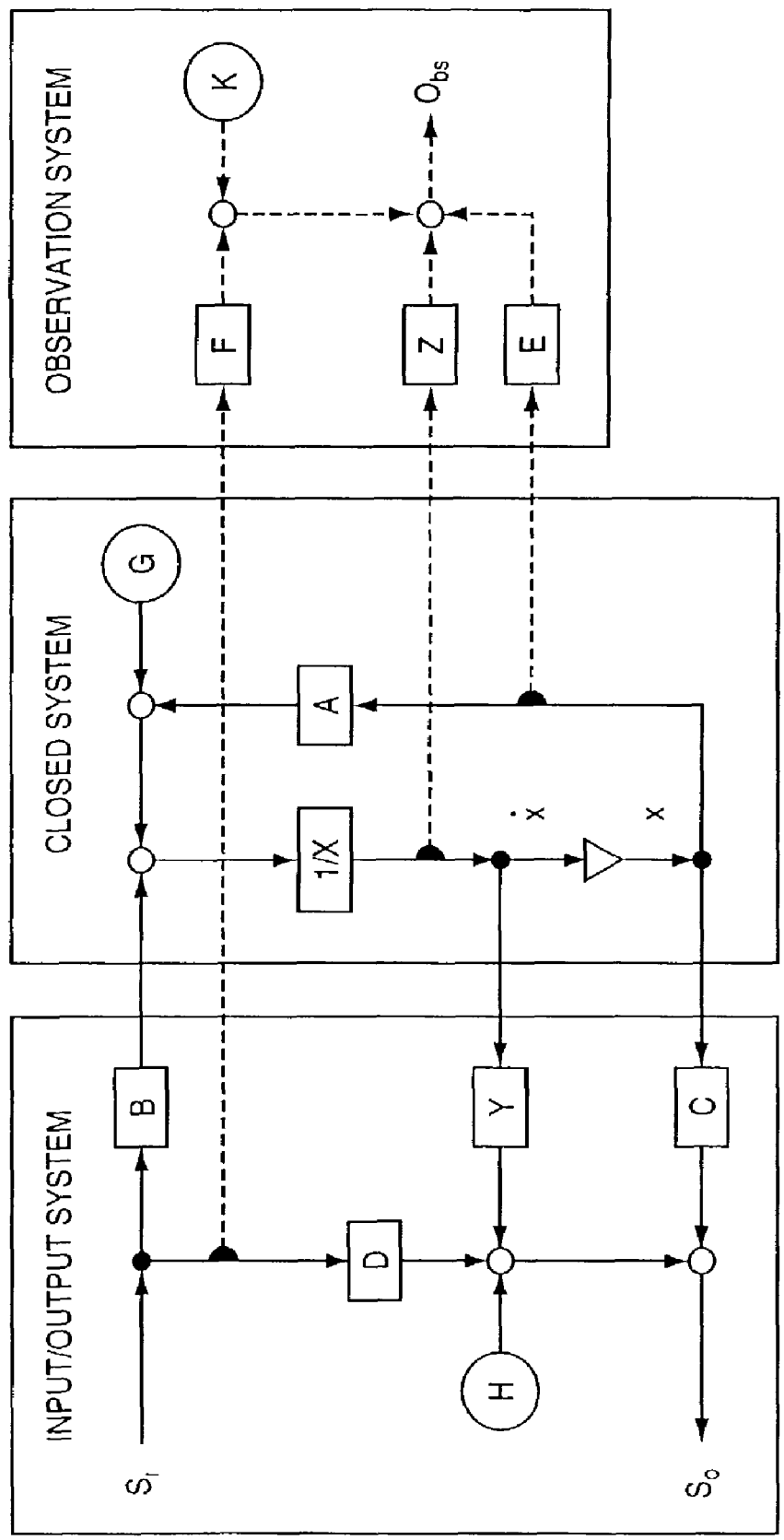
FIG. 41 is a diagram showing a typical example of the internal arrangement of a functional model according to an embodiment of the present invention.

FIG. 41 shows the basic internal arrangement of a functional model which is to undergo expansion and integration. The model shown in FIG. 41 is comprised of an input/output system connected to another functional model, a closed system that simulates unique characteristics inside the system, and an observation system for observing the internal state of the system.

Governing equations that generalize FIG. 41 are:

$$\left.\begin{array}{l}0 = X\dot{x} + Ax + BS_i + G \\ S_o = Y\dot{x} + Cx + DS_i + H \\ O_{bs} = Z\dot{x} + Ex + FS_i + K\end{array}\right\} \quad \text{(EQ27)}$$

$$E = S_o S_i \quad \text{(EQ28)}$$

EQ27 includes in turn from the top a state equation indicating the closed system, an input/output equation indicating the input/output system, and an observation equation indicating the observation system. A state variable x indicates the internal state variable of the closed system; $S_o$, the output state variable of the input/output system; $S_i$, the input state variable of the input/output system; and $O_{bs}$, the observation variable of the observation system. EQ28 indicates that energy E exchanged by the system is the product of independent and dependent variables $S_o$ and $S_i$. In EQ27, matrices X, Y, and Z are manifolds of storage characteristics, and matrices A, B, C, D, E, and F are manifolds of loss characteristics and coefficients. If derivative state variables do not interfere, matrices X, Y, and Z are diagonal square matrices, and if functional elements are directly coupled via pairs of potential and flow variables, elements of matrices A, B, C, D, E, and F assume coefficient values 1 or −1.

EQ27 includes basic equations that can derive equations of steady, transient, eigenvalue, and the like of the system, and can be applied to a broad range from a low-order model group to a high-order model. A detailed equation that further classifies EQ27 into potential and flow variables is a basic equation for connecting, expanding, and integrating functional models:

$$\begin{bmatrix}0_p \\ 0_f \\ V_{out\_p} \\ V_{out\_f} \\ V_{obs\_p} \\ V_{obs\_f}\end{bmatrix} = \begin{bmatrix}X_{L\_f} & X_{N\_p} & A_{L\_f} & A_{N\_p} & B_{L\_f} & B_{N\_p} & G_{\_p} \\ X_{N\_f} & X_{L\_p} & A_{N\_f} & A_{L\_p} & B_{N\_f} & B_{L\_p} & G_{\_f} \\ Y_{L\_f} & Y_{N\_p} & C_{L\_f} & C_{N\_p} & D_{L\_f} & D_{N\_p} & H_{\_p} \\ Y_{N\_f} & Y_{L\_p} & C_{N\_f} & C_{L\_p} & D_{N\_f} & D_{L\_p} & H_{\_p} \\ Z_{L\_f} & Z_{N\_p} & E_{L\_f} & E_{N\_p} & F_{L\_f} & F_{N\_p} & K_{\_p} \\ Z_{N\_f} & Z_{L\_p} & E_{N\_F} & E_{L\_p} & F_{N\_f} & F_{L\_p} & K_{\_f}\end{bmatrix}\begin{bmatrix}V_{sta\_f} \\ V_{sta\_p} \\ V_{sta\_f} \\ V_{sta\_p} \\ V_{inp\_f} \\ V_{inp\_p} \\ 1\end{bmatrix} \quad \text{(EQ29)}$$

Independent and dependent variables of EQ29 are arranged so that the product of flow and potential variables becomes energy. This equation is a mathematical model which represents all kinds of functional elements indicated by functional models. Suffix L assigned to coefficient matrix elements indicates a characteristic; N, a coefficient; and f and P, flow and potential variables, respectively. Suffix L of X, Y, and Z indicates a storage characteristic, and suffix N that involves storage of energy corresponds to a coefficient such as the mutual inductance of an electrical system. EQ29 is comprised of, in turn from the top, a potential state equation, flow state equation, potential input/output equation, flow input/output equation, potential observation equation, and flow observation equation.

<6-3. Formulation of Structurized Models>

Structurization of functional models by expansion according to this embodiment has no constraint condition except that energy between elements is exchanged using pairs of potential and flow variables, and if this constraint condition is satisfied, functional models can be recombined. As another condition, the governing equation must be expressed by linear algebraic expressions of simultaneous linear equations since expansion is allowed. The governing equation expressed by simultaneous linear equations can be applied to a broad range from physical and engineering theories expressed by the same mathematical models to statistical models and empirical formulas of, e.g., multivariate analysis and the like. The principle of a functional model can be considered as a black-box-like model that can connect models via pairs of potential and flow variables.

Figure 42:
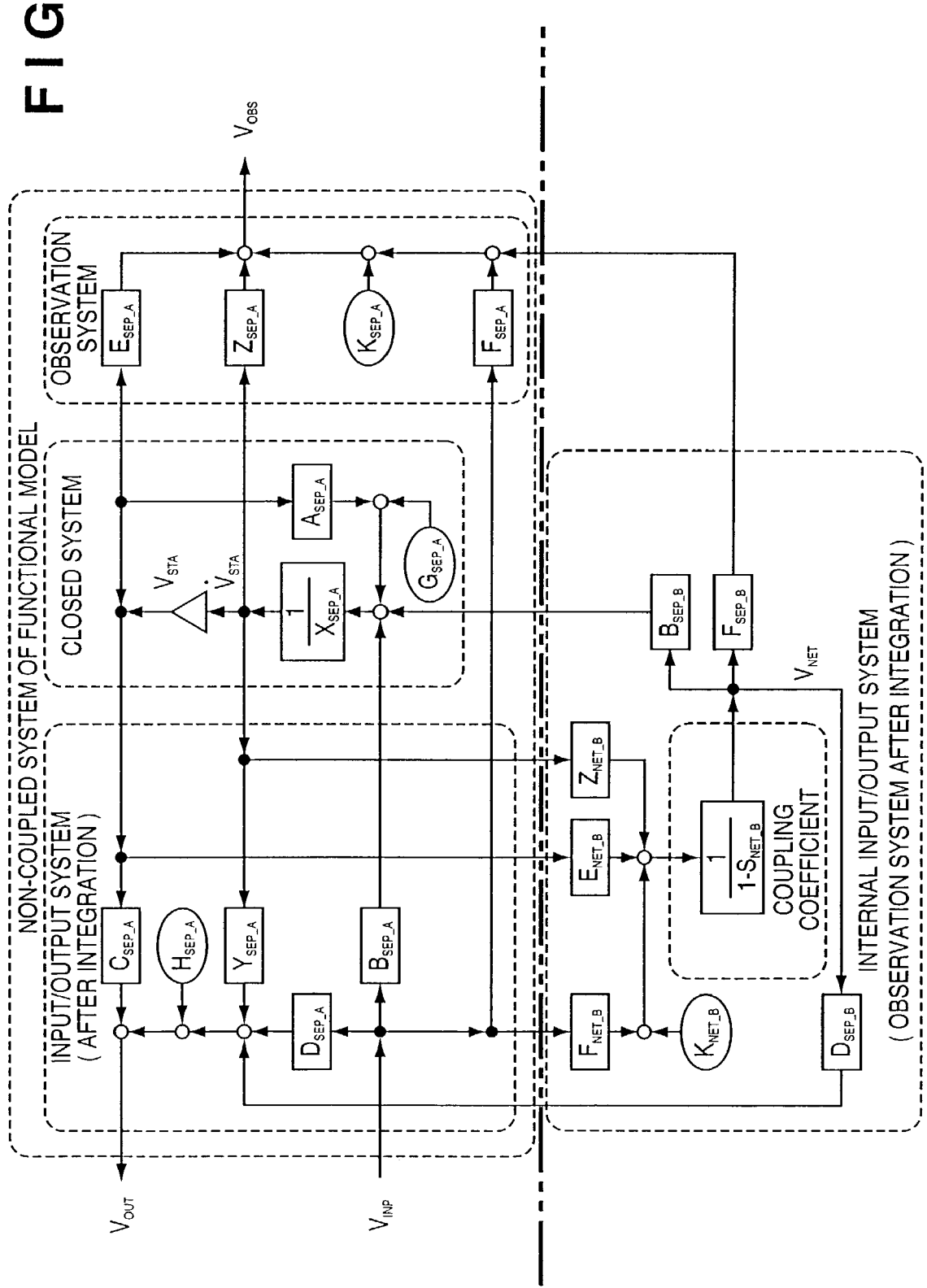
FIG. 42 is a diagram showing a typical example of the internal arrangement of a structurized functional model according to an embodiment of the present invention.
Figure 42A:
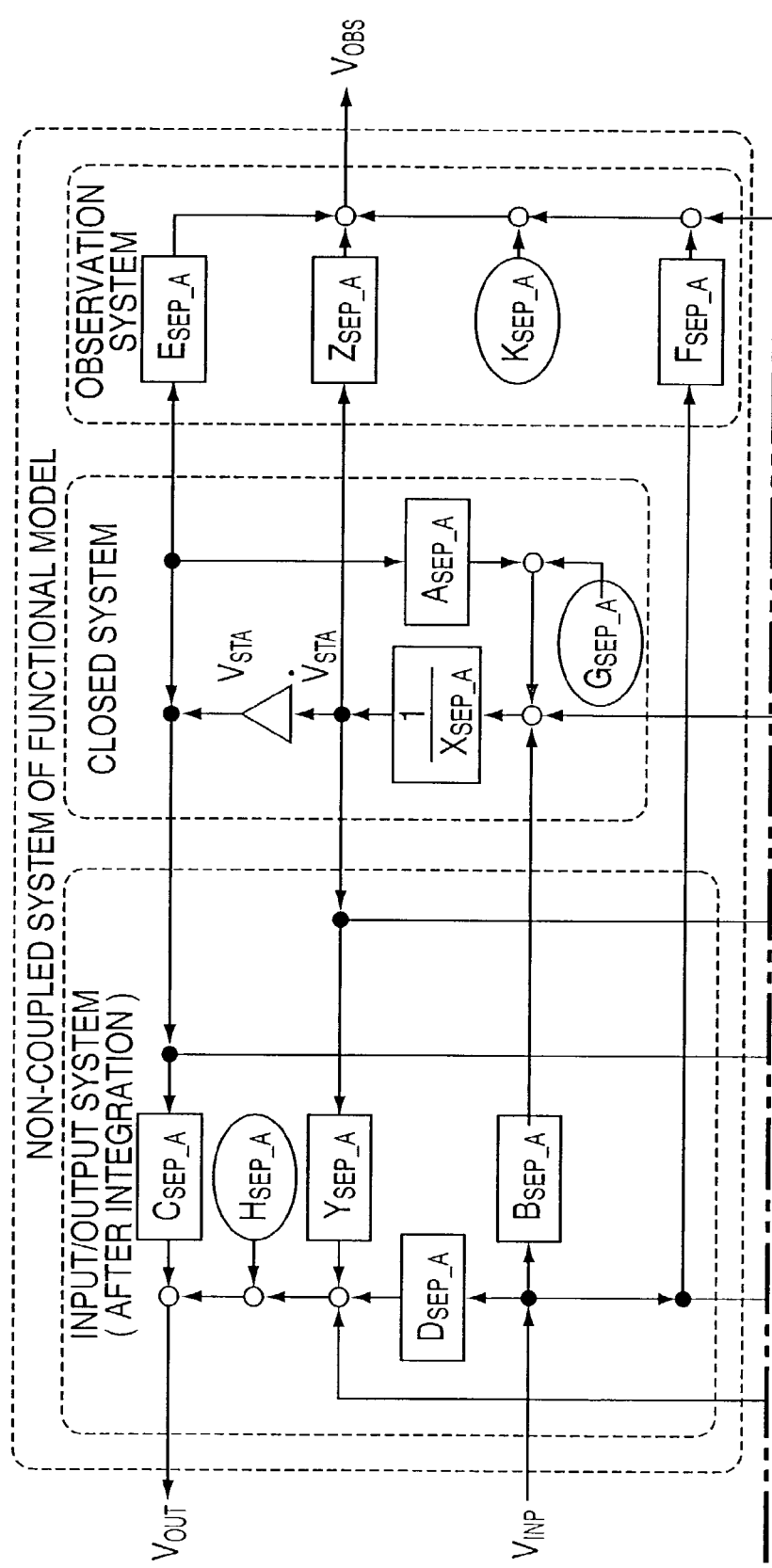
Figure 42B:
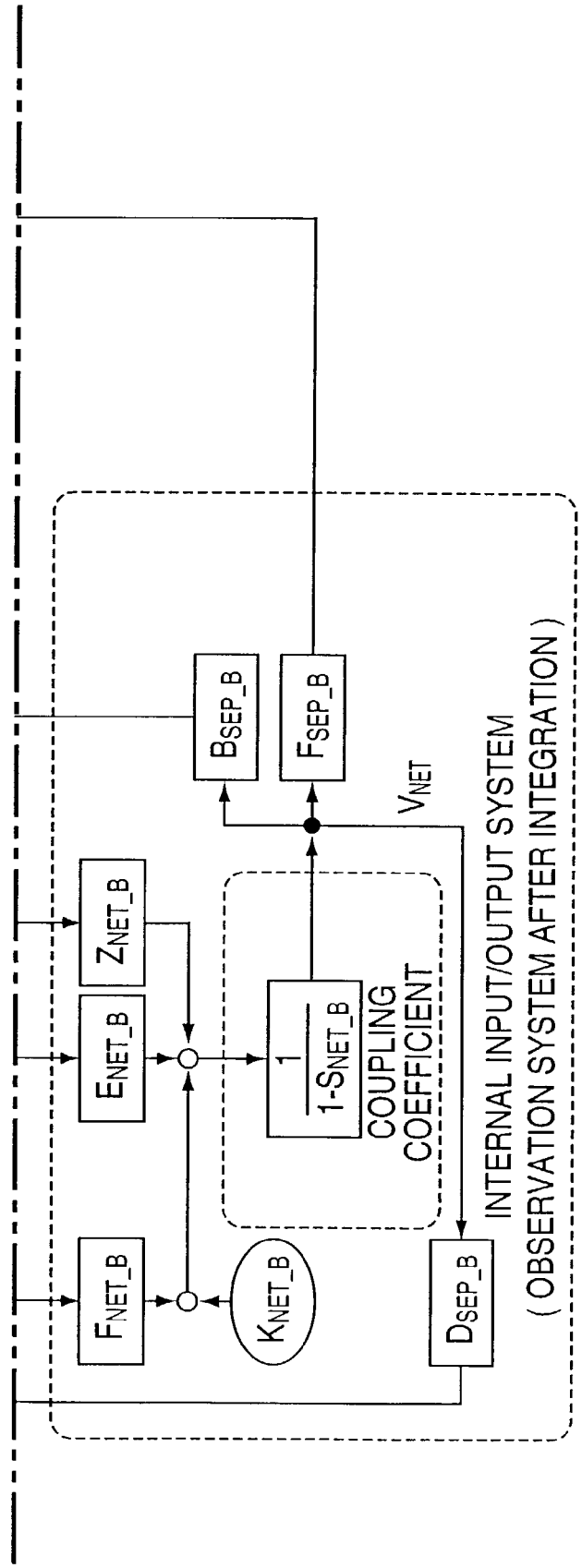

FIG. 42 shows a general functional model used upon structurizing a group of black-box-like functional models by expanding them.

The functional model shown in FIG. 42 is a state before integration, and an internal input/output system on the lower side is to be built in an observation system by integration. A coupling coefficient present in the internal input/output system includes coefficients for coupling input and output state variables of a group of low-order functional models. A governing equation that generalizes FIG. 42 is called a structure governing equation, and is described by:

$$\begin{bmatrix}0 \\ V_{OUT} \\ V_{OBS} \\ V_{NET}\end{bmatrix} = \begin{bmatrix}X_{SEP\_A} & A_{SEP\_A} & B_{SEP\_A} & G_{SEP\_A} & B_{SEP\_B} \\ Y_{SEP\_A} & C_{SEP\_A} & D_{SEP\_A} & H_{SEP\_A} & D_{SEP\_B} \\ Z_{SEP\_A} & E_{SEP\_A} & F_{SEP\_A} & K_{SEP\_A} & F_{SEP\_B} \\ Z_{NET\_B} & E_{NET\_B} & F_{NET\_B} & K_{NET\_B} & S_{NET\_B}\end{bmatrix}\begin{bmatrix}\dot{V}_{STA} \\ V_{STA} \\ V_{INP} \\ 1 \\ V_{NET}\end{bmatrix} \quad \text{(EQ30)}$$

In this equation, the input/output equation of EQ27 is converted as follows. Dependent variables (rows) are divided into output state variables after integration, and internally coupled output state variables, and independent variables (columns) are divided into input state variables after integration, and input state variables which are internally coupled and are substituted by observation variables. In EQ30, the first row is a state equation, the second row is an input/output equation after integration, the third row is an observation equation before integration, and the fourth row is an internal input/output equation which is internally coupled by expansion, and becomes an observation equation after integration.

A dependent variable $V_{OUT}$ in EQ30 is an output state variable after integration; $V_{OBS}$, an observation state variable before integration; and $V_{NET}$, an observation state variable after integration. An independent variable $V_{STA}$ is an internal state variable; $V_{INT}$, an input state variable after integration; and VNET, an input state variable substituted by an output state variable by expansion. As for coefficients, uppercase symbols indicate symbols of the governing equation of a general functional model, suffix _A indicates an input/output equation after integration, and suffix _B indicates an observation equation and coefficients to be erased after integration. Also, output state variables are arranged so that the product of $V_{OUT}$ and $V_{INP}$ becomes energy, and an internal input/output equation is arranged so that the product of dependent and independent variables $V_{NET}$ and $V_{NET}$ becomes energy.

<6-4. Formulation of Hierarchical Models>

(6-4-1. Formulation)

A general method for deriving a governing equation by integrating structure governing equations obtained by expanding a low-order function model group into an upper layer will be formulated. $S_{NET\_B}$ in structure governing equation (EQ30) can be described by:

$$\begin{bmatrix} 0 \\ V_{OUT} \\ V_{OBS} \\ V_{OBS\_C} \end{bmatrix} = \begin{bmatrix} X_{SEP\_A} & A_{SEP\_A} & B_{SEP\_A} & G_{SEP\_A} & B_{SEP\_B} \\ Y_{SEP\_A} & C_{SEP\_A} & D_{SEP\_A} & H_{SEP\_A} & D_{SEP\_B} \\ Z_{SEP\_A} & E_{SEP\_A} & F_{SEP\_A} & K_{SEP\_A} & F_{SEP\_B} \\ Z_{NET\_C} & E_{NET\_C} & F_{NET\_C} & K_{NET\_C} & 0 \end{bmatrix} \begin{bmatrix} \dot{V}_{STA} \\ V_{STA} \\ V_{INP} \\ 1 \\ V_{NET} \end{bmatrix}$$

by deleting it since dependent variables VNET and $V_{NET}$ are the same.

Note that coefficients $Z_{NET\_C}$, $F_{NET\_C}$, $F_{NET\_C}$, and $K_{NET\_C}$ with suffix _C in EQ31 are the following with deleting $S_{NET\_B}$ by multiplying coefficients $Z_{NET\_B}$, $E_{NET\_B}$, $F_{NET\_B}$, and $K_{NET\_B}$ in EQ30 by the reciprocal of $(I-S_{NET\_B})$:

$$\left. \begin{aligned} Z_{NET\_C} &= (I - S_{NET\_B})^{-1} Z_{NET\_B} \\ E_{NET\_C} &= (I - S_{NET\_B})^{-1} E_{NET\_B} \\ F_{NET\_C} &= (I - S_{NET\_B})^{-1} F_{NET\_B} \\ K_{NET\_C} &= (I - S_{NET\_B})^{-1} K_{NET\_B} \end{aligned} \right\} \quad \text{(EQ32)}$$

The lowermost row of EQ31 can be expressed by the following observation equation that becomes an observation variable after integration:

$$V_{OBS\_C} = [Z_{NET\_C} \ E_{NET\_C} \ F_{NET\_C} \ K_{NET\_C}] \begin{bmatrix} \dot{V}_{STA} \\ V_{STA} \\ V_{INP} \\ 1 \end{bmatrix} \quad \text{(EQ33)}$$

A governing equation obtained by substituting $V_{OBS\_C}$ of EQ33 into $V_{NET}$ of EQ31 is that of each functional model before expansion, which can be described by the following equation having the same configuration as EQ30:

$$\begin{bmatrix} 0 \\ V_{OUT\_E} \\ V_{OBS\_E} \end{bmatrix} = \begin{bmatrix} X_E & A_E & B_E & G_E \\ Y_E & C_E & D_E & H_E \\ Z_E & E_E & F_E & K_E \end{bmatrix} \begin{bmatrix} \dot{V}_{STA\_E} \\ V_{STA\_E} \\ V_{INP\_E} \\ 1 \end{bmatrix} \quad \text{(EQ34)}$$

Respective matrices of EQ34 that represents the governing equation after integration can be described as follows.

Matrices of a state equation:

$$\left. \begin{aligned} X_E &= X_{SEP\_A} + B_{SEP\_B}(I - S_{NET\_B})^{-1} Z_{NET\_B} \\ A_E &= A_{SEP\_A} + B_{SEP\_B}(I - S_{NET\_B})^{-1} E_{NET\_B} \\ B_E &= B_{SEP\_A} + B_{SEP\_B}(I - S_{NET\_B})^{-1} F_{NET\_B} \\ G_E &= G_{SEP\_A} + (I - S_{NET\_B})^{-1} K_{NET\_B} \end{aligned} \right\} \quad \text{(EQ35)}$$

Matrices of an input/output equation:

$$\left. \begin{aligned} Y_E &= Y_{SEP\_A} + D_{SEP\_B}(I - S_{NET\_B})^{-1} Z_{NET\_B} \\ C_E &= C_{SEP\_A} + D_{SEP\_B}(I - S_{NET\_B})^{-1} E_{NET\_B} \\ D_E &= D_{SEP\_A} + D_{SEP\_B}(I - S_{NET\_B})^{-1} F_{NET\_B} \\ H_E &= H_{SEP\_A} + (I - S_{NET\_B})^{-1} K_{NET\_B} \end{aligned} \right\} \quad \text{(EQ36)}$$

Matrices of an observation equation:

Observation equations before and after integration can be combined as:

$$Z_E = \begin{bmatrix} Z_{SEP\_A} + F_{SEP\_B}(I - S_{NET\_B})^{-1} Z_{NET\_B} \\ (I - S_{NET\_B})^{-1} Z_{NET\_B} \end{bmatrix} \quad \text{(EQ37)}$$

$$E_E = \begin{bmatrix} E_{SEP\_A} + F_{SEP\_B}(I - S_{NET\_B})^{-1} E_{NET\_B} \\ (I - S_{NET\_B})^{-1} E_{NET\_B} \end{bmatrix}$$

$$F_E = \begin{bmatrix} F_{SEP\_A} + F_{SEP\_B}(I - S_{NET\_B})^{-1} F_{NET\_B} \\ (I - S_{NET\_B})^{-1} F_{NET\_B} \end{bmatrix}$$

$$K_E = \begin{bmatrix} K_{SEP\_A} + (I - S_{NET\_B})^{-1} K_{NET\_B} \\ (I - S_{NET\_B})^{-1} K_{NET\_B} \end{bmatrix}$$

(6-4-2. Constraint Condition of Governing Equation)

The aforementioned method of converting expanded and structurized structure governing equations into a high-order equivalent model by integrating them is characterized in that no state variables (independent variables) which must be constrained are included. Variables that must be constrained can be limited to independent variables which pair with a dependent variable (output state variable) $V_{OUT}$ of the input/output equation in the governing equation of EQ34. Furthermore, since the governing equation for the uppermost layer which is integrated to a high-order functional model in turn has no input/output equation, and includes only state and observation equations, all these unconstrained independent variables are erased.

When the governing equation has the input/output equation of EQ34, an input state variable (independent variable) can be erased by constraining it by connecting a side load that becomes an input state variable which manipulates the system, or a mass, rigidity, drag, or the like having a value that does not influence the behavior of the system as a terminal element.

(6-4-3. Example of Hierarchication of RLC Series Circuit)

Figure 43:
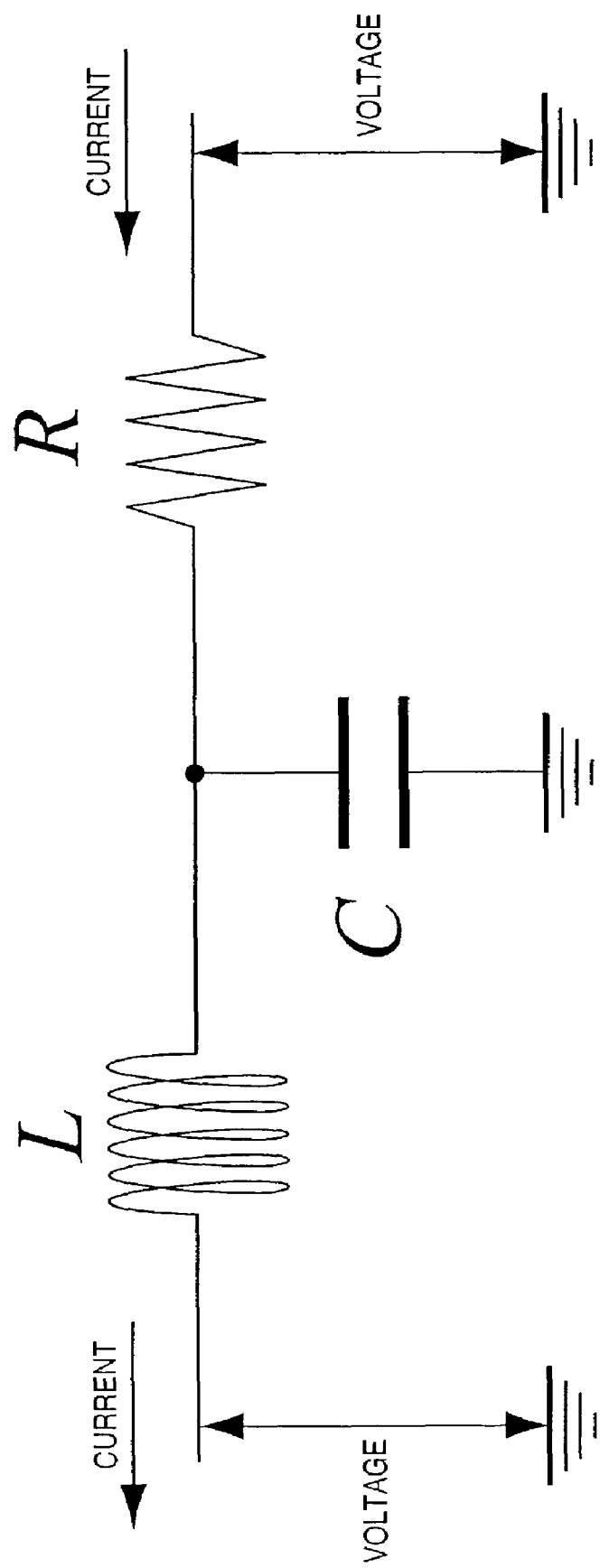
FIG. 43 is a diagram showing an electrical circuit example of RLC elements.

An electrical circuit comprised of a coil, electrostatic capacitance, and resistance shown in FIG. 43 will be examined as an example of function structurization by simplest expansion.

Figure 44:
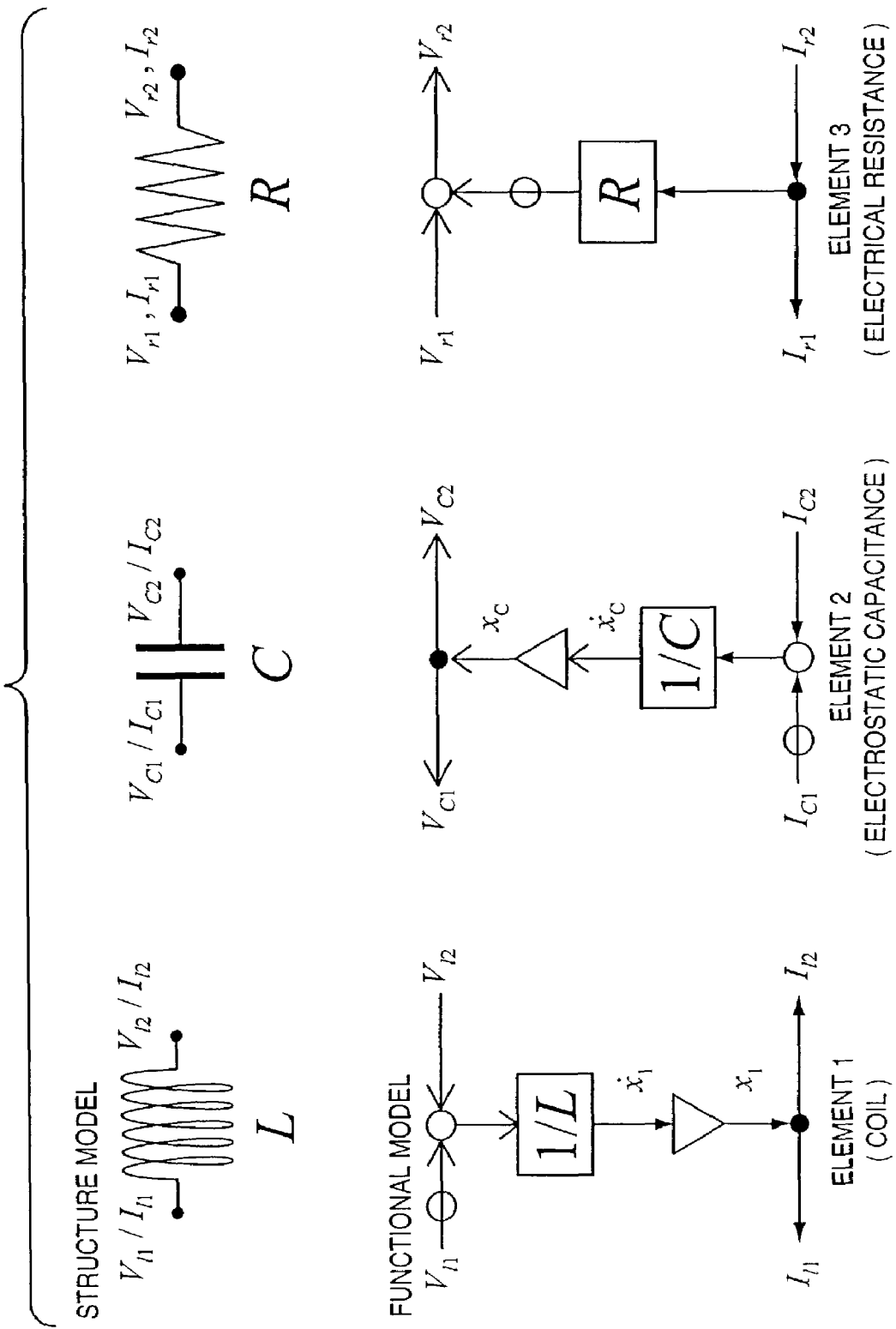
FIG. 44 shows functional element models of RLC elements.

FIG. 44 shows the relationship between structure models and functional elements of circuit elements built in the electrical circuit shown in FIG. 43.

In FIG. 44, L is the inductance of a coil; C, the electrostatic capacitance; R, the electrical resistance; and pairs of $V_I$ and $I_I$, $V_C$ and $I_C$, and $V_r$ and $I_r$, voltages and currents before coupling. The governing equations of the inductance L, electrostatic capacitance C, and electrical resistance R are respectively described by:

$$\begin{bmatrix} 0 \\ I_{l1} \\ I_{l2} \end{bmatrix} = \begin{bmatrix} -L & 0 & -1 & 1 \\ 0 & 1 & 0 & 0 \\ 0 & 1 & 0 & 0 \end{bmatrix} \begin{bmatrix} \dot{x}_I \\ x_I \\ V_{l1} \\ V_{l2} \end{bmatrix} \quad \text{(EQ38)}$$

$$\begin{bmatrix} 0 \\ V_{C1} \\ V_{C2} \end{bmatrix} = \begin{bmatrix} -\frac{1}{C} & 0 & -1 & 1 \\ 0 & 1 & 0 & 0 \\ 0 & 1 & 0 & 0 \end{bmatrix} \begin{bmatrix} \dot{x}_C \\ x_C \\ I_{C1} \\ I_{C2} \end{bmatrix} \quad \text{(EQ39)}$$

$$\begin{bmatrix} I_{r1} \\ V_{r2} \end{bmatrix} = \begin{bmatrix} 0 & 1 \\ 1 & -R \end{bmatrix} \begin{bmatrix} V_{r1} \\ I_{r2} \end{bmatrix} \quad \text{(EQ40)}$$

From FIG. 44, connection of the inductance L and electrostatic capacitance C is expressed by connections of an output state variable $V_{C1}$ and input state variable $V_{I2}$, and an output state variable $I_{I2}$ and input state variable $I_{C1}$, and the same applies to connection of electrostatic capacitance C and electrical resistance R. Hence, the structurization sequence by expansion is as follows.

(1) Substitute independent variable VI2 of EQ38 by dependent variable VC1 of EQ39 (connect L and C).

(2) Substitute independent variable IC1 of EQ39 by dependent variable II2 of EQ38 (connect L and C).

(3) Substitute Ic2 of EQ39 by Ir1 of EQ40 (connect C and R).

(4) Substitute Vr1 of EQ40 by Vc2 of EQ39 (connect C and R).

A governing equation obtained by structurizing functions by substituting input/output voltages and currents is given by:

$$\begin{bmatrix} 0 \\ 0 \\ I_{l1} \\ V_{r2} \\ I_{l2} \\ V_{C1} \\ V_{C2} \\ I_{r1} \end{bmatrix} = \begin{bmatrix} -L & 0 & 0 & 0 & -1 & 0 & 1 & 0 & 0 & 0 \\ 0 & -\frac{1}{C} & 0 & 0 & 0 & 0 & 0 & -1 & 1 & 0 \\ 0 & 0 & 1 & 0 & 0 & 0 & 0 & 0 & 0 & 0 \\ 0 & 0 & 0 & 0 & 0 & -R & 0 & 0 & 0 & 1 \\ 0 & 0 & 1 & 0 & 0 & 0 & 0 & 0 & 0 & 0 \\ 0 & 0 & 0 & 1 & 0 & 0 & 0 & 0 & 0 & 0 \\ 0 & 0 & 0 & 1 & 0 & 0 & 0 & 0 & 0 & 0 \\ 0 & 0 & 0 & 0 & 0 & 1 & 0 & 0 & 0 & 0 \end{bmatrix} \times \quad \text{(EQ41)}$$

$$[\dot{x}_I \; \dot{x}_C \; x_I \; x_C \; V_{l1} \; I_{r2} \; V_{C1} \; I_{l2} \; I_{r1} \; V_{C2}]$$

In EQ41, the upper two rows are state equations, the next two rows are input/output equations, and the fifth and subsequent rows are observation equations which are hidden after integration and become observation variables. As for columns of EQ41, the first four columns are internal state variables, the next two columns are input state variables after integration, and the end four columns are input state variables to be erased after equivalent conversion.

In the structure governing equation (EQ41) of the expanded functional models, since independent variables $II_{2}$, $V_{c1}$, $V_{c2}$, and $I_{r1}$ of the fifth and subsequent rows, and independent variables $V_{C1}$, $I_{I2}$, $I_{r1}$, and $V_{C2}$ of the seventh and subsequent columns have identical variable names, substitution of these dependent variables into the independent variables results in:

$$\begin{bmatrix} 0 \\ 0 \\ \dot{I}_{I1} \\ \dot{V}_{r2} \\ \dot{I}_{I2} \\ \dot{V}_{C1} \\ \dot{V}_{C2} \\ \dot{I}_{r1} \end{bmatrix} = \begin{bmatrix} -L & 0 & 0 & 1 & -1 & 0 \\ 0 & -\frac{1}{C} & -1 & 0 & 0 & 1 \\ 0 & 0 & 1 & 0 & 0 & 0 \\ 0 & 0 & 0 & 1 & 0 & -R \\ 0 & 0 & 1 & 0 & 0 & 0 \\ 0 & 0 & 0 & 1 & 0 & 0 \\ 0 & 0 & 0 & 1 & 0 & 0 \\ 0 & 0 & 0 & 0 & 0 & 1 \end{bmatrix} \times [\dot{x}_I \; \dot{x}_C \; x_I \; x_C \; V_{I1} \; I_{r1}]^t \quad \text{(EQ42)}$$

Figure 45:
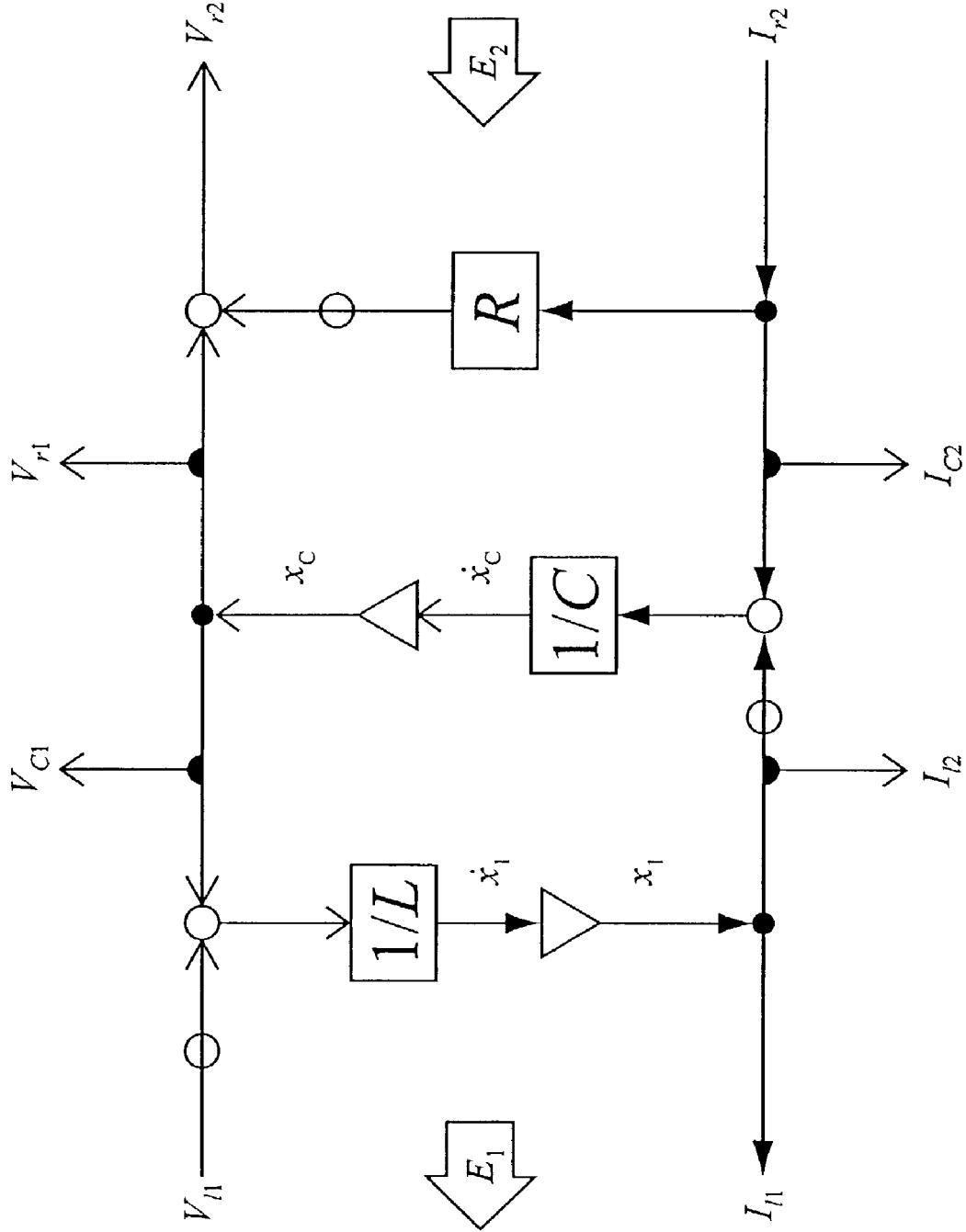
FIG. 45 is a diagram showing a functional model of an RLC electrical circuit.

EQ42 is a governing equation of a high-order function model obtained by expanding and integrating the governing equations (EQ38 to EQ40) of the functional models shown in FIG. 44. The first and second rows of EQ42 are state equations, the third and fourth rows are input/output equations, and the fifth and subsequent rows are observation equations. FIG. 45 shows an integrated functional model of EQ42.

In FIG. 45, pairs of potential variables $V_{r1}$ and $V_{r2}$ and flow variables $I_{r1}$ and $I_{r2}$ of input/output equations to be coupled to other functional models are expressed by input and output state variables at the two ends of the model, and observation variables $I_{r2}$, $V_{C1}$, $V_{C2}$, and $I_{r1}$ which are expressed by observation equations and are hidden after integration are derived via semicircular observation symbols.

<6-5. Governing Equation of Equivalent Conversion>

(1) Dual Conversion of Storage Element

In FIG. 30 above, left elements indicate storage elements of an integral type, right elements indicate functional elements of a derivative type, upper elements indicate flow storage elements such as rigidity, electrical capacitance, and the like, and lower elements indicate potential storage elements such as rigidity, inductance, and the like. The governing equations of these elements are as follows.

The governing equations of a flow storage element (integral):

$$\left. \begin{array}{l} \dot{x} = \frac{1}{M}(F_{ai} - F_{bi}) \\ P_{ao} = P_{bo} = x \end{array} \right\} \quad \text{(EQ43)}$$

The governing equations of a flow storage element (derivative):

$$\left. \begin{array}{l} x = P_{ai} = P_{bo} \\ F_{ao} = M\dot{x} + F_{bi} \end{array} \right\} \quad \text{(EQ44)}$$

The governing equations of a potential storage element (integral):

$$\left. \begin{array}{l} \dot{x} = K(P_{ai} - P_{bi}) \\ F_{ao} = F_{bo} = x \end{array} \right\} \quad \text{(EQ45)}$$

The governing equations of a potential storage element (derivative):

$$\left. \begin{array}{l} x = F_{ai} = F_{bo} \\ P_{ao} = \frac{1}{K}\dot{x} + P_{bi} \end{array} \right\} \quad \text{(EQ46)}$$

(2) Dual Conversion of Transfer and Loss Elements

In FIG. 31 above, central elements are transfer elements, right elements are loss elements, right elements are loss elements that supply supplied energy as a negative loss, upper elements are flow transfer and loss elements, and lower elements are potential transfer and loss elements. The governing equations of these elements are as follows:

The governing equations of a flow loss element:

$$\left. \begin{array}{l} P_{bo} = P_{ai} \\ F_{ao} = DP_{ai} + F_{bi} \end{array} \right\} \quad \text{(EQ47)}$$

The governing equation of a flow transfer element:

$$P_{ao} = P_{bo} = \frac{1}{D}(F_{ai} - F_{bi}) \quad \text{(EQ48)}$$

The governing equations (negative supply energy) of a flow loss element:

$$\left. \begin{array}{l} P_{ao} = P_{ai} \\ F_{bo} = -DP_{bi} + F_{ai} \end{array} \right\} \quad \text{(EQ49)}$$

The governing equations of a potential loss element:

$$\left. \begin{array}{l} F_{bo} = F_{ai} \\ P_{ao} = \frac{1}{D}F_{ai} + P_{bi} \end{array} \right\} \quad \text{(EQ50)}$$

The governing equation of a potential transfer element:

$$F_{ao} = F_{bo} = D(P_{ai} - P_{bi}) \quad \text{(EQ51)}$$

The governing equations (negative supply energy) of a potential loss element:

$$\left. \begin{array}{l} F_{ao} = F_{bi} \\ P_{bo} = -\frac{1}{D}F_{bi} + P_{ai} \end{array} \right\} \quad \text{(EQ52)}$$

(3) Dual Conversion of Supply and Load Elements

In the left frame (the potential system) of FIG. 32 mentioned above, left elements are supply elements, right elements are load elements, upper elements are those which incorporate potential side loads, and lower elements are those which incorporate flow side loads. On the other hand, elements in the right frame (the flow system) in FIG. 32 are supply and load elements vertically symmetrical to those in the left frame.

The governing equations for the left side in FIG. 32 are as follows.

The governing equation of a potential supply element with a potential side load:

$$P_{ao} = P_O - \frac{1}{D}F_{ai} \quad (EQ53)$$

The governing equation of a potential load element with a potential side load:

$$P_{ao} = P_O + \frac{1}{D}F_{ai} \quad (EQ54)$$

The governing equation of a potential supply element with a flow side load:

$$P_{ao} = \frac{1}{D}(F_O - F_{ai}) \quad (EQ55)$$

The governing equation of a potential load element with a flow side load:

$$P_{ao} = \frac{1}{D}(F_O + F_{ai}) \quad (EQ56)$$

The governing equations for the right side in FIG. 32 are as follows:

The governing equation of a flow supply element with a flow side load:

$$F_{ao} = F_O - DP_{ai} \quad (EQ57)$$

The governing equation of a flow load element with a flow side load:

$$F_{ao} = F_O + DP_{ai} \quad (EQ58)$$

The governing equation of a flow supply element with a potential side load:

$$F_{ao} = D(P_O - P_{ai}) \quad (EQ59)$$

The governing equation of a flow load element with a potential side load:

$$F_{ao} = D(P_O + P_{ai}) \quad (EQ60)$$

(4) Equivalent Conversion of Loss Characteristic

Lower models (after conversion) in FIG. 33 above are examples wherein loss characteristic $D_1$ integrates $D_2$ to be equivalently converted into an equivalent loss characteristic $D_0$. The equations and equivalent loss characteristics $D_0$ of the equivalently converted models can be respectively given by:

$$\left.\begin{array}{l} P_{bo} = \frac{1}{D_0}N^2 F_{bi} + NP_{ai} \\ F_{ao} = NF_{bi} \\ D_0 = \dfrac{1}{\dfrac{1}{D_1} + \dfrac{1}{N^2 D_2}} \end{array}\right\} \quad (EQ61)$$

-continued $$\left.\begin{array}{l} P_{bo} = NP_{ai} \\ F_{ao} = D_0 P_{ai} + NF_{bi} \\ D_0 = D_1 + N^2 D_2 \end{array}\right\} \quad (EQ62)$$

Of these equations, EQ61 describes the left equivalent conversion in FIG. 33, and EQ62 describes right equivalent conversion. As can be seen from these equations, the square of coefficient N influences loss characteristic $D_2$ side to be integrated. On the other hand, when loss characteristic $D_2$ integrate $D_1$, the square of coefficient N influences loss characteristic $D_1$ side.

(5) Equivalent Conversion of Distribution Coupling (5-1) Overall Governing Equation The governing equation of the functional model shown in FIG. 35 above is:

$$\begin{bmatrix} 0 \\ 0 \\ 0 \\ f_2 \\ f_3 \\ p_a \\ p_b \end{bmatrix} = \begin{bmatrix} -M_1 & & & -1 & -1 & 1 & -1 \\ & -1 & & 1 & & & \\ & & -1 & 1 & & & \\ & M_2 & & & & & \\ & & M_3 & & & & \\ & & & & 1 & & \\ & & & & & 1 & \end{bmatrix} \begin{bmatrix} \dot{x}_1 \\ \dot{x}_2 \\ \dot{x}_3 \\ x_1 \\ f'_2 \\ f'_3 \\ f_a \\ f_b \end{bmatrix} \quad (EQ63)$$

(5-2) Distribution and Addition Processes of State Variables

① From FIG. 35, since internal state variables $x_1$, $x_2$, and $x_3$ are equivalent to (derivatives $x_1$, $x_2$, and $x_3$), $x_2$ and $x_3$ and their derivative variables (derivatives $x_2$ and $x_3$) of the governing equation of EQ63 are respectively substituted by $x_1$.

② Likewise, since $f_2'$ and $f_3'$ are equivalent to $f_2$ and $f_3$, $f_2'$ and $f_3'$ are substituted by $f_2$ and $f_3$. The substitution yields:

$$\begin{bmatrix} 0 \\ 0 \\ 0 \\ f_2 \\ f_3 \\ p_a \\ p_b \end{bmatrix} = \begin{bmatrix} -M_1 & & & -1 & -1 & 1 & -1 \\ & -1 & & 1 & & & \\ & & -1 & 1 & & & \\ & M_2 & & & & & \\ & & M_3 & & & & \\ & & & & 1 & & \\ & & & & & 1 & \end{bmatrix} \begin{bmatrix} \dot{x}_1 \\ \dot{x}_2 \\ \dot{x}_3 \\ x_1 \\ f_2 \\ f_3 \\ f_a \\ f_b \end{bmatrix} \quad (EQ64)$$

The relationship between FIG. 35 and the overall governing equation (EQ64) is as follows.

1st to 3rd rows state equations of elements 1 to 3

4th row input/output equation of element 2

5th row input/output equation of element 1

6th and 7th rows input/output equations of whole model (5-3) Rearrangement of Columns of Overall Governing Equation The columns of the coefficient matrix of EQ64 are arranged in the following sequence ① Since internal state variables $x_2$ and $x_3$ of the state equations of the second and third rows of EQ64 are equivalent to $x_1$ and all their derivative variables are equivalent to each other, the second and third rows are erased (converted to the model in FIG. 35).

② Derivative variables in the first, second, and third columns of EQ64 are added to the first column, and the third and fifth columns are erased.

The arrangement of the columns of EQ64 yields:

$$\begin{bmatrix} 0 \\ f_2 \\ f_3 \\ p_a \\ p_b \end{bmatrix} = \begin{bmatrix} -M_1 & & & -1 & -1 & 1 & -1 \\ & M_2 & & & & & \\ & & M_3 & & & & \\ & & & 1 & & & \\ & & & & 1 & & \end{bmatrix} \begin{bmatrix} \dot{x}_1 \\ \dot{x}_1 \\ \dot{x}_1 \\ x_1 \\ f_2 \\ f_3 \\ f_a \\ f_b \end{bmatrix} \quad (EQ65)$$

(5-4) Distribution Coupling Process of Derivative State Variables

Substitution of dependent variables $f_2$ and $f_3$ of the second and third rows of EQ65 into $f_2$ and $f_3$ of the third and fourth columns to arrange EQ65 yields:

$$\begin{bmatrix} 0 \\ p_a \\ p_b \end{bmatrix} = \begin{bmatrix} -(M_1+M_2+M_3) & 0 & 1 & -1 \\ & & 1 & 0 & 0 \\ & & 1 & 0 & 0 \end{bmatrix} \begin{bmatrix} \dot{x}_1 \\ x_1 \\ f_a \\ f_b \end{bmatrix} \quad (EQ66)$$

EQ66 is the governing equation of an equivalent functional model after integration, and its configuration is as follows:

1st row state equation

2nd and 3rd rows input/output equations

The equivalent characteristic $M_a$ integrated by distribution coupling is described by:

$$M_a = M_1 + M_2 + M_3 \quad (EQ67)$$

(6) Equivalent Conversion of Addition Coupling (6-1) Overall Governing Equation

The governing equation of the functional model shown in FIG. 37 is described by:

$$\begin{bmatrix} 0 \\ 0 \\ 0 \\ p_a \\ p_b \\ f_{o1} \\ f_{o2} \\ f_{o2} \\ p_{o1} \\ p_{o2} \\ p_{o3} \end{bmatrix} = \begin{bmatrix} -M_1 & & & & & & & & & 1 & & \\ & -M_2 & & & & & & & & & 1 & \\ & & -M_3 & & & & & & & & & 1 \\ & & & & & & 1 & 1 & 1 & & & \\ & & & & & & 1 & 1 & 1 & & & \\ & & & & 1 & -1 & & & & & & \\ & & & & 1 & -1 & & & & & & \\ & & & & 1 & -1 & & & & & & \\ & & & & & & & & & 1 & & \\ & & & & & & & & & & 1 & \\ & & & & & & & & & & & 1 \end{bmatrix} \begin{bmatrix} \dot{x}_1 \\ \dot{x}_2 \\ \dot{x}_3 \\ x_1 \\ x_2 \\ x_3 \\ f_a \\ f_b \\ p_{i1} \\ p_{i2} \\ p_{i3} \\ f_{i1} \\ f_{i2} \\ f_{i3} \end{bmatrix} \quad (EQ68)$$

(6-2) Distribution and Addition Processes of State Variables

The dependent and independent variables of EQ68 are arranged from the distribution- and addition-coupled elements in FIG. 37 in the following sequence.

① By substituting $f_{i1}$, $f_{i2}$, and $f_{i3}$ of independent variables by $f_{o1}$, $f_{o2}$, and $f_{o3}$ equivalent thereto, $f_{i1}$, $f_{i2}$, and $f_{i3}$ are erased.

② Substitution of the sixth to eighth rows having identical dependent variables into $f_{o1}$, $f_{o2}$, and $f_{o3}$ of independent variables substituted in ① erases $f_{o1}$, $f_{o2}$, and $f_{o3}$ from the equation.

③ Substitution of $p_{i1}$, $p_{i2}$, and $p_{i3}$ of independent variables by $p_{o1}$, $p_{o2}$ and $p_{o3}$ equivalent thereto erases $p_{i1}$, $p_{i2}$, and $p_{i3}$ from the equation.

④ Substitution of the ninth to 11th rows having identical dependent variables into $p_{o1}$, $p_{o2}$, and $p_{o3}$ of independent variables substituted in ③ erases $p_{o1}$, $p_{o2}$, and $p_{o3}$ from the equation.

When the first to third rows of EQ68 are rewritten using the above processing result, we have:

$$\begin{bmatrix} 0 \\ 0 \\ 0 \\ p_a \\ p_b \end{bmatrix} = \begin{bmatrix} -M_1 & & & & & 1 & -1 \\ & M_2 & & & & 1 & -1 \\ & & M_3 & & & 1 & -1 \\ & & & 1 & 1 & 1 & \\ & & & 1 & 1 & 1 & \end{bmatrix} \begin{bmatrix} \dot{x}_1 \\ \dot{x}_2 \\ \dot{x}_3 \\ x_1 \\ x_2 \\ x_3 \\ f_a \\ f_b \end{bmatrix} \quad \text{(EQ69)}$$

EQ69 has the following configuration.

1st to 3rd rows state equations of elements 1 to 3

4th and 5th rows input/output equations (6-3) Addition Coupling Process of Derivative State Variable Addition coupling of addition-coupled internal state variables is arranged as follows.

When the first to third rows of EQ69 are rewritten, we have:

$$\begin{bmatrix} \dot{x}_1 \\ \dot{x}_2 \\ \dot{x}_3 \end{bmatrix} = \begin{bmatrix} \frac{1}{M_1} & -\frac{1}{M_1} \\ \frac{1}{M_2} & -\frac{1}{M_2} \\ \frac{1}{M_3} & -\frac{1}{M_3} \end{bmatrix} \begin{bmatrix} f_a \\ f_b \end{bmatrix} \quad \text{(EQ70)}$$

From addition coupling in FIG. 37, since the sum of (derivatives $x_1$, $x_2$, and $x_3$) is derivation $x_a$, EQ70 can be described by:

$$\dot{x}_a = \left(\frac{1}{M_1} + \frac{1}{M_2} + \frac{1}{M_3}\right)(f_a + f_b) \quad \text{(EQ71)}$$

EQ71 can be rewritten as:

$$0 = \frac{1}{\frac{1}{M_1} + \frac{1}{M_2} + \frac{1}{M_3}} \dot{x}_a + (f_a + f_b) \quad \text{(EQ72)}$$

Likewise, since the sum of $x_1$, $x_2$, and $x_3$ is $x_a$, the fourth and fifth rows of EQ68 can be described by:

$$\begin{bmatrix} p_a \\ p_b \end{bmatrix} = \begin{bmatrix} 1 \\ 1 \end{bmatrix} x_a \quad \text{(EQ73)}$$

EQ72 and EQ73 can be combined as:

$$\begin{bmatrix} 0 \\ p_a \\ p_b \end{bmatrix} = \begin{bmatrix} -\frac{1}{\frac{1}{M_1} + \frac{1}{M_2} + \frac{1}{M_3}} & & 1 & -1 \\ & 1 & & \\ & 1 & & \end{bmatrix} \begin{bmatrix} \dot{x}_a \\ x_a \\ f_a \\ f_b \end{bmatrix} \quad \text{(EQ74)}$$

EQ74 is a high-order governing equation after the derivative variables are added, and its internal configuration is as follows.

1st row state equation

2nd and 3rd rows input/output equations

The equivalent storage characteristic $M_a$ integrated by addition coupling is described by:

$$M_a = \frac{1}{\frac{1}{M_1} + \frac{1}{M_2} + \frac{1}{M_3}} \quad \text{(EQ75)}$$

<6-6. Execution Governing Equation>

(6-6-1. Execution Governing Equation of Transient State)

In order to predict the behavior of the system from EQ27 mentioned above by simulation, an execution governing equation used to execute this simulation must be derived in the following sequence.

The state equation extracted from EQ27 is:

$$0 = X\dot{V}_{sta} + AV_{sta} + BV_{inp} + G \quad \text{(EQ76)}$$

By erasing X from EQ76 to convert it to a dependent variable, we have:

$$\dot{V}_{sta} = -X^{-1}AV_{sta} - X^{-1}BV_{inp} - X^{-1}G \quad \text{(EQ77)}$$

Substitution of the input/output equation and observation equation extracted from EQ34 into EQ77 yields:

$$\begin{bmatrix} \dot{V}_{sta} \\ \dot{V}_{out} \\ \dot{V}_{obs} \end{bmatrix} = \begin{bmatrix} -X^{-1}A & -X^{-1}B & -X^{-1}G \\ C - YX^{-1}A & D - YX^{-1}B & H - YX^{-1}G \\ E - ZX^{-1}A & F - ZX^{-1}B & K - ZX^{-1}G \end{bmatrix} \begin{bmatrix} \dot{V}_{sta} \\ \dot{V}_{inp} \\ 1 \end{bmatrix} \quad \text{(EQ78)}$$

EQ78 includes a state equation in the first row, an input/output equation in the second row, and an observation equation in the third row in turn from the top. In EQ78, the input state variable $V_{inp}$ can receive an external input, but a pair of input and output state variables $V_{inp}$ and $V_{out}$ cannot be connected to another functional model. The internal variable $V_{sta}$ is further integrated to be substituted by:

$$\begin{bmatrix} \dot{V}_{sta} \\ \dot{V}_{acc} \\ \dot{V}_{out} \\ V_{obs} \\ \dot{V}_{acc} \end{bmatrix} = \begin{bmatrix} -X^{-1}A & 0 & -X^{-1}B & -X^{-1}G \\ 1 & 0 & 0 & 0 \\ C - YX^{-1}A & 0 & D - YX^{-1}B & H - YX^{-1}G \\ E - ZX^{-1}A & 0 & F - ZX^{-1}B & K - ZX^{-1}G \\ 0 & 1 & 0 & 0 \end{bmatrix} \begin{bmatrix} \dot{V}_{sta} \\ \overline{V}_{acc} \\ \dot{V}_{inp} \\ 1 \end{bmatrix} \quad \text{(EQ79)}$$

EQ79 is an equation that sets all internal state variables as accumulated observation variables, in which the second row is a state equation of the accumulated observation variable, and the fifth row is an accumulated observation equation. A derivative $V_{acc}$ in EQ79 is an internal derivative accumulated observation variable, $/V_{acc}$ is an internal accumulated observation variable, and $V_{acc}$ is an accumulated observation variable, (6-6-2. Execution Governing Equation of Steady State)

The governing equation of a steady state in which the internal derivative state variable: derivative $V_{sta}$ of a functional model can be obtained by equating derivative $V_{sta}$ in that equation to zero. When the term of a state equation is erased from EQ27, we have:

$$0 = AV_{sta} + BV_{inp} 30 \, G \qquad (EQ80)$$

From EQ80, the state variable $V_{sta}$ is given by:

$$V_{sta} = -A^{-1} B V_{inp} - A^{-1} G \qquad (EQ81)$$

An equation of the steady state obtained by substituting $V_{sta}$ of EQ81 into an input/output equation and observation equation extracted from EQ34 is described by:

$$\begin{bmatrix} V_{OUT} \\ V_{OBS} \end{bmatrix} = \begin{bmatrix} D - CA^{-1}B & H - CA^{-1}G \\ F - EA^{-1}B & K - EA^{-1}G \end{bmatrix} \begin{bmatrix} V_{inp} \\ 1 \end{bmatrix} \qquad (EQ82)$$

In EQ82, the first row is a governing equation of the steady state, and the second row is a steady observation equation.

The governing equation of the steady characteristics can be widely used in performance computations and analysis of products and components such as the rotational speed, torque characteristics, transfer efficiency, and the like. Therefore, development of actual products and components requires execution governing equations that simulate transient behaviors and steady governing equations that simulate the steady state.

7. Example of Expansion and Integration of Model

<7-1. Example of Processing Sequence>

The expansion and integration schemes of functional models described above can be automatically converted into a high-order equivalent functional model by a computer which installs these schemes. FIG. 46 shows an outline of that sequence.

In the basic sequence shown in FIG. 46, functional components that form a product are modeled, and these models are selected and expanded for respective high-order layers. The structurized functional model groups are integrated into an equivalent functional model of a high-order layer, and required mechanism models are built in. Finally, the adequacy of the equivalent functional model is verified by simulation. Furthermore, the integrated equivalent functional model is integrated into a high-order layer by expansion together with other functional model groups.

The principal sequence of expansion and integration is as follows.

(Step 1: Hierarchically Structurized Models)

Functional components that form a product are extracted, and a hierarchical structure of models that simulate these functional components is formed with reference to component arrangements sorted for respective assemblies. An example of the hierarchical structurization corresponds to the upper figures of FIGS. 19, 20, and the like.

(Step 2: Modeling of Functional Components)

Functional models (low-order) of respective functional components are modeled, and their governing equations (low-order) are derived.

(Step 3: Select Low-Order Functional Components)

Low-order functional models that form a high-order functional model for each assembly are selected. As for nesting functional models, the frame of functional models is defined.

(Step 4: Select Nesting Functional Models)

Models that can meet the purpose intended are selected from the functional model groups which are built in a low-order layer in a nested structure, and are built in.

(Step 5: Couple Functional Models)

Low-order functional models to be assembled are extracted, and input state variable names that couple low-order functional components are substituted by output state variable names. Likewise, dependent variable names of input/output equations of low-order governing equations are substituted by independent variable names to be coupled.

(Step 6: Generate Structure Governing Equation (Before Integration))

A governing equation (high-order) of a high-order functional model is generated to incorporate low-order governing equations. Elements of the incorporated low-order governing equations are arranged in a matrix arranged in rows and columns of EQ30.

(Step 7: Low-Order Conversion of Functional Models)

Unnecessary storage characteristics such as stiffness, mass, and the like are arranged to attain low-order conversion. In the low-order conversion method, storage characteristics that do not influence the simulation result of functional models are erased. On the other hand, storage characteristics which have influences are incorporated into the same kinds of other storage characteristics to obtain equivalent storage characteristics.

(Step 8: Conversion from One-to-Many to One-to-One Coupling)

Independent variable rows corresponding to input state variables of one-to-many distribution coupling are added, and dependent variable rows corresponding to output state variables of addition coupling are added. With this process, all horizontally expanded functional model groups are converted into duality coupling.

(Step 9: Distribution Coupling of Derivative State Variables)

Storage characteristics of the closed system in which derivative state variables are distribution-coupled are converted into an equivalent storage characteristics. The detailed sequence is based on "distribution coupling of derivative state variables" mentioned above.

(Step 10: Addition Coupling of Derivative State Variables)

Storage characteristics of the closed system in which derivative state variables are addition-coupled are converted into an equivalent storage characteristics. The detailed sequence is based on "addition coupling of derivative state variables" mentioned above.

(Step 11: Convert into Equivalent Governing Equation)

Dependent variables of internal governing equations having identical state variable names are substituted in independent variables of governing equations to erase them. The detailed sequence is based on "integration to equivalent governing equation" mentioned above.

(Step 12: Convert Internal Characteristics into Equivalent Characteristic)

The internal characteristics of low-order functional models are converted into equivalent characteristics to generate high-order mechanism models to be substituted in the internal characteristics of a high-order functional model. The high-order mechanism models include low-order mechanism models. The detailed sequence corresponds to the equivalent storage characteristics of "distribution coupling of derivative state variables", "addition coupling of derivative state variables", and the like.

(Step 13: Synthesize Observation Equations)

Observation equations before and after integration are added to a high-order observation equation. The detailed sequence is based on "integration into equivalent governing equation".

(Step 14: Modeling of High-Order Governing Equation)

Since the integrated high-order governing equation can be expressed by a general form of a functional model shown in FIG. 41, a high-order functional model is generated based on this.

(Step 15: Build in Mechanism Models)

Mechanism models that generate internal characteristics of the equivalently converted functional model are built in. As for nesting mechanism models, the frame of mechanism models is defined.

(Step 16: Select Nesting Mechanism Models)

Models that can meet the purpose intended are selected from the mechanism model groups which are built in a low-order layer in a nested structure, and are built in.

(Step 17: Verify High-Order Functional Model)

The internal characteristic values or empirical values of assembled high-order functional components are designated, the governing equations of high-order functional models are converted into execution governing equations, and adequacy is verified by simulation or the like. Especially, verification is necessary when low-order conversion is done in the integration process of models.

(Step 18: Save (Register) High-Order Model)

Functional models that simulate assembled high-order functional components and their governing equations are registered (saved) as needed. The saved models are re-used when simulation evaluation of a sole assembly functional component is done, and when such functional component is commonly built in another product.

The governing equation of a high-order functional model integrated in this sequence has the same structure as those of governing equations of low-order functional models to be integrated. Therefore, the governing equation of the integrated high-order functional model can be integrated to a still high-order functional model when it is coupled to other functional models and is expanded.

The aforementioned integration on a computer includes a method of performing performance evaluation, numerical value analysis, and the like by making direct simulation based on numerical value data of respective characteristics, and a method of generating high-order governing equations, and examining a product to components with consistency using various schemes such as an identification scheme, optimization scheme, and the like. These methods are used in correspondence with purposes intended. Since expansion and integration represent causality from a product to components, they can be incorporated in activities of the overall product development such as quality function development (QFD) that uses them.

<7-2. Example of Rear Wiper System>

The expansion and integration schemes are applied to a rear wiper system built in a rear window of an automobile as an actual product, and model integration along with component assembly will be tried.

(7-2-1. Component Arrangement and Hierarchical Functional Models)

Figure 47:
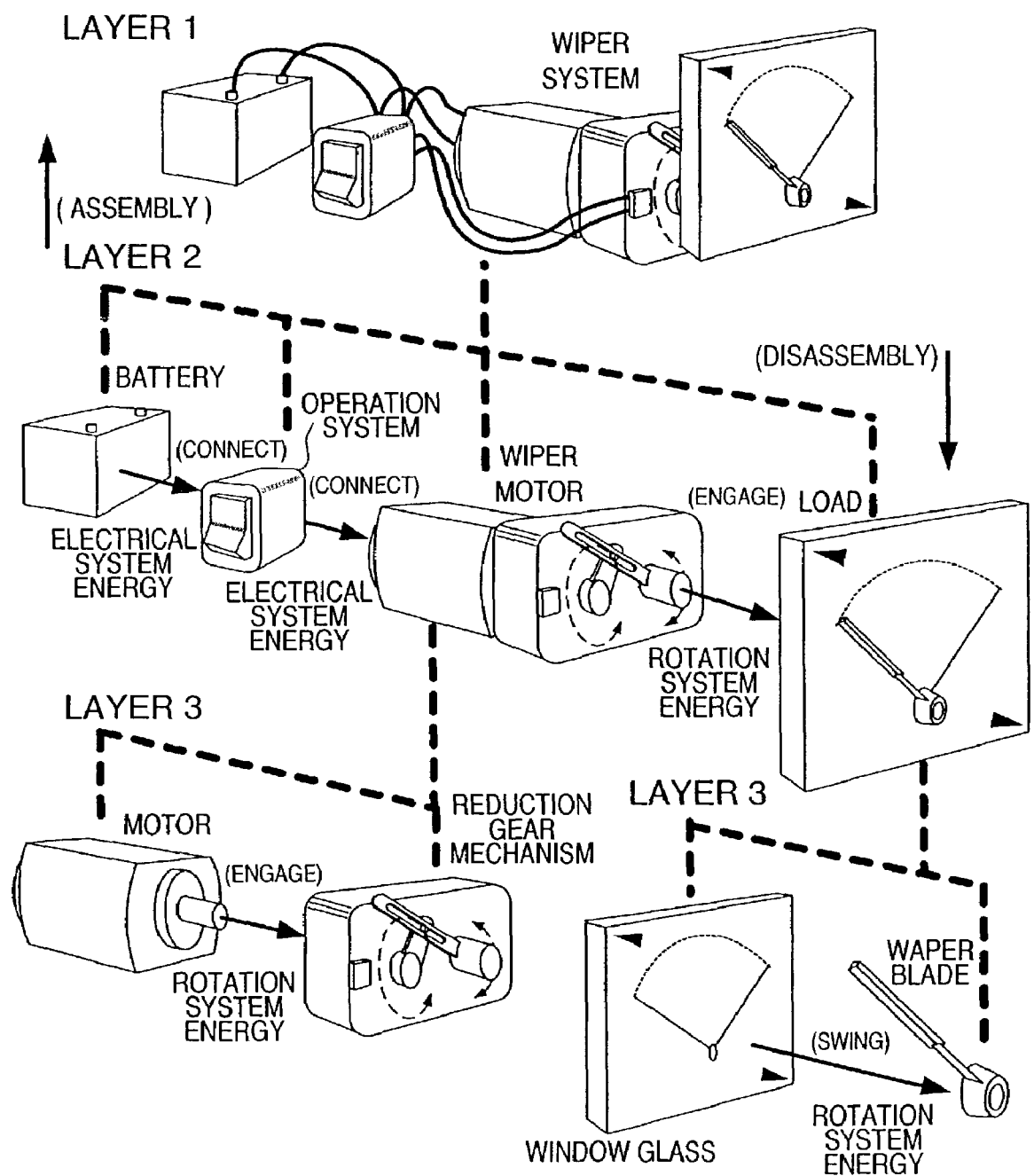
FIG. 47 shows a display example of the component arrangement of a rear wiper system.

FIG. 47 shows a display example based on the component arrangement of this system. Of respective layers, layer 1 corresponds to a state wherein the system is mounted on a vehicle, layer 2 corresponds to states of individual functional components, i.e., a battery, operation switch, wiper motor, and load before they are built in the vehicle, and layer 3 corresponds to a state wherein a motor and reduction gear mechanism, a window glass and wiper blade, and the like are individually disassembled.

Figure 48:
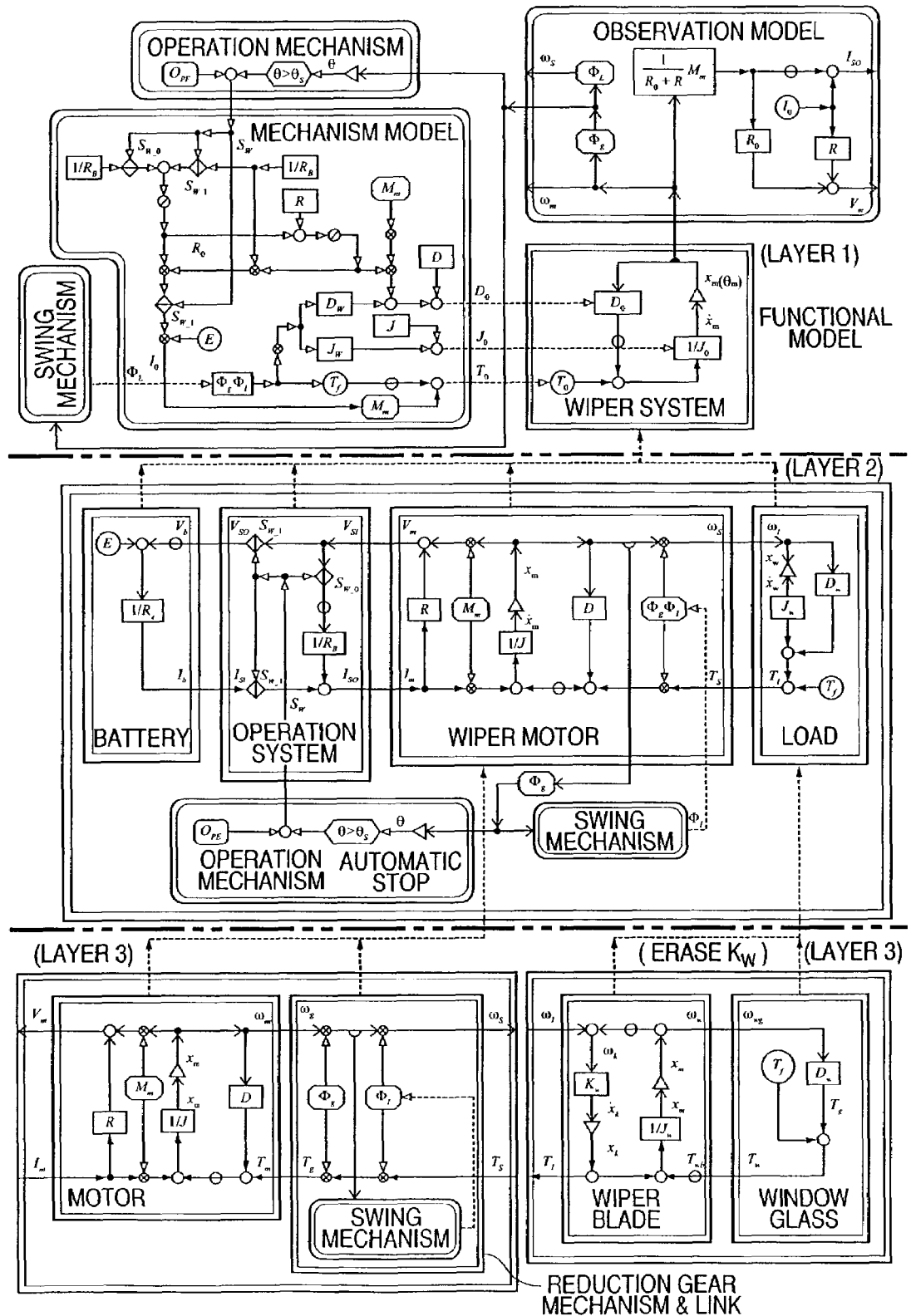
FIG. 48 shows a display example of functional models of the rear wiper system.
Figure 48A:
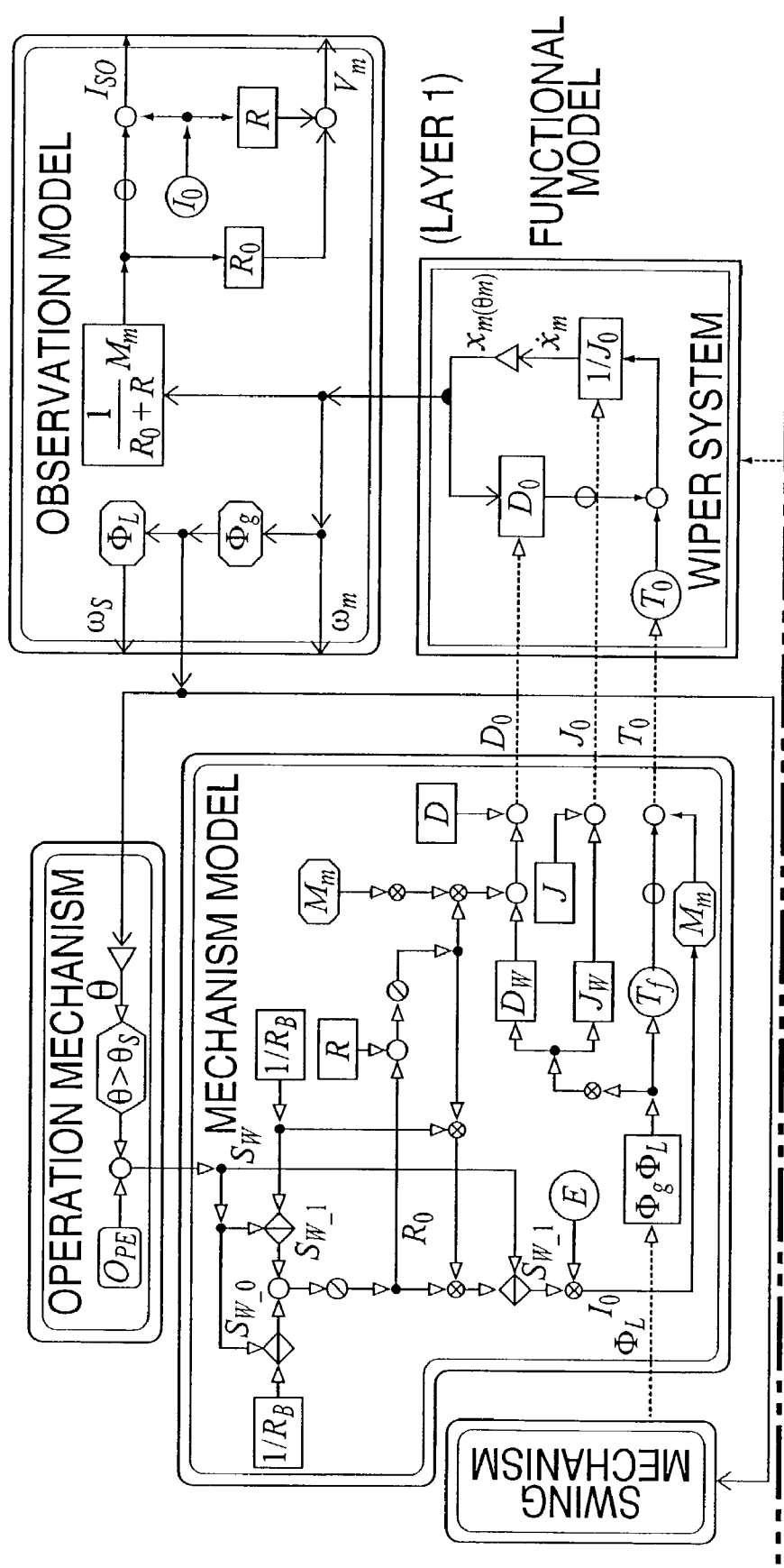
Figure 48B:
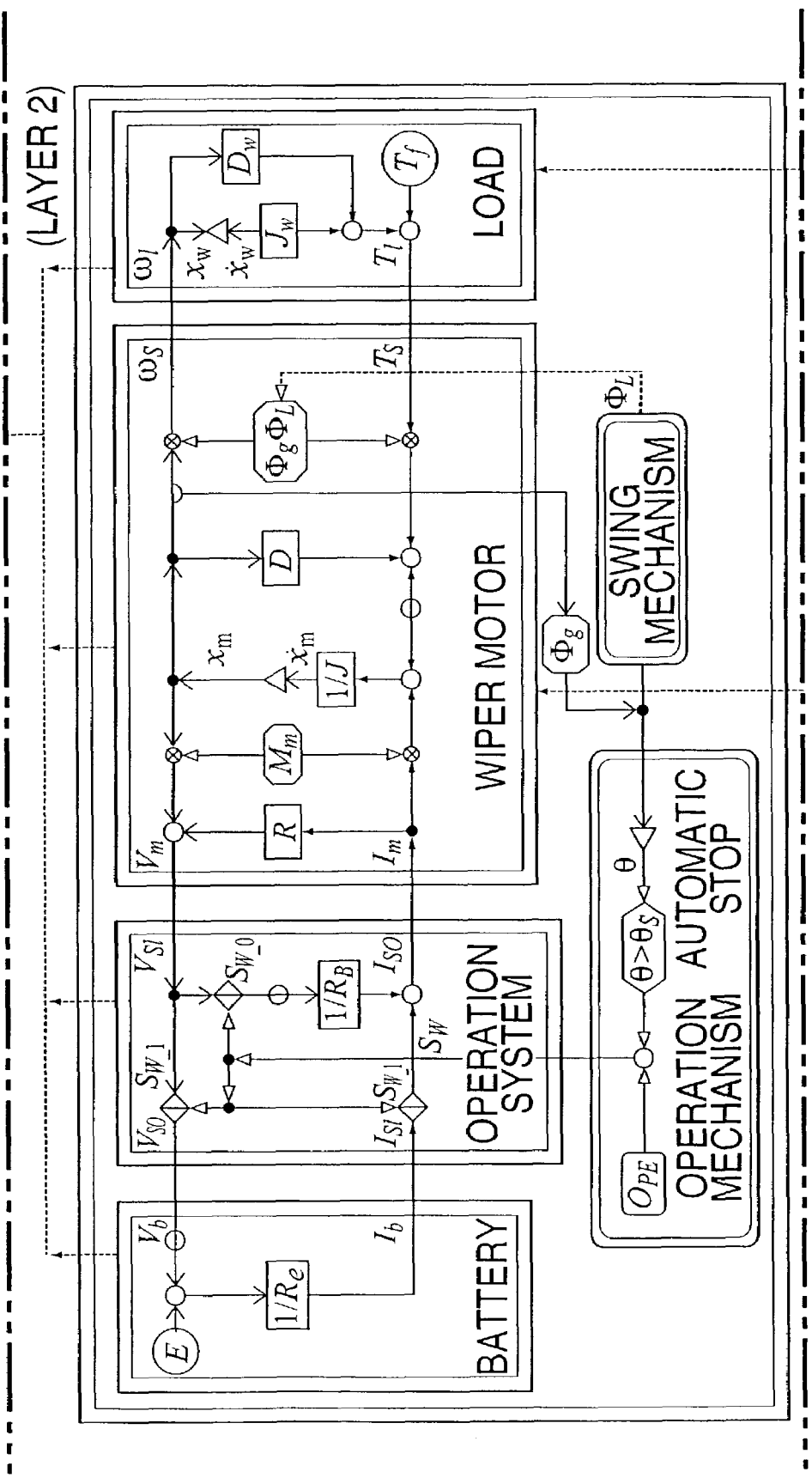
Figure 48C:
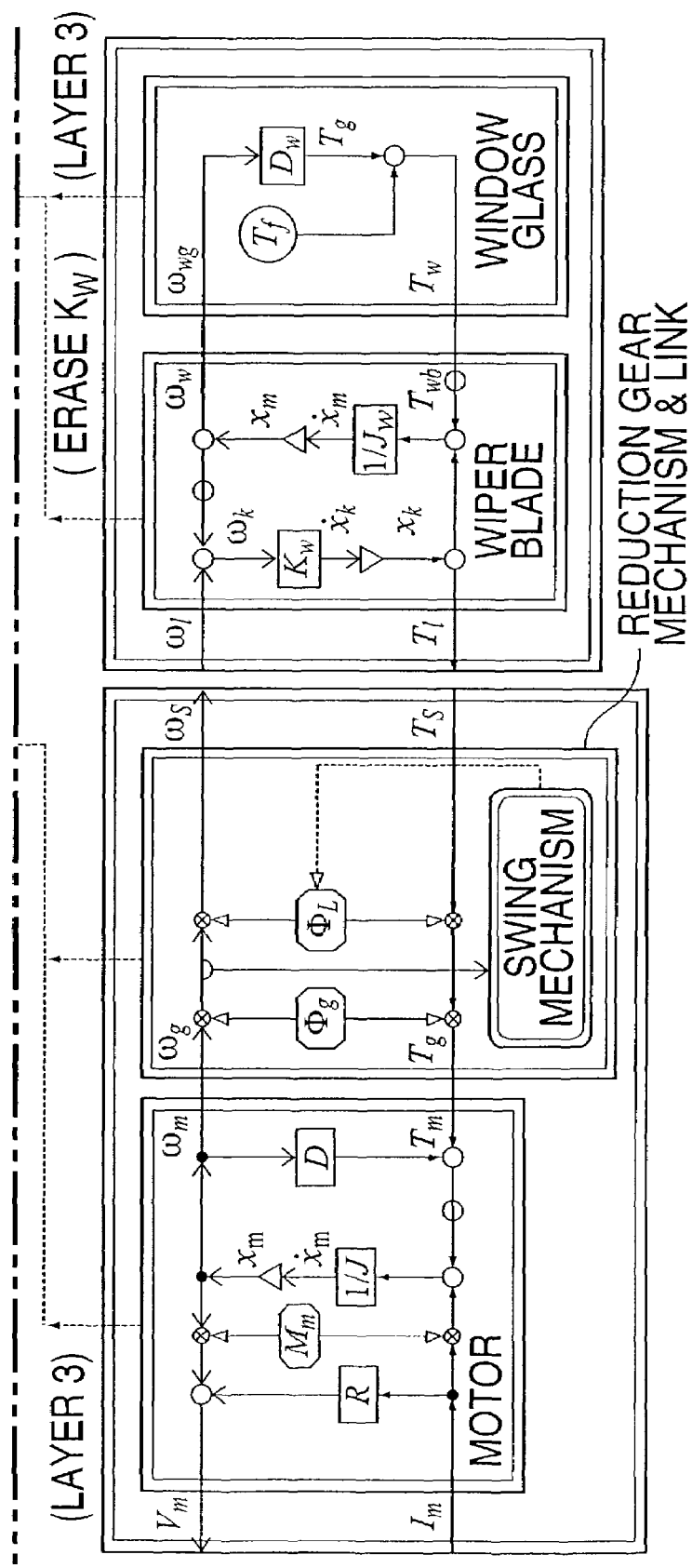

FIG. 48 shows functional models of this wiper system. As state variables of respective functional models, V is a voltage; I, a current; ω, an angular velocity; and T, torque. The characteristics of the functional models are as follows.

The right side of layer 3 represents the window glass and blade, in which $T_f$ is the frictional torque; $D_w$, an equivalent viscous coefficient; $J_w$, the moment of inertia of the blade; and $K_w$, the rigidity of the blade. The left side of layer 3 represents sole components of the reduction gear mechanism and motor, in which $\Phi_L$ is the transfer coefficient of the swing mechanism $\Phi_g$, the reduction gear ratio; D, an equivalent viscous coefficient; J, the moment of inertia; $M_m$, the motor constant that converts an electrical system and rotation system; and R, the coil resistance, in turn from the right side. The transfer coefficient $\Phi_L$ is a mechanism model of the swing mechanism having a nonlinear transfer characteristic, and is succeeded to equivalent coefficients $\Phi_g$ and $\Phi_L$ in a wiper motor after integration. Note that the frictional torque $T_f$ becomes $T_f=0$ when the angular velocity of the blade is zero, and a mechanism model is omitted.

Layer 2 is comprised of, in turn from the right side, a load integrated via low-order conversion by erasing the blade rigidity $K_w$ of layer 3, a wiper motor obtained by integrating layer 3, a battery consisting of an electromotive force E and internal resistance Re, and an operation system that makes power supply operation to be supplied to a motor, and electrically brakes the motor upon stopping. The operation system has an operation mechanism of a nonlinear mechanism model that changes a model structure by dividing and connecting models. The electrical brake operation upon stopping is done by a mechanism model of an operation mechanism indicated by a round frame. A rotation angle θ is an accumulated potential variable obtained by integrating the angular velocity $\omega_s$.

Layer 1 is an equivalent functional model of the uppermost layer obtained by integrating layer 2. A functional model is combined to the equivalent characteristics of a torque source $T_O$, a flow supply element with a loss characteristic $D_O$, and a potential storage element $J_O$. A mechanism model on the left side of this functional model generates equivalent characteristics $T_O$, $D_O$, and $J_O$, and succeeds the transfer coefficient $\Phi_L$ and the nonlinear mechanism model of the operation mechanism from layer 2. An observer that observes hidden state variables is provided on the upper side of the functional model.

As actions of the operation mechanism for obtaining a nonlinear model structure, generation of an operation signal $S_w$ for making ON/OFF operations by an operation system $O_{PE}$, and an automatic stop mechanism for holding the operation signal $S_w$ until the rotation angle θ of the wiper blade returns to a stop angle $\theta_s$ are built in. The operation system comprises switch elements $S_{W\_0}$ and $S_{W\_1}$ switched by the operation signal $S_w$. When $S_W=1$, $S_{W\_0}=0$ and $S_{W\_1}=1$ are set to supply a current to the motor; when $S_W=0$, $S_{W\_0}=1$ and $S_{W\_1}=0$ are set, and a current flows back to a brake resistance RB that absorbs the motor electromotive force, thus electrically braking and immediately stopping the motor. Note that a description of details of modeling of the swing mechanism, motor, and operation system will be omitted.

(7-2-2. Modeling of Motor)

The functions (actions) of the functional components shown in FIG. 47 must be modeled, expanded, and integrated up to a wiper system. In this case, a method of modeling the motor in layer 3 in FIG. 48 from functional components will be examined. This process may be considered as layers 4 and 5. In this case, the lowermost layer is a functional element itself, and the uppermost layer is a product to be modeled. A layer from which expansion•integration begins is determined depending on a layer to which a component used belongs. Therefore, the functional element of the lowermost layer is often a functional expression which is not divided into components, and a target component can often be designed from a functional model integrated based on such functional element.

Figure 49:
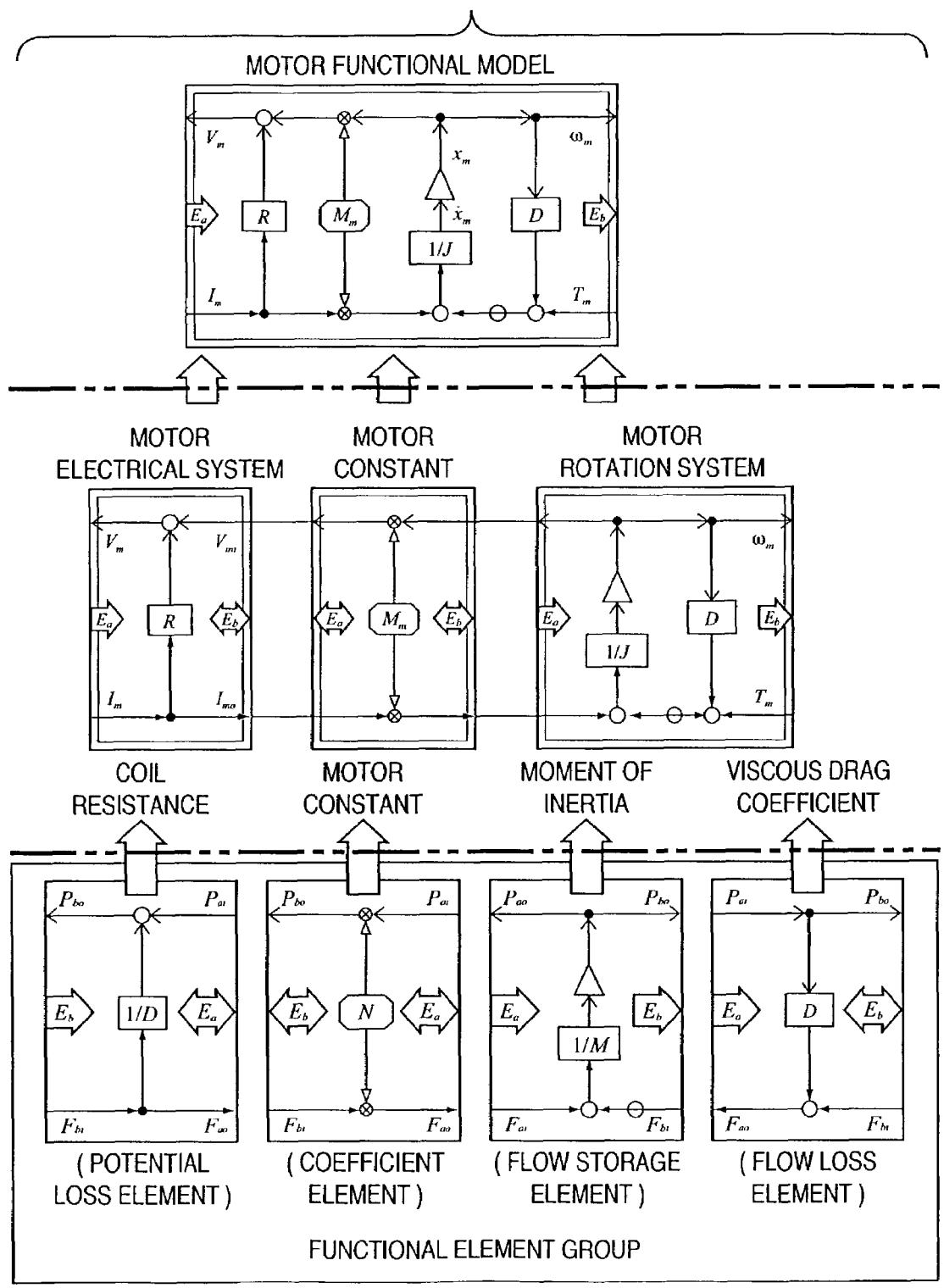
FIG. 49 is a diagram showing a modeling example of a motor using functional elements.
Figure 49A:
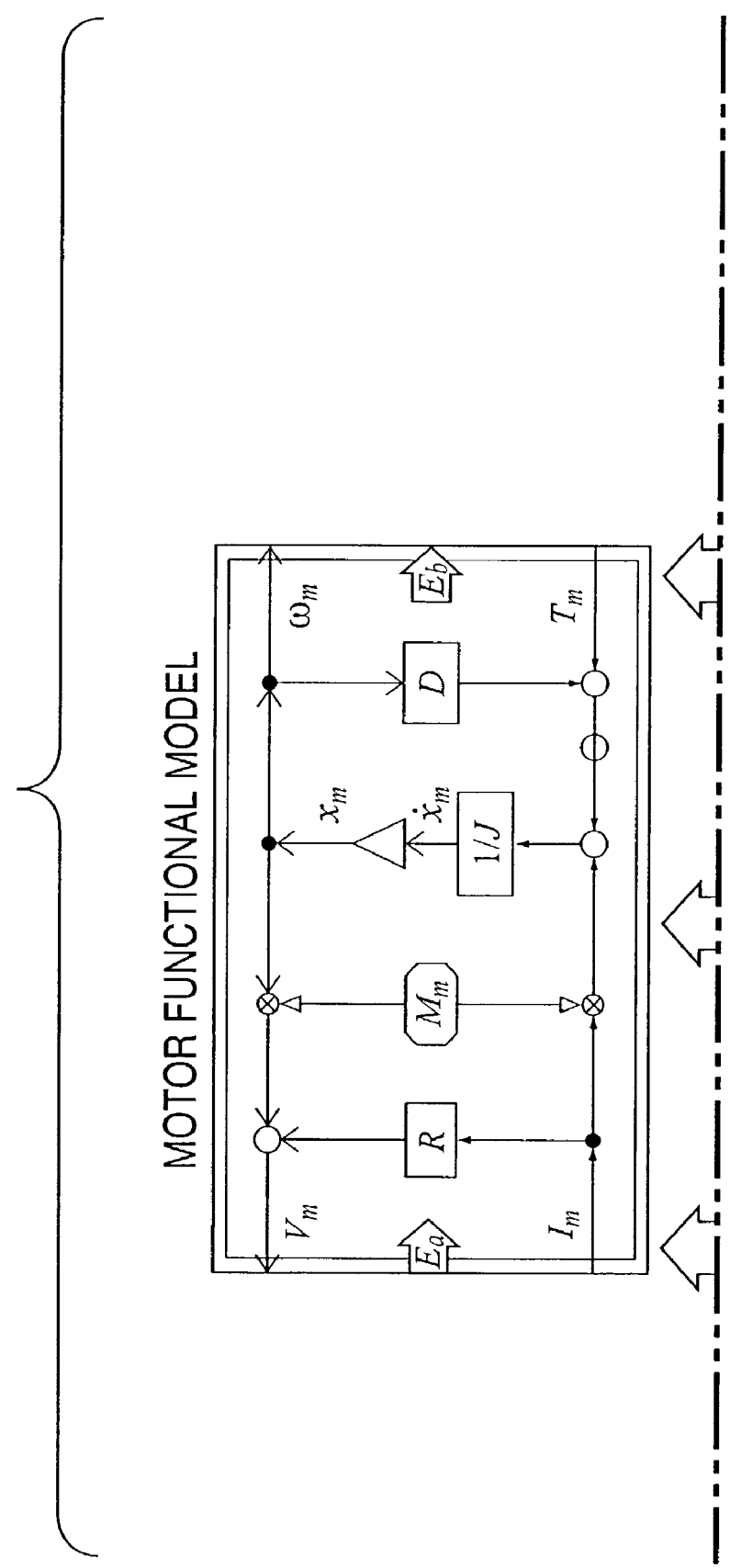
Figure 49B:
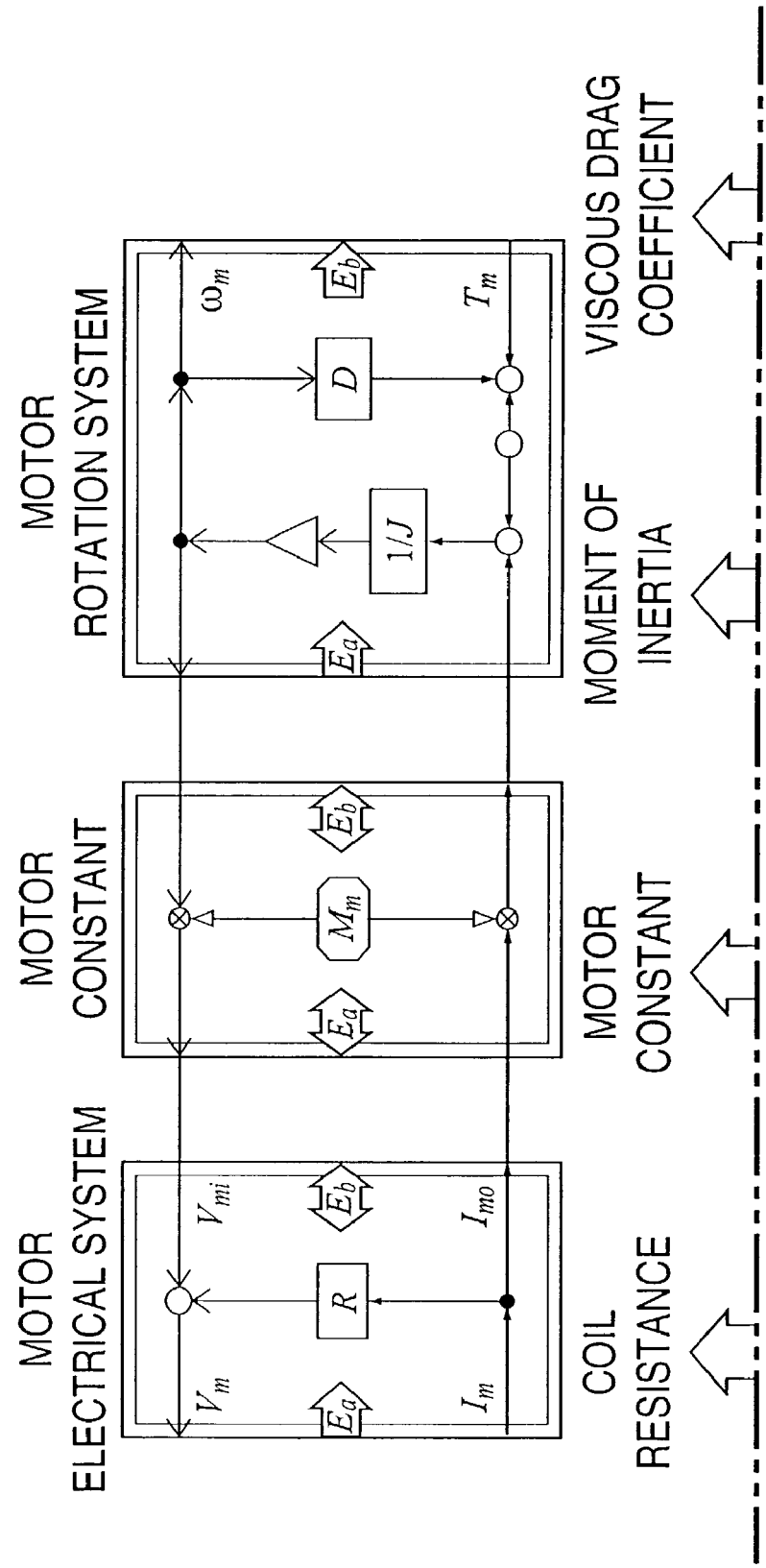
Figure 49C:
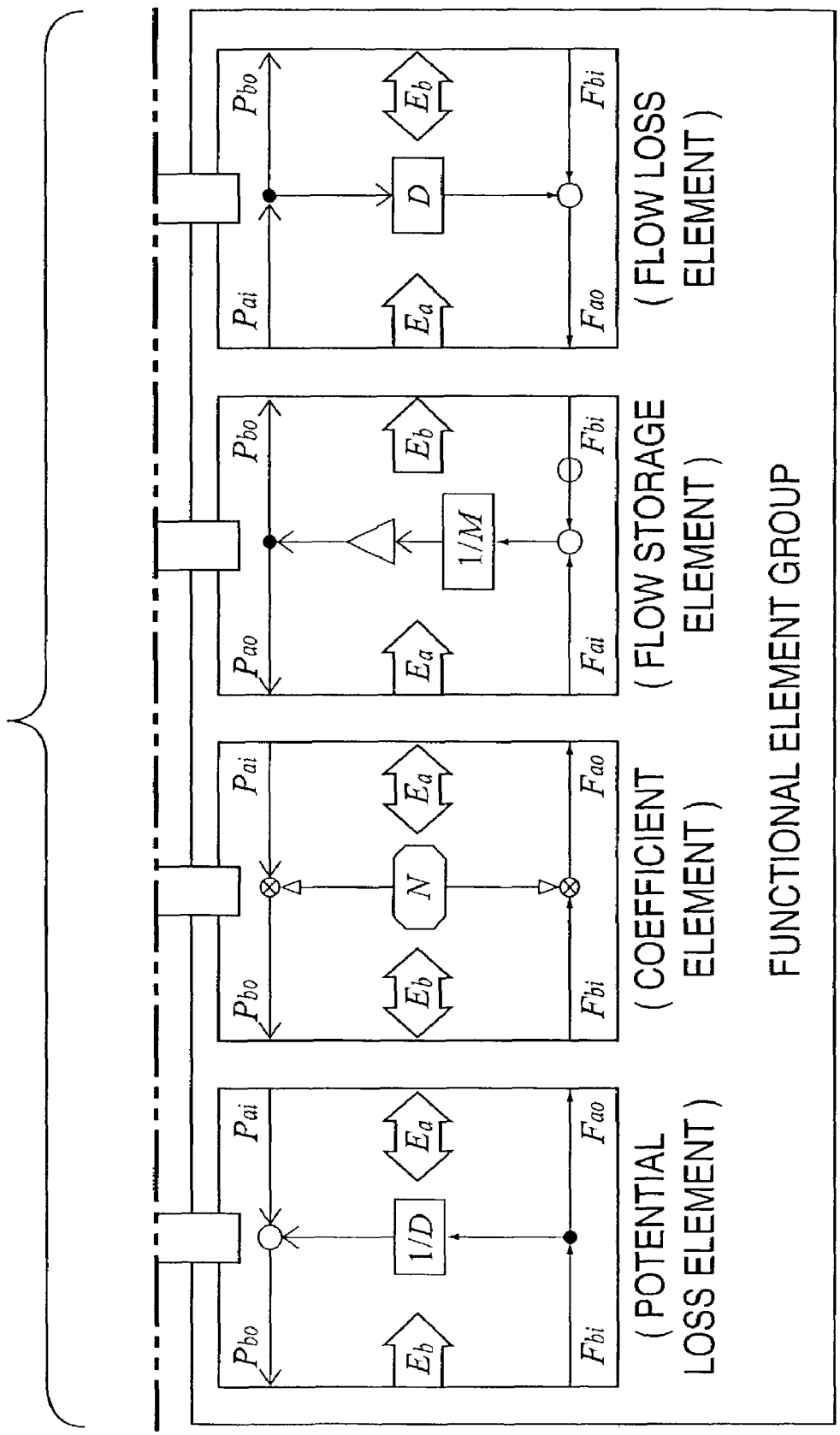

The basic function of the motor is to receive electricity, convert it into rotation, and drive the load. Therefore, the motor includes different physical unit systems, i.e., an electrical system and rotation system, and a physical unit system conversion function for relating these systems. The electrical system has electrical characteristics such as a coil resistance, inductance, and the like of electric elements, and the rotation system has characteristics of machine motions such as moment of inertia, viscous drag coefficient, and the like. These systems can be related by a motor constant determined by the number of effective conductors of a motor coil, magnetic circuit, and the like. FIG. 49 shows this relation.

In FIG. 49, the lowermost stage indicates functional elements which represent the internal functions of the motor, the middle stage indicates the internal functions of the motor modeled using the functional components, and the uppermost stage indicates a functional model of the motor integrated by expanding the internal functions. In this case, low-order conversion is attained by representing the internal function of the electrical system by the coil resistance, and omitting the inductance.

Note that a description of the sequences for modeling other functional components from the functional elements will be omitted.

(7-2-3. Low-order Conversion of Rigidity of Blade)

Figure 50:
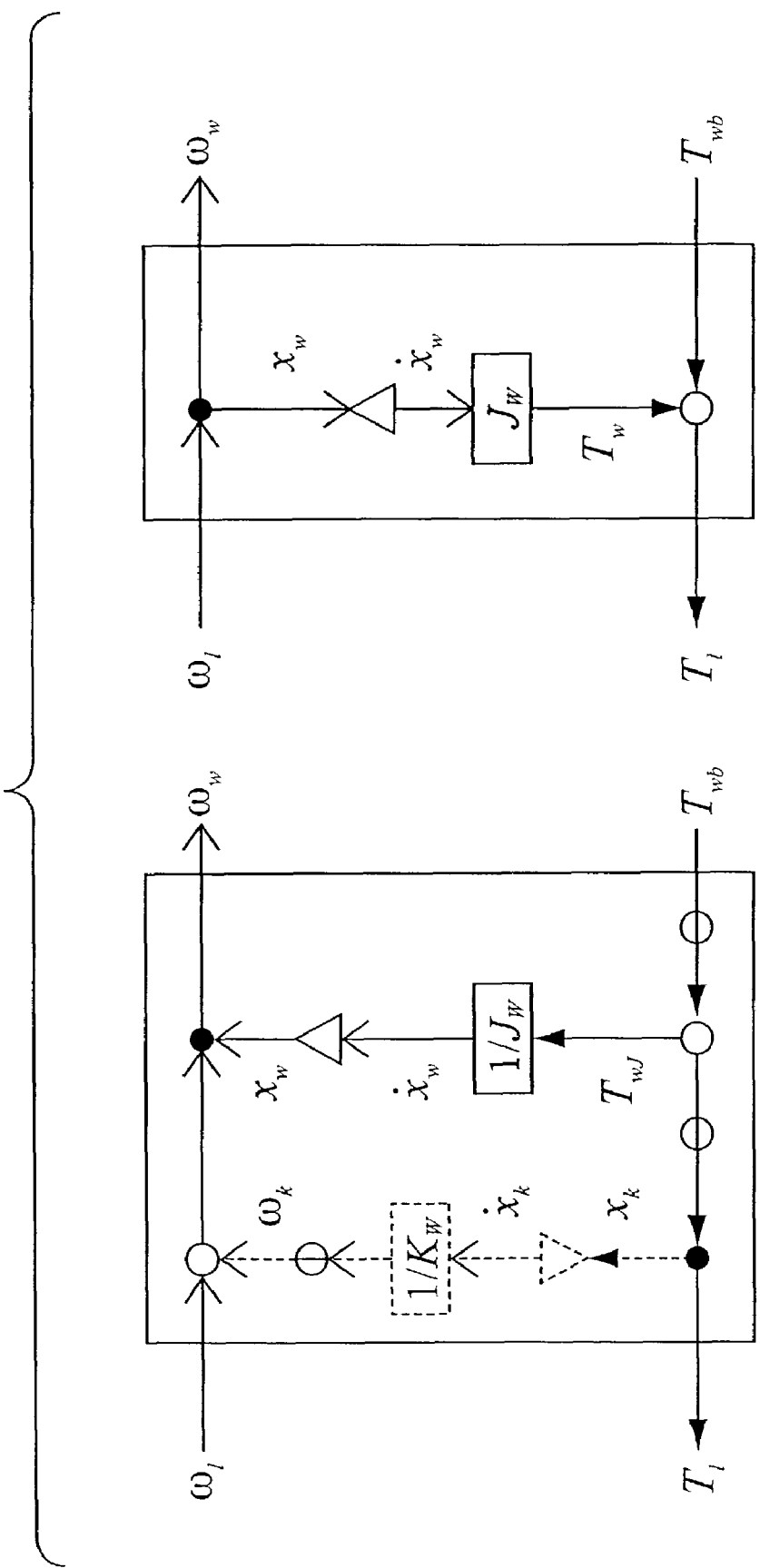
FIG. 50 shows a low-order conversion example of blade rigidity by erasing $K_w$.

Upon integrating the models of the wiper blade and window glass of layer 3 in FIG. 48, low-order conversion for erasing blade rigidity $K_W$ of the wiper is tried. The blade rigidity $K_W$ is required in terms of mechanical strength but does not directly influence motion characteristics. Hence, $K_W$ is erased by conversion on the block diagram of the functional model. In the functional model, the storage characteristics of a derivative form can be dual-converted into an integral form. FIG. 50 shows an example of this conversion. FIG. 50 shows a state (a) during a process for erasing rigidity $K_W$ (dotted line) and dual-converting the moment $J_W$ of inertia of the blade into a derivative form, and a state (b) after conversion. The low-order conversion sequence will be explained below along the block diagram.

The flow storage element of the wiper blade rigidity $K_W$ shown in layer 3 in FIG. 48 is dual-converted (dotted line in FIG. 50). In the conversion, an integral symbol is substituted by a derivative symbol, $K_W$ is set to be a reciprocal $1/K_W$, and since the flow of the angular velocity $W_k$ is reversed, a sign conversion symbol is added. With this conversion, state variables of distribution and addition symbols above and below the blade rigidity $K_W$ are changed to inputs (former) and outputs (latter). In this state, since the input/output conditions of the distribution and addition symbols are not satisfied, sign conversion symbols are added to the output flow variable of the distribution symbols and to the input potential variable of the addition symbol to change the flow direction. At this time, the state variables to be changed are determined depending on the conditions of the connection destination. In this example, external input state variables $\omega_1$ and $T_1$, and $\omega_W$ and $T_{Wb}$ in FIG. 50 are fixed to guarantee the coupling conditions. Hence, the direction of the moment $J_W$ of inertia is changed. The conversion results obtained so far are shown in (a) of FIG. 50. In FIG. 50, the rigidity $K_W$ indicated by the dotted line is considered to have a value which is large enough not to influence the behavior of the system, and $K_W=\infty$ is set. As a result, the angular velocity $\omega_K\approx 0$, and the rigidity $K_W$ can be erased. Of course, an internal derivative variable xk and derivative symbol are also erased. With this erasure, since distribution and addition symbols become 1-input/output, they are erased.

With this conversion, the rigidity $K_W$ indicated by the dotted line can be erased from FIG. 50. However, since the input/output conditions of distribution coupling and addition coupling above and below the moment $J_W$ of inertia are not satisfied, the moment $J_W$ of inertia is dual-converted from an integral form to a derivative form in the same sequence as the rigidity $K_W$. With this conversion, as all input and output state variables of the addition symbol below the moment $J_W$ of inertia become sign inversion symbols, they are erased. The result of erasing the rigidity $K_W$ by the aforementioned conversion process is shown in (b) of FIG. 50.

(7-2-4. Element Models of Building Components)

Mathematical models of functional models in layers 2 and 3 shown in FIG. 48 are obtained, and layer 3 is model-integrated to the load of layer 2. Note that mathematical models of transfer characteristics $\Phi_g$ and $\Phi_L$ and the operation mechanism indicated by the mechanism models in FIG. 48 will be omitted.

(1) Modeling of Window Glass and Wiper Blade

The window glass and the swing portion of the wiper blade are modeled first. Mathematical models of the window glass and the swing portion of the wiper blade shown in layer 3 in FIG. 48 are given by:

$$T_W = D_W \omega_{wg} + T_f$$

if ($\omega_{wg}=0$), then ($T_f=0$), else ($T_f=T_{f0}$) \hfill (EQ83)

where $T_{f0}$ is the frictional torque between the blade and glass.

A mathematical model of the wiper blade that has undergone the low-order conversion in FIG. 50 is described by:

$$\left. \begin{array}{l} T_l = J_W \dot{x}_w + T_{wb} \\ \omega_w = \omega_l = x_w \end{array} \right\} \hfill (EQ84)$$

(2) Modeling of Reduction Gear Mechanism and Motor

From the model of the reduction gear mechanism on the right side of layer 3, a mathematical model of the reduction gear mechanism is described by:

$$\left. \begin{array}{l} \omega_S = \Phi_g \Phi_L \omega_g \\ T_g = \Phi_g \Phi_L T_S \end{array} \right\} \hfill (EQ85)$$

A mathematical model of the motor on the left side of layer 3 integrates the internal functions shown in FIG. 50 and is described by:

$$\left.\begin{array}{l} 0 = -J\dot{x}_m - Dx_m + M_m I_m - T_m \\ \omega_m = x_m \\ V_m = R I_m + M_m x_m \end{array}\right\} \quad \text{(EQ86)}$$

In EQ86, the first to third rows represent the equations of motion of the motor.

Figure 51:
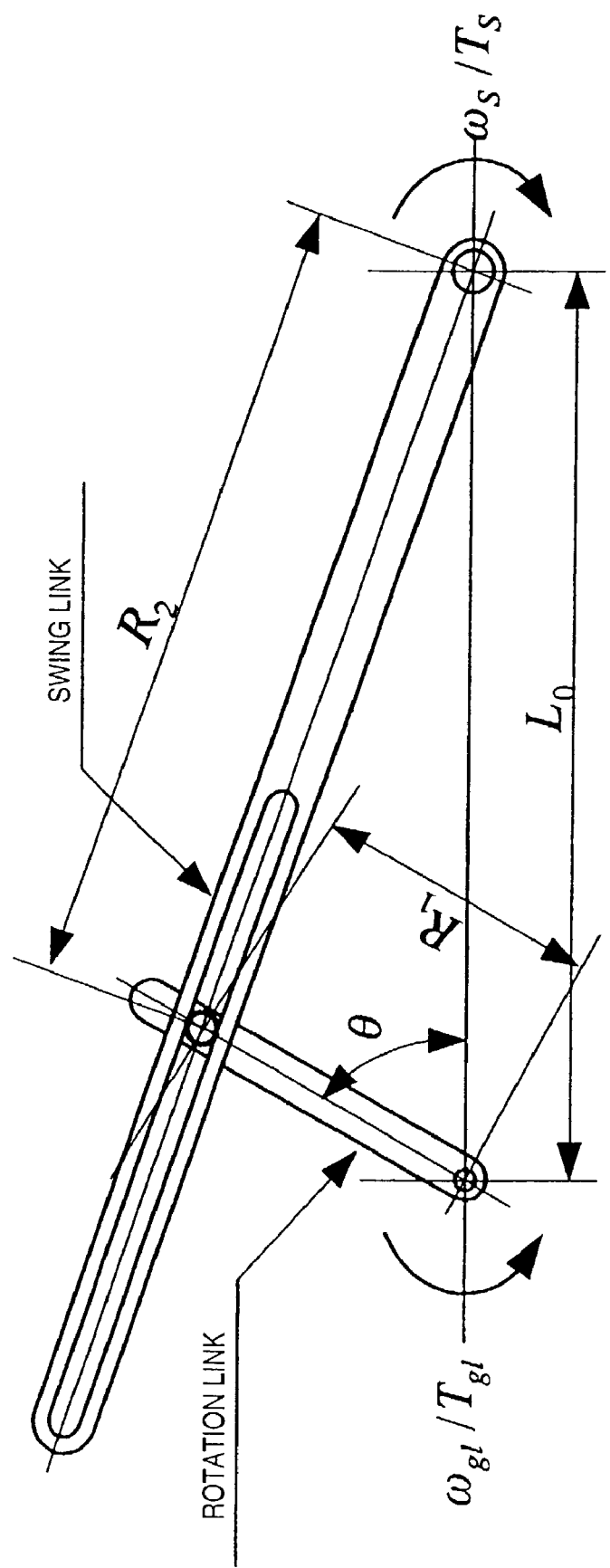
FIG. 51 shows a structure model of a swing mechanism.

Finally, the swing mechanism indicated by the transfer mechanism $\Phi_L$ is built in the reduction gear mechanism. FIG. 51 shows this structure.

FIG. 51 illustrates the structure in which a rotary link coupled to the rotation shaft of the reduction gear mechanism, and a swing link that swings the wiper blade to the right and left are arranged to have a distance L0. As the characteristics of the rotary link in FIG. 51, $R_1$ is the radius; $\omega_{g1}$, the angular velocity; $T_{g1}$, the torque; and $\theta$, the rotation angle. On the swing link side, $R_2$ is the radius of the coupling point to the rotary link; $\omega_S$, the angular velocity; and $T_S$, the torque. The transfer coefficient $\Phi_L$ of this swing mechanism is given by:

$$\Phi_L = \frac{R_1 \{R_1 - L_0 \cos(\theta)\}}{R_1^2 + L_0^2 - 2 R_1 L_0 \cos(\theta)} \quad \text{(EQ87)}$$

Figure 52:
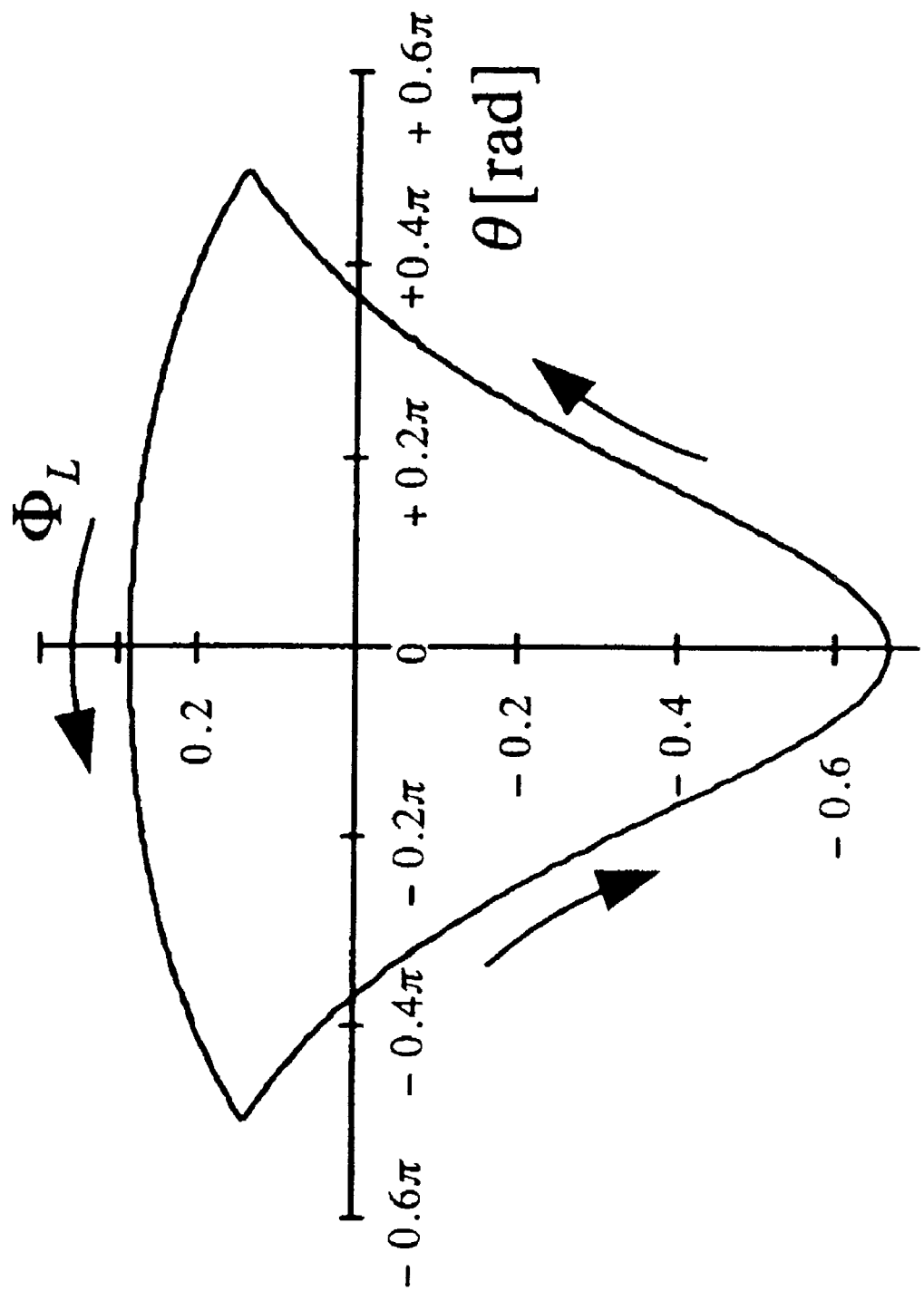
FIG. 52 shows a nonlinear characteristic of a transfer coefficient $\Phi_L$ of the swing mechanism.

As can be seen from EQ87, the transfer coefficient $\Phi_L$ exhibits nonlinear characteristics with respect to the rotary link angle $\theta$ shown in FIG. 52. Note that the values of $L_0$ and $R_1$ of EQ87 that determine the transfer coefficient $\Phi_L$ in FIG. 52 are shown in Table 6 to be described later.

(3) Modeling of Battery and Operation System

A mathematical model of the battery on the left end of layer 2 is given by:

$$I_b = \frac{E}{R_e} - \frac{V_b}{R_e} \quad \text{(EQ 88)}$$

A mathematical model of the operation system of the switch element, which is built in the wiper operation system on the second leftmost side of layer 3, is described by:

$$\left.\begin{array}{l} V_{SO} = S_{W\_1} V_{SI} \\ I_{SO} = S_{W\_1} I_{SI} - \dfrac{1}{R_B} S_{W\_0} V_{SI} \end{array}\right\} \quad \text{(EQ89)}$$

EQ89 is rewritten as $V_{SO}=V_{SI}$ and $I_{SO}=I_{SI}$ when the operation signal $S_W=1$ (ON), thus directly coupling the battery and motor. On the other hand, when $S_W=0$ (OFF), EQ89 is rewritten as $V_{SO}=0$ and $I_{SO}=V_{SI}/R_B$, thus disconnecting the motor from the battery and connecting the brake resistance $R_B$ and motor. The nonlinear action of the switch element $S_W$ at that time is described by:

$$\theta = \Phi_g \int \omega_m dt$$

if $(\theta > \theta_S$ or $Ope=1)$ then $(S_{W\_0}=0, S_{W\_1}=1)$ else
$(S_{W\_0}=1, S_{W\_1}=0)$ (EQ90)

In EQ90, the first row is the output shaft rotation angle of the reduction gear mechanism attached to the wiper motor, and the second row is the logic of the switch that operates the power supply for driving the motor. When the operation switch is ON or when the angle $\theta$ of the wiper output rotation shaft is equal to or larger than the automatic stop angle $\theta_s$, the switch variable $S_{W\_1}$ is set ON and the switch variable $S_{W\_0}$ OFF. Note that the output shaft rotation angle is obtained by integrating the motor angular velocity $\omega_m$, and multiplying the integral by a reduction gear ratio $\Phi_g$. This is to handle the product of $\Phi_g$ and $\Phi_L$ as an equivalent coefficient upon being integrated to layer 2.

(7-2-5. Equivalent Model Conversion by Integration)

The governing equations of functional components (functional models) that form the wiper system are expanded and integrated from layer 3 to layer 1.

(1) Expansion and Integration from Layer 3 to Layer 2

Upon integrating the window glass and wiper blade a structure governing equation in which $T_{wb}$ of EQ83 is substituted by $T_W$ of EQ84, and $\omega_{wg}$ by $\omega_w$ is described by:

$$\begin{bmatrix} 0 \\ T_l \\ T_w \\ \omega_w \end{bmatrix} = \begin{bmatrix} 0 & 1 & -1 & 0 & 0 & 0 \\ J_W & 0 & 0 & 0 & 1 & 0 \\ 0 & 0 & 0 & T_f & 0 & D_W \\ 0 & 1 & 0 & 0 & 0 & 0 \end{bmatrix} \begin{bmatrix} \dot{x}_w \\ x_w \\ \omega_l \\ 1 \\ T_w \\ \omega_w \end{bmatrix} \quad \text{(EQ91)}$$

In EQ91, the first row is a state equation, the second row is an input/output equation, and the third and subsequent rows are internally connected input/output equations. Also, the first and second columns are internal state variable, the third column is an input state variable, the fourth column is a side load, and the fifth and sixth columns are internal input state variables connected to the output state variables of the third and subsequent rows. A governing equation of the load of layer 2 obtained by integrating EQ91 is computed by substituting the third and subsequent rows of EQ91 into the fifth and subsequent columns. The computation result is:

$$\begin{bmatrix} 0 \\ T_l \\ T_w \\ \omega_w \end{bmatrix} = \begin{bmatrix} 0 & 1 & -1 & 0 \\ J_W & D_W & 0 & T_f \\ 0 & D_W & 0 & T_f \\ 0 & 1 & 0 & 0 \end{bmatrix} \begin{bmatrix} \dot{x}_w \\ x_w \\ \omega_l \\ 1 \end{bmatrix} \quad \text{(EQ92)}$$

EQ92 is the governing equation of the load shown in layer 2 of FIG. 48, in which the first row is a state equation, the second row is an input/output equation, and the third and subsequent rows are observation equations for observing state variables hidden by integration.

Likewise, a structure governing equation of the wiper motor in which $\omega_g$ of EQ85 is substituted by $\omega_m$ of EQ96, and $T_m$ by $T_g$ is described by:

$$\begin{bmatrix} 0 \\ \omega_S \\ V_m \\ T_g \\ \omega_m \end{bmatrix} = \begin{bmatrix} -J & -D & 0 & M_m & 0 & -1 \\ 0 & 0 & 0 & 0 & \Phi_g\Phi_L & 0 \\ 0 & M_m & 0 & R & 0 & 0 \\ 0 & 0 & \Phi_g\Phi_L & 0 & 0 & 0 \\ 0 & 1 & 0 & 0 & 0 & 0 \end{bmatrix} \begin{bmatrix} \dot{x}_m \\ x_m \\ T_S \\ I_m \\ \omega_m \\ T_g \end{bmatrix} \quad (EQ93)$$

In EQ93, the first row is a state equation, the second and third rows are input/output equation, and the fourth and subsequent rows are internally connected input/output equations, which are substituted in input state variables of the fifth and subsequent columns to integrate EQ93. A governing equation of the motor of layer 2 obtained by integrating EQ93 is:

$$\begin{bmatrix} 0 \\ \omega_S \\ V_m \\ T_g \\ \omega_m \end{bmatrix} = \begin{bmatrix} -J & -D & -\Phi_g\Phi_L & M_m \\ 0 & \Phi_g\Phi_L & 0 & 0 \\ 0 & M_m & 0 & R \\ 0 & 0 & \Phi_g\Phi_L & 0 \\ 0 & 1 & 0 & 0 \end{bmatrix} \begin{bmatrix} \dot{x}_m \\ x_m \\ T_S \\ I_m \end{bmatrix} \quad (EQ94)$$

In EQ94, the first row is a state equation, the second and third rows are input/output equations, and the fourth and fifth rows are equations of observation variables hidden by integration. Note that the product of the reduction gear ratio $\Phi_g$ and transfer characteristic $\Phi_L$ can be handled as an equivalent coefficient $\Phi_O$.

(2) Expansion and Integration from Layer 2 to Layer 1

Layer 2 is expanded by substituting the input state variable names $T_S$, $\omega_I$, $V_{SI}$, $V_b$, and $I_{SI}$ of state variables that connect the power supply, operation switch, wiper motor, and load to each other by output state variable names $T_I$, $\omega_S$, $V_m$, $I_{SO}$, $V_{SO}$, and $I_b$. A structure governing equation obtained by expanding the governing equations of the respective functional models of layer 2 is described by:

$$\begin{bmatrix} 0 \\ 0 \\ 0 \\ T_I \\ \omega_S \\ V_m \\ I_{SO} \\ V_{SO} \\ I_b \end{bmatrix} = \begin{bmatrix} 0 & 0 & 1 & 0 & 0 & 0 & -1 & 0 & 0 & 0 & 0 \\ 0 & -J & 0 & -D & 0 & -\Phi_g\Phi_l & 0 & 0 & M_m & 0 & 0 \\ J_W & 0 & 0 & 0 & T_f & 0 & D_W & 0 & 0 & 0 & 0 \\ 0 & 0 & 0 & \Phi_g\Phi_L & 0 & 0 & 0 & 0 & 0 & 0 & 0 \\ 0 & 0 & 0 & M_m & 0 & 0 & 0 & 0 & R & 0 & 0 \\ 0 & 0 & 0 & 0 & 0 & 0 & 0 & -\frac{1}{R_B}S_{W\_O} & 0 & 0 & S_{W\_I} \\ 0 & 0 & 0 & 0 & 0 & 0 & 0 & S_{W\_I} & 0 & 0 & 0 \\ 0 & 0 & 0 & 0 & \frac{E}{R_e} & 0 & 0 & 0 & 0 & -\frac{1}{R_e} & 0 \end{bmatrix} \begin{bmatrix} \dot{x}_{u'} \\ \dot{x}_m \\ x_{u'} \\ x_m \\ 1 \\ T_I \\ \omega_S \\ V_m \\ I_{SO} \\ V_{SO} \\ I_b \end{bmatrix} \quad (EQ95)$$

Note that observation equations are omitted since the equation becomes complicated.

In EQ95, the first and second rows are state equations, and the third and subsequent rows are internal input/output equations that become observation equations after integration.

Then, conversion of derivative variables of $J_W$ and $J$ included in the first and third rows of EQ95 into equivalent characteristics yields:

$$\begin{bmatrix} 0 \\ 0 \\ T_I \\ \omega_S \\ V_m \\ I_{SO} \\ V_{SO} \\ I_b \end{bmatrix} = \begin{bmatrix} -J & -D & 0 & -\Phi_g\Phi_L & 0 & 0 & M_m & 0 & 0 \\ J_W & 0 & T_f & 0 & D_W & 0 & 0 & 0 & 0 \\ 0 & \Phi_g\Phi_L & 0 & 0 & 0 & 0 & 0 & 0 & 0 \\ 0 & M_m & 0 & 0 & 0 & 0 & R & 0 & 0 \\ 0 & 0 & 0 & 0 & 0 & -\frac{1}{R_B}S_{W\_O} & 0 & 0 & S_{W\_I} \\ 0 & 0 & 0 & 0 & 0 & S_{W\_I} & 0 & 0 & 0 \\ 0 & 0 & \frac{E}{R_e} & 0 & 0 & 0 & 0 & -\frac{1}{R_e} & 0 \end{bmatrix} \begin{bmatrix} \dot{x}_m \\ x_m \\ 1 \\ T_I \\ \omega_S \\ V_m \\ I_{SO} \\ V_{SO} \\ I_b \end{bmatrix} \quad (EQ96)$$

Note that this equation represents the intermediate process of equivalent conversion, and $J_W$ and $J$ become equivalent storage characteristics by the next integration process.

Finally, dependent variables of the second and subsequent rows of EQ96 are substituted in identical variable names of the fourth and subsequent columns to integrate into a governing equation of the first layer. The result is a governing equation of the wiper system given by:

$$\begin{bmatrix} 0 \\ \omega_w \\ \omega_S \\ V_m \\ I_{SO} \end{bmatrix} = \begin{bmatrix} -J_0 & -D_0 & T_0 \\ 0 & 1 & 0 \\ 0 & \Phi_g \Phi_L & 0 \\ 0 & \frac{R_0}{R_0+R} M_m & I_0 R \\ 0 & -\frac{1}{R_0+R} M_m & I_0 \end{bmatrix} \begin{bmatrix} \dot{x}_m \\ x_m \\ 1 \end{bmatrix} \quad (EQ97)$$

In EQ97, the first row is a state equation that represents an equivalent functional model of the wiper system of the uppermost layer. The second and subsequent rows are observation equations which are omitted in the above equations, and are added and integrated for the purpose of reference. This equivalent functional model defines abstract equivalent characteristics obtained by reducing the internal characteristics of the low-order functional models by the equivalent moment $J_0$ of inertia, equivalent loss characteristic $D_0$, and equivalent torque source $T_0$.

The abstract equivalent characteristics are given by:

$$\left. \begin{array}{l} D_0 = D + D_W \Phi_g^2 \Phi_L^2 + \frac{1}{R_0+R} M_m^2 \\ T_0 = M_m I_0 - T_f \Phi_g \Phi_L \\ J_0 = J + J_W \Phi_g^2 \Phi_L^2 \\ I_0 = \frac{R_0}{R_0+R} \frac{E}{R_e} S_{W\_I} \\ R_0 = \frac{R_e R_B}{R_e S_{W\_O} + R_B S_{W\_I}^2} \end{array} \right\} \quad (EQ98)$$

In EQ98, the first to third rows are mathematical models of the abstract characteristics $D_0$, $T_0$, and $J_0$ of the functional models, and the fourth and fifth rows are a current source $I_0$ and total resistance $R_0$ that express the power supply and operation system as equivalent characteristics of the electrical system. These equivalent characteristics become mechanism models which generate internal characteristics of the functional models shown in FIG. 48. In these mechanism models, those of the operation mechanism and transfer characteristics which simulate the nonlinear characteristics of the wiper system are built in.

(7-2-6. Simulation Result)

Figure 53:
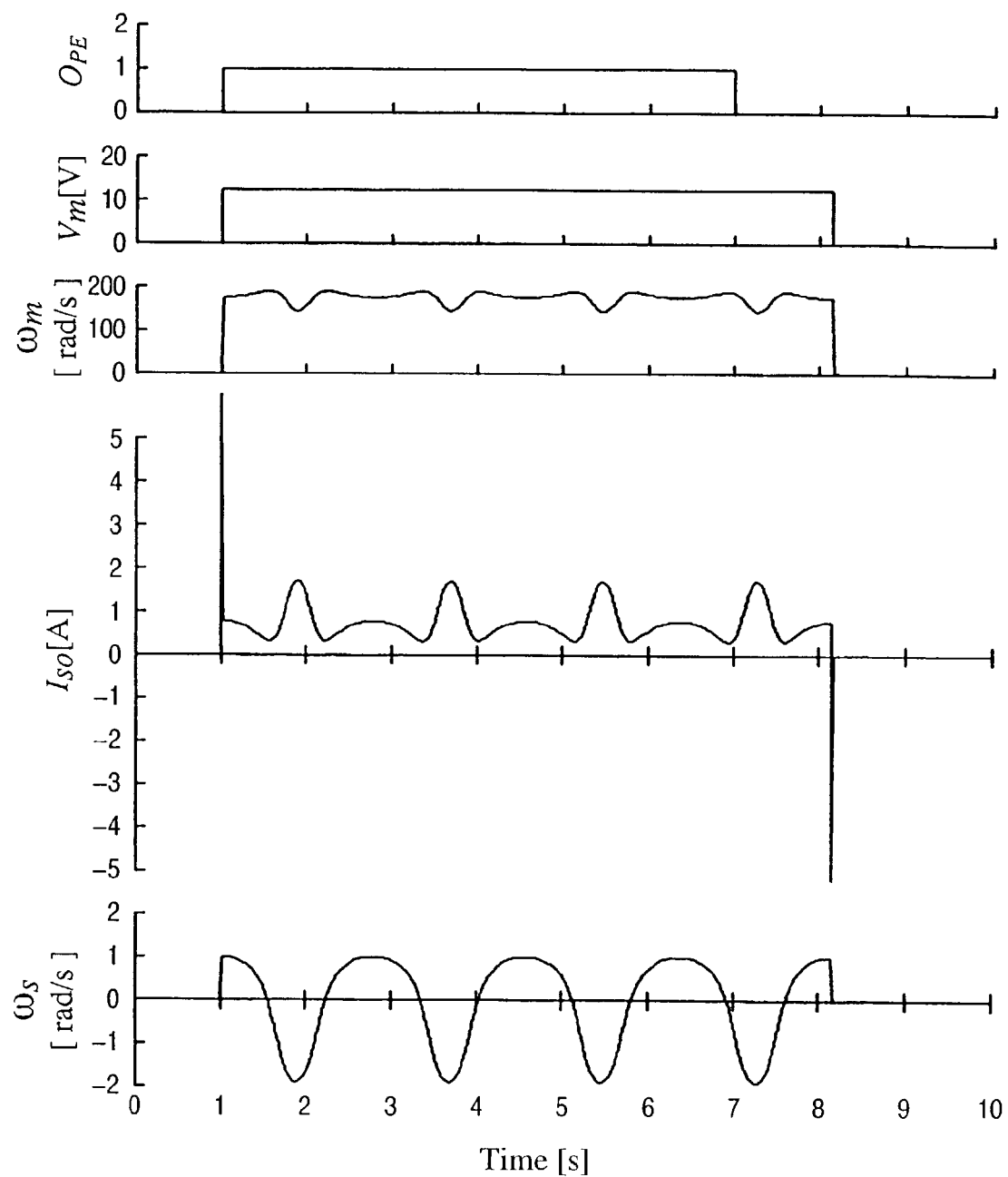
FIG. 53 shows the simulation result of the rear wiper system.

FIG. 53 shows the simulation result obtained by giving the characteristic values in Table 6 below to the functional models of the uppermost layer in FIG. 48.

TABLE 6

| Component Name | Characteristic Name | Symbol | Unit | Characteristic Value |
|---|---|---|---|---|
| Battery | Power Supply Voltage | E | [V] | 12.0 |
| | Internal Resistance | $R_e$ | [Ω] | $1.0 \times 10^{-3}$ |
| Operation System | Brake Electrical Resistance | $R_B$ | [Ω] | $1.0 \times 10^{-3}$ |

TABLE 6-continued

| Component Name | Characteristic Name | Symbol | Unit | Characteristic Value |
|---|---|---|---|---|
| Motor | Moment of Inertia | J | [Nm/(rad/s$^2$)] | $5.0 \times 10^{-6}$ |
| | Viscous Drag Coefficient | D | [Nm/(rad/s)] | $1.0 \times 10^{-4}$ |
| | Coil Resistance | R | [Ω] | 2.0 |
| | Motor Constant | $M_m$ | [Nm/A] | 0.006 |
| Reduction Gear Mechanism | Reduction Ratio | $\Phi_g$ | | 1/50 |
| | Radius of Rotary Node | $R_1$ | [m] | 0.02 |
| | Distance between Centers of Rotation | $L_0$ | [m] | 0.05 |
| Wiper Blade | Moment of Inertia | $J_W$ | [Nm/(rad/s$^2$)] | $1.0 \times 10^{-4}$ |
| | Viscous Drag Coefficient | $D_W$ | [Nm/(rad/s)] | 4.0 |
| | Dynamic Frictional Torque | $T_f$ | [Nm] | 1.0 |

The result shown in FIG. 53 includes the observation variables of the operation switch signal $O_{PE}$, motor electromotive voltage $V_m$ [V], motor angular velocity $\omega_m$ [rad/s], motor current $I_m$ [A], and angular velocity $\omega_S$ [rad/s] of the reduction gear mechanism output shaft (link). In the simulation, the operation switch is set ON ($O_{PE}=1$) at 1 [s], and is set OFF ($O_{PE}=0$) at 7 [s]. After the switch is OFF, the automatic stop mechanism functions, and maintains rotation by supplying a current to the motor until the motor angle returns to the stop angle $\theta_p$. Each observation variable changes asymmetric during one rotation since the swing mechanism of the wiper link has the transfer coefficient $\Phi_L$ of a nonlinear characteristic. A transient current upon startup is a startup current. Also, a negative transient current upon stopping is a current of the electric brake, which flows in the reverse direction using the motor electromotive voltage.

The aforementioned example of the wiper motor indicates that a high-order equivalent functional model obtained by integrating low-order functional models is expressed by abstract basic functions. That is, in this wiper system, primary responses of the torque supply source, drag loss, and moment of inertia are basic functions. As these basic functions, $D_0$, $T_0$, and $J_0$ obtained by integrating the characteristics of the low-order functional components are high-order characteristics, as indicated by EQ98. Upon observing low-order functions from the high-order functions, $D_0$, $T_0$, and $J_0$ that form the basic functions are assigned to the characteristics of the low-order functional components shown in FIG. 47 via EQ98. This demonstrates a successive relationship in which the basic functions that abstract the actions of the overall system are succeeded from the high-order to the low-order functions and are expanded to specific functions by the modeling scheme of expansion and integration proposed in this embodiment.

<7-3. Example of Automotive Vehicle>

Figure 54:
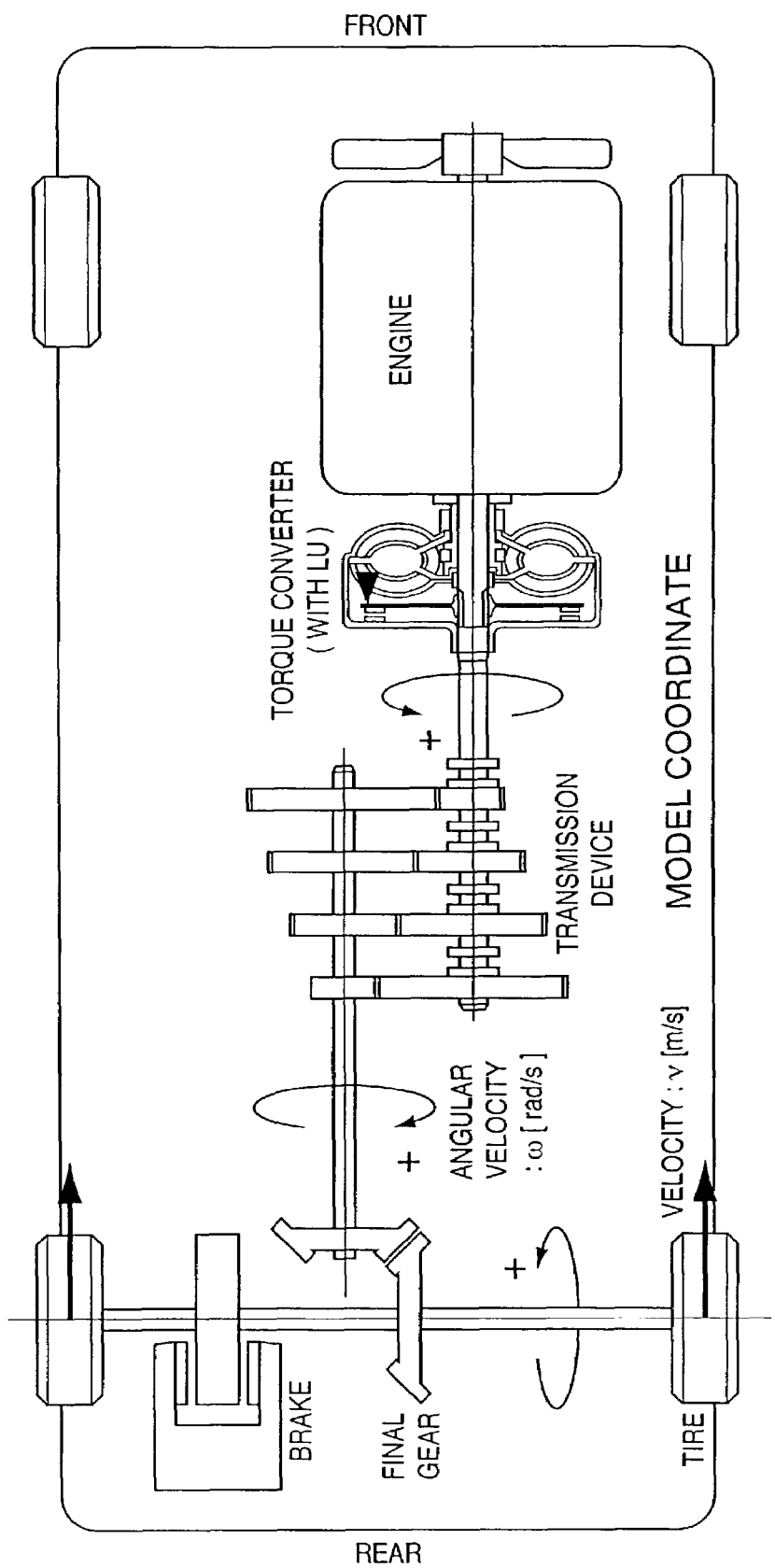
FIG. 54 shows an example of the arrangement of functional components of a vehicle.

Modeling of a vehicle to which the aforementioned contents are applied will be briefly explained. Modeling is done based on the arrangement of functional components shown in FIG. 54. As for tires, a four-wheel vehicle shown in FIG. 54 runs back and forth by a single driving wheel.

(7-3-1. Modeling Using Symbolized Models)

Figure 55:
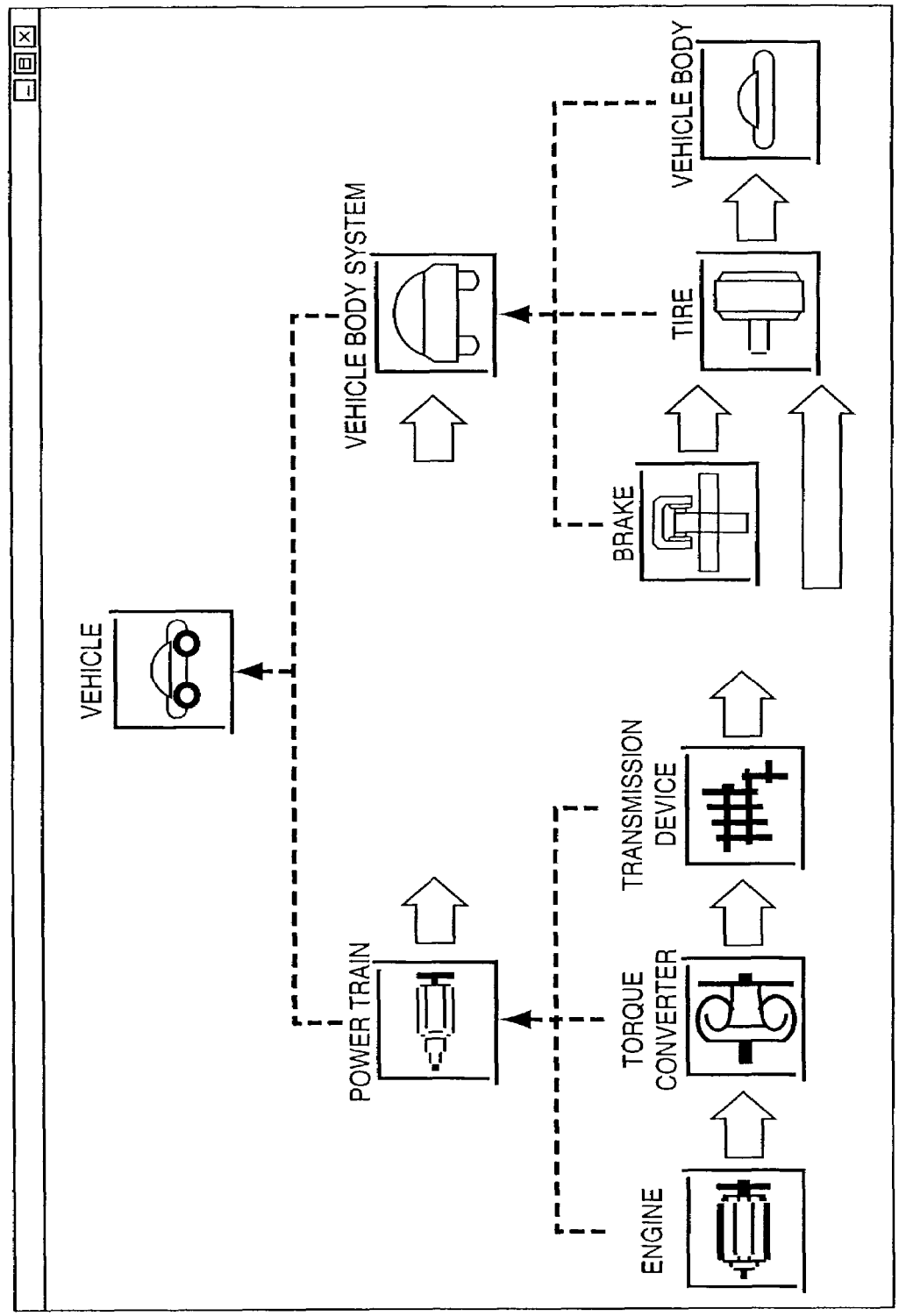
FIG. 55 shows expansion and integration of a vehicle using symbolized models.

FIG. 55 shows a hierarchical structure model of icons that symbolize functional and mechanism models of functional components in accordance with the arrangement of functional components of a product. Upon modeling, iconized functional models are expanded (broad arrows in FIG. 55) along the flow of energy exchanged between functional components in accordance with the component arrangement of the product, and are integrated to a high-order layer (assembly functional component). Expansion and integration of functional components (functional models) using icons displayed on a computer can be read by the computer. The respective icons in FIG. 55 hide the governing equations of functional models which simulate respective functional components, mechanism models, and equivalent characteristic functions. Therefore, in the computer, the state variables of functional components (functional models) are connected along the flow of energy exchanged between icons (between functional components) to convert and integrate governing equations into a structure governing equation. As high-order governing equation integrated from FIG. 55, a power train and vehicle system are integrated first, they are expanded to generate structure governing equations, and these equations are integrated to obtain the highest-order governing equation of a vehicle.

As can be seen from FIG. 55, a model diagram of the iconized functional models corresponds to a function diagram that shows the hierarchical structure of functional components or functions which form the product. Note that detailed functional and mechanism models, and the governing equations and functions will be explained later.

(7-3-2. Modeling of Functional Components)

Modeling of simple models of respective functional components which form the vehicle shown in FIG. 55 will be examined.

(7-3-2-1. Modeling of Engine)

(1) Functional Model

Figure 56:
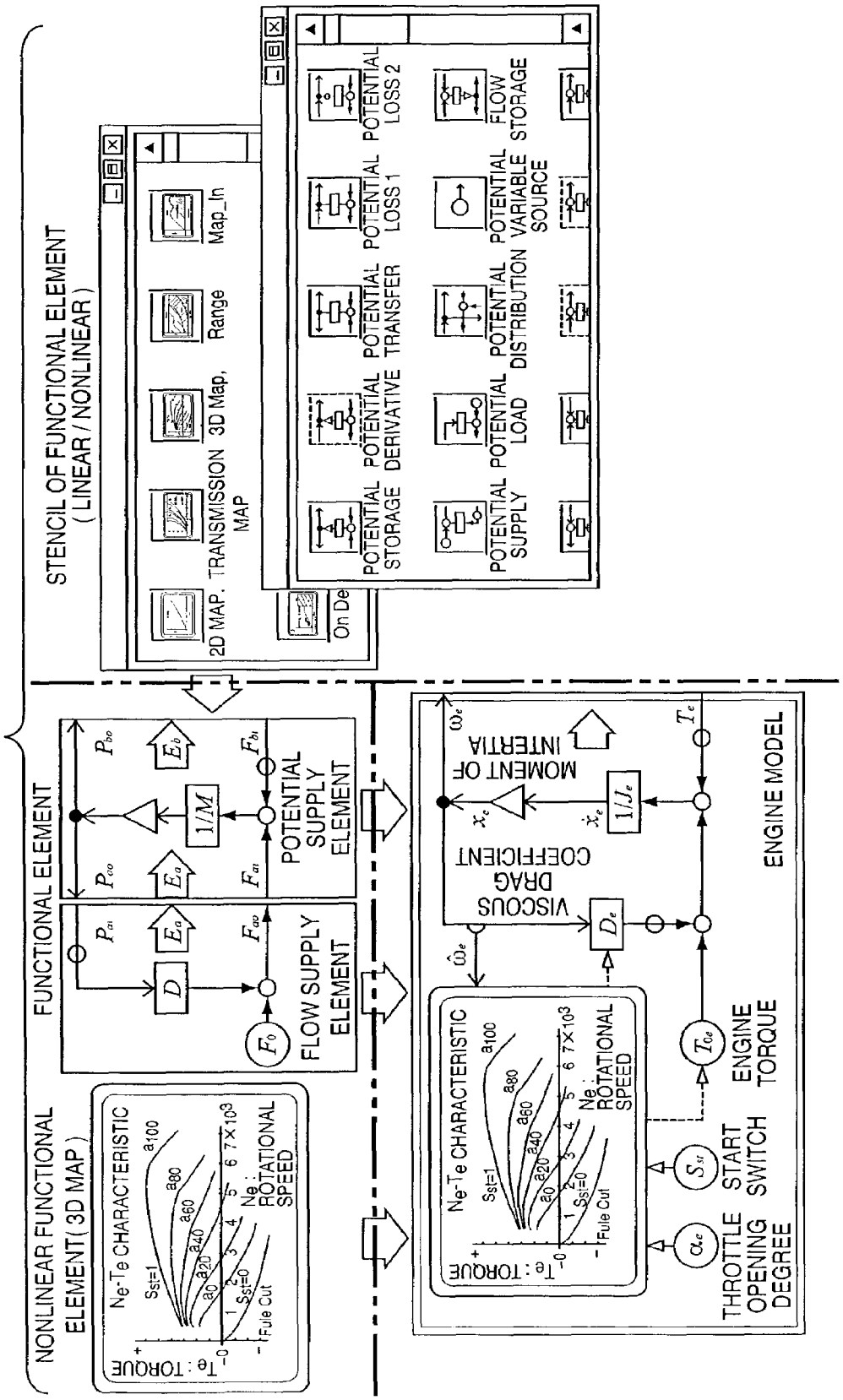
FIG. 56 shows expansion and integration of an engine using symbolized models.
Figure 56A:
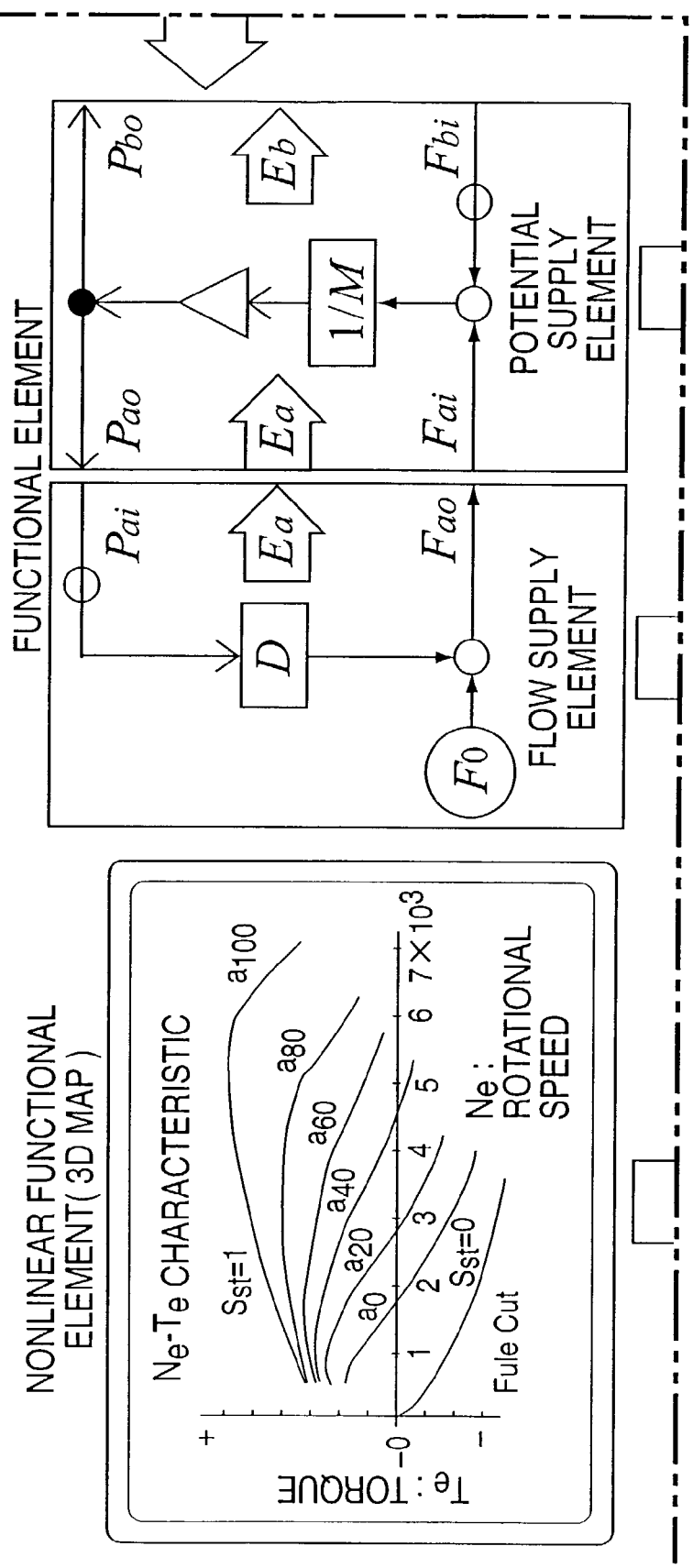
Figure 56B:
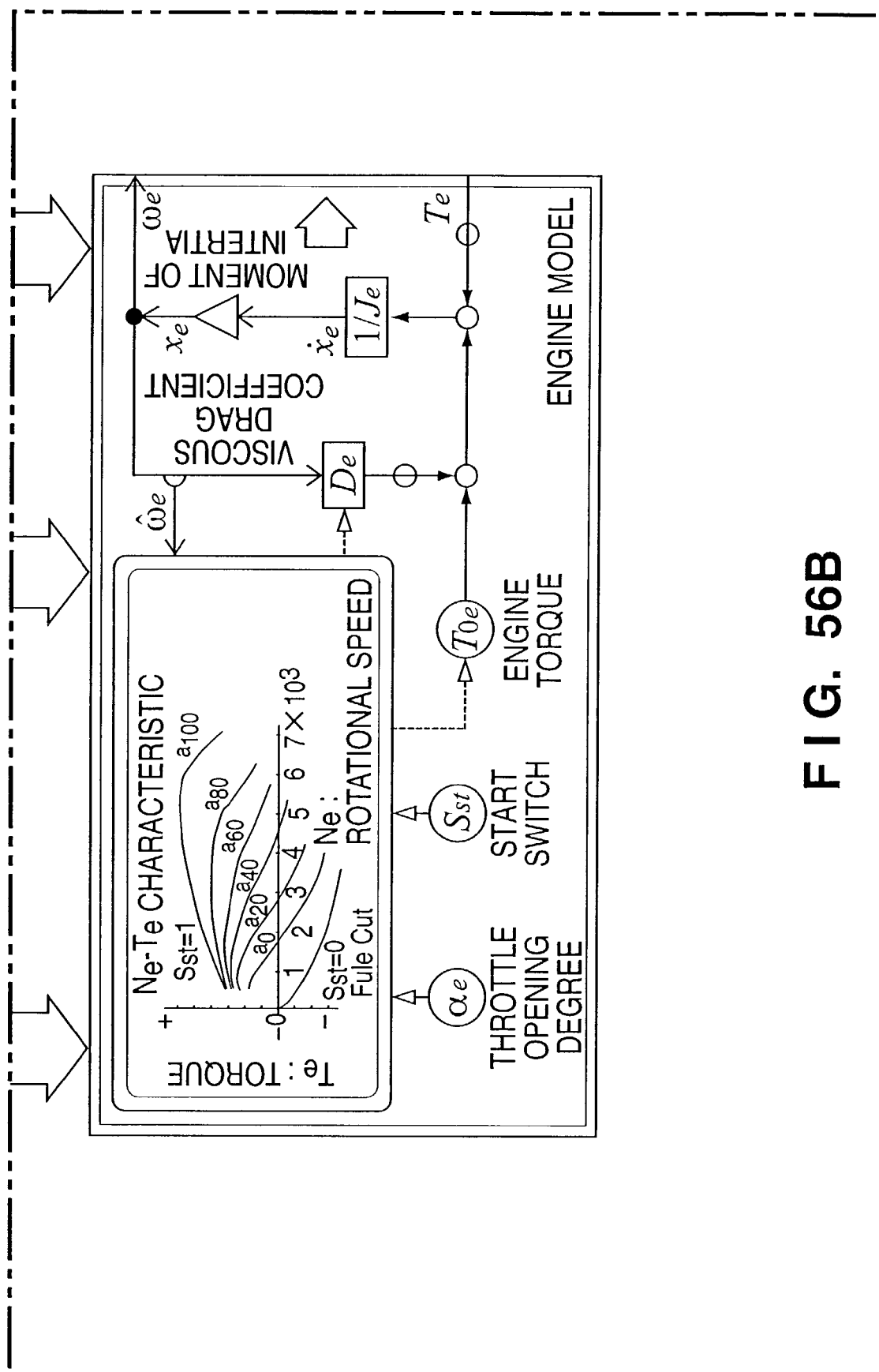

An engine can be modeled by combining linear functional elements shown in FIG. 8 and nonlinear functional elements shown in FIG. 10. FIG. 56 shows the modeling process. In FIG. 56, the right figure shows stencils that register linear and nonlinear functional elements as icons, the upper left figure shows functional elements obtained by selecting and dragging those required to model the engine from the stencils, and the lower left figure shows functional and mechanism models of the engine obtained by arranging results of connecting and expanding the dragged functional elements.

(2) Governing Equation

When the linear functional elements in the upper left figure of FIG. 55 are connected and expanded, an expansion/integration tool of a system installed in the computer generates a structure governing equation:

$$\begin{bmatrix} 0 \\ \omega_e \\ P_{ao} \\ F_{ao} \end{bmatrix} = \begin{bmatrix} -J_e & 0 & -1 & 0 & 1 & 0 \\ 0 & 1 & 0 & 0 & 0 & 0 \\ 0 & 1 & 0 & 0 & 0 & 0 \\ 0 & 0 & 0 & T_{0e} & 0 & -D_e \end{bmatrix} \begin{bmatrix} \dot{x}_p \\ x_p \\ T_e \\ 1 \\ F_{ao} \\ P_{ao} \end{bmatrix} \quad (EQ99)$$

In EQ99, the first row is a state equation, the second row is an input/output equation, and the third and fourth rows are internally connected input/output equations, which are generated in the following sequence. The functional elements are expanded by connecting a potential storage element $P_{ao}$ to a flow supply element $P_{ai}$, and also connecting a flow supply element $F_{ao}$ to a potential storage element $F_{ai}$. Since this connection is duality coupling, $P_{ai}$ is substituted by $P_{ao}$, and $F_{ai}$ by $F_{ao}$. Furthermore, since the variable names of these state variables and characteristic are those assigned to versatile functional elements, they are changed to variable names unique to the functional model of the engine. Upon change, a state variable $P_{bo}$ is substituted by an engine angular velocity $\omega_e$, $F_{bi}$ by an engine load torque $T_e$, and $P_{ao}$ and $F_{ao}$ remain unchanged since they are not converted into observation variables after integration. As for characteristics, M is changed to a moment $J_e$ of inertia, D to a viscous drag coefficient $D_e$, and $F_0$ to a torque source $T_{0e}$. These changes are made on the input/output characteristic table shown in FIG. 57. Parallel to generation of this characteristic table, an input table for inputting characteristic values of functional and mechanism models and initializing state variables is generated.

Equations of dependent variable names in the two lower rows of EQ99 are substituted in independent variables of identical names to erase two rightmost columns. After erasure, the functional model of the engine is described by:

$$\begin{bmatrix} 0 \\ \omega_e \end{bmatrix} = \begin{bmatrix} -J_e & -D_e & -1 & T_{0e} \\ 0 & 1 & 0 & 0 \end{bmatrix} \begin{bmatrix} \dot{x}_e \\ x_e \\ T_e \\ 1 \end{bmatrix} \quad (EQ100)$$

EQ100 is a governing equation of a functional model which expresses characteristics between potential and flow variables of functional and mechanism models in the lower left figure of FIG. 56. Note that the governing equation of such simple model can be directly derived from the functional model shown in FIG. 56.

(3) Mechanism Model

A mechanism model of engine rotational speed—torque characteristics built in the upper left figure in FIG. 56 will be modeled. Since the torque characteristics are nonlinear, as can be seen from FIG. 56, the output torque of the engine steady state is determined by an engine rotational speed $\omega_e$ and throttle opening degree $\alpha_e$. The engine is started by turning on a start switch $S_{st}$, and is stopped by turning off that switch. That is, the engine rotational speed—torque characteristics generate torque in accordance with five throttle opening degree characteristic curves shown in the graph while the engine start switch is ON, and the lowermost engine load characteristic in the graph acts while the switch is OFF. To the engine rotational speed—torque characteristics of FIG. 56, an engine angular velocity state variable and signal for making these operations are connected.

Figure 58:
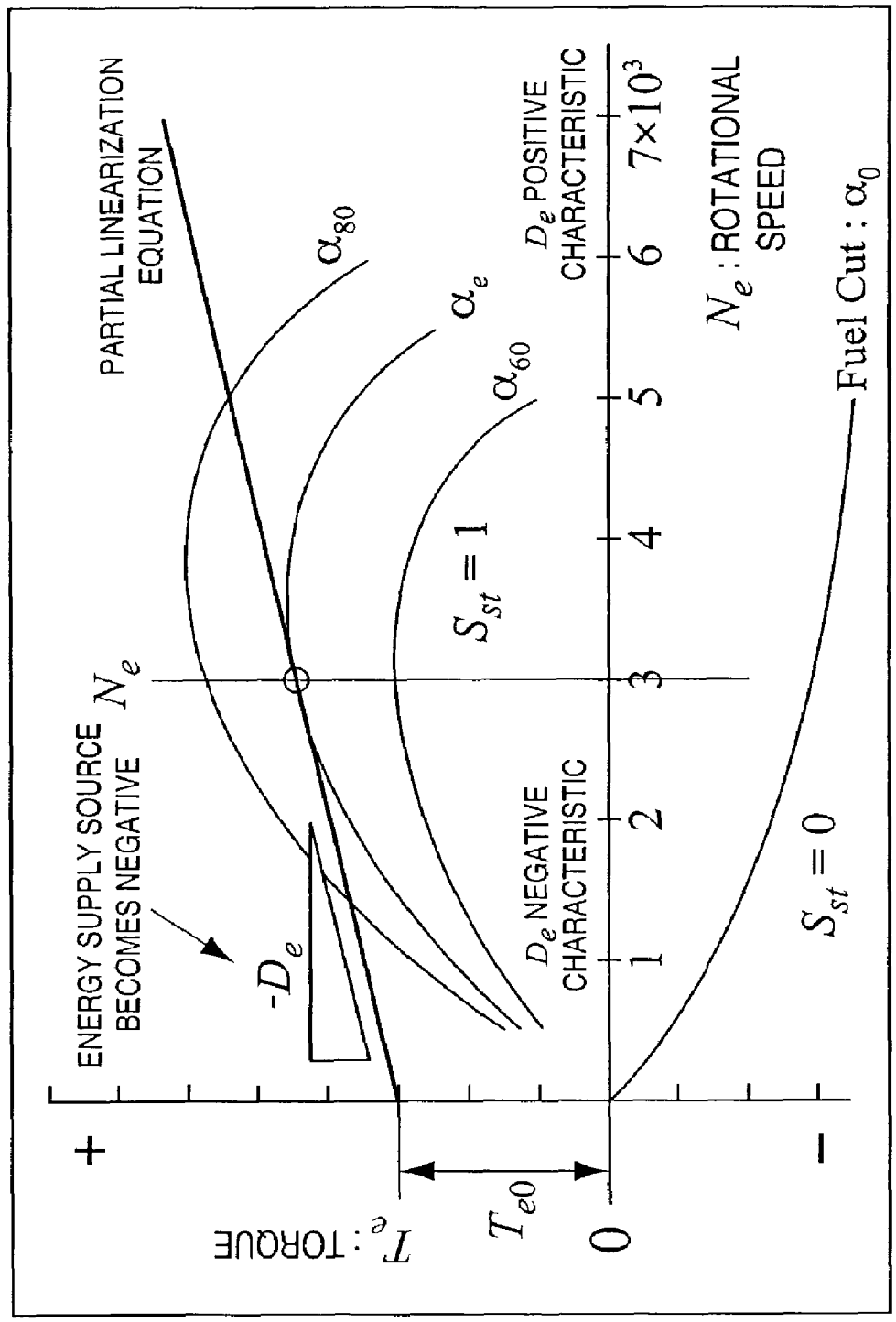
FIG. 58 shows the relationship between the engine torque characteristic as a nonlinear characteristic, and De•T0e.

A torque generation state is obtained by computing a torque curve to be generated on the basis of the current engine angular velocity $\omega_e$ and throttle opening degree $\alpha_e$, and computing a viscous drag coefficient $D_e$ and torque source $T_{0e}$ of the functional model from the intersection (angular velocity=0) between the slope of that curve and torque axis by a partial linear method. FIG. 58 shows this process.

Also, characteristics upon stopping the engine can be obtained from a curve on the negative torque side in FIG. 58. Switching between torque generation and load torque is attained by:

if ($S_\alpha=1$) then (opening degree $\alpha-\alpha_{100}$ characteristic)
   else (load characteristic)     (EQ101)

Since the processes of these mechanism models are built in as processing functions in nonlinear elements of the torque characteristics dragged from right icons in FIG. 56, they are automatically built in by connecting the mechanism models in FIG. 56 to the lower left functional model. The function names of these built-in functions are automatically written in a characteristic value definition table (input/output table) shown in FIG. 59.

In the characteristic input table shown in FIG. 59, a blank characteristic value input field requires a numerical value input, and "Fnc_De" and "Fnc_Tq" are function names automatically entered by the system.

(4) Equivalent Functional Model

Figure 60:
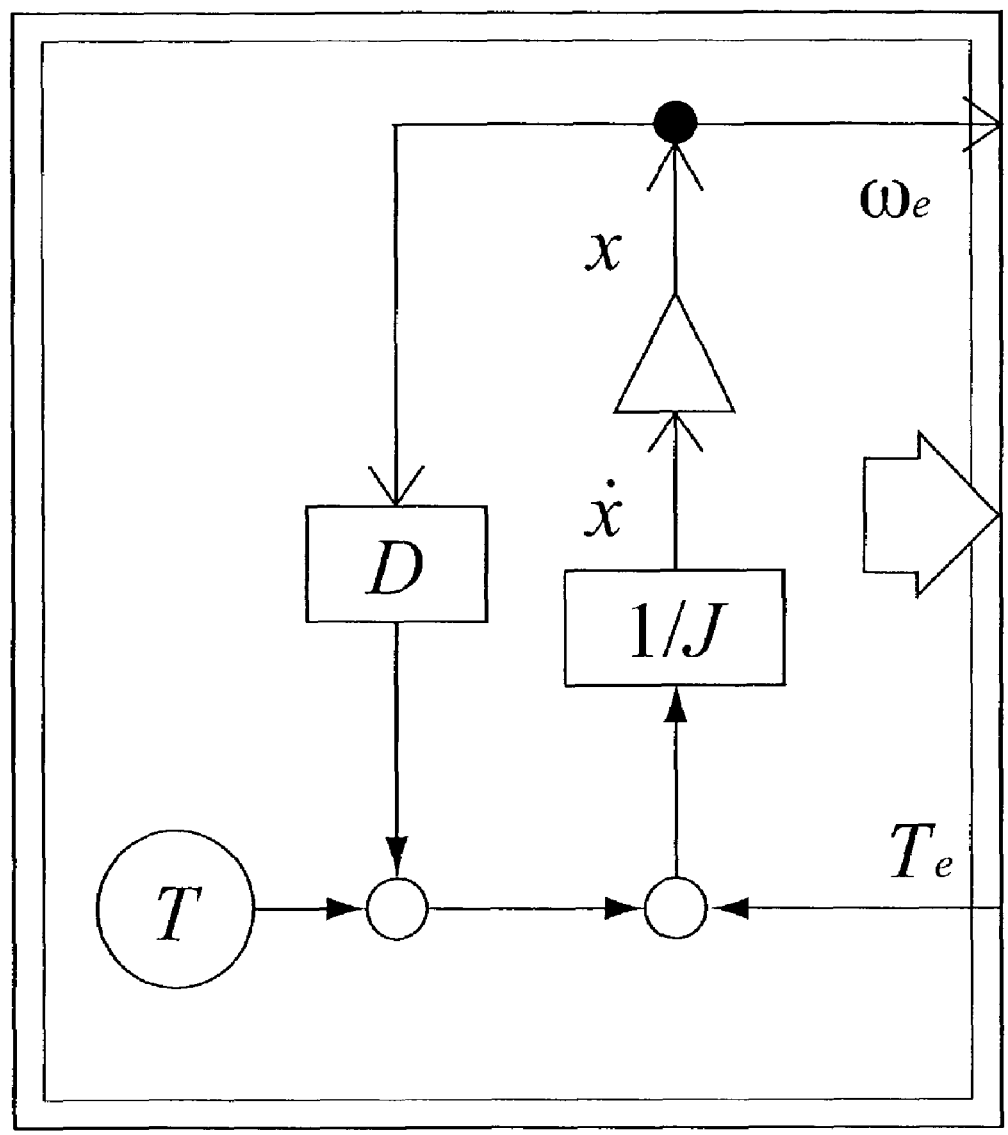
FIG. 60 shows an example of an equivalent functional model of an engine.

FIG. 60 shows a simplified functional model that hides the contents of functional and mechanism models modeled in FIG. 56. This model is an example in which the nonlinear rotational speed—torque characteristics are hidden from FIG. 60 in association with characteristics $D_E$ and $T_{oe}$. With this hiding, the functional and mechanism models in FIG. 60 incorporate functions for processing equivalent characteristics, state variables, signals of a governing equation associated with an external system, and this model and input/output definition table in FIG. 59, and the like are simultaneously registered.

The governing equation and equivalent characteristics in FIG. 60 are respectively given by:

$$\begin{bmatrix} 0 \\ \omega_e \end{bmatrix} = \begin{bmatrix} J & D & -1 & T \\ 0 & 1 & 0 & 0 \end{bmatrix} \begin{bmatrix} \dot{x} \\ x \\ T_e \\ 1 \end{bmatrix} \quad \text{(EQ102)}$$

$$\left. \begin{array}{l} J = -Je \\ D = -fnc\_De(Map\_Tq, \alpha_e, \omega_e) \\ T = fnc\_Tq(Map\_Tq, \alpha_e, \omega_e) \end{array} \right\}$$

The uppermost equation in EQ102 is the governing equation, which is the same as EQ99. Lower equations are functions for partially linearizing the nonlinear rotational speed—torque characteristics of the engine, and substituting them into characteristic values D and T.

(5) Model Registration

Figure 61:
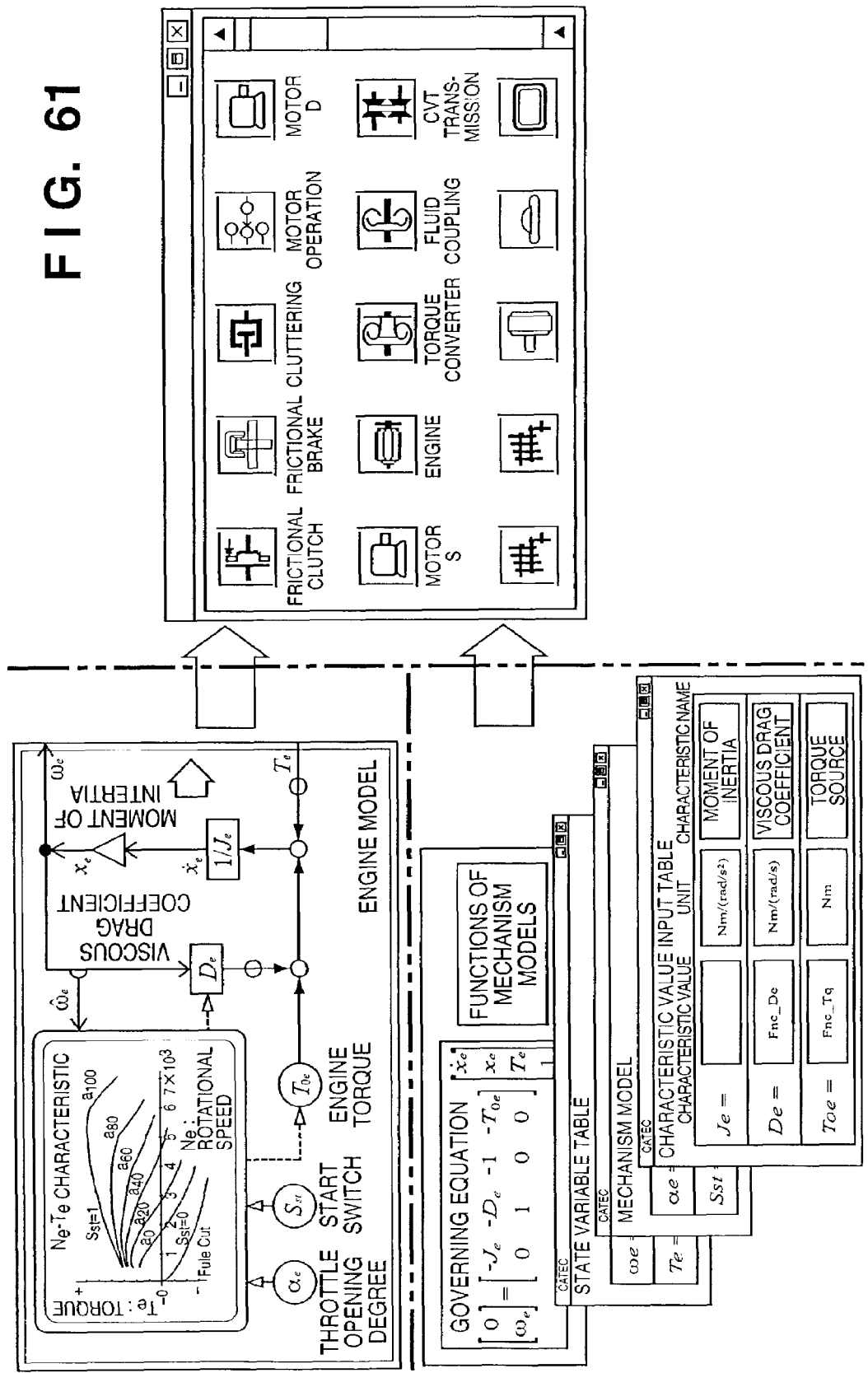
FIG. 61 shows a registration example of an equivalent functional model of an engine.
Figure 61B:
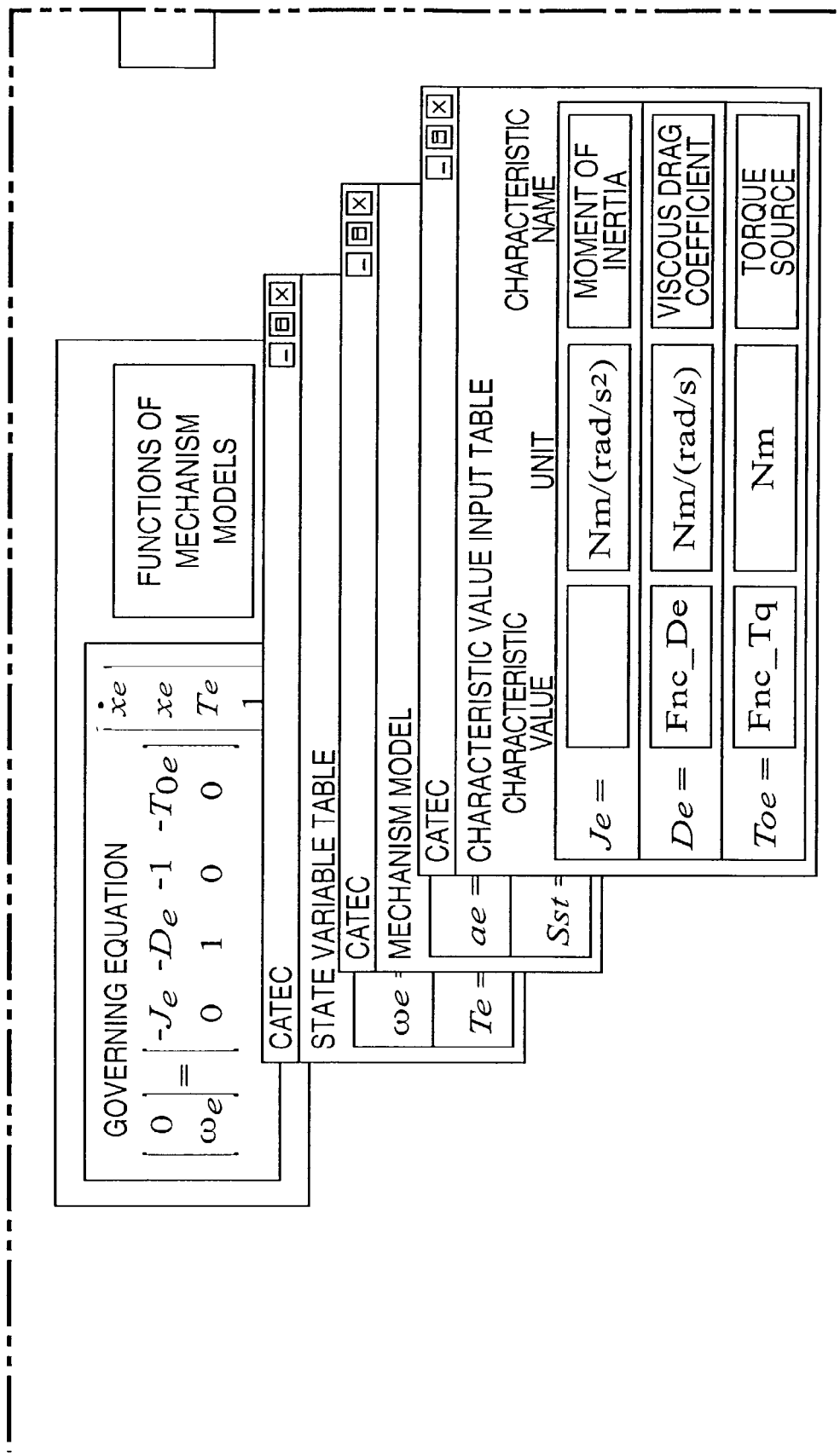
Figure 61C:
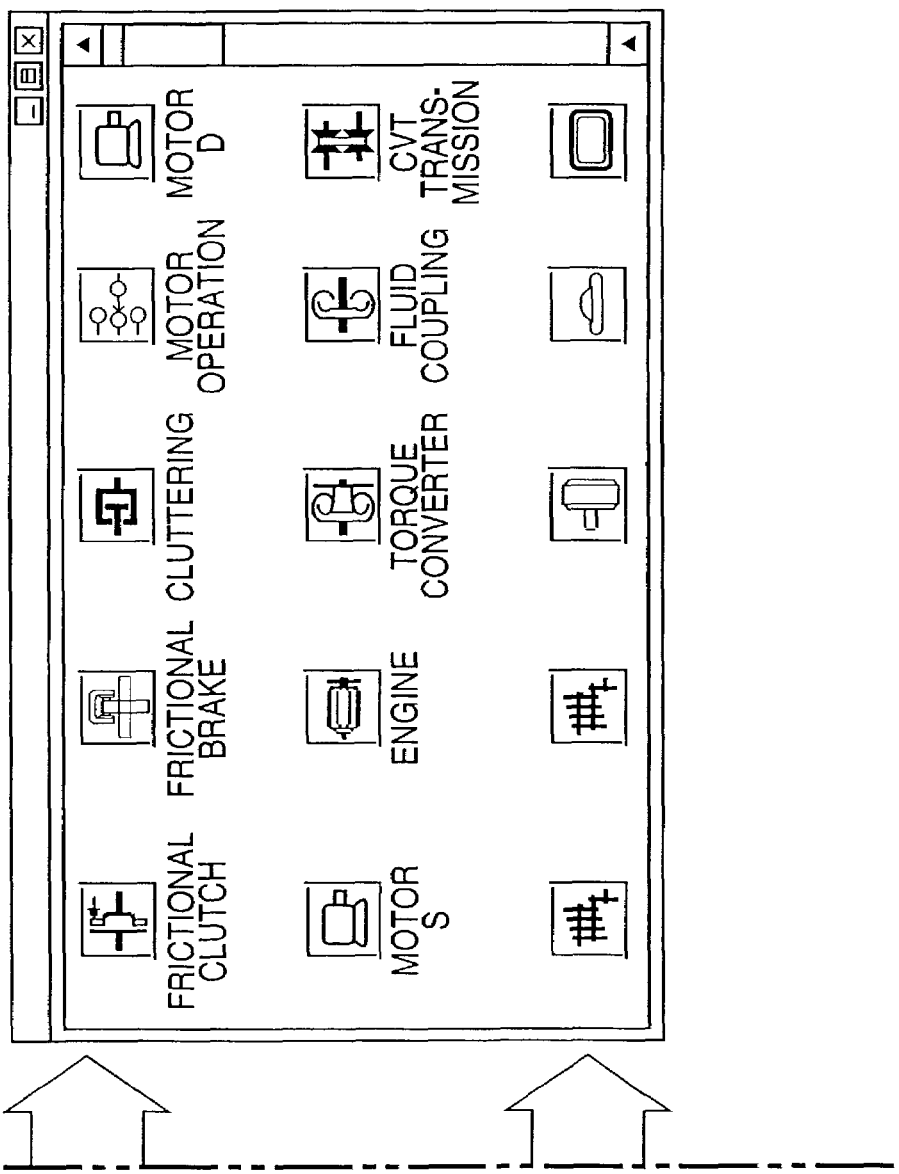

The generated functional and mechanism models can be registered and re-used. The functional and mechanism models are registered as icons in a stencil list table that manages information which pertains to functional and mechanism models. At the same time, functional and mechanism model diagrams, governing equations, functions for mechanism models, characteristic definition and input/output tables, and definition tables of state variables, observation variables, and the like are registered together. The functional and mechanism models registered in the stencil list table can reproduce functional and mechanism model diagrams on a computer if they are read out by dragging corresponding icons from the list table. Of course, the displayed model diagram includes governing equations, mechanism model functions, and definition tables at the time of registration. FIG. 61 shows this relationship.

(7-3-2-2. Modeling of Other Vehicle Functional Components)

The sequence for modeling functional and mechanism models in this system has been described taking the engine as an example. An outline of models which have already been modeled and registered in a stencil list in the same sequence as the engine will be presented below. Note that a description of functions of functional and mechanism models will be omitted. Also, functional components to be described below are the contents of iconized functional models shown in FIG. 55.

(1) Torque Converter Model with Lockup Function

Figure 62:
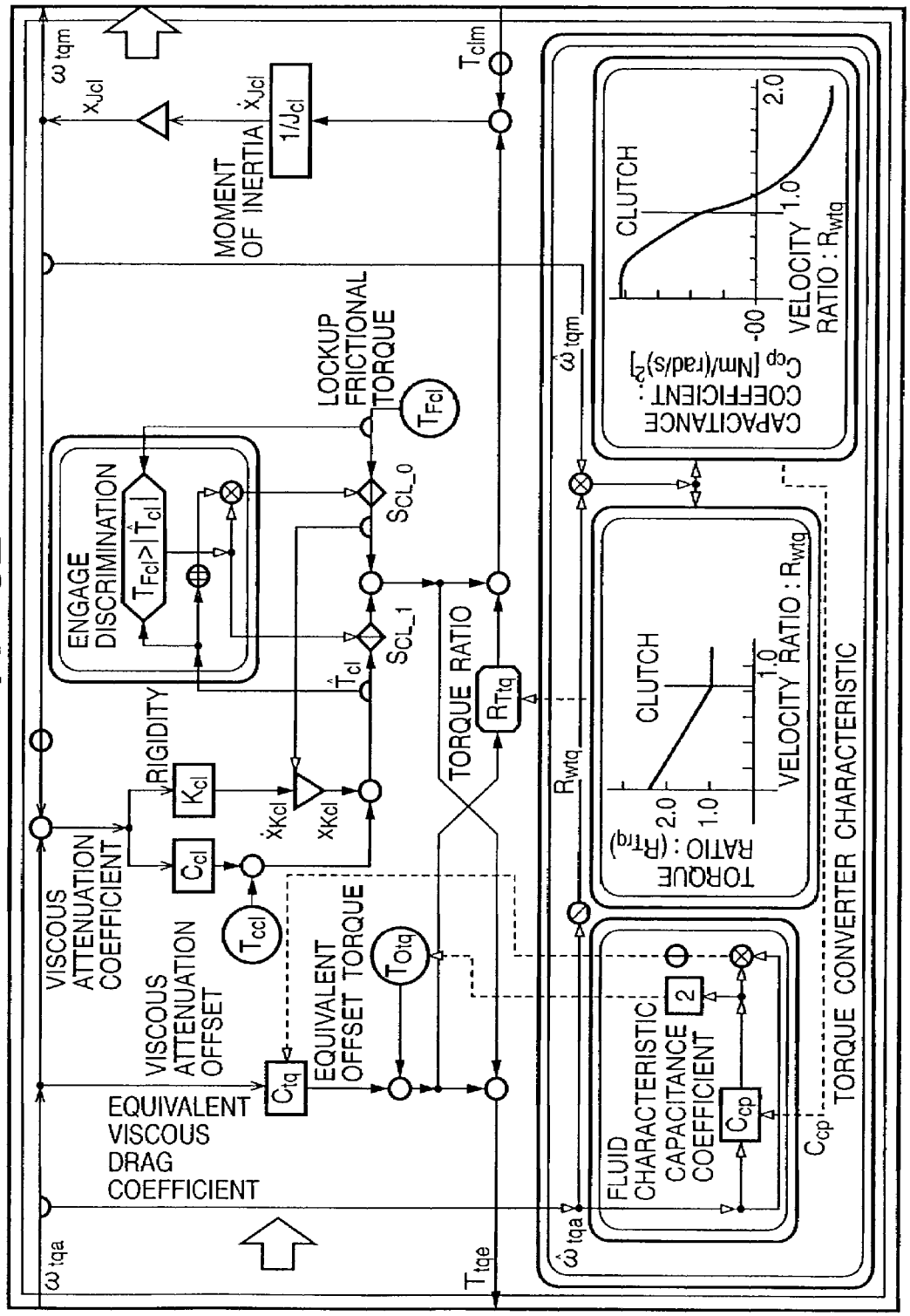
FIG. 62 shows an example of a functional model of a torque converter with an LU function.

FIG. 62 shows a torque converter with a lockup function. The upper side of FIG. 62 shows a functional model. The functional model includes, as mechanism models, nonlinear elements of the frictional characteristics of a lockup clutch and the fluid characteristics of the converter, and characteristic maps that express the capacitance coefficient and torque ratio of the torque converter by the ratio of input and output angular velocities of the converter and their processing functions. Note that the converter model compensates the continuity of velocity by the capacitance coefficient determined by the velocity ratio.

The governing equation of FIG. 62 is:

$$\begin{bmatrix} 0 \\ 0 \\ T_{tqe} \\ \omega_{tqe} \end{bmatrix} = \begin{bmatrix} -J_{cl} & 0 & -C_{cl}S_{cl\_1} & 1 & C_{lq}R_{Ttq} + C_{cl}S_{cl\_1} & -1 & T_{0tq}R_{Ttq} + T_{Fcl}S_{cl\_0} + T_{Ccl}S_{cl\_1} \\ 0 & -\dfrac{1}{K_{cl}S_{cl\_1}} & -1 & 0 & 1 & 0 & 0 \\ 0 & 0 & -C_{cl}S_{cl\_1} & 1 & C_{tq} + C_{cl}S_{cl\_1} & 0 & T_{0tq} + T_{Fcl}S_{cl\_0} + T_{Ccl}S_{cl\_1} \\ 0 & 0 & 1 & 0 & 0 & 0 & 0 \end{bmatrix} \begin{bmatrix} \dot{x}_{Jcl} \\ \dot{x}_{Kcl} \\ x_{Jcl} \\ x_{Kcl} \\ \omega_{tqe} \\ T_{tqm} \\ 1 \end{bmatrix} \quad \text{(EQ 103)}$$

Figure 63:
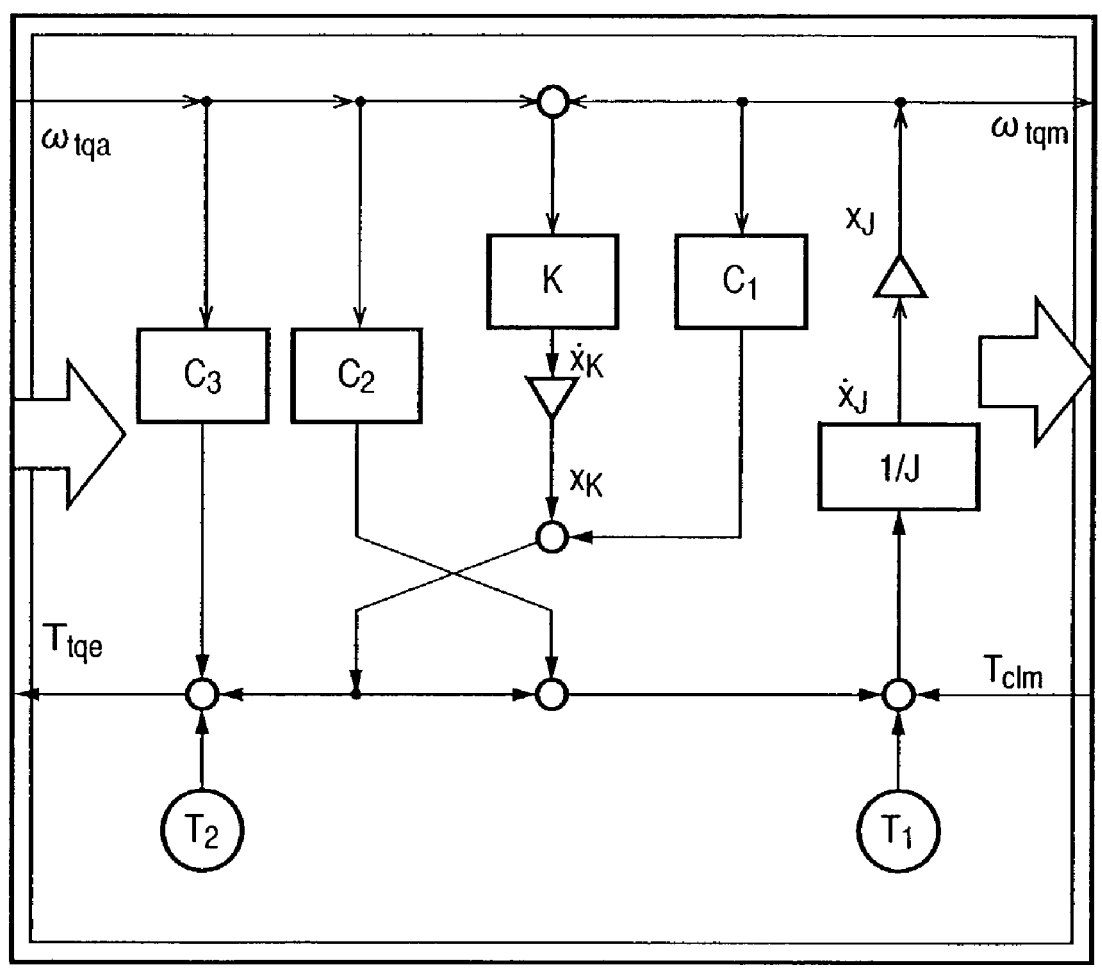
FIG. 63 shows an example of an equivalent functional model of the torque converter with an LU function.

An equivalent functional model that simplifies the functional and mechanism models shown in FIG. 62 can be expressed by FIG. 63.

The governing equation and equivalent characteristics of FIG. 63 are respectively given by:

$$\begin{bmatrix} 0 \\ 0 \\ T_{tqe} \\ \omega_{tqm} \end{bmatrix} = \begin{bmatrix} J & 0 & C_1 & 1 & C_2 & -1 & T_1 \\ 0 & K & -1 & 0 & 1 & 0 & 0 \\ 0 & 0 & C_1 & 1 & C_3 & 0 & T_2 \\ 0 & 0 & 1 & 0 & 0 & 0 & 0 \end{bmatrix} \begin{bmatrix} \dot{x}_J \\ \dot{x}_K \\ x_J \\ x_K \\ \omega_{tqe} \\ T_{tqm} \\ 1 \end{bmatrix} \quad \text{(EQ 104)}$$

$$\begin{aligned} S_{cl\_1} &= \text{fnc\_Frc1}(\hat{T}_{cl}, T_{Fcl}) \\ S_{cl\_0} &= \text{fnc\_Frc0}(\hat{T}_{cl}, T_{Fcl}) \\ C_{tq} &= \text{fnc\_Frc\_Ctq}(M_{ap}C_p, \omega_{tqm}/\omega_{tqe}) \\ R_{Ttq} &= \text{fnc\_Frc\_RTtq}(M_{ap}Tr, \omega_{tqm}/\omega_{tqe}) \\ J &= -J_{cl} \\ K &= -\frac{1}{K_{cl}S_{cl\_1}} \\ C_1 &= -C_{cl}S_{cl\_1} \\ C_2 &= C_{tq}R_{Ttq} + C_{cl}S_{cl\_1} \\ C_3 &= C_{tq} + C_{cl}S_{cl\_1} \\ T_1 &= T_{0tq}R_{Ttq} + T_{Fcl}S_{cl\_0} + T_{Ccl}S_{cl\_1} \\ T_2 &= T_{0tq} + T_{Fcl}S_{cl\_0} + T_{Ccl}S_{cl\_1} \end{aligned}$$

In EQ104, the uppermost equation is the governing equation, and lower equations are equivalent characteristics. Upper four rows of the equivalent characteristics are processing functions of nonlinear elements of the built-in mechanism models, and lower five rows are equivalent characteristics.

(2) Transmission Device Model

FIG. 64 shows versatile functional and mechanism models (left side) of a transmission device, and a simplified equivalent model (right side). In this model, the loss characteristics and detailed functions inside the transmission device are omitted. As for detailed models of a manual transmission device (MT), automatic transmission device (AT), changeless transmission device (CVT), and the like, models vary depending on different transmission device structures. In the model shown in FIG. 64, a frame with round corners at the two ends is a function of determining a gear ratio $N_{mis}$ by designating a transmission position by $S_{hift}$=1st to nth speeds in a matrix variable of a transmission ratio (gear ratio).

The governing equation of the left functional model shown in FIG. 64 is described by:

$$\begin{bmatrix} \omega_{def} \\ T_{mis} \end{bmatrix} = \begin{bmatrix} 0 & N_{mis}N_{ddef} \\ N_{mis}N_{ddef} & 0 \end{bmatrix} \begin{bmatrix} T_{def} \\ \omega_{mis} \end{bmatrix} \quad \text{(EQ 105)}$$

The governing equation and equivalent characteristics of the right functional model in FIG. 64 are given by:

$$\begin{bmatrix} \omega_{def} \\ T_{mis} \end{bmatrix} = \begin{bmatrix} 0 & N \\ N & 0 \end{bmatrix} \begin{bmatrix} T_{def} \\ \omega_{mis} \end{bmatrix} \quad \text{(EQ 106)}$$

The function fnc_Nmis( ) in EQ106 selects a transmission gear ratio from the transmission position $S_{shift}$.

(3) Brake Model

Figure 65:
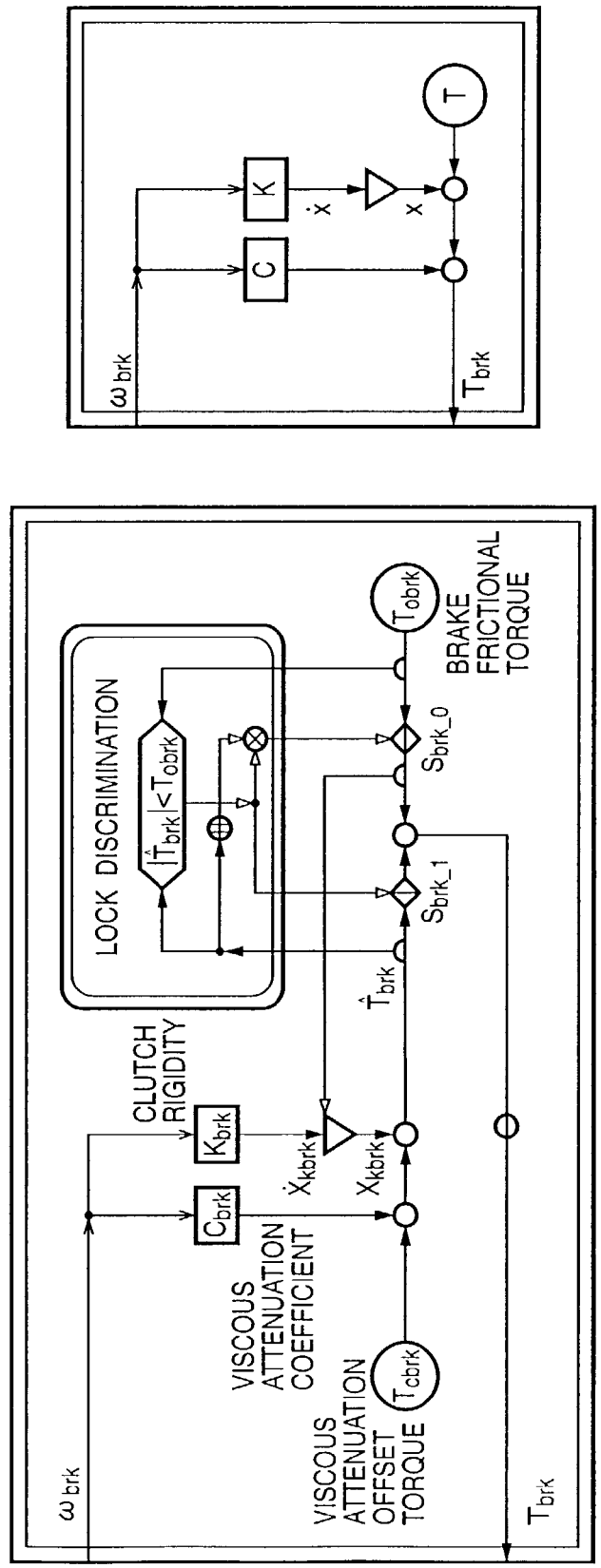
FIG. 65 shows an example of a functional model and equivalent functional model of a brake.

FIG. 65 shows general functional and mechanism models (left side) of a brake and its simplified equivalent functional mode (right side). The functional and mechanism models shown in FIG. 65 include a mechanism model of lock discrimination which absorbs the driving force of the vehicle by the frictional force of the brake to stop the vehicle. This mechanism model is the same as that of the lockup clutch except for variable names.

The governing equation of the left functional model in FIG. 65 is given by:

$$\begin{bmatrix} 0 \\ T_{brk} \end{bmatrix} = \quad \text{(EQ 107)}$$

$$\begin{bmatrix} -\frac{1}{K_{brk}S_{brk\_1}} & 0 & 1 & 0 \\ 0 & -1 & -C_{brk}S_{brk\_1} & -T_{cbrk}S_{brk\_1} - T_{obrk}S_{brk\_0} \end{bmatrix} \begin{bmatrix} \dot{x}_{Kbrk} \\ x_{Kbrk} \\ \omega_{brk} \\ 1 \end{bmatrix}$$

The governing equation and equivalent characteristics of the right equivalent functional model in FIG. 65 are given by:

$$\begin{bmatrix} 0 \\ T_{brk} \end{bmatrix} = \begin{bmatrix} K & 0 & 1 & 0 \\ 0 & -1 & C & -T \end{bmatrix} \begin{bmatrix} \dot{x} \\ x \\ \omega_{brk} \\ 1 \end{bmatrix} \quad \text{(EQ 108)}$$

$$\begin{aligned} S_{brk\_1} &= \text{fnc\_Frc1}(\hat{T}_{brk}, T_{obrk}) \\ S_{brk\_0} &= \text{fnc\_Frc0}(\hat{T}_{brk}, T_{obrkl}) \\ K &= -\frac{1}{K_{brk}S_{brk\_1}} \\ C &= -C_{brk}S_{brk\_1} \\ T &= -(T_{cbrk}S_{brk\_1} + T_{obrk}S_{brk\_0}) \end{aligned}$$

(4) Tire Model

Figure 66:
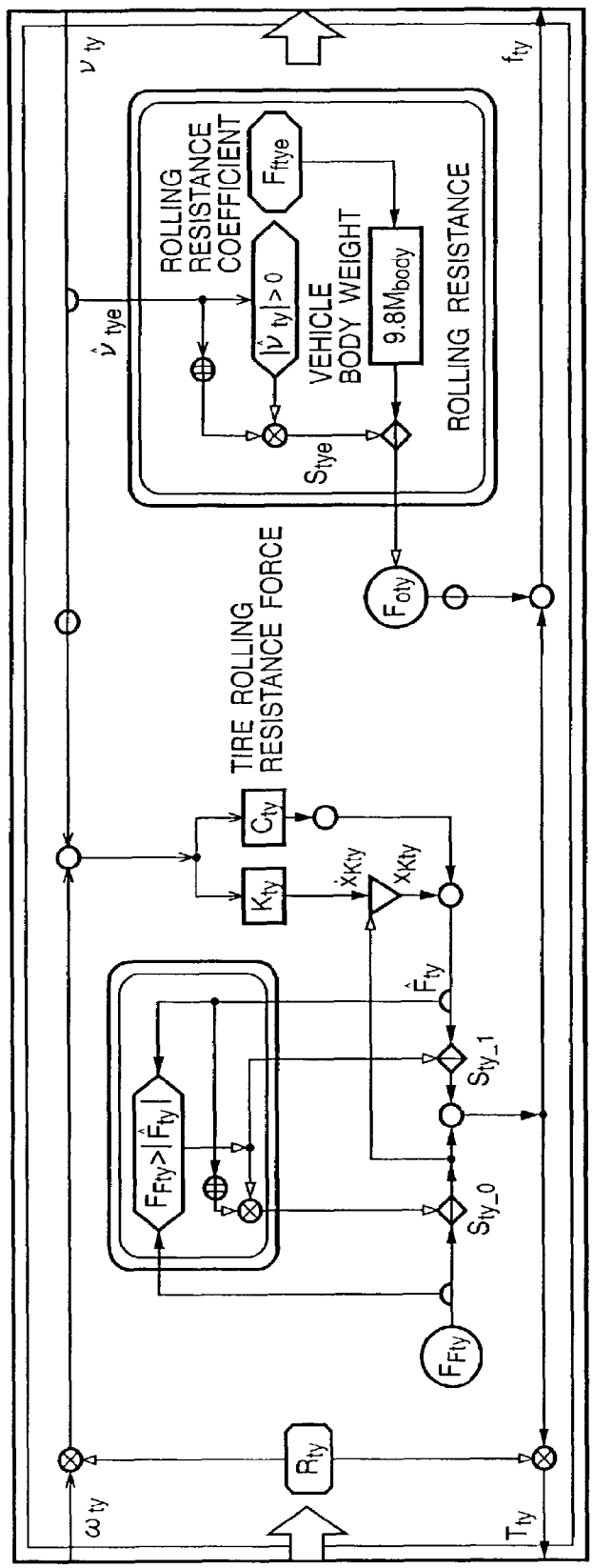
FIG. 66 shows an example of a functional model of a tire.

FIG. 66 shows functional and mechanism models of a tire. The functional and mechanism models in FIG. 66 include a mechanism model (left side in FIG. 66) that simulates slip of the tire, and a mechanism model (right side in FIG. 66) that represents a rolling resistance. Note that the mechanism model of the rolling resistance is a simple model that does not generate any resistance force when velocity=0, although the rolling resistance force acts as a brake force in practice.

The governing equation of the functional model in FIG. 66 is given by:

$$\begin{bmatrix} 0 \\ T_{ty} \\ f_{ty} \end{bmatrix} = \qquad (EQ\ 109)$$

$$\begin{bmatrix} -\dfrac{1}{K_{bk}S_{ty\_1}} & 0 & R_{ty} & -1 & 0 \\ 0 & R_{ty} & R_{ty}^2 C_{ty} S_{ty\_1} & -R_{ty}C_{ty}S_{ty\_1} & R_{ty}F_{Fty}S_{ty\_0} \\ 0 & 1 & R_{ty}C_{ty}S_{ty\_1} & -C_{ty}S_{ty\_1} & F_{Fty}S_{ty\_0} - F_{oty} \end{bmatrix} \begin{bmatrix} \dot{x}_{Kty} \\ x_{Kty} \\ \omega_{ty} \\ v_{ty} \\ 1 \end{bmatrix}$$

Figure 67:
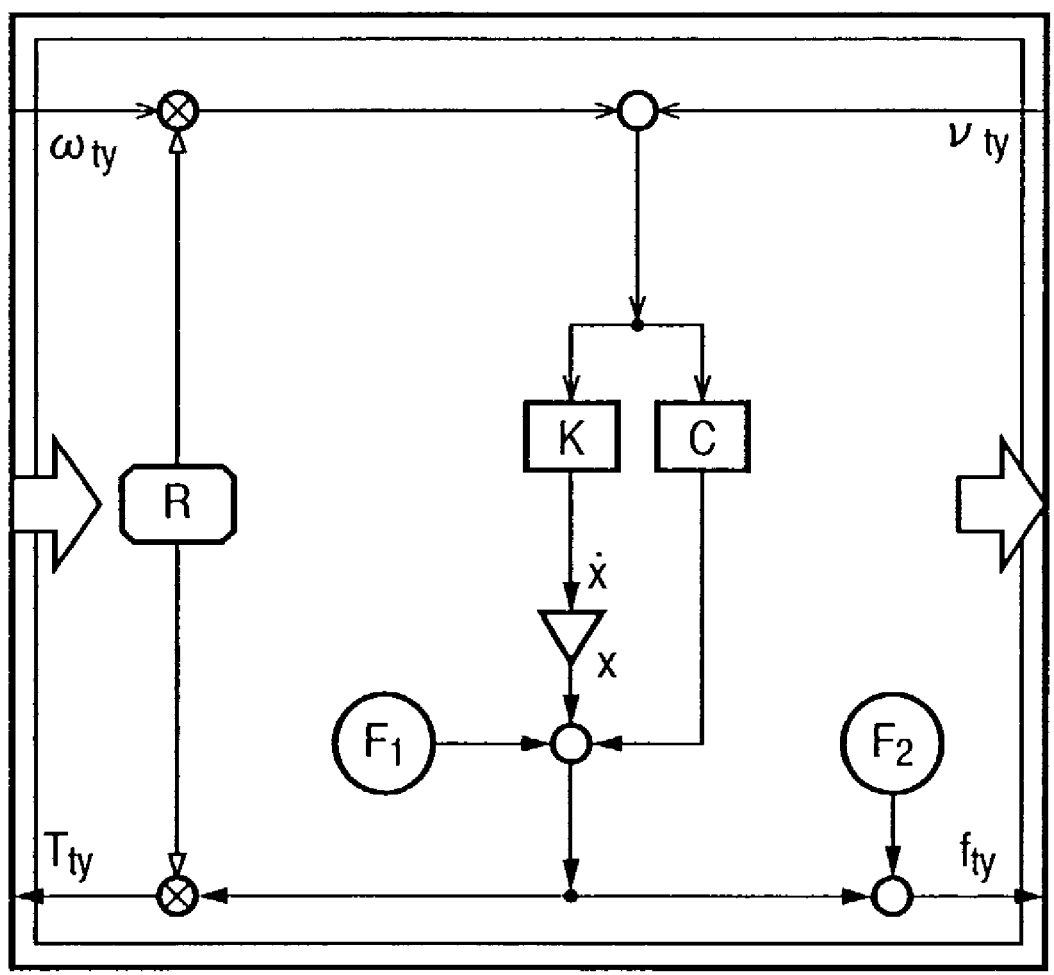
FIG. 67 shows an example of an equivalent functional model of the tire.

FIG. 67 shows an equivalent functional model obtained by simplifying the functional and mechanism models shown in FIG. 66.

The governing equation and equivalent characteristics of the equivalent functional model shown in FIG. 67 are given by:

$$\begin{bmatrix} 0 \\ T_{ty} \\ f_{ty} \end{bmatrix} = \begin{bmatrix} K & 0 & R & -1 & 0 \\ 0 & R & R^2C & -RC & RF_1 \\ 0 & 1 & RC & -C & F_2 \end{bmatrix} \begin{bmatrix} \dot{x} \\ x \\ \omega_{ty} \\ v_{ty} \\ 1 \end{bmatrix} \qquad (EQ\ 110)$$

$$\left. \begin{aligned} S_{ty\_1} &= \text{fnc\_Frc1}(\hat{F}_{ty}, F_{Fty}) \\ S_{ty\_0} &= \text{fnc\_Frc0}(\hat{F}_{ty}, F_{Fty}) \\ K &= -\dfrac{1}{K_{bk}S_{ty\_1}} \\ R &= R_{ty} \\ C &= C_{ty}S_{ty\_1} \\ F_1 &= F_{Fty}S_{ty\_0} \\ F_2 &= -\text{Fnc\_Foty}(\hat{V}_{ty}, M_{body}, F_{flye}) \end{aligned} \right\}$$

(5) Vehicle Body Model

Figure 68:
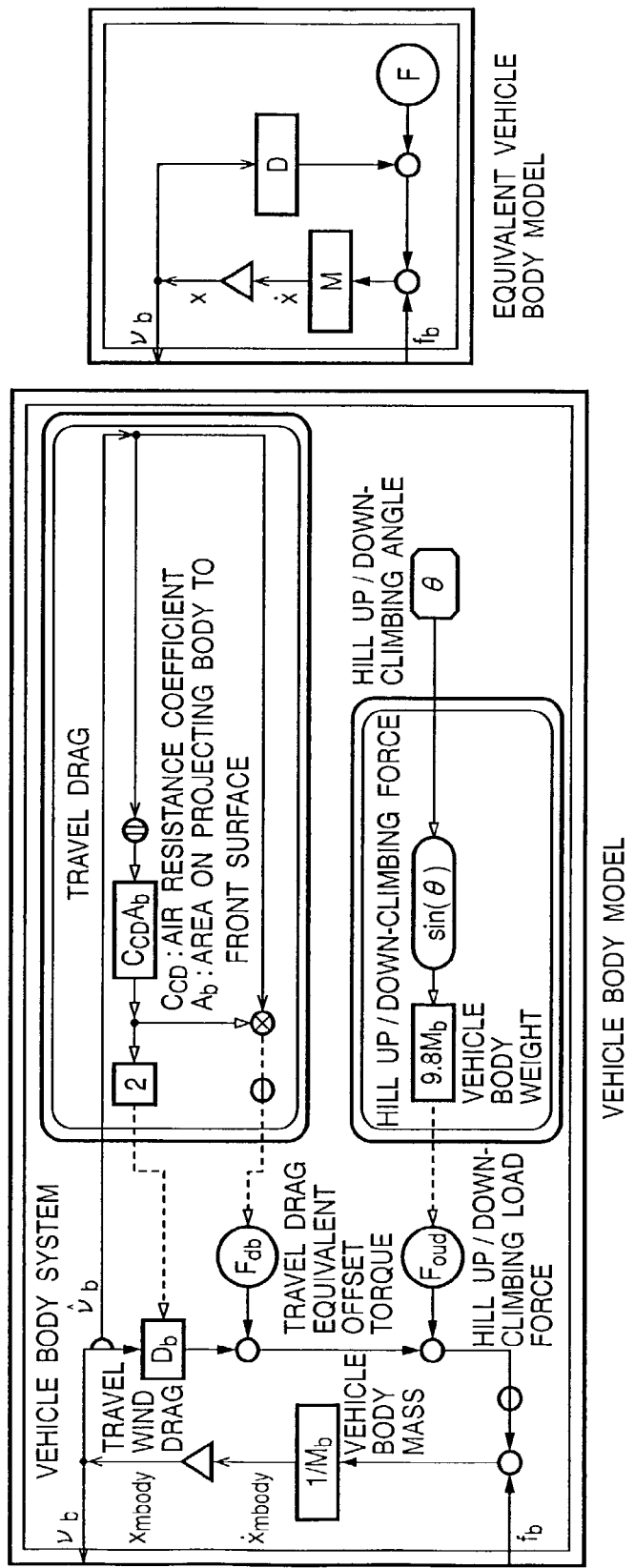
FIG. 68 shows an example of a functional model and equivalent functional model of a vehicle body.

FIG. 68 shows functional and mechanism models (left side) of a vehicle body, and its equivalent model. The left functional mechanism models in FIG. 68 include a mechanism model for generating a travel drag force proportional to the square of velocity, and a hill up/down-climbing force. Note that the mechanism model of the travel drag force is the same as that of the torque converter except that the direction (forward/backward) of the travel velocity is given to the travel drag force as a positive/negative sign (although variable names are different).

The governing equation of the left functional model in FIG. 68 is given by:

$$\begin{bmatrix} 0 \\ v_b \end{bmatrix} = \begin{bmatrix} -M_b & -D_b & 1 & -(F_{oud}+F_{db}) \\ 0 & 1 & 0 & 0 \end{bmatrix} \begin{bmatrix} \dot{x}_{Mb} \\ x_{Mb} \\ f_b \\ 1 \end{bmatrix} \qquad (EQ\ 111)$$

The governing equation and equivalent characteristics of the right equivalent functional model in FIG. 68 are given by:

$$\begin{bmatrix} 0 \\ v_b \end{bmatrix} = \begin{bmatrix} M & D & 1 & F \\ 0 & 1 & 0 & 0 \end{bmatrix} \begin{bmatrix} \dot{x} \\ x \\ f_b \\ 1 \end{bmatrix} \qquad (EQ\ 112)$$

$$\left. \begin{aligned} M &= -M \\ D &= -\text{fnc\_Db}(\hat{V}_b, C_{CD}, A_b) \\ F &= -\text{fnc\_Tb}(\hat{V}_b, C_{CD}, A_b, M_b, \theta) \end{aligned} \right\}$$

(7-3-3. Expansion and Integration of Vehicle Functional Model)

Model integration of a power train and vehicle system of a high-order layer, and a vehicle that integrates them will be done by expanding functional and mechanism models which are obtained by modeling functional components for a vehicle and are registered in the stencil list table.

(7-3-3-1. Functional Model of Power Train)

Figure 69B:
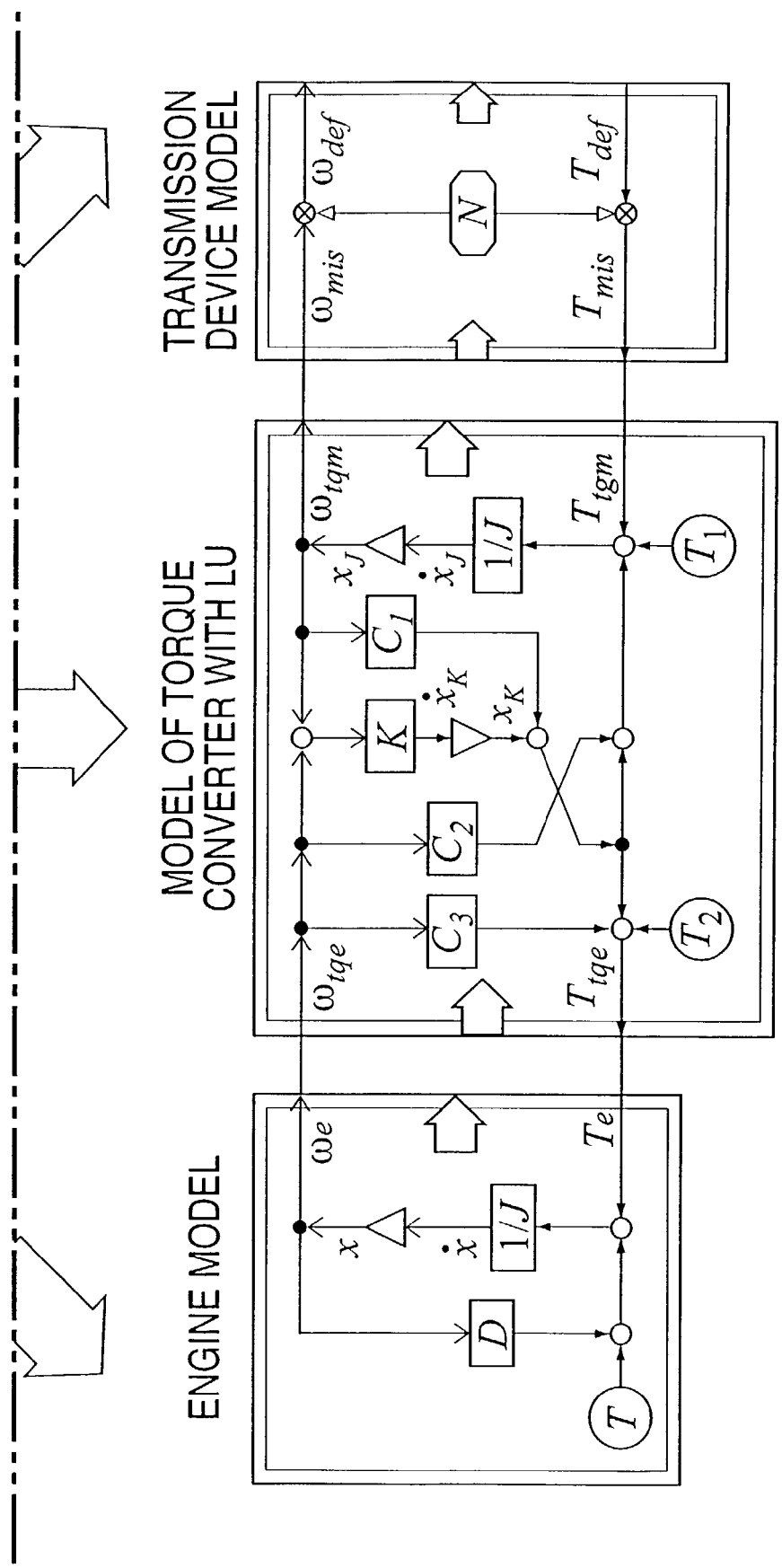
FIG. 69 shows an expansion example of a power train.
Figure 70:
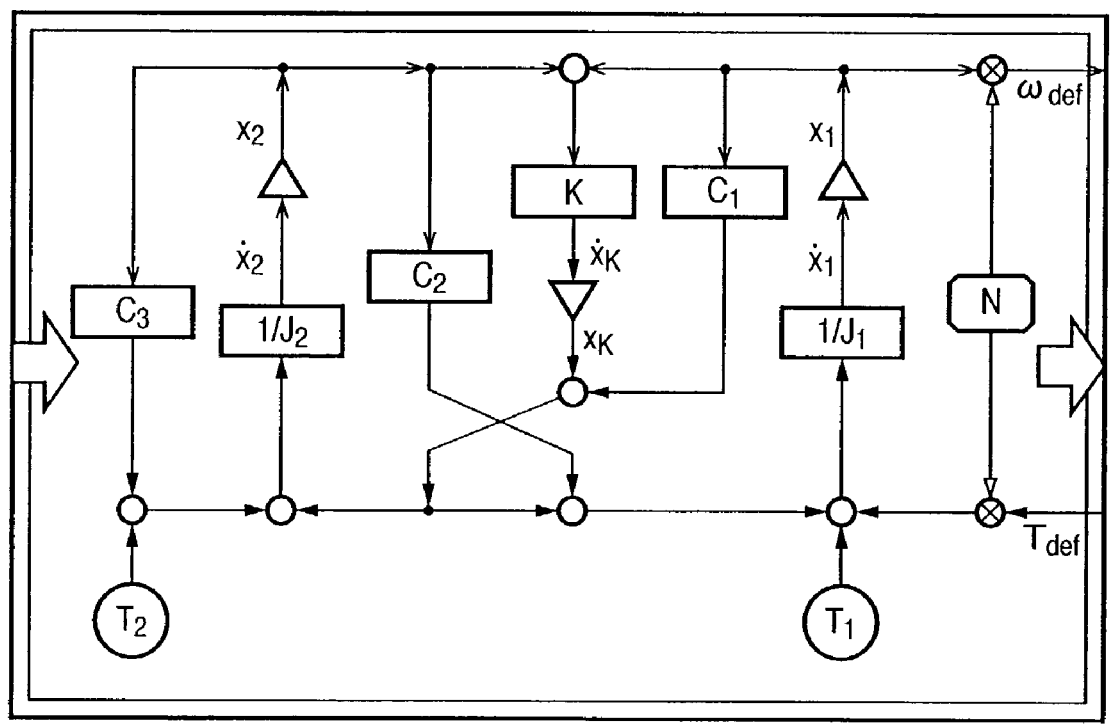
FIG. 70 shows a functional model example of the integrated power train.

FIG. 69 shows an expansion example drawn by dragging equivalent functional models that form the power train from the stencils. FIG. 70 shows an example of a functional model obtained by these expanded functional models to the power train of a high-order layer.

As the power train functional model in FIG. 69, a functional model diagram, governing equation, and functions of equivalent characteristics are registered together. As a characteristic input table and definition table of state variables and the like, those of functional components registered in advance are used. In a use method, icons of hierarchically structurized functional components shown in FIG. 55 are designated and read out so as to re-define their characteristics and to look up their contents.

The governing equation and equivalent characteristics of the mechanism model shown in FIG. 70 are given by:

$$\begin{bmatrix} 0 \\ 0 \\ 0 \end{bmatrix} = \begin{bmatrix} -J_2 & 0 & 0 & C_3 & -C_1 & -1 & 0 & T_2 \\ 0 & -J_1 & 0 & C_2 & C_1 & 1 & -N & T_1 \\ 0 & 0 & K & 1 & -1 & 0 & 0 & 0 \end{bmatrix} \times \qquad (EQ113)$$

$$[\dot{x}_2\ \dot{x}_1\ \dot{x}_K\ x_2\ x_1\ x_K\ T_{def}\ 1]$$

$$\left. \begin{aligned} N &= \text{fnc\_Nmis}(S_{hift})N_{def} \\ S_{cl\_1} &= \text{fnc\_Frc1}(\hat{T}_{cl}, T_{Fcl}) \\ S_{cl\_0} &= \text{fnc\_Frc0}(\hat{T}_{cl}, T_{Fcl}) \\ C_{tq} &= \text{fnc\_Frc\_CTq}(M_{ap}C_p, \omega_{tqm}/\omega_{tqe}) \\ R_{Ttq} &= \text{fnc\_Frc\_RTtq}(M_{ap}Tr, \omega_{tqm}/\omega_{tqe}) \\ J_1 &= -J_{cl} \\ J_2 &= -J_c \\ K &= \dfrac{1}{K_{cl}S_{cl\_1}} \\ C_1 &= -C_{cl}S_{cl\_1} \\ C_2 &= C_{tq}R_{Ttq} + C_{cl}S_{cl\_1} \\ C_3 &= -(C_{tq} + C_{cl}S_{cl\_1} + \text{fnc\_De}(Map\_Tq, \alpha_e, \omega_e)) \\ T_1 &= T_{0tq}R_{Ttq} + T_{Fcl}S_{cl\_0} + T_{Ccl}S_{cl\_1} \\ T_2 &= \text{fnc\_Tq}(Map\_Tq, \alpha_e, \omega_e) - (T_{0tq} + T_{Fcl}S_{cl\_0} + T_{Ccl}S_{cl\_1}) \end{aligned} \right\}$$

Note that observation variables hidden by integration are omitted from the equation.

(7-3-3-2. Functional Model of Vehicle Body System and Vehicle)

Figure 71A:
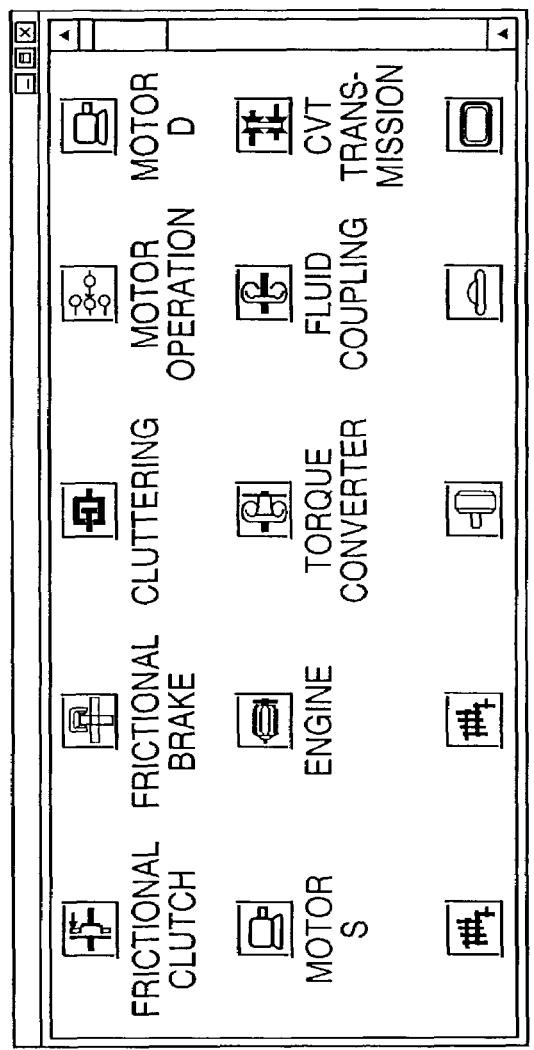
FIG. 71 shows an expansion example of a vehicle system.
Figure 71B:
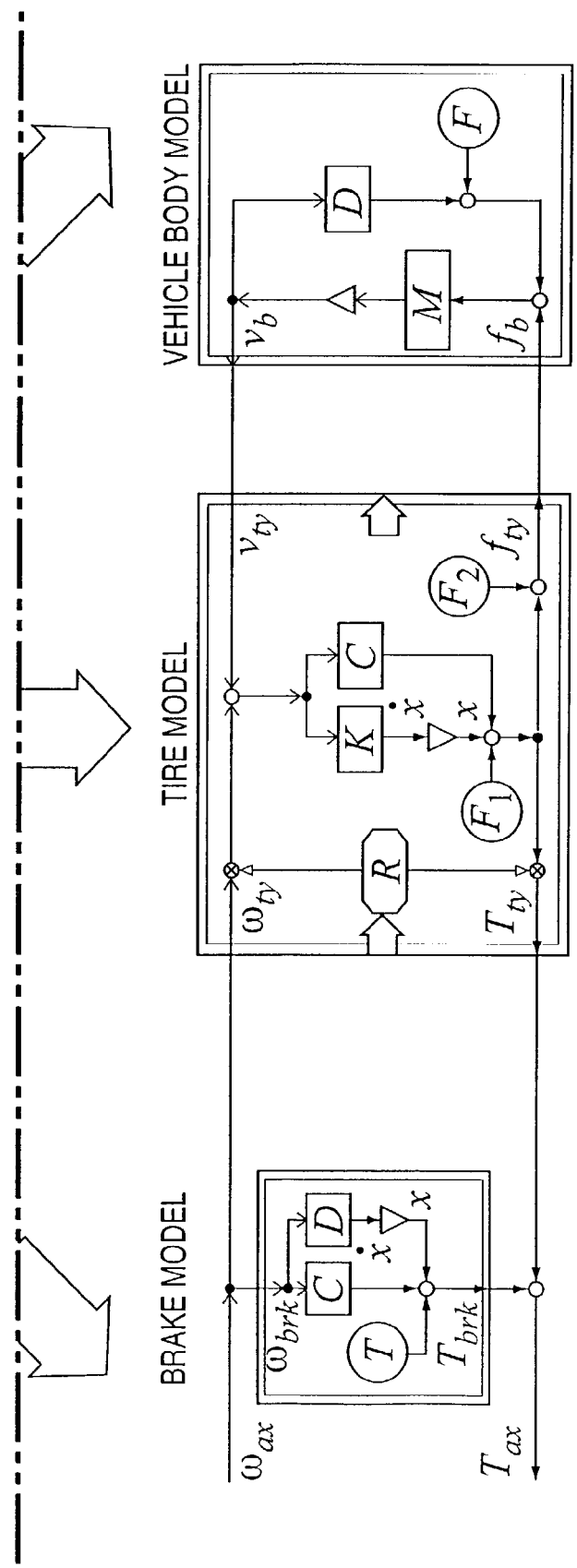
Figure 72:
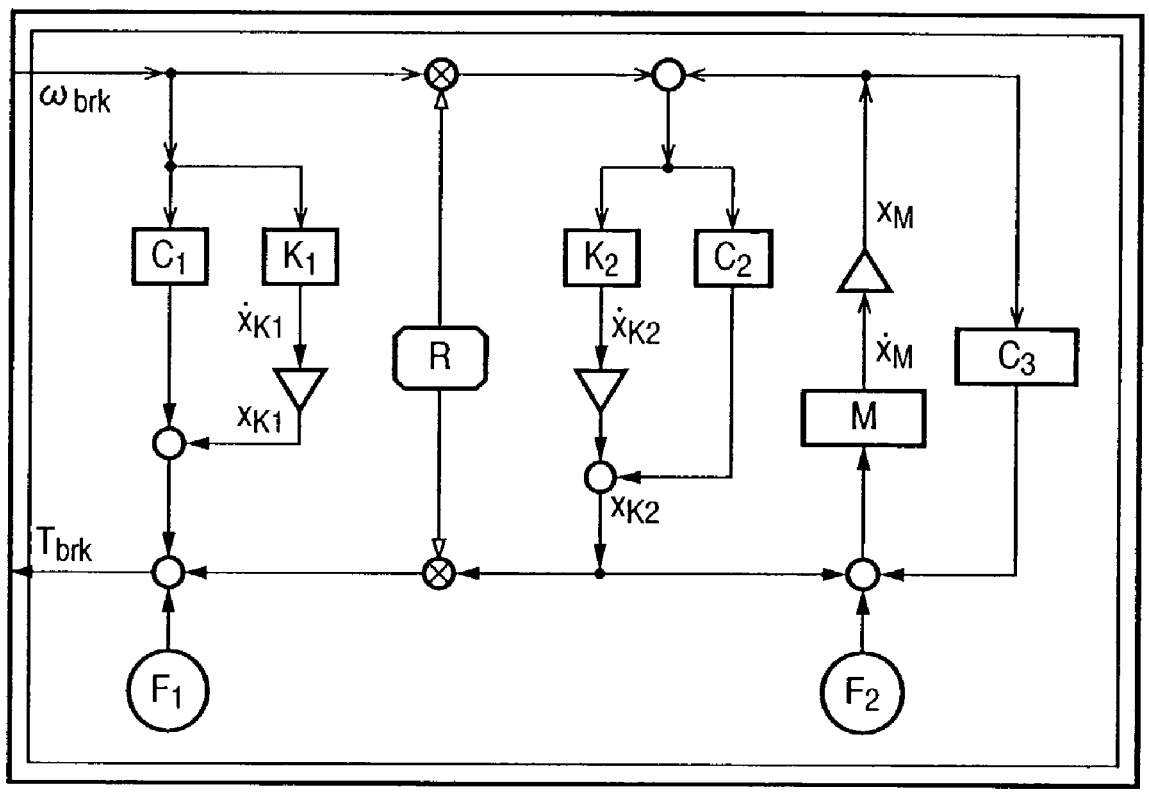
FIG. 72 shows a functional model example of the integrated vehicle system.
Figure 73:
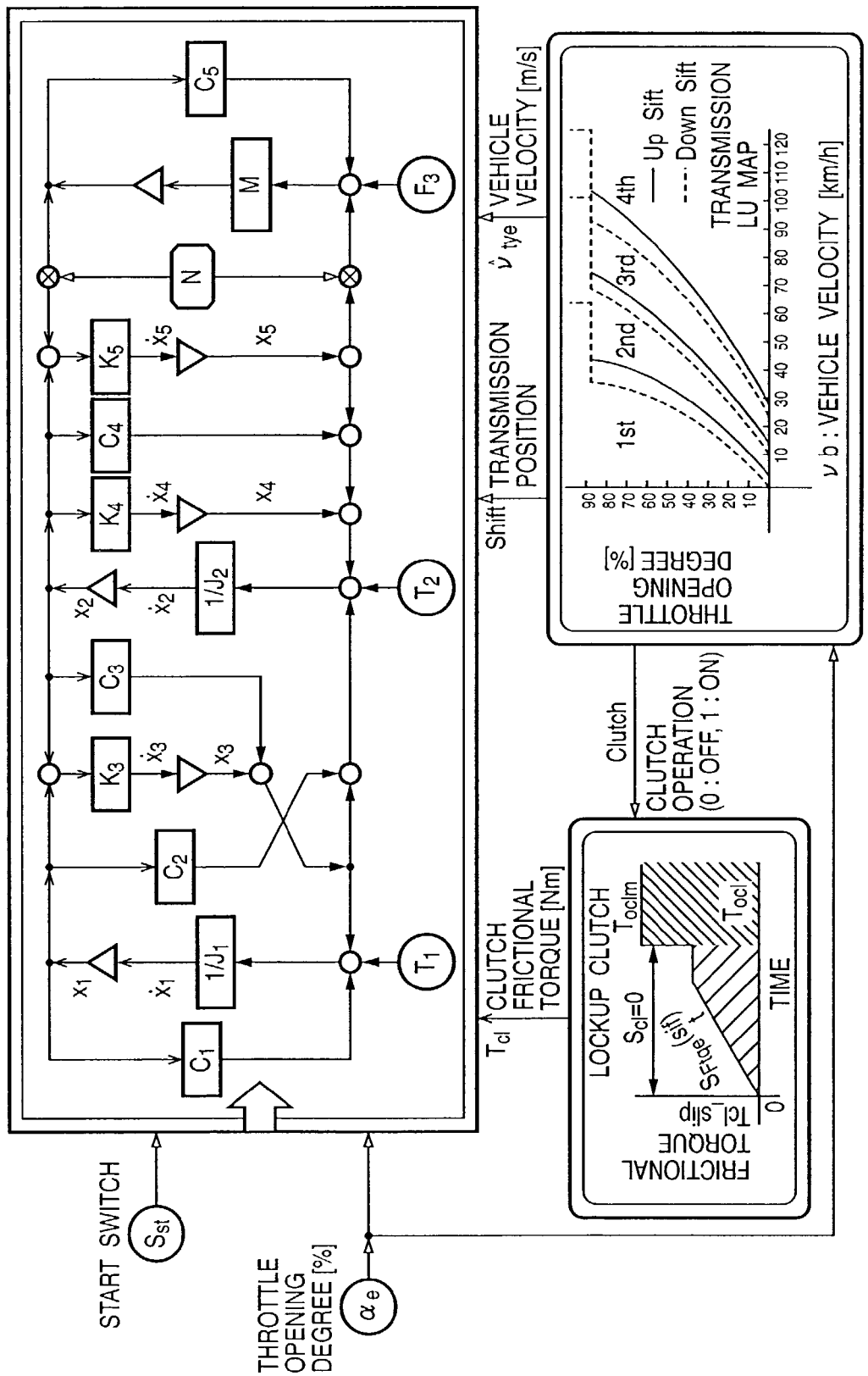
FIG. 73 shows a functional model example of an integrated vehicle.

FIG. 71 shows an expansion example of functional components that form a vehicle body system as in the power train, and FIG. 72 shows the integrated functional model. FIG. 73 shows a functional model of a vehicle of the highest-order layer obtained by expanding and integrating the functional models of the power train in FIG. 70 and the vehicle body system shown in FIG. 72. The vehicle functional model incorporates a transmission map for selecting the gear ratio of the automatic transmission device, a map for determining ON/OFF of the lockup clutch, and a function of a control algorithm for controlling this. The reason why these mechanism models are built in upon integration of the vehicle is that the transmission control uses the vehicle velocity of the vehicle body and the throttle opening degree of the engine as observation variables, and controls observation variables for a plurality of functional components of the torque converter and transmission device. Note that the governing equation and equivalent characteristic equations of the integrated functional model are omitted.

8. Example of System Arrangement of This Embodiment

<8-1. Schematic Example of Hardware and Software Arrangements>

Figure 74:
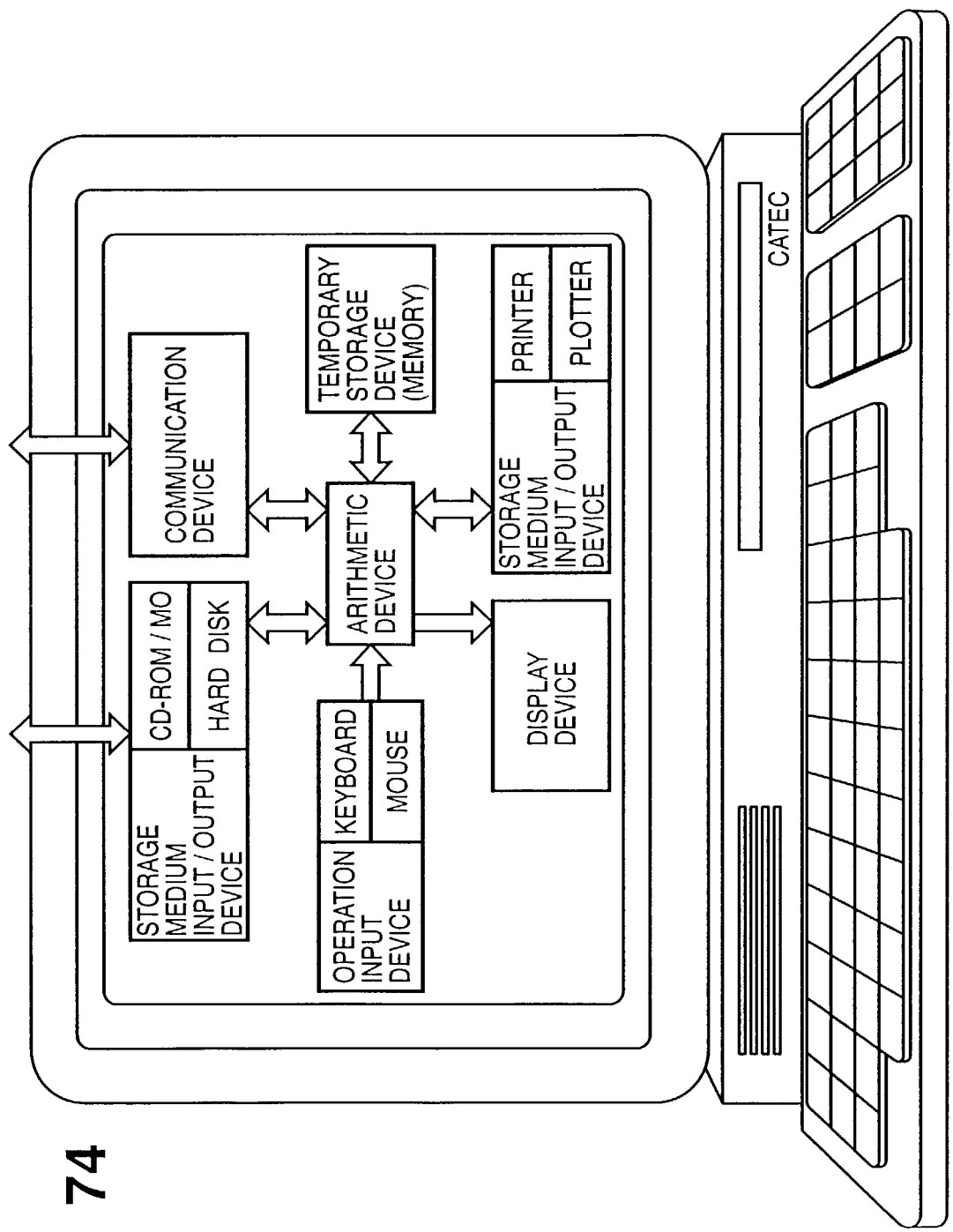
FIG. 74 shows an example of the hardware arrangement of a system according to an embodiment of the present invention.
Figure 75:
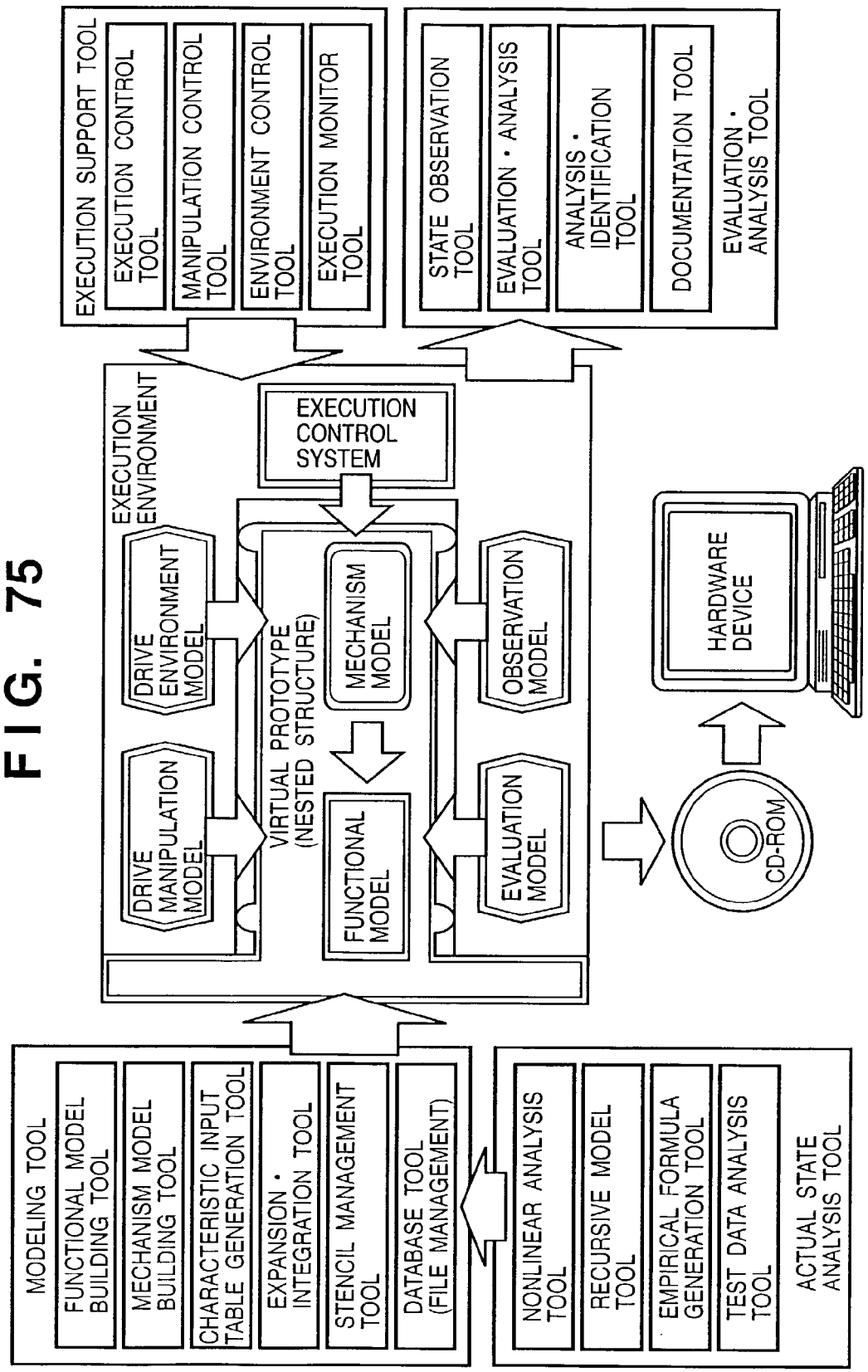
FIG. 75 shows an example of the software arrangement of the system according to an embodiment of the present invention.

FIG. 74 shows an outline of an example of the hardware arrangement of the system required for modeling functional and mechanism models, and FIG. 75 shows an outline of an example of software arrangement for implementing modeling.

In FIG. 75, since functional and mechanism models faithfully simulate functions and actions of a product and components, they are called virtual prototypes or execution models, and an execution environment for executing them is required. In the relationship between the execution environment and execution models, various execution models built in by nesting are manipulated from the execution environment side, and state variables generated by the functional models, physical characteristics generated by the mechanism models, and the like are observed. Therefore, models which form the execution environment include an operation manipulation model that manipulates execution models, a drive environment model that sets conditions such as environmental characteristics including an ambient temperature, atmospheric pressure, and the like, an observation model that measures state variables and characteristic values of execution models, and an evaluation model that checks the operation state and result of execution models. An execution control system makes various kinds of control for executing execution models such as start and stop of operation of execution models, change of characteristic values during operation, and the like.

Various tools required therefor include an execution support tool for operating execution models in the execution environment, and a tool for observing the operation state and the states of execution models. Each execution model requires a modeling tool for modeling it, and an actual state analysis tool for analyzing test data, physical phenomena, and the like of product and component characteristics upon modeling.

<8-2. Detailed Example of Hardware Arrangement>

Figure 88:
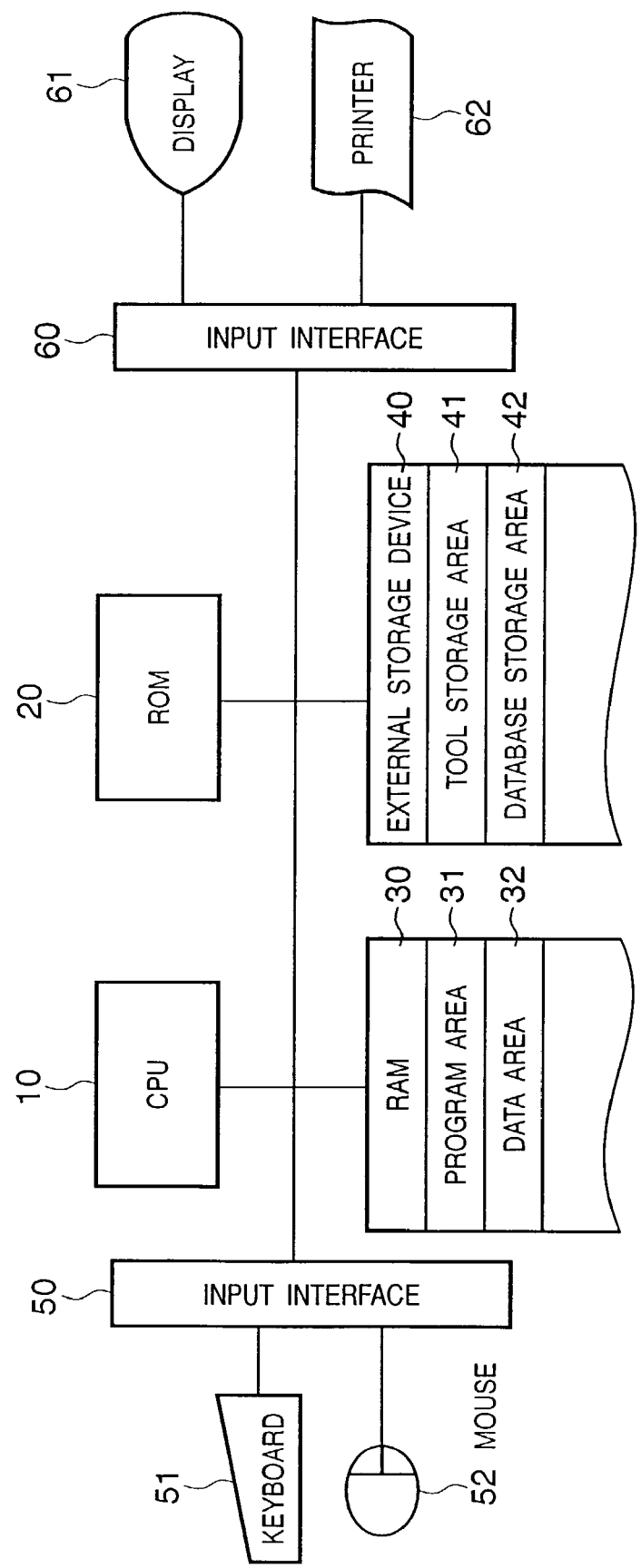
FIG. 88 is a block diagram showing an example of the arrangement of hardware of the system according to an embodiment of the present invention.

FIG. 88 shows the detailed example of hardware that implements modeling of this embodiment.

Referring to FIG. 88, reference numeral 10 denotes a CPU for arithmetic operations and control, which corresponds to an arithmetic device in FIG. 74; 20, a ROM which stores permanent programs, permanent parameters, and the like used by the CPU 10; and 30, a RAM which corresponds to a temporary storage device in FIG. 74, and includes a program area 31 for loading a program to be executed by the CPU 10 from an external storage unit 40, and a data area 32 used as a temporary storage of data upon executing the program by the CPU 10.

Reference numeral 40 denotes an external storage unit, which corresponds to a hard disk, CD-ROM/MO, or the like in FIG. 74, and includes a tool storage area 41 for storing programs of various tools shown in FIG. 75, and data, and a database storage area 42 for storing a database which is programmed to display and index various functional elements, functional models, mechanism models, and the like in a matrix (equation) display format, component display format, function•mechanism display format, element display format, or icons that can be read out. Note that the database storage area 42 preferably includes a rewritable area so that the user can register new models of components and products generated by the expansion•integration processes.

Reference numeral 50 denotes an input interface for interfacing with input devices. For example, a keyboard 51, mouse 52, and the like are connected to the input interface 50. Reference numeral 60 denotes an output interface for interfacing output devices. For example, a display 61, printer 62, and the like are connected to the output interface 60.

Although a communication unit is not shown in FIG. 88, functional models generated by this embodiment are exchanged between an enterprise that generates components of lower layers, and an enterprise that generates a product of an upper layer via the communication unit, thus allowing simulation early in the design process. These will be described in detail later in the paragraphs of a business model.

<8-3. Detailed Example of Processing Sequence>

Figure 89:
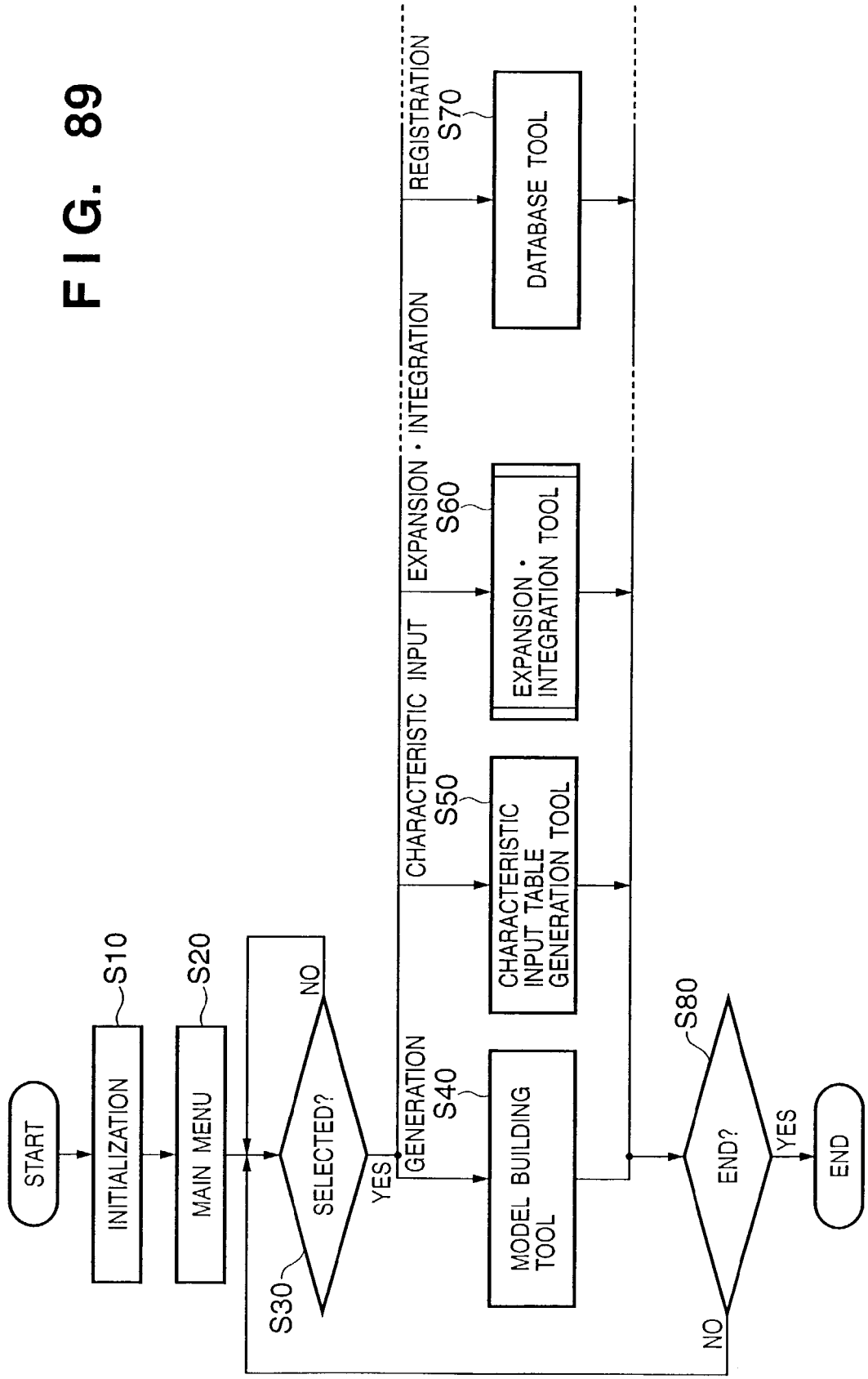
FIG. 89 is a flow chart showing an example of the processing sequence of the system according to an embodiment of the present invention.

FIG. 89 is a flow chart showing an example of the sequence for implementing modeling of this embodiment using tools shown in FIG. 75. Note that an expansion•integration tool in step S60 corresponds to the sequence shown in FIG. 46 mentioned above.

The system is initialized in step S10, and a main menu is displayed in step S20. The main menu need only allow to hierarchically open tools shown in FIG. 75. Since modeling is the principal object of this embodiment, the modeling tool is opened, various tools of the modeling tool are displayed as sub-menu items, and the subsequent process is executed by selecting a given sub-menu item. In step S30, a sub-menu item of the modeling tool is selected.

Upon selecting sub-menu items, tools in steps S40, S50, S60, S70, . . . can be used. FIG. 89 shows only a model building tool (S40), characteristic input table generation tool (S50), expansion•integration tool (S60), and database tool (S70) for registering a newly generated model.

In actual operation, a desired model is generated by the model building tool (S40) using data provided by the database, and at the same time, characteristics corresponding to respective functions are input by the characteristic input table generation tool (S50). When the model is built, that model is integrated to an upper layer by the expansion•integration tool (S60). Finally, the newly generated model is registered by the database tool (S70) if necessary.

As described in the example of the hardware arrangement, data of a functional model used by the model building tool (S40) may be read via, e.g., the Internet in addition to those input from a storage medium, and registration by the database tool (S70) may externally send data via, e.g., the Internet.

<8-4. Example of Data Configuration in Modeling of Wiper>

An example of the data configuration that can implement expansion•integration of models of this embodiment implemented by the hardware and software will be explained below.

(8-4-1. Example of Configuration of RAM)

Figure 90:
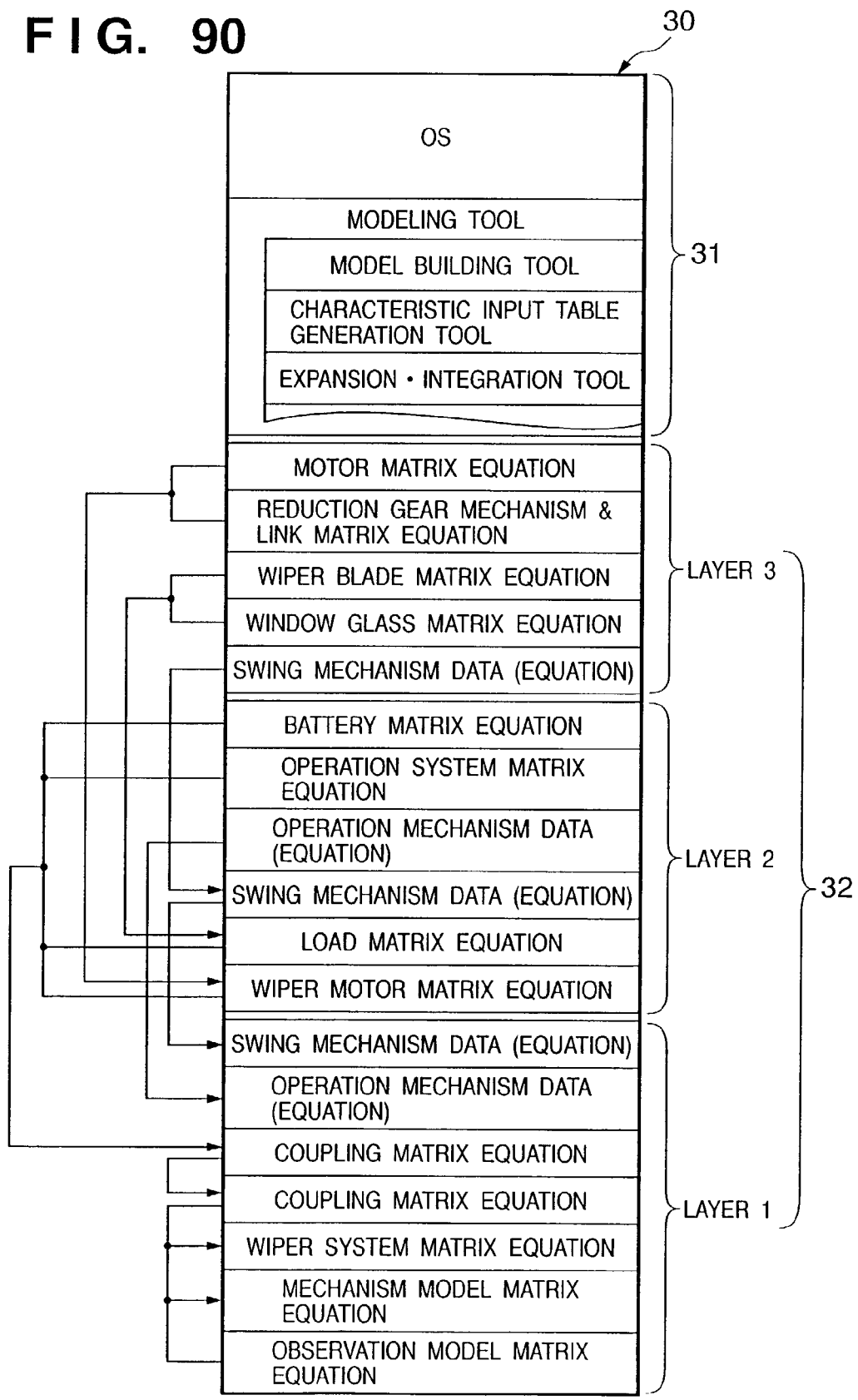
FIG. 90 shows an example of the format of a RAM shown in FIG. 88.

FIG. 90 shows an example of the contents of the RAM 30 in the expansion•integration process of models of this embodiment.

In FIG. 90, the program area 31 of the RAM 30 has loaded, e.g., an OS (operation system) and required modeling tool programs.

On the other hand, the data area 32 stores matrix equations (formulas), as shown in FIG. 90, together with modeling tool data and functional•mechanism model display data (not shown). FIG. 90 shows an example of expansion•integration of a wiper model described in the detailed example of integration.

As layer 3, the matrix equations of the motor, reduction gear mechanism & link, wiper blade, and window glass, and data (or equations) of the nonlinear swing mechanism are read out or generated as components of the wiper model. These matrix equations are modified in correspondence with dual conversion or sign change in the expansion process.

In the integration process, the motor matrix equation and reduction gear mechanism & link matrix equation are combined to generate a wiper motor matrix equation of layer 2, and the wiper blade matrix equation and window glass matrix equation are combined to generate a load matrix equation of layer 2. Furthermore, the generated matrix equations are equivalently converted into simplified matrix equations for the next integration by deleting elements that can be ignored.

To layer 2, the matrix equations of the battery and operation system as linear functional models, and nonlinear operation mechanism data (equations) are also added. The nonlinear swing mechanism data (equations) of layer 3 are directly moved to layer 2. The matrix equations of layer 2 are also modified in correspondence with dual conversion or sign conversion in the expansion process.

In the integration process, the battery, operation system, load, and wiper motor matrix equations are combined to generate a coupled matrix equation of layer 1. Furthermore, the nonlinear operation mechanism data (equations) and swing mechanism data (equations) are directly moved to layer 1. The coupled matrix equation of layer 1 is equivalently converted into a simplified integrated matrix equation by deleting elements that can be ignored. At this time, the integrated matrix equation includes wiper system, mechanism model, and observation model matrix equations. Of these equations, the wiper system matrix equation is a functional model of the wiper, and can be used as a model if it is registered in the database.

(8-4-2. Example of Configuration of Database)

Figure 91:
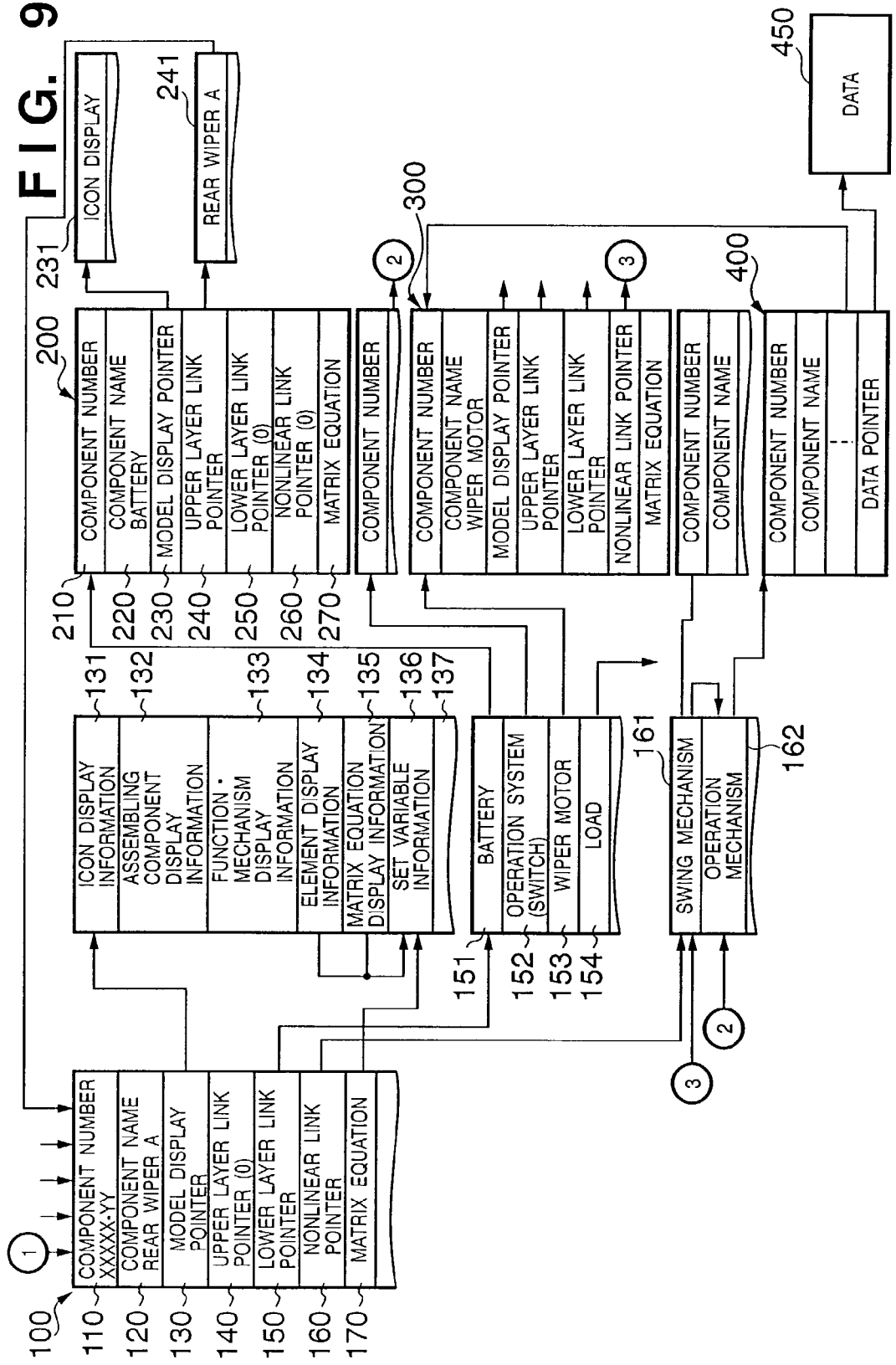
FIG. 91 shows an example of the format of a database shown in FIG. 88.
Figure 92:
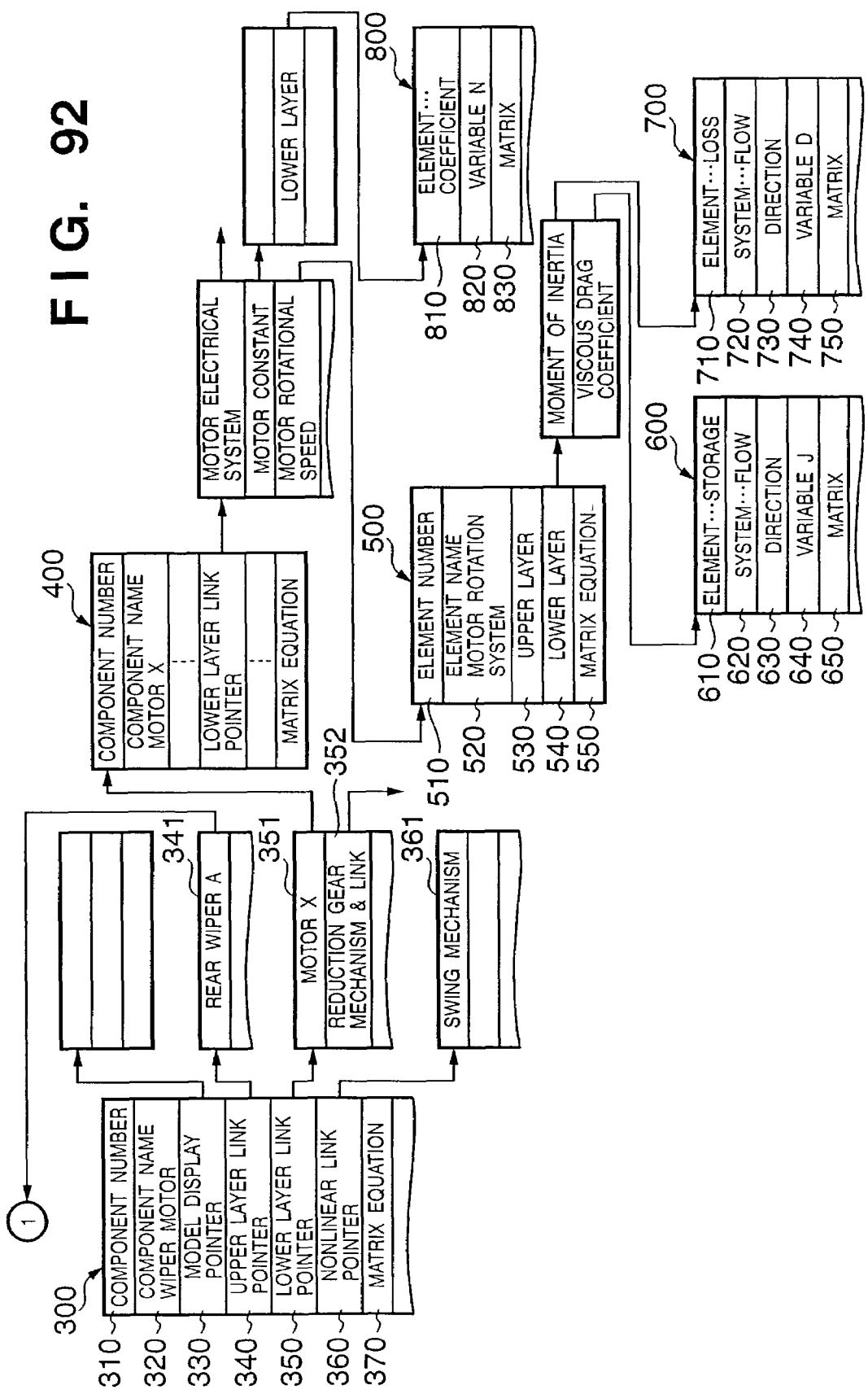
FIG. 92 shows an example of the format of the database shown in FIG. 88.

FIGS. 91 and 92 show an example of the configuration of the database that pertains to the wiper system shown in FIGS. 48 and 49. FIGS. 91 and 92 show a state after the wiper functional model is registered. Before the wiper functional model is generated, upper layer data are stored in the data area 32 of the RAM 30. Depending on the contents to be stored in the database, the structure shown in FIGS. 91 and 92 is divisionally stored in the storage medium and memory. In FIGS. 91 and 92, pointers of individual data are stored first, and each component information is made compact so as to improve the function of the database. Alternatively, each component may have all kinds of information. For example, component data 100 may include model display information 131 to model display information 136, upper layer data, lower layer data, nonlinear data, and the like.

Figure 81:
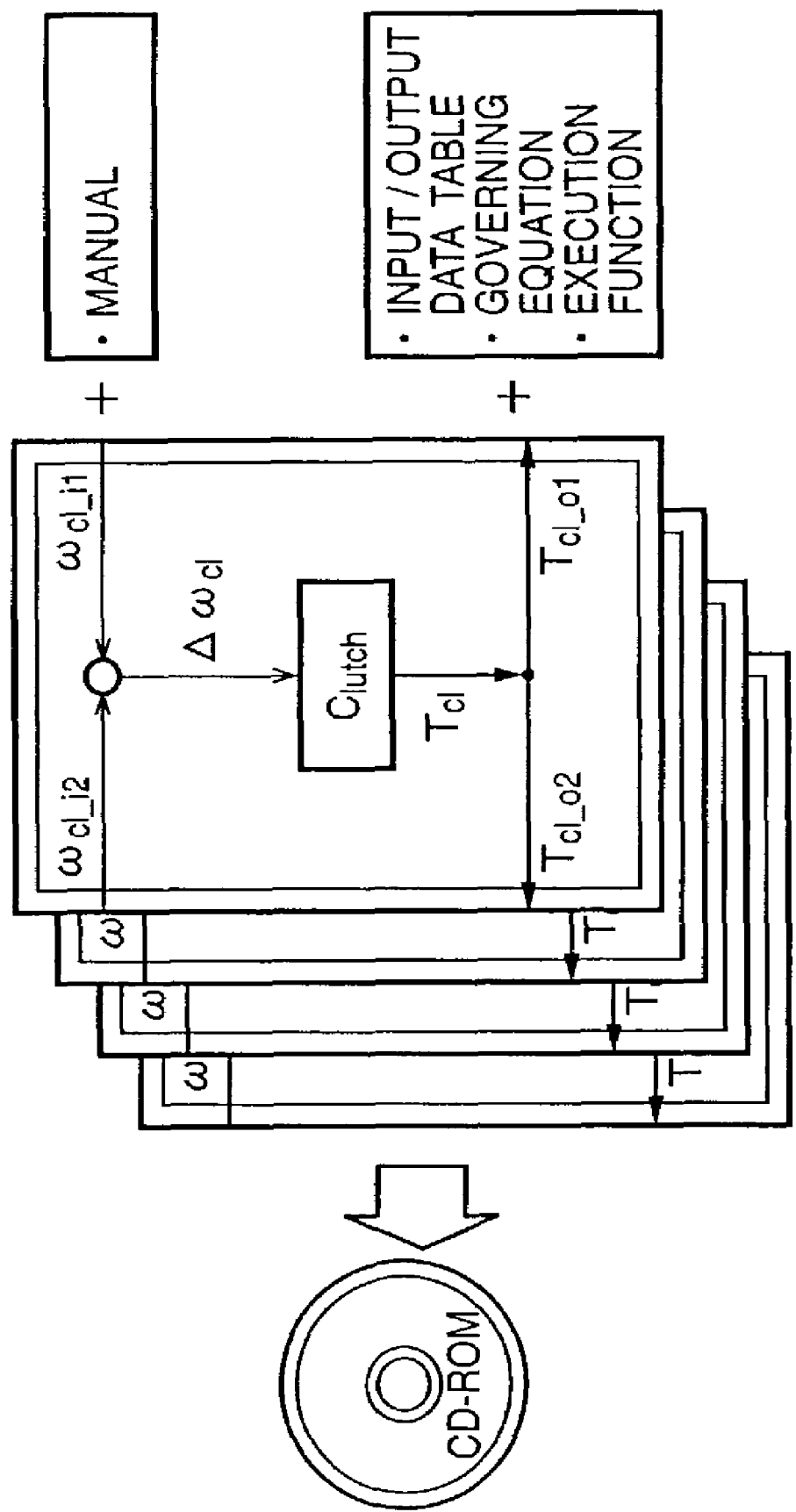
FIG. 81 shows the concept of a simplified functional model pack provided by an embodiment of the present invention.

A description will be made in turn from the upper to the lower layers. Reference numeral 100 denotes component data of rear wiper A of layer 1. Component data 100 has, in turn, a component number 110, component name 120, and model display pointer 130 which are used to search for this component data. Ahead of the model display pointer 130, areas for storing this component in various selectable formats are assured. Icon display information 131 used to display an icon of the component and to read out a functional model by clicking that icon, as shown in FIG. 72, assembling component display information 132 used to display assembly by a diagram that shows components, as shown in FIG. 47, function•mechanism display information 133 used to display a functional element as a black box, as shown in FIG. 81, element display information 134 used to display details of all functional elements, as shown in FIGS. 48 and 49, and matrix equation display information 135 used to display a functional model as matrix equations like EQ30 to EQ37 are stored, and a given display format can be selected by user's instruction. As will be described later, some pieces of information are inhibited from being provided to the user according to the contract. Furthermore, setup function information 136 for setting a general functional model, e.g., for setting functions of a beam and planetary gear of an identical functional model, is stored. This information is looked up from the element display information 134, matrix equation display information 135, or matrix equations 170.

Reference numeral 140 denotes an upper layer link pointer for looking up a functional model of an upper layer. Zero is stored since rear wiper A has no upper layer. Reference numeral 150 denotes a lower layer link pointer for looking up functional models of a lower layer. A battery 151, operation system (switch) 152, wiper motor 153, and load 154 of layer 2 are linked to rear wiper A of this embodiment. Reference numeral 160 denotes a nonlinear link pointer for looking up nonlinear mechanism models. A swing mechanism 161 and operation mechanism 162 are linked to rear wiper A of this embodiment. A field 170 stores matrix equations that represent functional models of this component.

Also, for example, component data 200 of the battery stores a component number 210, component name 220, model display pointer 230, upper layer link pointer 240, lower layer link pointer 250, nonlinear link pointer 260, and matrix equations 270 as in rear wiper A. For the battery, icon display information 231 and the like are similarly stored, and rear wiper A 241 is linked to the upper layer link pointer 240. Furthermore, the operation system 152, wiper motor 153, and load 154 respectively have component data. For example, component data 300 is linked to the wiper motor 153.

Component data are respectively linked to the swing mechanism 161 and operation mechanism 162, and nonlinear data 450 is further linked to, e.g., component data 400 of the operation mechanism.

Note that ①, ②, and ③ in FIGS. 91 and 92 indicate links.

FIG. 92 shows links from component data 300 of the wiper motor of layer 2. As an upper layer, rear wiper A is linked (341). A motor X 351 (component data 400) and reduction gear mechanism & link 352 of layer 3 are linked to a lower layer link pointer. The swing mechanism 361 is linked to a nonlinear link pointer.

A motor electrical system, motor constant, and motor rotational speed are linked to the component data 400 of motor X. The motor constant is an coefficient element 810, and data 800 including the coefficient element 810, a variable=N (820), and a matrix equation 830 is linked to the motor constant. The motor rotation system has, as element data 500, an element number 510, element name 520, upper layer link 530, lower layer link 540, and matrix equation 550. To the lower layer, a moment 600 of inertia and viscous drag coefficient 700 are linked. The moment 600 of inertia is a storage element 610, and has fluid system 620, signal direction 630, function J 640, and matrix equation 650. The viscous drag coefficient 700 is a loss element 710, and has a fluid system 720, signal direction 730, function D 740, and matrix equation 750.

9. Operating System of Functional-Mechanism Model

<9-1. Re-use Method of Model>

Figure 76:
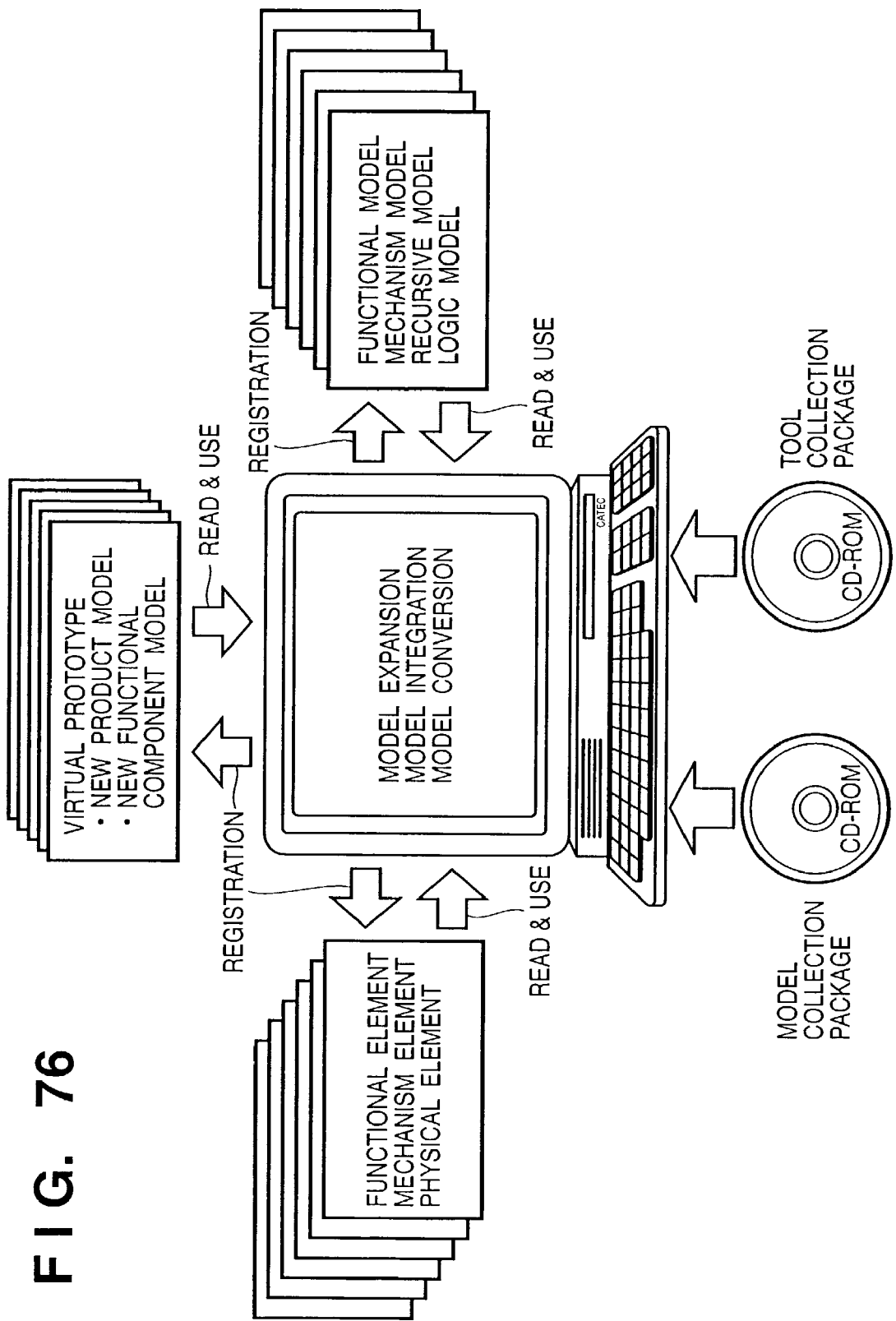
FIG. 76 shows the concept of model registration and re-use according to an embodiment of the present invention.

Functional models can re-use already developed models of respective layers that have been modeled by expansion and integration so as to allow to assemble a product by diverting standardized or already developed various functional components. FIG. 76 shows the relationship between registration and diversion.

FIG. 76 illustrates that modeling is done based on a model collection and tool collection to register function, mechanism, and physical elements, and the like, and the registered elements are read out and used in next modeling. The model collection used upon modeling includes modeling symbols and stencils shown in FIG. 77, models of functional elements shown in FIG. 8, models of nonlinear elements shown in FIG. 10, and the like, and they are symbols and elements commonized across physical unit systems. Of course, as these symbols and models, those newly generated during the modeling process can be registered and re-used.

FIG. 77 shows versatile symbols used in linear and nonlinear functional and mechanism models. These symbols have basic functions such as state variables, characteristic variables, arithmetic operations, and the like required for modeling. Therefore, a model drawn on the computer by combining these symbols in accordance with the rules of the modeling scheme of a functional model can automatically derive a mathematical model.

<9-2. Model Contents of Model Collection>

As the contents of a model collection, various packages from simple symbol expression to detailed models are available in correspondence with the use purpose. A model expression method upon packaging functional models will be examined below. FIGS. 78, 80, 81, and 83 show examples of the relationships between packages and model patterns when such packages are recorded on external storage media. In a model of each figure, the left end indicates a CD-ROM that stores models, the uppermost one of central diagrams indicates functional and mechanism models of a friction coupling mechanism, the upper box on the right end indicates information contents appended, and the lower box on the right end indicates software modules.

(9-2-1. Package of Detailed Function Models)

Figure 78:
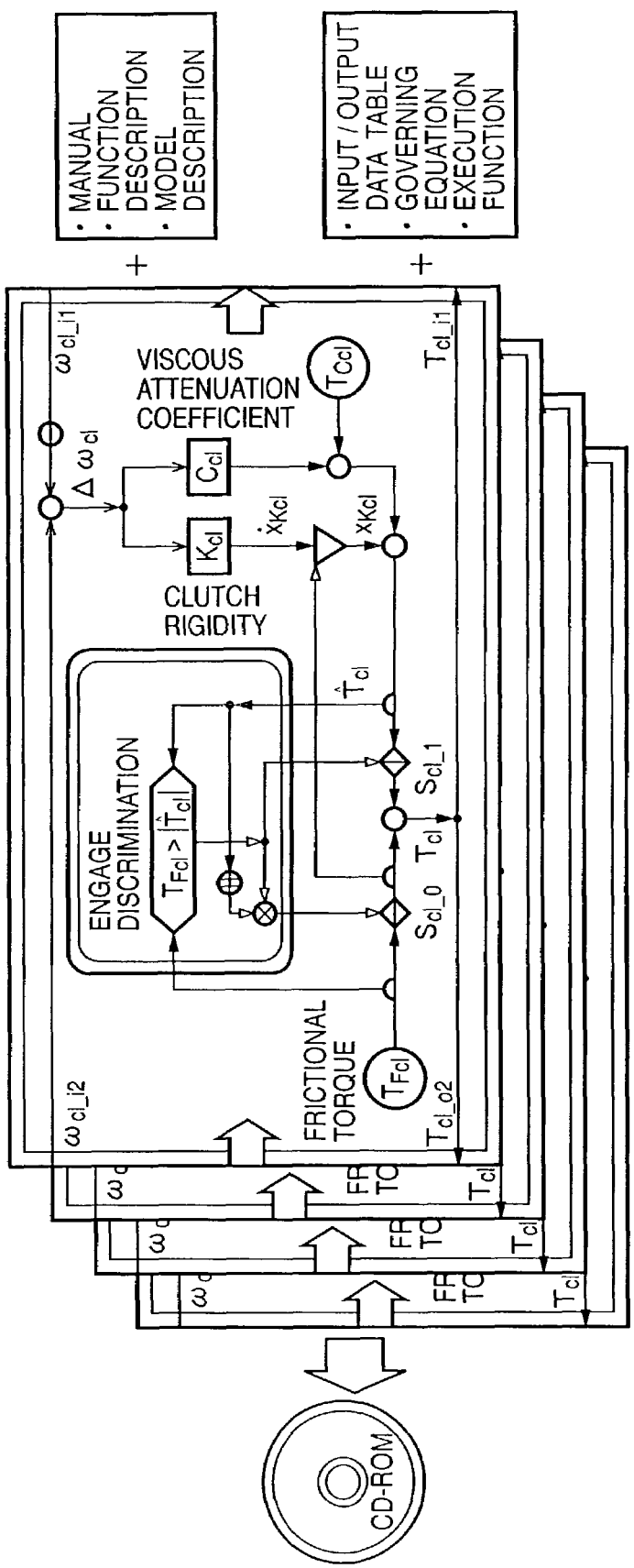
FIG. 78 shows the concept of a detailed functional model pack provided by an embodiment of the present invention.

FIG. 78 shows a package of a model collection that provides functional component models for experts who model products, components, and the like on the basis of physical phenomena, engineering theories, and the like. This model is expressed up to its details, and the technical know-how can be stored in mechanism models and equivalent characteristics as retained techniques.

For example, a functional model of the friction coupling mechanism on the central upper side can be built in a system via the modeling tool of the system shown in FIG. 75, and can undergo expansion and integration with other functional models to model a product or component. This package has model diagrams, governing equations, execution functions of mechanism models that simulate nonlinearity and the like, and input tables for inputting characteristic values upon execution, which are required upon modeling at that time (FIG. 79). Also, references appended can be looked up as a help list during execution after modeling and integration in the system shown in FIG. 75.

The governing equation of the friction coupling mechanism functional model in FIG. 78 is expressed by the relationship of a flow variable output ($T_{cl}$) with respect to a differential input ($\Delta\omega_{cl}$) of potential variables, and governing equations of input state variables $\omega_{cl\_i1}$ and $\omega_{cl\_i2}$, and output state variables $T_{cl\_o1}$ and $T_{cl\_o2}$ are omitted to improve the versatility of the model. Therefore, upon connecting and expanding this model to other functional models, the system automatically generates equations expressed by the input and output state variables. As a matter of course, governing equations expressed by input and output state variables may be provided. The governing equation of friction coupling on the central upper side in FIG. 78 is given by:

$$\begin{bmatrix} 0 \\ T_{cl} \end{bmatrix} = \begin{bmatrix} -\dfrac{1}{K_{cl}S_{cl\_1}} & 0 & 1 & 0 \\ 0 & 1 & C_{cl}S_{cl\_1} & T_{Fcl}S_{cl\_0}+T_{Kcl}S_{cl\_1} \end{bmatrix} \begin{bmatrix} \dot{x}_{kcl} \\ x_{kcl} \\ \Delta\omega_{cl} \\ 1 \end{bmatrix} \quad (EQ114)$$

Also, a mechanism model of engagement discrimination is given by:

if $(|\hat{T}_{cl}|>T_{Fcl})$ then $(S_{cl\_1}=1, S_{cl\_0}=0)$ else $(S_{cl\_1}=0,$
$S_{cl\_0}=$sign $(\hat{T}_{cl}))$ (EQ115)

EQ115 is an equation of a switch element $S_{cl}$ that discriminates the engaged/slip state of friction coupling. Also, Sign ( ) in EQ115 is a function of checking the sign of a state variable, and outputting 1 or −1.

(9-2-2. Package of Equivalent Function Models)

Figure 80:
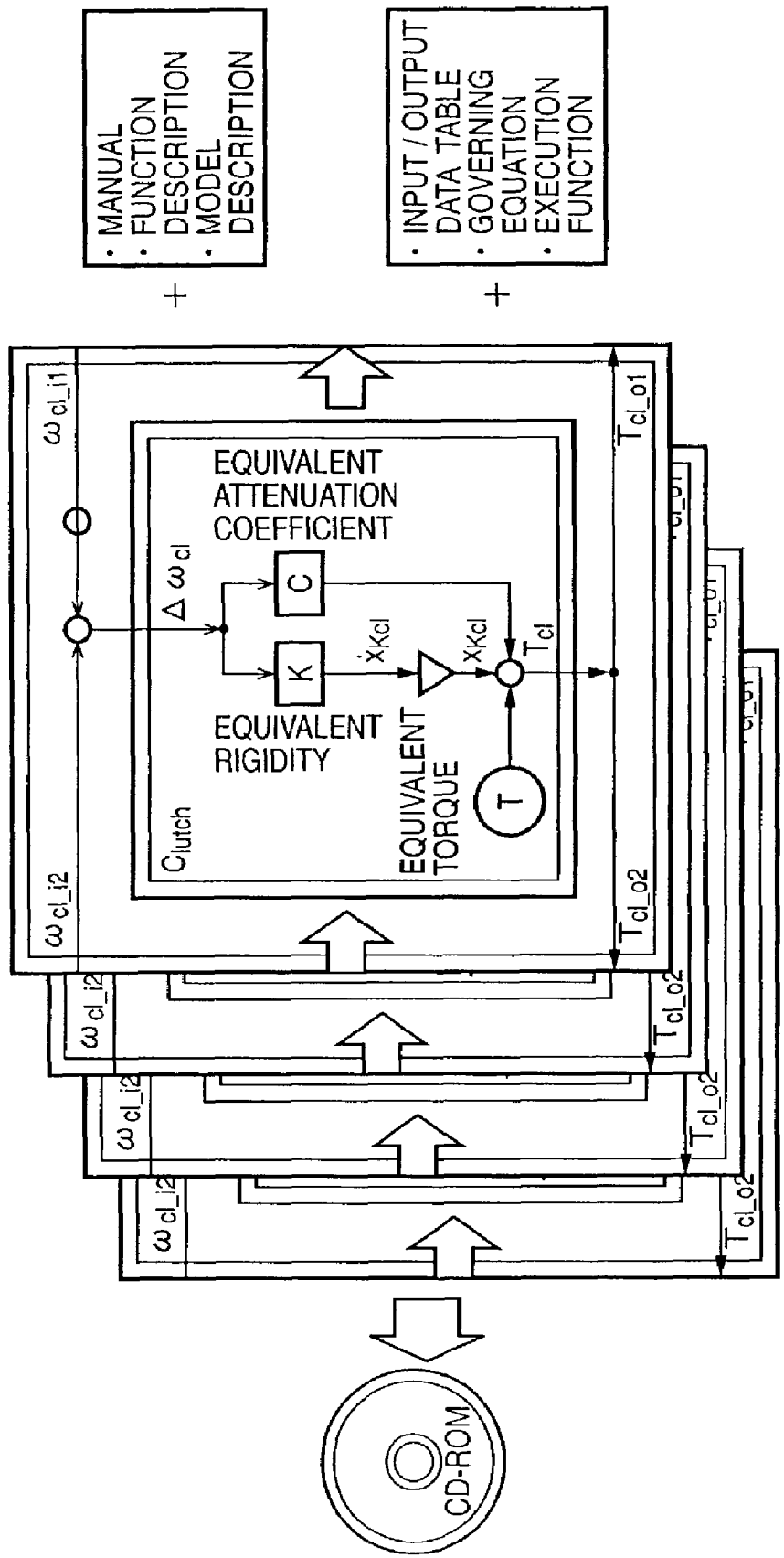
FIG. 80 shows the concept of an equivalent function model pack provided by an embodiment of the present invention.

FIG. 80 shows a package of a model collection which provides functional component models for product development engineers, who execute modeling by combining equivalent functions as abstract internal functions of products, components, and the like. This model collection provides a pack of a product, components, and its simulation model to a customer, who can simulate by building the governing equation of the provided model into a model of a product of his or her company. At that time, since the provided model is an abstract integrated model, technical contents of the product and components incorporated in the mechanism models and equivalent characteristics of the provider can be hidden as functions.

A central upper functional model in FIG. 80 is obtained by expanding and integrating the characteristics in the functional model shown in FIG. 78 into equivalent characteristics. Note that the input and output tables of the characteristics shown in FIG. 80 are the same as those in FIG. 79.

Also, the governing equation of FIG. 80 is obtained by integrating EQ113, and is given by:

$$\begin{bmatrix} 0 \\ T_{cl} \end{bmatrix} = \begin{bmatrix} K & 0 & 1 & 0 \\ 0 & 1 & C & T \end{bmatrix} \begin{bmatrix} \dot{x}_{kcl} \\ x_{kcl} \\ \Delta\omega_{cl} \\ 1 \end{bmatrix} \quad (\text{EQ116})$$

The respective characteristics in EQ116 are given by:

$$\left. \begin{array}{l} K = -\dfrac{1}{K_{cl} S_{cl\_1}} \\ C = C_{cl} S_{cl\_1} \\ T = T_{Fcl} S_{cl\_0} + T_{Kcl} S_{cl\_1} \end{array} \right\} \quad (\text{EQ117})$$

These characteristics are provided as equivalent characteristics which are converted into functions as in EQ114.

In EQ117, the first row represents the equivalent spring stiffness; the second row, the equivalent attenuation coefficient; and the third row, the equivalent torque.

(9-2-3. Package of Simplified Function Models)

FIG. 81 shows a package of a model collection which provides functional component models for product development engineers, who combine models on the basis of the exchange relationship of physical variables (state variables) with other mechanism components using models of a product, components, and the like, the internal functions of which are hidden. This model collection provides a pack of a product, components, and its simulation model to a customer, who can give use conditions and the like of a product of his or her company as input and output state variables and characteristic values to the provided model, and can confirm product or component functions by simulation. In this case, the governing equation cannot be built in the customer's model. Since the provided model is an abstract model, the technical contents of functional models, mechanism models, and equivalent characteristics incorporated in the product and components can be hidden as functions.

Figure 82:
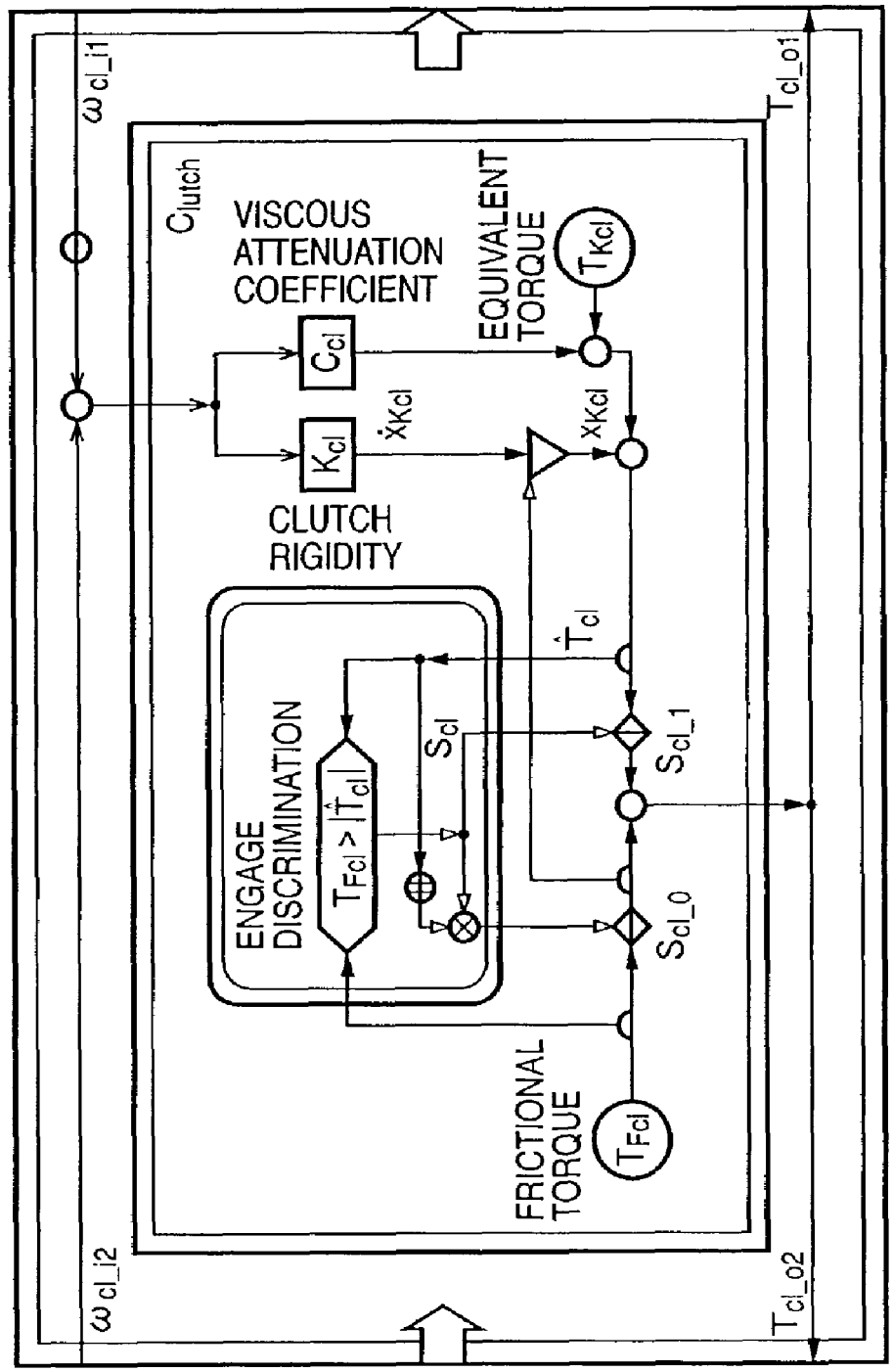
FIG. 82 shows an example of an integrated region in a simplified functional model.

Modeling using this package requires neither detailed theories nor knowledge in functional components. A simplified functional model shown in FIG. 81 summarizes as the function of a Clutch the relationship of a flow variable output ($T_{cl}$) with respect to a differential input ($\Delta\omega_{cl}$) of potential variables of the functional and mechanism models shown in FIG. 78. FIG. 82 shows this relationship.

This simplified function package provides the governing equation, mechanism models, and equivalent characteristics as functions, and equations cannot be changed upon modeling.

(9-2-4. Package of Symbolized Models)

Figure 83:
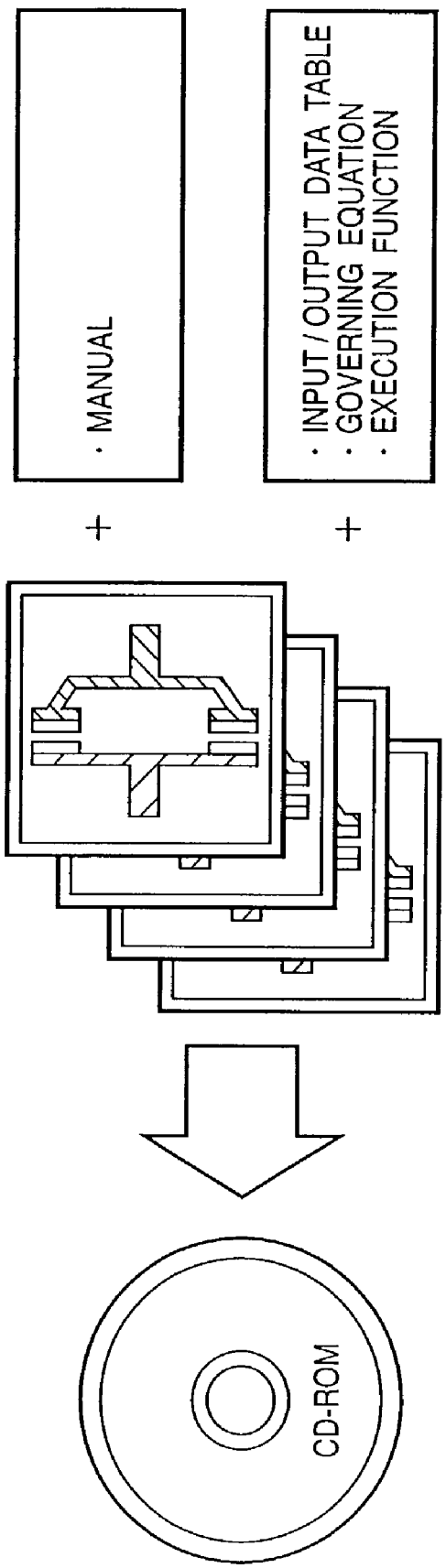
FIG. 83 shows the concept of a symbol model pack provided by an embodiment of the present invention.

FIG. 83 shows a package of a model collection which expresses models of a product, components, and the like, the internal functions of which are hidden, by abstract symbols, and provides functional component models for engineers who execute modeling by connecting the product or components to other mechanism components (systems) using the symbols on the basis of the energy exchange relationship. This model collection provides a pack of a product, components, and its simulation model to a customer, who confirms the behavior and characteristics of the provided product and components by simulation using the provided model, and can verify his or her required specifications by updating characteristic values within the range designated by the provider. However, the customer cannot build the governing equation into his or her model to change model contents. Furthermore, the provided model is symbolized, and the technical contents of functional models, mechanism models, and equivalent characteristics cannot be updated since they are hidden as functions.

All the governing equation, mechanism models, and equivalent functions of the symbolized model are converted into functions, and model contents cannot be changed. In order to directly connect the product or components to other systems, the input and output state variables of the governing equation provided as functions describe EQ115 by:

$$\begin{bmatrix} 0 \\ T_{cl\_o1} \\ T_{cl\_o2} \end{bmatrix} = \begin{bmatrix} K & 0 & 1 & -1 & 0 \\ 0 & 1 & C & -C & T \\ 0 & 1 & C & -C & T \end{bmatrix} \begin{bmatrix} \dot{x}_{kcl} \\ x_{kcl} \\ \omega_{cl\_i1} \\ \omega_{cl\_i2} \\ 1 \end{bmatrix} \quad (\text{EQ118})$$

10. Business Model

The expansion and integration schemes of functional and mechanism models described above can be expanded between enterprises associated with product development.

<10-1. Transaction of Functional-Mechanism Model>

Figure 84:
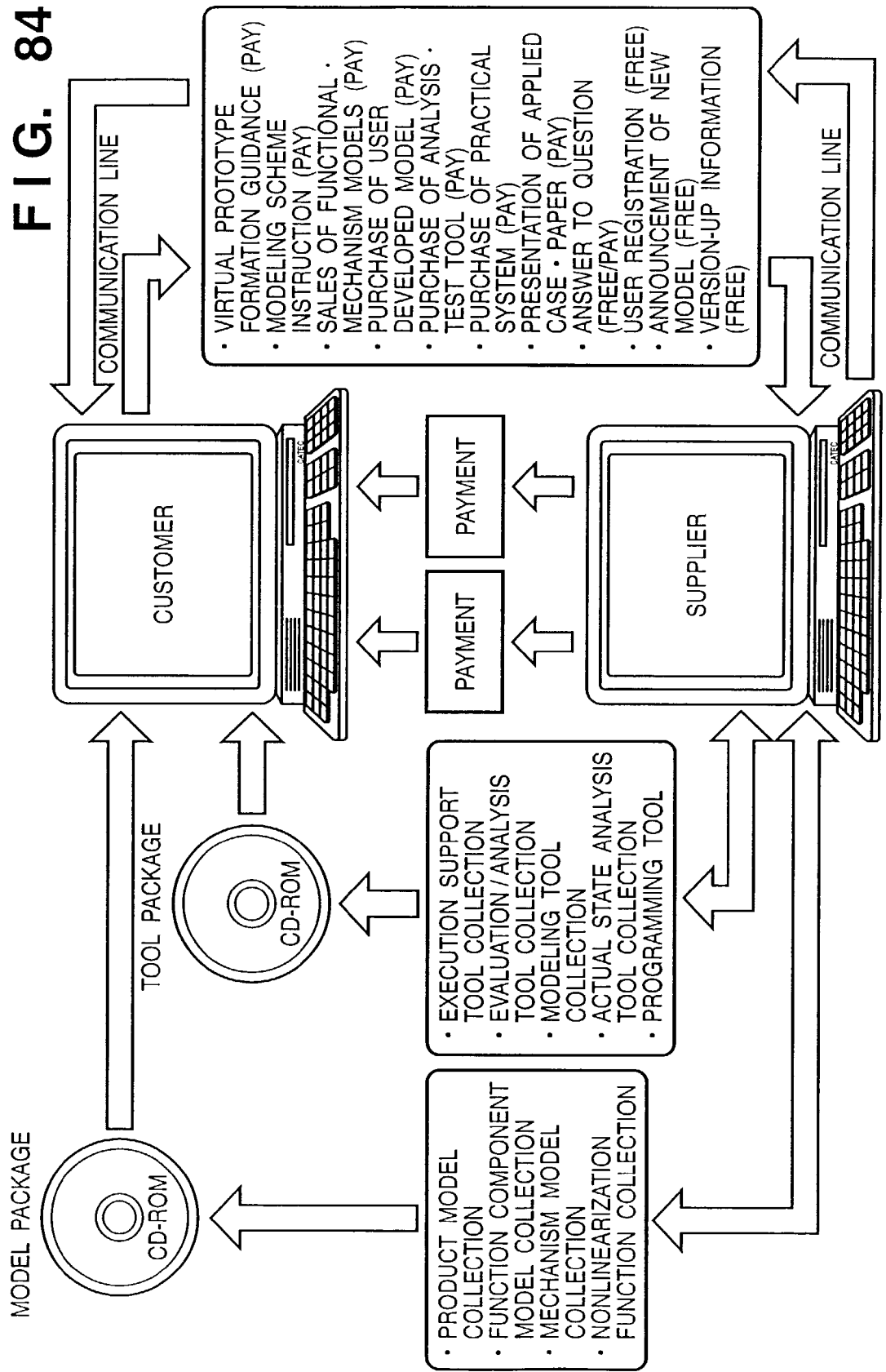
FIG. 84 shows an example of a business pattern by the system according to an embodiment of the present invention.

Functional and mechanism models can be modeled for respective functional components in accordance with the component arrangement of a product. Also, versatile models standardized for respective functions can be built in product and component models. Therefore, due to such high versatility, models of functional components, physical phenomena, engineering theories, and the like can be used as shared models for modeling engineers. Also, business for selling such sharable models bought up from a model producer or on commission of the model producer is conceivable. FIG. 84 illustrates this relationship.

<10-2. Performance Approval of Product on Order in Product Development>

Figure 85:
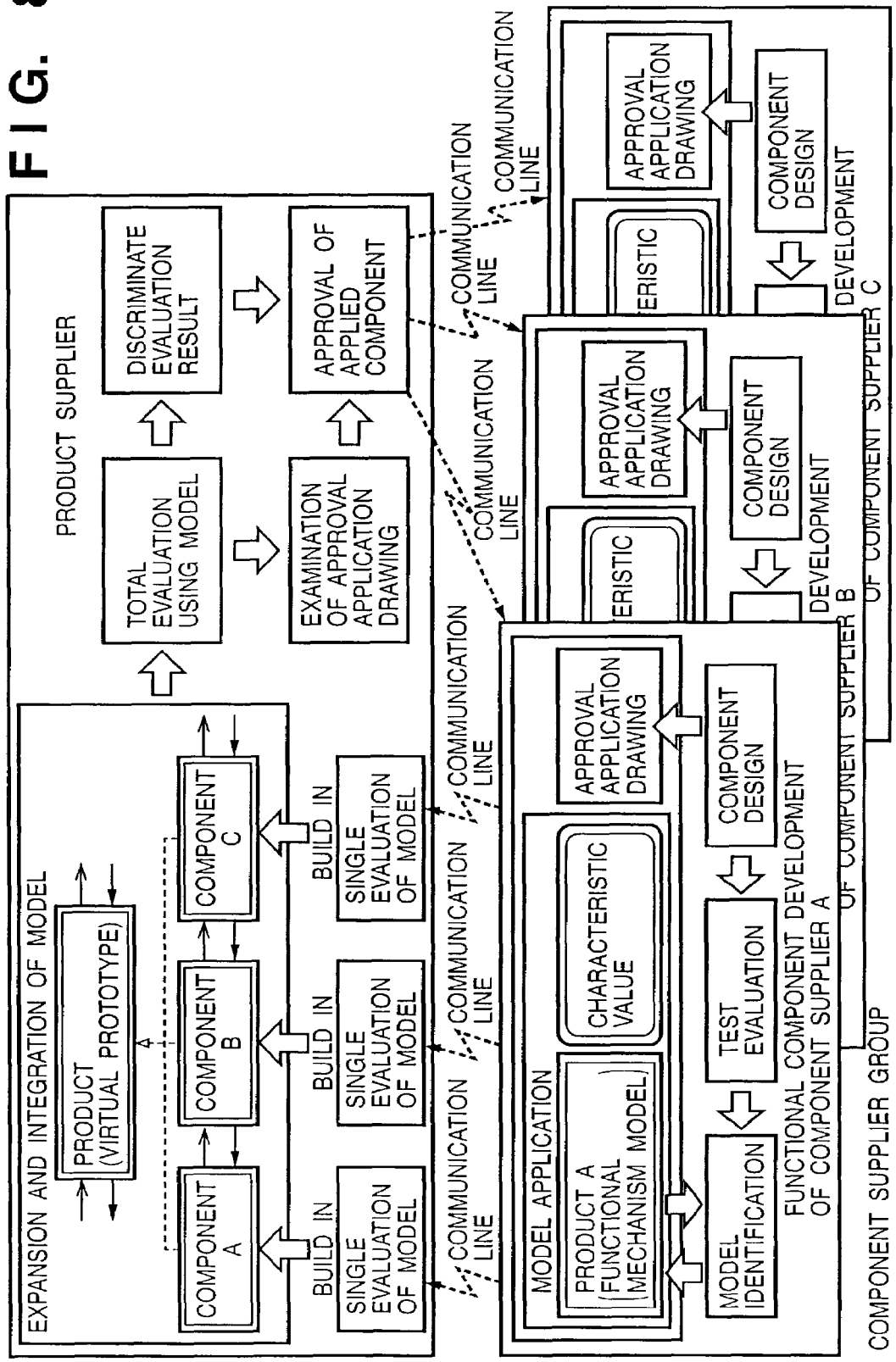
FIG. 85 shows an example of performance contract using models between a component supplier and product developer.

As a conventional method of contracting for technical contents in a transaction between the orderer and order receiver, a transaction using approval drawings is known. In this transaction, the performance and characteristics of a component on order cannot be expressed up to its full details. As a method of solving this, by exploiting the facts that expansion and integration can be made by hierarchically structurizing functional and mechanism models from individual components to the entire product, and functional and mechanism models can be recombined by nesting, a pack of functional and mechanism models of the component on order can be approved together with the approval application drawings exchanged between the orderer and order receiver. The functional and mechanism models of the component on order are applied together with characteristic data identified by the test result of the components to be delivered and having a tolerance variation range. The orderer evaluates the validity of the component alone by simulating and evaluating a sole mechanism model, and then totally evaluates the compatibility of the performance and characteristics of the component on order to the product under development by building that mechanism model in the product model, thus determining if the component is approvable. FIG. 85 shows a simple example of this mechanism.

<10-3. Sales of Functional Component With Evaluation Model>

Figure 86:
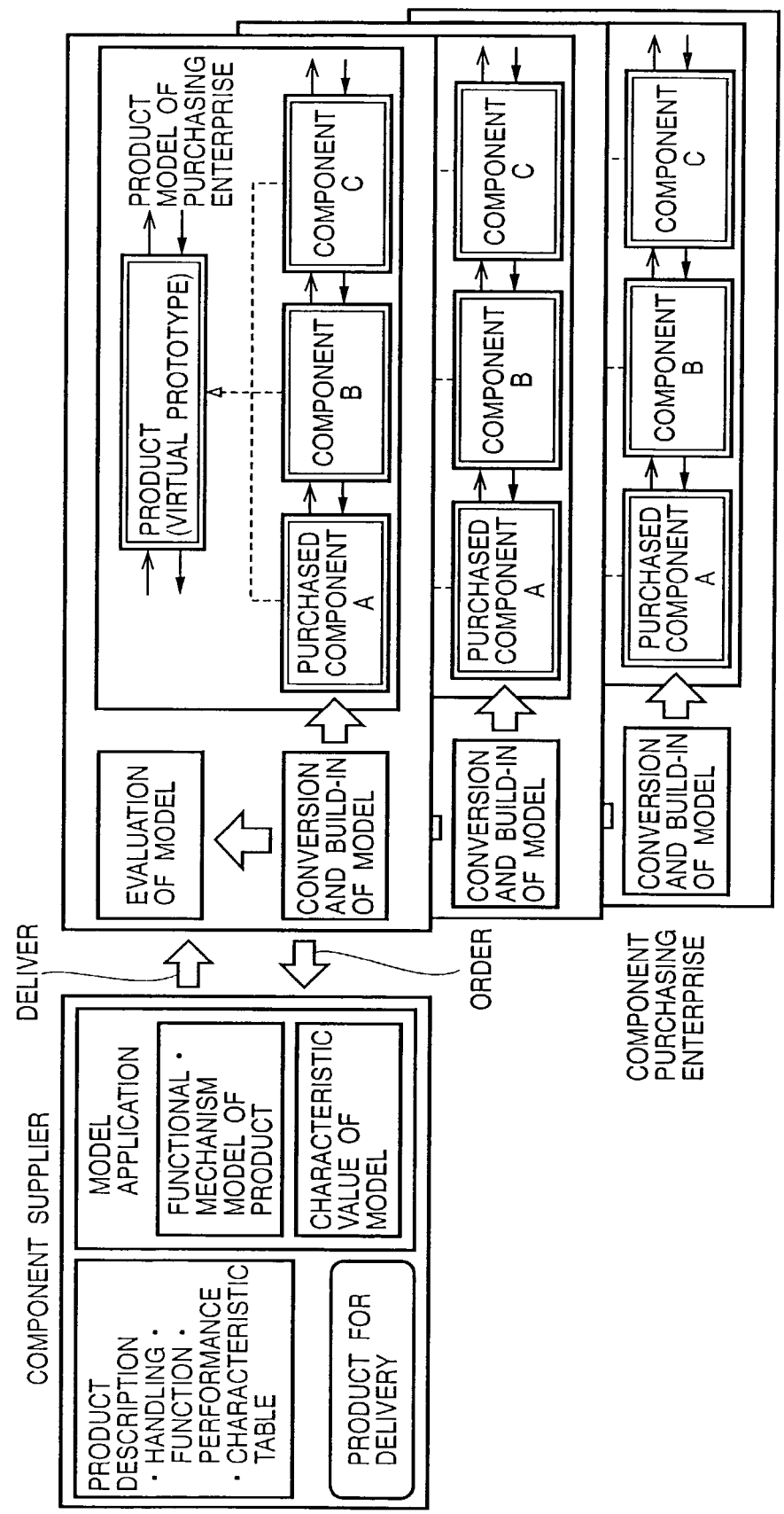
FIG. 86 shows an example of product sales with a production simulation model.
Figure 87:
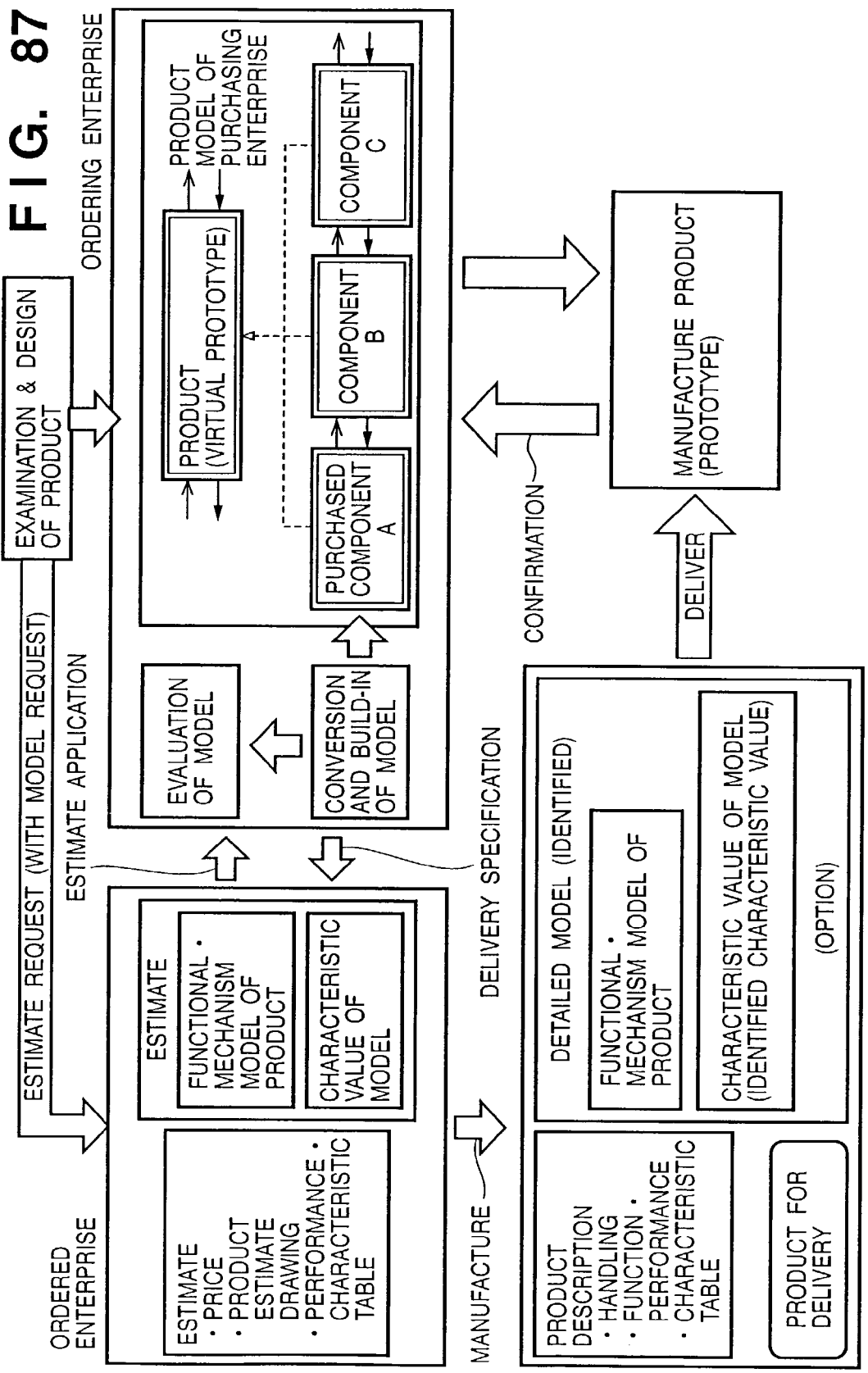
FIG. 87 shows an example of estimation by model evaluation.

Many components are versatilely built in many kinds of products. On the purchase side of such versatile functional components, the product is entirely or partially modeled to make technical evaluation. If a model generated by a modeling scheme highly adaptable to the system modeled by the orderer can be provided, the development cost, the number of processes, and period of the orderer can be reduced. FIGS. 86 and 87 show an example of the mechanism formed for such purpose.

FIG. 86 shows a method of delivering functional and mechanism models and internal characteristic data of a component to be delivered together with that component. FIG. 87 shows an example of the mechanism in which functional and mechanism models and internal characteristic data are applied together with an estimate application during the estimate process, and the orderer places an order after the performance and characteristics of a requested component are confirmed.

11. Execution of Simulation

Finally, an example of the sequence from when a simulation model is generated according to this embodiment until simulation is actually executed on a computer using that simulation model will be explained. This embodiment will exemplify a case wherein the object to be simulated is the drive system of an automobile.

Figure 93:
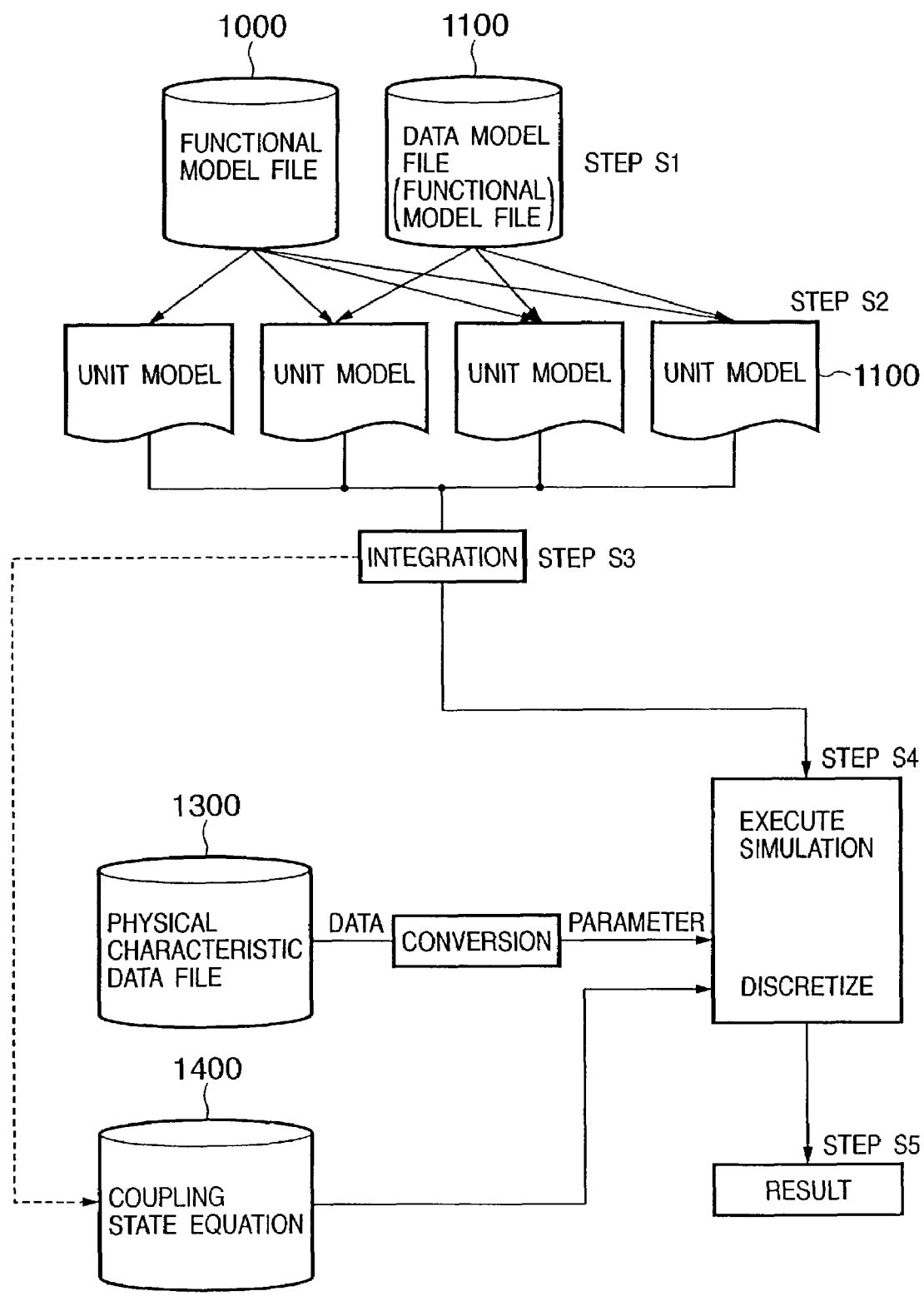
FIG. 93 is a flow chart showing the processing sequence until simulation execution according to an embodiment of the present invention.
Figure 94:
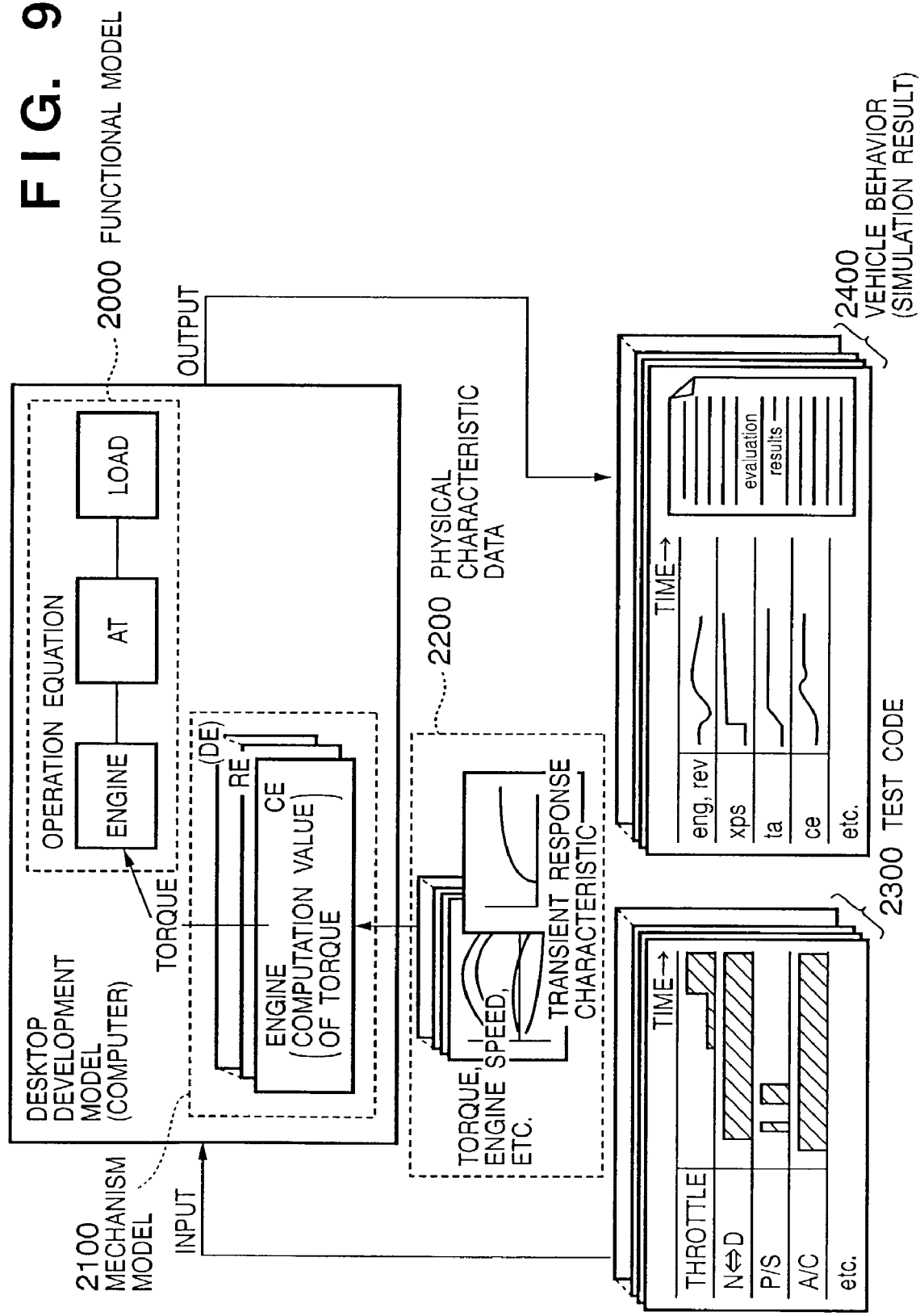
FIG. 94 shows the concept of simulation execution according to an embodiment of the present invention.
Figure 47:
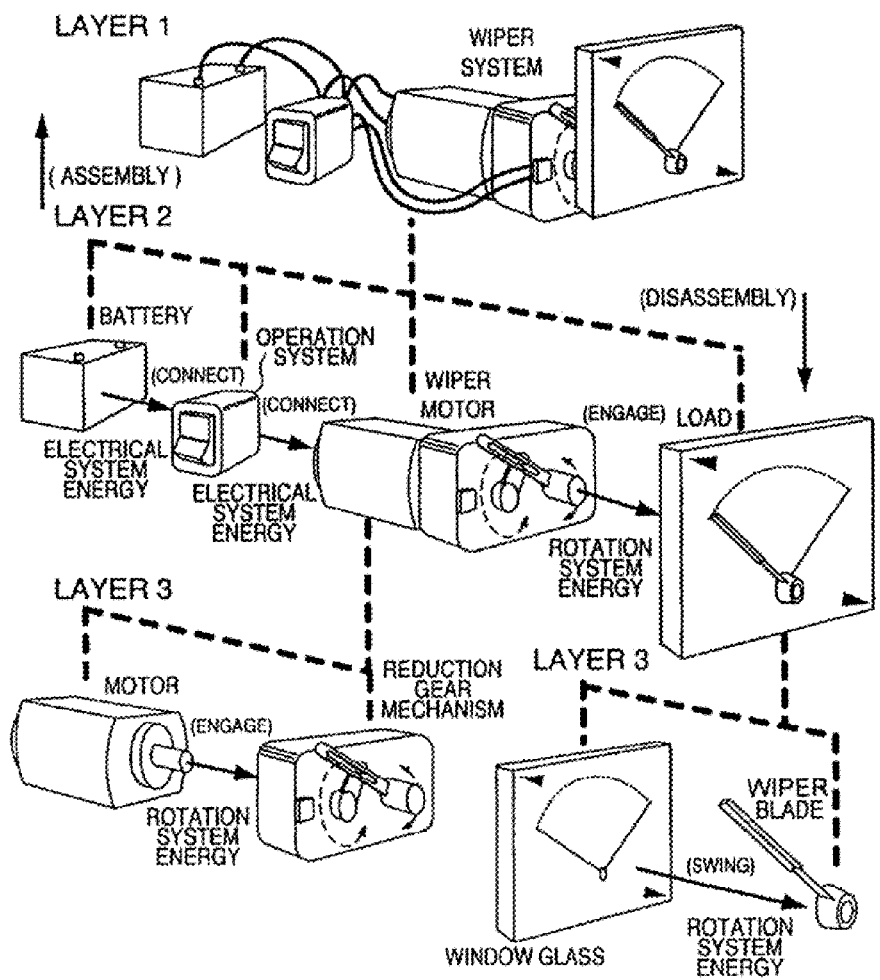
Figure 81:
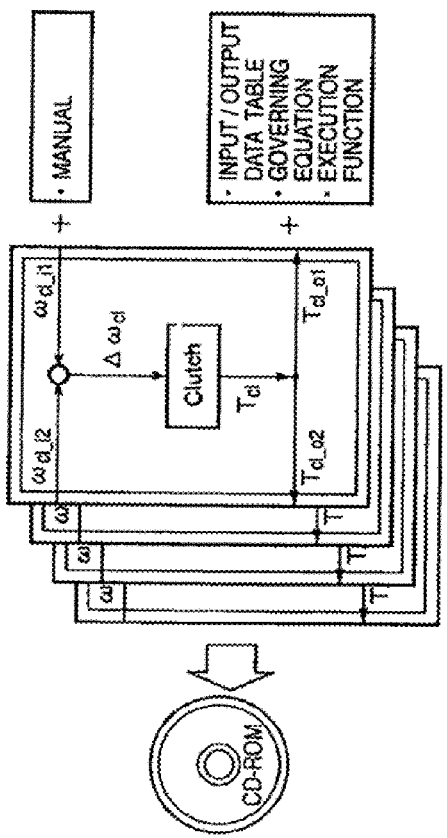

FIG. 93 is a flow chart showing the simulation sequence of the simulation system according to this embodiment. FIG. 94 is a diagram for explaining the concept upon simulating the drive system of an automobile using the simulation system.

<11-1. Resources for Generating Simulation Model>

Step S1: As resources for generating a simulation model, the following data are prepared. These data include a functional model that expresses one unit, and a functional component that expresses a component or its portion.

In FIG. 93, a functional model file 1000 pre-stores functional models of an apparatus (or system) to be simulated, or functional element data used to generate the functional models, and control parameters to be looked up by these functional models, so that the operator can select them.

A physical characteristic data file 1300 pre-stores data (physical characteristic data) which are extracted upon modeling a given mechanism portion of the object to be simulated, and expresses physical characteristics unique to that mechanism portion. Such data are stored in the form of functions or lookup tables that represent nonlinear elements unique to the mechanism portion in practice.

Therefore, when the object to be simulated is limited to only the drive system of the automobile, as in the example of FIG. 94, the functional model file 1000 stores functional models of an engine, automatic transmission device (AT), and load as elements that form the drive system, and their control parameters, and the physical characteristic data file 1300 stores physical characteristic data such as physical characteristics including the torque, rotational speed, and the like, transient response characteristics, and the like of the engine, AT, and the like.

A data model file (mechanism model file) 1100 pre-stores mechanism models separated from nonlinear physical characteristic data upon modeling a given mechanism portion that forms the object to be simulated. Upon executing the simulation, the data model file 1100 reads out physical characteristic data stored in the physical characteristic data file 1300, and substitutes the readout data into a mechanism model as a control parameter value for arithmetic operations. In the example shown in FIG. 94, such mechanism models correspond to mechanism models 2100 for obtaining torque computation values based on torque characteristics for respective types of engine such as CE (reciprocating engine), RE (rotary engine), DE (diesel engine), and the like.

Using these three different files, simulation model generation and simulation according to this embodiment are executed.

<11-2. Generation of Simulation Model>

Step S2: Unit models 1200 for a plurality of units that form the object to be simulated are generated on the basis of functional models read out from the functional model file 1000, and mechanism models read out from the data model file 1100, and are connected using pairs of potential and flow variables, thus expressing the object to be simulated as a modeled system.

Currently, such operation is substantially the same as that of general rendering software, and is done when the operator selects desired blocks (appropriate blocks) from the functional model file 1000 and data model file 1100 on the display screen of a computer so as to define the system of the object to be simulated. In the example shown in FIG. 94, the models to be selected by the operator correspond to a functional model 2000 in which the models of the engine, automatic transmission device (AT), and load which form the drive system of the object to be simulated are connected, and to the mechanism model 2100 for obtaining the torque computation value based on the torque characteristics of the engine of the selected type.

Step 3: The system consisting of the plurality of unit models connected via the pairs of potential and flow variables is automatically integrated in accordance with the aforementioned sequence. Note that the model integrated in step S3 corresponds to a state equation (system equation if an observation system is included to improve operability) that expresses the object to be simulated in practice in the computer, and the computed state equation is stored as an integrated state equation 1400.

The unit models and integrated object to be simulated newly generated in steps S2 and S3 are registered in the functional model file 1000 and data model file 1100 so that they can be searched out and read out, since they are re-used as resources later.

<11-3. Execution of Simulation>

Step 4: By supplying, to the model integrated in step S3 that expresses the object to be simulated, test codes prepared in advance (corresponding to test codes 2300 in which transition states of the throttle opening degree of the engine, the shift range of the AT, and the like are registered in advance in the example in FIG. 94), and physical characteristic data (corresponding to physical characteristic data including physical characteristics such as torque, rotational speed, and the like, and transient response characteristics of the engine, AT, and the like in the example shown in FIG. 94) at predetermined sampling periods, the operation of the model is simulated on the computer.

That is, since the state equation stored in the integrated state equation 1400 includes mechanism models read out from the data model file 1100, physical characteristic data read out from the physical characteristic data file 1300 (physical characteristic data 2300) (parameter values to be substituted may be computed based on the simulation result of the current control period or an infinitesimal time period before that) are substituted in corresponding portions of the mechanism model as control parameters at predetermined sampling periods. The arithmetic operation results corresponding to the substituted control parameters are stored in a storage device for respective control periods.

Step S5: The arithmetic operation results computed in step S4 for a predetermined simulation period are output to a display, plotter, or the like in accordance with a predetermined format, as exemplified by a vehicle behavior (simulation result) 2400 in FIG. 94.

The present invention can provide a simulation model creation method for systematically generating models that simulate operations from a component of a single function to a machine that combines many components and also to a system that combines a plurality of machines, which can be expressed by all physical systems such as an electric system and mechanical system, solid-state system and fluid system, and the like, a system therefor, and a storage medium.

That is, (1) Even when many nonlinear characteristics are contained, the arithmetic processing volume can be minimized, and the precision can be improved. Respective models and, especially, nonlinear characteristics, can be easily set in a nested structure.

(2) A coupling process of functional models can be easily executed.

(3) Intermediate potential and flow variables that cannot be observed after integration can be observed.

(4) Function simulation models can be easily generated.

(5) An integrated function simulation model can be theoretically recognized and re-used.

(6) Effective business operations are possible in correspondence with the use levels of users.

As many apparently widely different embodiments of the present invention can be made without departing from the spirit and scope thereof, it is to be understood that the invention is not limited to the specific embodiments thereof except as defined in the appended claims.

The invention claimed is:

1. A computer readable medium encoded with a computer program for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, wherein each of the component function simulation models include linear characteristic elements that have a regular relationship between input and output values, and at least one of the component function simulation models includes a nonlinear characteristic element that has an irregular relationship between input and output values or outputs irregular data independently, the program being executed by a computer to perform:

separating the nonlinear characteristic element and the linear characteristic elements, and replacing the nonlinear characteristic element with a predetermined linear element corresponding to a linear mathematical element;

combining the plurality of component function simulation models using the corresponding component mathematical models to create a combined linear function simulation model represented as a combined linear mathematical model; and reinserting the nonlinear characteristic element in place of the predetermined linear element corresponding to the linear mathematical element to create the combined function simulation model represented as a combined mathematical model including at least a nonlinear characteristic element.

2. The method according to claim 1, wherein the nonlinear characteristic element is expressed by nonlinear data.

3. The method according to claim 1, wherein said combining includes converting a plurality of characteristic elements in the combined linear function simulation model into an equivalent characteristic element.

4. The method according to claim 3, wherein said converting includes grouping the plurality of characteristic elements in the combined linear function simulation model based on characteristic types, and converting the characteristic elements into equivalent characteristic elements for respective characteristic types.

5. The method according to claim 3, wherein, when the characteristic element is a loss characteristic that involves energy loss, a series connection of a plurality of characteristic elements is converted into a sum of characteristic values thereof, and a parallel connection of a plurality of characteristic elements is converted into a reciprocal value of a sum of reciprocal values of characteristic values thereof.

6. The method according to claim 3, wherein, when the characteristic element is a characteristic that involves storing energy, a series connection of a plurality of characteristic elements is converted into a reciprocal value of a sum of reciprocal values of characteristic values thereof, and a parallel connection of a plurality of characteristic elements is converted into a sum of characteristic values thereof.

7. A computer readable medium encoded with a computer program for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, the program being executed by a computer to perform:

preparing linear functional elements corresponding to components, which indicate a linear relationship between the first and second state variables of a function, and a coefficient element for connecting the linear functional elements;

replacing a nonlinear functional element corresponding to a component, which indicates a nonlinear relationship between the first and second state variables of a function, with a predetermined linear functional element;

creating a new functional element corresponding to a component by integrating at least one linear functional element by the coefficient element, wherein said creating reinserts the replaced nonlinear functional element in place of the predetermined linear functional element in the new functional element after creating the new functional element by integrating linear functional elements; and repeating integration of new functional elements corresponding to the components until a combined function to be simulated is created.

8. The method according to claim 7, wherein each functional element includes a loss element which loses energy, and a storage element which stores energy.

9. The method according to claim 7, wherein the coefficient element is an element for converting physical systems of functional elements to be integrated, and when the physical systems are equal, the functional elements are integrated by setting a value of the coefficient element to be 1.

10. A computer readable medium encoded with a computer program for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, the program being executed by a computer to perform:

preparing linear functional elements corresponding to components, which indicate a linear relationship between the first and second state variables of a function, a coefficient element for connecting the linear functional elements, and equivalent functional elements obtained by converting input and output directions and signs of first and second state variables of the functions;

replacing a nonlinear functional element corresponding to a component, which indicates a nonlinear relationship between the first and second state variables of a function, with a predetermined linear functional element;

creating a new functional element corresponding to a component by integrating at least one linear functional element by the coefficient element, wherein said creating reinserts the replaced nonlinear functional element in place of the predetermined linear functional element in the new functional element after creating the new functional element by integrating linear functional elements; and repeating integration of new functional elements corresponding to the components until a combined function to be simulated is created.

11. A system for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, wherein each of the component function simulation models include linear characteristic elements that have a regular relationship between input and output values, and at least one of the component function simulation models includes a nonlinear characteristic element that has an irregular relationship between input and output values or outputs irregular data independently, the system comprising:

means for separating the nonlinear characteristic element and the linear characteristic elements, and replacing the nonlinear characteristic element with a predetermined linear element corresponding to a linear mathematical element;

means for combining the plurality of component function simulation models using the corresponding component mathematical models to create a combined linear function simulation model represented as a combined linear mathematical model; and means for reinserting the nonlinear characteristic element in place of the predetermined linear element corresponding to the linear mathematical element to create the combined function simulation model represented as a combined mathematical model including at least a nonlinear characteristic element.

12. The system according to claim 11, wherein said means for combining includes means for converting a plurality of characteristic elements in the combined linear function simulation model into an equivalent characteristic element.

13. The system according to claim 11, further comprising means for developing component mathematical models that represent each component function simulation model and means for exchanging the component mathematical models for the component function simulation models via a detachable storage medium or communication.

14. A computer readable storage medium encoded with a program for providing a method for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, including at least a program for creating the component function simulation models, and a program for combining the plurality of component function simulation models, said combining program, when respective component function simulation models include linear characteristic elements and at least one component function simulation model includes a nonlinear characteristic element, when executed by a computer performs:

separating the nonlinear characteristic element and the linear characteristic elements, and replacing the nonlinear characteristic element with a predetermined linear element corresponding to a linear mathematical element;

combining the plurality of component function simulation models using the corresponding component mathematical models to create a combined linear function simulation model represented as a combined linear mathematical model; and reinserting the nonlinear characteristic element in place of the predetermined linear element corresponding to the linear mathematical element to create the combined function simulation model represented as a combined mathematical model including at least a nonlinear characteristic element.

15. The storage medium according to claim 14, wherein the combining includes converting a plurality of characteristic elements in the combined linear function simulation model into an equivalent characteristic element.

16. The storage medium according to claim 14, further including a database for searchably storing the created component function simulation models.

17. The storage medium according to claim 16, wherein said database includes a read-only area for storing component function simulation models in advance, and an area for rewritably storing newly created component function simulation models.

18. A computer readable storage medium for providing a method for creating a combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, including resource elements for creating the component function simulation models, and a program for combining the plurality of function simulation models, said resource elements including linear functional elements each indicating a linear relationship between the first and second state variables, and a coefficient element for connecting the linear functional elements, said combining program being executed by a computer to perform:

replacing a nonlinear functional element corresponding to a component, which indicates a nonlinear relationship between the first and second state variables of a function, with a predetermined linear functional element;

creating a new functional element corresponding to a component by integrating at least one linear functional element by the coefficient element, wherein said creating reinserts the replaced nonlinear functional element in place of the predetermined linear functional element in the new functional element after creating the new functional element by integrating linear functional elements; and repeating integration of new functional elements corresponding to the components until a combined function to be simulated is created.

19. A system for creating an combined function simulation model that represents a combined system and corresponds to a combined mathematical model, using a plurality of component function simulation models that each represent a component of the combined system and corresponds to a component mathematical model being identified by a first state variable that represents a moving amount or a quantity of a medium that carries energy and a second state variable that represents a strength or an amount of energy of a medium, the system comprising:

at least a CPU and a storage unit storing processing modules, said CPU, when respective component function simulation models include linear characteristic elements and at least one function simulation model includes a nonlinear characteristic element, executing the stored processing modules including:

a processing module separating the nonlinear characteristic element and the linear characteristic elements, and replacing the nonlinear characteristic element with a predetermined linear element corresponding to a linear mathematical element;

a processing module combining the plurality of component function simulation models using the corresponding component mathematical models to create a combined linear function simulation model represented as a combined linear mathematical model; and a processing module reinserting the nonlinear characteristic element in place of the predetermined linear element corresponding to the linear mathematical element to create the combined function simulation model represented as a combined mathematical model including at least a nonlinear characteristic element.

20. The simulation model creation system according to claim 19, wherein said combining processing module includes a processing module converting a plurality of characteristic elements in the combined linear function simulation model into an equivalent characteristic element.

21. The simulation model creation system according to claim 19, further comprising a processing module and interface exchanging component mathematical models that express the component function simulation models via a detachable storage medium or communication.

\* \* \* \* \*

UNITED STATES PATENT AND TRADEMARK OFFICE
CERTIFICATE OF CORRECTION

PATENT NO. : 7,260,510 B2
APPLICATION NO. : 10/110408
DATED : August 21, 2007
INVENTOR(S) : Shizuo Sumida It is certified that error appears in the above-identified patent and that said Letters Patent is hereby corrected as shown below:

Title Page 2, Column 1 (Other Publications), Line 9, change "Oct. 2123." to --Oct. 21-23,--.

Title Page 2, Column 1 (Other Publications), Line 24, change "Hiearchical" to --"Hierarchical--.

Drawings
Sheet 62 of 125 (LAYER 3) (FIG. 47), Line 1, change "WAPER" to --WIPER--.

Sheet 112 of 125 (FIG. 81), Line 3, change "$C_{lutch}$" to --Clutch--.

Column 16, Line 63, change "Functional-Mechanism" to --Functional Mechanism--.

Column 20 ("Remarks"), Lines 21-22, change "characteristic coefficient side" to --characteristic·coefficient·side--.

Column 23, Line 21, change "nonlinearlity" to --nonlinearity--.

Column 35, Line 24, change "devicees" to --devices--.

Column 35, Line 38, change "devicees" to --devices--.

Column 38, Line 56, change "Pao" to --$P_{ao}$--.

Column 44, Line 39, change "fa" to --$f_a$--.

UNITED STATES PATENT AND TRADEMARK OFFICE
CERTIFICATE OF CORRECTION

PATENT NO. : 7,260,510 B2
APPLICATION NO. : 10/110408
DATED : August 21, 2007
INVENTOR(S) : Shizuo Sumida It is certified that error appears in the above-identified patent and that said Letters Patent is hereby corrected as shown below:

Column 45, Line 39, change "(5-1-l." to --(5-1-1.--.

Column 46, Line 23, change "fb" to --$f_b$--.

Column 47 (EQ29), Line 46, change "$E_{N\_F}$" to --$E_{N\_f}$--.

Column 49, Line 21, change "VNET," to --$V_{NET}$,--.

Column 49, Line 51, change "VNET" to --$V_{NET}$--.

Column 49, Line 53, change "$F_{NET\_C}$," to --$E_{NET\_C}$,--.

Column 51, Line 43, change "Hierarchication" to --Hierarchisation--.

Column 52, Line 21, change "VI2" to --$V_{I2}$--.

Column 52, Line 22, change "VC1" to --$V_{C1}$--.

Column 52, Line 24, change "IC1" to --$I_{C1}$--.

Column 52, Line 25, change "II2" to --$I_{I2}$--.

Column 52, Line 26, change "Ic2" to --$I_{c2}$--.

Column 52, Line 26, change "Ir1" to --$I_{r1}$--.

Column 52, Line 29, change "Vr1" to --$V_{r1}$--.

Column 52, Line 29, change "Vc2" to --$V_{c2}$--.

UNITED STATES PATENT AND TRADEMARK OFFICE
CERTIFICATE OF CORRECTION

PATENT NO. : 7,260,510 B2
APPLICATION NO. : 10/110408
DATED : August 21, 2007
INVENTOR(S) : Shizuo Sumida It is certified that error appears in the above-identified patent and that said Letters Patent is hereby corrected as shown below:

Column 52, Line 66, change "$II_{12}$," to --$I_{12}$,--.

Column 60 (EQ77), Line 40, change "$=X^{-1}$" to --$=-X^{-1}$--.

Column 61, Line 6, change "/$V_{acc}$" to --$V_{acc}$--.

Column 61, Line 8, change "variable," to --variable.--.

Column 61 (EQ80), Line 15, change $$"0 = AV_{sta} + BV_{inp} 30 \ G"$$

to $$--0 = AV_{sta} + BV_{inp} + G--$$

UNITED STATES PATENT AND TRADEMARK OFFICE
CERTIFICATE OF CORRECTION

PATENT NO. : 7,260,510 B2
APPLICATION NO. : 10/110408
DATED : August 21, 2007
INVENTOR(S) : Shizuo Sumida It is certified that error appears in the above-identified patent and that said Letters Patent is hereby corrected as shown below:

Column 66, Line 17, change "xk" to --$x_k$--.

Column 67, Line 20, change "L0." to --$L_0$.--.

Column 70 (EQ95), Line 28, change $$\text{``}\dot{x}_u{'}\text{''}$$

to $$--\dot{x}_{u'}--.$$

Column 70 (EQ95), Line 30, change $$\text{``}x_u{'}\text{''}$$

to $$--x_{u'}--.$$

UNITED STATES PATENT AND TRADEMARK OFFICE
CERTIFICATE OF CORRECTION

PATENT NO. : 7,260,510 B2
APPLICATION NO. : 10/110408
DATED : August 21, 2007
INVENTOR(S) : Shizuo Sumida It is certified that error appears in the above-identified patent and that said Letters Patent is hereby corrected as shown below:

Column 75-76 (EQ103), Line 58, change "$\dot{X}_{Kcl}$" to --$\dot{X}_{Kd}$--.

Column 78, Line 10, change "fnc_Nmis()" to --fnc_$N_{mis}$()--.

Column 85, Line 20, change "Functional-Mechanism" to --Functional·Mechanism--.

Column 86, Line 20, change "$\omega_{c1\_i1}$" to --$\omega_{c1\_i1}$--.

Signed and Sealed this

Seventeenth Day of February, 2009

JOHN DOLL
*Acting Director of the United States Patent and Trademark Office*